(12) United States Patent
Tomita et al.

(10) Patent No.: US 8,828,527 B2
(45) Date of Patent: Sep. 9, 2014

(54) SURFACE-COATED CUTTING TOOL

(75) Inventors: Kohei Tomita, Joso (JP); Makoto Igarashi, Naka-gun (JP); Akira Osada, Naka-gun (JP); Eiji Nakamura, Naka (JP)

(73) Assignee: Mitsubishi Materials Corporation, Tokyo (JP)

( * ) Notice: Subject to any disclaimer, the term of this patent is extended or adjusted under 35 U.S.C. 154(b) by 392 days.

(21) Appl. No.: 13/256,867

(22) PCT Filed: Mar. 18, 2010

(86) PCT No.: PCT/JP2010/001973
§ 371 (c)(1),
(2), (4) Date: Sep. 15, 2011

(87) PCT Pub. No.: WO2010/106811
PCT Pub. Date: Sep. 23, 2010

(65) Prior Publication Data
US 2012/0003452 A1 Jan. 5, 2012

(30) Foreign Application Priority Data

Mar. 18, 2009 (JP) .................................. 2009-065814
Jun. 22, 2009 (JP) .................................. 2009-147767
Jun. 24, 2009 (JP) .................................. 2009-149350

(51) Int. Cl.
*B23B 27/14* (2006.01)
*C23C 28/04* (2006.01)
(Continued)

(52) U.S. Cl.
CPC .............. *C23C 16/403* (2013.01); *C23C 28/044* (2013.01); *C23C 16/0272* (2013.01); *C23C 16/32* (2013.01); *C23C 30/005* (2013.01); *C23C 28/042* (2013.01); *C23C 16/36* (2013.01); *C23C 16/34* (2013.01); *C23C 16/30* (2013.01); *C23C 16/40* (2013.01)
USPC ............... 428/216; 51/307; 51/309; 428/336; 428/697; 428/698; 428/699; 428/701; 428/702; 428/704

(58) Field of Classification Search
CPC .............. B22F 2302/10; B22F 2302/15; B22F 2302/20; B22F 2302/25; B22F 2302/253; B23B 2224/28; B23B 27/14; B23B 2228/10; B23B 2228/36; B23B 2228/105; C01B 21/062; C01B 21/076; C01B 21/0615; C01B 31/30; C01B 31/34; C01B 31/301; C01B 31/305; C04B 22/06; C23C 16/32; C23C 16/34; C23C 16/36; C23C 16/40; C23C 16/347; C23C 16/403; C23C 16/405
USPC ............ 51/307, 309; 428/216, 336, 697, 698, 428/699, 701, 702, 704
See application file for complete search history.

(56) References Cited

U.S. PATENT DOCUMENTS 4,599,281 A * 7/1986 Schintlmeister et al. ..... 428/698
5,827,570 A * 10/1998 Russell .................... 427/255.34
(Continued)

FOREIGN PATENT DOCUMENTS

CN 101372041 A 2/2009
JP 58-115081 A 7/1983
(Continued)

OTHER PUBLICATIONS

Ruppi, 'Enhanced performance of α-Al₂O₃ coatings by control of crystal orientation', Surface and Coatings Technology, May 25, 2008, pp. 4257-4269, vol. 202, No. 17.
(Continued)

*Primary Examiner* — Archene Turner
(74) *Attorney, Agent, or Firm* — Leason Ellis LLP.

(57) ABSTRACT

A surface-coated cutting tool includes a tool substrate made of tungsten carbide-based cemented carbide or titanium carbonitride-based cermet; and a hard coating layer formed by vapor-depositing in order, a lower layer (a), an intermediate layer (b), and an upper layer (c) on the tool substrate. The lower layer (a) is a Ti layer composed of one or more of a titanium carbide layer, a titanium nitride layer, a titanium carbonitride layer, a titanium carboxide layer, and a titanium oxycarbonitride layer, and having a thickness of 3 to 20 μm. The intermediate layer (b) is an aluminum oxide layer having a thickness of 1 to 5 μm, and having an α-type crystal structure in a chemically vapor-deposited state. The upper layer (c) is an aluminum oxide layer having a thickness of 2 to 15 μm, and containing one or more elements of Ti, Y, Zr, Cr, and B.

20 Claims, 14 Drawing Sheets

(51) Int. Cl.
  *C23C 16/02* (2006.01)
  *C23C 16/40* (2006.01)
  *C23C 16/32* (2006.01)
  *C23C 30/00* (2006.01)
  *C23C 16/36* (2006.01)
  *C23C 16/34* (2006.01)
  *C23C 16/30* (2006.01)

(56) References Cited

U.S. PATENT DOCUMENTS 7,276,301 B2 * 10/2007 Tsushima et al. ............ 428/699
2004/0202877 A1    10/2004 Martensson

FOREIGN PATENT DOCUMENTS

| JP | 59-028565 | * | 2/1984 |
| JP | 06-008010 | A | 1/1994 |
| JP | 10-291102 | A | 11/1998 |
| JP | 2002-160105 | A | 6/2002 |
| JP | 2002-263914 | A | 9/2002 |
| JP | 2004-001154 | A | 1/2004 |
| JP | 2005-279908 | A | 10/2005 |
| JP | 2006-198735 | A | 8/2006 |
| JP | 2006-289556 | A | 10/2006 |
| JP | 2006-289557 | A | 10/2006 |
| JP | 2006-289586 | A | 10/2006 |
| JP | 2007-168027 | * | 7/2007 |
| JP | 2009-248218 | A | 10/2009 |

OTHER PUBLICATIONS

International Search Report mailed May 18, 2010 for the corresponding PCT application No. PCT/JP2010/001973.
Chinese Search Report mailed Nov. 15, 2012 for the corresponding Chinese Patent Application No. 201080012240.3.
Ruppi, 'Enhanced performance of $\alpha$-$Al_2O_3$, coatings by control of crystal orientation', Surface and Coatings Technology, May 25, 2008, pp. 4257-4269, vol. 202, No. 17 (Previously filed on Sep. 15, 2011).

* cited by examiner

— CRYSTAL GRAIN BOUNDARY
----- Σ3 COINCIDENCE SITE LATTICE INTERFACE

FIG. 7A
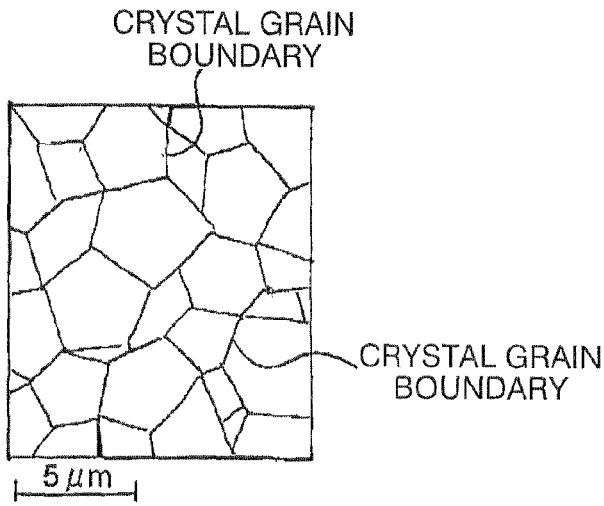
FIG. 7B
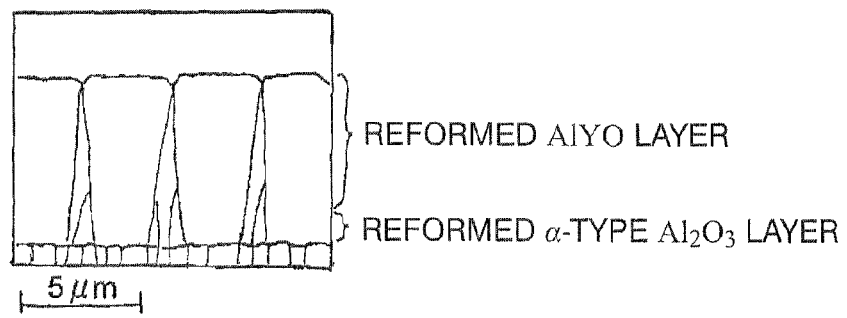
FIG. 7C    FLAT-PLATE HEXAGONAL
          SHAPE TEXTURE
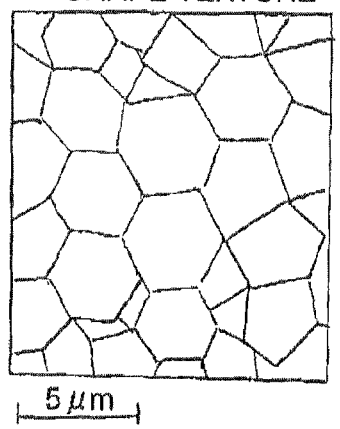

— CRYSTAL GRAIN BOUNDARY
---- Σ3 COINCIDENCE SITE LATTICE INTERFACE

FIG. 11A
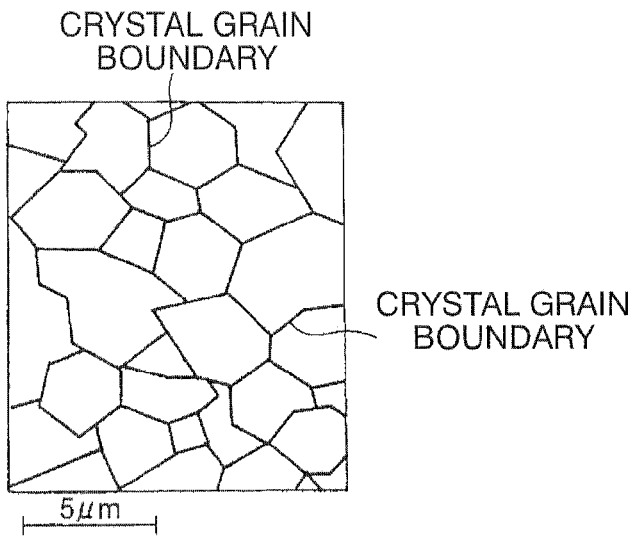
CRYSTAL GRAIN BOUNDARY
CRYSTAL GRAIN BOUNDARY
FIG. 11B
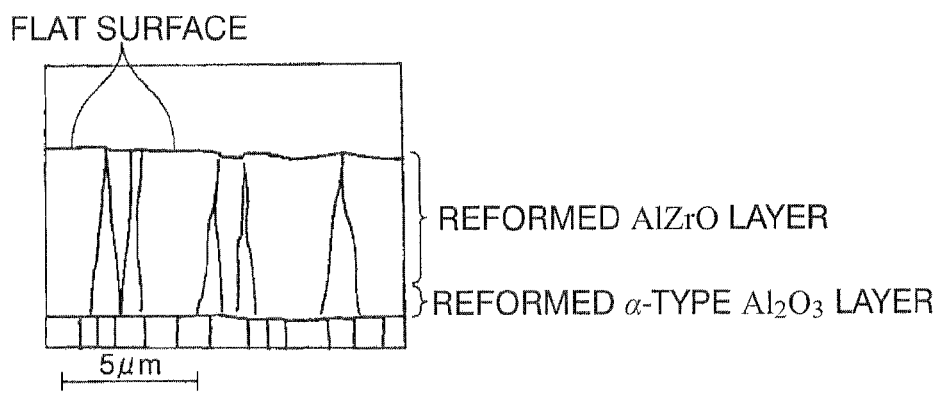
FLAT SURFACE
REFORMED AlZrO LAYER
REFORMED α-TYPE Al$_2$O$_3$ LAYER
FIG. 11C   FLAT-PLATE HEXAGONAL SHAPE TEXTURE
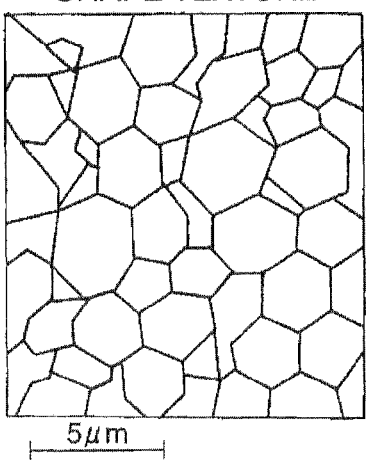

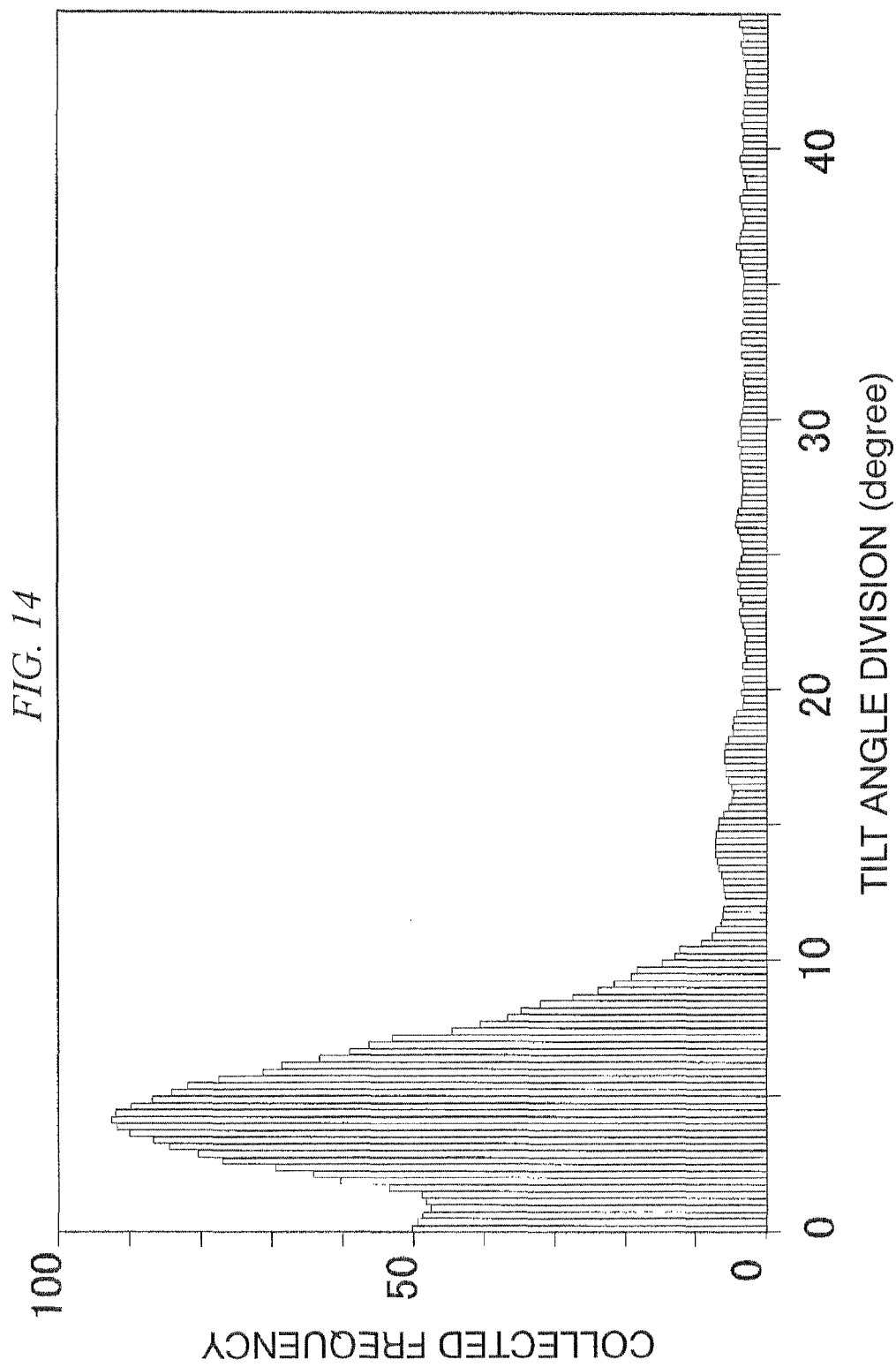

CRYSTAL GRAIN BOUNDARY

—— CRYSTAL GRAIN BOUNDARY
----- Σ3 COINCIDENCE SITE LATTICE INTERFACE

CRYSTAL GRAIN BOUNDARY

5 μm

CRYSTAL GRAIN BOUNDARY

CRYSTAL GRAIN BOUNDARY

5 μm

CONCAVO-CONVEX SURFACE

CONVENTIONAL Cr-CONTAINING $Al_2O_3$ LAYER

5 μm

SURFACE-COATED CUTTING TOOL

CROSS-REFERENCE TO RELATED PATENT APPLICATIONS

This application is a U.S. National Phase Application under 35 U.S.C. §371 of International Patent Application No. PCT/JP2010/001973, filed Mar. 18, 2010, and claims the benefit of Japanese Patent Applications No. 2009-065814, filed Mar. 18, 2009, No. 2009-147767, filed Jun. 22, 2009, and No. 2009-149350, filed Jun. 24, 2009, all of which are incorporated by reference herein. The International Application was published in Japanese on Sep. 23, 2010 as International Publication No. WO/2010/106811 under PCT Article 21(2).

TECHNICAL FIELD

The present invention relates to a surface-coated cutting tool (hereinafter referred to as a coated tool) which exhibits excellent cutting performance over the long-term, without the hard coating layer becoming chipped, for example, (1) if cutting work on high-hardness steel, such as quenching materials for alloy tool steel or bearing steel, is performed under high-speed intermittent cutting conditions where intermittent impact loading repeatedly acts on the cutting edge, along with the accompanying high heat generation, or (2) if cutting work on difficult-to-cut materials, such as stainless steel or ductile cast iron, is performed under high-speed heavy cutting conditions where a high load resulting from a high feed rate and a high depth of cut act on the cutting edge, along with the accompanying high heat generation.

This application claims priority on Japanese Patent Application No. 2009-065814 filed on Mar. 18, 2009, Japanese Patent Application No. 2009-147767 filed on Jun. 22, 2009, and Japanese Patent Application No. 2009-149350 filed on Jun. 24, 2009, the contents of which are incorporated herein by reference.

BACKGROUND ART

As shown in PTL 1 (Japanese Unexamined Patent Application Publication No. 2006-198735), conventionally, a coated tool (hereinafter referred to as a conventional coated tool 1) is known which is formed by vapor-depositing, on the surface of a tool substrate (hereinafter generally referred to as a tool substrate) made of tungsten carbide (hereinafter referred to as WC)-based cemented carbide or titanium carbonitride (hereinafter referred to as TiCN)-based cermet, a hard-coating layer including a lower layer (a) and an upper layer (b) satisfying the following conditions.

The lower layer (a) is a Ti compound layer composed of one or more of a titanium carbide (TiC) layer, a titanium nitride (TiN) layer, a titanium carbonitride (TiCN) layer, a titanium carboxide (TiCO) layer and a titanium oxycarbonitride (TiCNO) layer, and having a total mean layer thickness of 3 to 20 µm.

The upper layer (b) is an α-type $Al_2O_3$ layer (referred to as a conventional α-type $Al_2O_3$ layer) having a mean layer thickness of 1 to 15 µm and having an α-type crystal structure in a chemically vapor-deposited state. As for this upper layer, when the field-emission-type scanning electron microscope is used to individually irradiate crystal grains having a hexagonal crystal lattice present within the measurement range of a polished surface with an electron beam, and to measure the tilt angle of the normal lines of the (0001) plane and plane (10-10), which are crystal planes of the crystal grains, to the normal line to the polished surface; the crystal grains have a corundum hexagonal close-packing structure in which the constituent atoms composed of Al and oxygen are present at lattice points; the distribution of lattice points (constituent atom sharing lattice points) where the respective constituent atoms share one constituent atom between the crystal lattices at an interface between mutually adjacent crystal grains is calculated on the basis of the resulting measured tilt angles; and a constituent atom sharing lattice point configuration in which N (here, N is any even number equal to or greater than 2 in a crystal structure of a corundum-type hexagonal close-packing crystal, but when the upper limit of N is 28 from the viewpoint of a distribution frequency, even numbers 4, 8, 14, 24, and 26 do not exist) lattice points which do not share any constituent atoms between the constituent atom sharing lattice points are present is expressed by ΣN+1, this layer shows a constituent atom sharing lattice point distribution graph in which the highest peak is present in Σ3 in the constituent atom sharing lattice point distribution graph showing distribution ratios in which individuals of ΣN+1 are accounted for in a total of ΣN+1, and the distribution ratio of Σ3 accounted for in the total of ΣN+1 is 60 to 80%.

Since the α-type $Al_2O_3$ layer has excellent high-temperature strength, it is known that the conventional coated tool 1 exhibits chipping resistance in high-speed intermittent cutting work.

As shown in PTL 2 (Japanese Unexamined Patent Application Publication No. 2006-289556), instead of the upper layer (b) of the conventional coated tool 1, a coated tool (hereinafter referred to as a conventional coated tool 2) in which an Al—Ti compound oxide layer (hereinafter referred to as a conventional AlTiO layer) is formed is also known.

The Al—Ti compound oxide layer has a mean layer thickness of 1 to 15 µm, and an α-type crystal structure in a chemically vapor-deposited state. This layer satisfies the compositional formula, $(Al_{1-X}Ti_X)_2O_3$, where X ranges from 0.003 to 0.05 in atomic ratio. Moreover, as for this layer, when the field-emission-type scanning electron microscope and an electronic backscattering diffraction image apparatus are used to individually irradiate crystal grains having a hexagonal crystal lattice present within the measurement range of a polished surface with an electron beam, and to measure the tilt angle of the normal lines of the (0001) plane and plane (10-10), which are crystal planes of the crystal grains, to the normal line to the surface of a base; the crystal grains have a corundum hexagonal close-packing structure in which constituent atoms composed of Al, Ti and oxygen are present at lattice points; the distribution of lattice points (constituent atom sharing lattice points) where the respective constituent atoms share one constituent atom between the crystal lattices at an interface between mutually adjacent crystal grains is calculated on the basis of the resulting measured tilt angles; and a constituent atom sharing lattice point configuration in which N (where N is any even number equal to or greater than 2 in a crystal structure of a corundum-type hexagonal close-packing crystal, but when the upper limit of N is 28 from the viewpoint of a distribution frequency, even numbers 4, 8, 14, 24, and 26 do not exist) lattice points which do not share any constituent atoms between the constituent atom sharing lattice points are present is expressed by ΣN+1, this layer shows a constituent atom sharing lattice point distribution graph in which the highest peak is present in Σ3 in the constituent atom sharing lattice point distribution graph showing distribution ratios in which individuals of ΣN+1 are accounted for in a total of ΣN+1, and the distribution ratio of Σ3 accounted for in the total of ΣN+1 is 60 to 80%.

It is known that this conventional coated tool 2 also exhibits excellent chipping resistance.

As shown in PTL 3 (Japanese Unexamined Patent Application Publication No. 2004-1154), instead of the upper layer (b) of the conventional coated tool 1, a coated tool (hereinafter referred to as a conventional coated tool 3) in which an α-type $(Al, Y)_2O_3$ layer (hereinafter referred to as a conventional AlYO layer) containing a small amount of Y (yttrium) is formed is also known. In this conventional coated tool 3, it is known that missing out of the crystal grains of α-type $Al_2O_3$ is prevented, and excellent cutting durability is shown in continuous cutting work.

As shown in PTL 4 (Japanese Unexamined Patent Application Publication No. 2006-289557), instead of the upper layer (b) of the conventional coated tool 1, a coated tool (hereinafter referred to as a conventional coated tool 4) in which an Al—Zr compound oxide layer (hereinafter referred to as a conventional AlZrO layer) is formed is also known. The Al—Zr compound oxide layer has an α-type crystal structure, and a mean layer thickness of 1 to 15 μm in a chemically vapor-deposited state, and satisfies the compositional formula, $(Al_{1-X}Zr_X)_2O_3$, where X ranges from 0.003 to 0.05 in atomic ratio. As for the Al—Zr compound oxide layer, when the field-emission-type scanning electron microscope is used to individually irradiate crystal grains having a hexagonal crystal lattice present within the measurement range of a polished surface with of a base with an electron beam, and to measure the tilt angle of the normal lines of the (0001) plane and plane (10-10), which are crystal planes of the crystal grains, to the normal line to the surface of the base; the crystal grains have a corundum hexagonal close-packing structure in which constituent atoms composed of Al, Zr and oxygen are present at lattice points; the distribution of lattice points (constituent atom sharing lattice points) where the respective constituent atoms share one constituent atom between the crystal lattices at an interface between mutually adjacent crystal grains is calculated on the basis of the resulting measured tilt angles; and a constituent atom sharing lattice point configuration in which N (here, N is any even number equal to or greater than 2 in a crystal structure of a corundum-type hexagonal close-packing crystal, but when the upper limit of N is 28 from the viewpoint of a distribution frequency, even numbers 4, 8, 14, 24, and 26 do not exist) lattice points which do not share any constituent atoms between the constituent atom sharing lattice points are present is expressed by ΣN+1, this layer shows a constituent atom sharing lattice point distribution graph in which the highest peak is present in Σ3 in the constituent atom sharing lattice point distribution graph showing distribution ratios in which individuals of ΣN+1 are accounted for in a total of ΣN+1, and the distribution ratio of Σ3 accounted for in the total of ΣN+1 is 60 to 80%.

It is known that this conventional coated tool 4 also exhibits excellent chipping resistance.

As shown in PTL 5 (Japanese Unexamined Patent Application Publication No. 2006-289586, a coated tool (hereinafter referred to as a conventional coated tool 5) is known which is formed by vapor-depositing, on the surface of a tool substrate made of tungsten carbide (hereinafter referred to as WC)-based cemented carbide or titanium carbonitride (hereinafter referred to as TiCN)-based cermet, a hard-coating layer including following lower layer (a) and upper layer (b).

The lower layer (a) is a Ti compound layer composed of one or more of a titanium carbide (TiC) layer, a titanium nitride (TiN) layer, a titanium carbonitride (TiCN) layer, a titanium carboxide (TiCO) layer and a titanium oxycarbonitride (TiCNO) layer, all of which are formed by vapor deposition, and having a total mean layer thickness of 3 to 20 μm, and The upper layer (b) is a Cr-containing aluminum oxide layer having a mean layer thickness of 1 to 15 μm and having an α-type crystal structure in a chemically vapor-deposited state. As for this upper layer, when the field-emission-type scanning electron microscope is used to individually irradiate crystal grains having a hexagonal crystal lattice present within the measurement range of the polished surface of the tool substrate with an electron beam, and to measure the tilt angle of the normal line to the (0001) plane, which is a crystal plane of each crystal grain, to the normal line to the polished surface, the measured tilt angles which are within a range of 0 to 45 degrees among the measured tilt angles are divided at every pitch of 0.25 degrees, and a tilt angle frequency distribution graph obtained by summing the frequencies present within the respective divisions is plotted, this layer shows a tilt angle frequency distribution graph in which the highest peak is present in the tilt angle division within a range of 0 to 10 degrees, and the total sum of the frequencies present within a range of 0 to 10 degrees accounts for the ratio of 45% or more of the total frequency in the tilt angle frequency distribution graph.

Since the Cr-containing aluminum oxide layer has excellent high-temperature strength, it is known that the conventional coated tool 5 exhibits chipping resistance in high-speed intermittent cutting work.

RELATED ART DOCUMENT

Patent Literature

[PTL 1] Japanese Unexamined Patent Application Publication No. 2006-198735
[PTL 2] Japanese Unexamined Patent Application Publication No. 2006-289556
[PTL 3] Japanese Unexamined Patent Application Publication No. 2004-1154
[PTL 4] Japanese Unexamined Patent Application Publication No. 2006-289557
[PTL 5] Japanese Unexamined Patent Application Publication No. 2006-289586
[PTL 6] Japanese Patent No. 1388775
[PTL 7] Japanese Unexamined Patent Application Publication No. 10-291102

DISCLOSURE OF INVENTION

Technical Problem

In recent years, the performance of the cutting device has been significantly improved. At the same time, there is strong demands for power saving, energy saving, and cost reduction in the cutting work. Because of these trends, the cutting work is performed even faster and more efficiently.

A conventional coated tool performs adequately when it is used high-speed cutting work or high-speed intermittent cutting work of ordinary steel, such as low alloy steel or carbon steel, and normal cast iron, such as gray cast iron. However, when this conventional coated tool is used for high-speed intermittent cutting work of high-hardness steel, such as quenching materials for alloy tool steel or bearing steel, the high-temperature strength and surface properties of the hard coating layer are not adequate. Thus, chipping (fine chipping) occurs easily on the cutting edge. As a result, under such conditions, the coated tool comes to the end of its usable lifespan in a relatively short period of time.

In addition, when the conventional coated tool is used for high-speed heavy cutting work on difficult-to-cut materials, such as stainless steel or ductile cast iron, accompanied by high heat generation, and high load of a high feed rate and a high depth of cut acts on the cutting edge, the high-temperature strength and surface properties of the hard coating layer are not adequate. Thus, chipping (fine chipping) easily occurs at the cutting edge. As a result, under such conditions, the conventional coated tool comes to the end of its usable lifespan in a relatively short period of time.

Solution to Problem

Thus, the present inventors have diligently conducted studies from the above viewpoints in order to develop a coated tool having excellent chipping resistance and abrasion resistance for long-term use, even if it is used for: 1) high-speed intermittent cutting work on high-hardness steel, and intermittent impact loading repeatedly acts on the cutting edge, along with the accompanying high heat generation, or 2) high-speed heavy cutting work in which the high load of a high feed rate and a high depth of cut acts on the cutting edge. Accordingly, the following coated cutting tool is invented.

The surface-coated cutting tool of the present invention is a surface-coated cutting tool formed by vapor-depositing, on the surface of a tool substrate made of tungsten carbide-based cemented carbide or titanium carbonitride-based cermet, a hard coating layer including the following lower layer (a), an intermediate layer (b), and an upper layer (c).

The lower layer (a) is a Ti compound layer composed of one or more of a titanium carbide layer, a titanium nitride layer, a titanium carbonitride layer, a titanium carboxide layer, and a titanium oxycarbonitride layer, all of which are formed by chemical vapor deposition, and having a total mean layer thickness of 3 to 20 μm.

The intermediate layer (b) is an aluminum oxide layer having a mean layer thickness of 1 to 5 μm and having an α-type crystal structure in a chemically vapor-deposited state.

The upper layer (c) is an aluminum oxide layer having a mean layer thickness of 2 to 15 μm and an α-type crystal structure in a chemically vapor-deposited state, the aluminum oxide layer containing one or more kinds of elements selected from a group consisting of Ti, Y, Zr, Cr, and B.

The intermediate layer (b) has properties indicated by a tilt-angle frequency distribution graph in which the highest peak exists in a tilt angle division ranging 0 to 10° and the total sum of frequencies existing in the range of 0 to 10° occupies a ratio of 45% or more of the total frequencies in the tilt-angle frequency distribution graph, the tilt-angle frequency distribution graph being obtained by utilizing a field-emission-type scanning electron microscope, irradiating electron beams to individual crystal grains with a hexagonal crystal lattice existing in a measurement range of a polished surface of the tool substrate, measuring a tilt angle formed by the normal line to the polished surface and the normal line to (0001) plane as a crystal plane of the crystal grains, sectioning the measured tilt angles belonging to a range of 0 to 45° every pitch of 0.25°, and collecting the frequencies existing in each section.

The upper layer (c) is an aluminum oxide layer having a texture made of crystal grains with a flat-plate polygonal shape within a plane perpendicular to a layer thickness direction and have an elongated shape in the layer thickness direction within a plane parallel to the layer thickness direction and containing one or more kinds of elements selected from a group consisting of Ti, Y, Zr, Cr, and B, the texture being observed by a field-emission scanning electron microscope.

The upper layer (c) has properties indicated by a tilt-angle frequency distribution graph in which the highest peak exists in a tilt angle division ranging 0 to 10° and the sum of frequencies existing in the range of 0 to 10° occupies a ratio of 60% or more of the total frequencies in the tilt-angle frequency distribution graph, the tilt-angle frequency distribution graph being obtained by utilizing a field-emission-type scanning electron microscope, irradiating electron beams to individual crystal grains with a hexagonal crystal lattice existing in a measurement range of a polished surface of the tool substrate, measuring a tilt angle formed by the normal line to the polished surface and the normal line to (0001) plane as a crystal plane of the crystal grains, sectioning the measured tilt angles belonging to a range of 0 to 45° every pitch of 0.25°, and collecting the frequencies existing in each section.

Moreover, as for the upper layer of the above (c), when electron beams are radiated to the individual crystal grains existing within a measurable range of a polished surface of the tool substrate by utilizing a field-emission-type scanning electron microscope and an electron backscatter diffraction imaging device to measure angles formed by normal lines of crystal lattice faces with hexagonal crystal lattices and the normal line to the polished surface, a crystallographic orientation relationship between the adjacent crystal lattices is calculated from the measurement result, a distribution of lattice points (constituent atom sharing lattice points) in each constituent atom of a crystal lattice interface shares one constituent atom between the crystal lattices is calculated, and when a constituent atom sharing lattice point type in which N lattice points not sharing the constituent atom exist between the constituent atom sharing lattice points (where N is an even number of 2 or more in view of a crystal structure of corundum type hexagonal close packed crystal but does not include even numbers of 4, 8, 14, 24, and 26 when the upper limit of N is set to 28 in view of distribution frequency) is expressed as ΣN+1, the insides of the above mentioned crystal grains, which constitutes the upper layer (c) and occupies 60% or more as an area ratio in the crystal grains of the upper layer, are divided by at least one crystal lattice interface with the constituent atom sharing lattice point type expressed by Σ3.

In the surface-coated cutting tool mentioned above, the upper layer (c) may be an aluminum oxide layer containing Ti only.

In the surface-coated cutting tool mentioned above, the upper layer (c) may be an aluminum oxide layer containing Y only.

In the surface-coated cutting tool mentioned above, the upper layer (c) may be an aluminum oxide layer containing Zr only.

In the surface-coated cutting tool mentioned above, the upper layer (c) may be an aluminum oxide layer containing Cr only.

In the surface-coated cutting tool mentioned above, the upper layer (c) may be an aluminum oxide layer containing B only.

In the surface-coated cutting tool mentioned above, when the texture of the upper layer (c) is observed by the field-emission scanning electron microscope, crystal grains which have a flat hexagonal shape within the plane perpendicular to the layer thickness direction and have an elongated shape in the layer thickness direction within the plane parallel to the layer thickness direction may account for 35% or more of the whole as an area ratio within the plane perpendicular to the layer thickness direction.

In the surface-coated cutting tool motioned above, the above upper layer (c) may have a surface roughness (Ra) within a range of 0.05 to 0.3 μm.

Advantageous Effects of Invention

Since the surface-coated cutting tool of the present invention has the configuration described above, the ratio of the (0001) plane orientation is high in the intermediate layer composed of the reformed α-type $Al_2O_3$ layer. As a result, the surface-coated cutting tool has excellent high-temperature strength, in addition to excellent high-temperature hardness and heat resistance. In addition, by increasing the ratio of the (0001) plane orientation in the upper layer composed of the reformed layer, the upper layer obtains the texture made of crystal grains having flat-plate polygonal shape (including flat hexagonal) at the top and bottom, and elongated shape at sides with surface flatness. Moreover, in the upper layer, strength within the crystal grains is enhanced by forming the Σ3 coincidence site lattice interface inside the crystal grains. Because of this, the upper layer, which is consisted of crystal grains with a concavo-convex polygonal shape at the top and bottom, and an elongated shape at sides, obtains even more superior surface properties and high-temperature strength as compared to the conventional layer with few Σ3 coincidence site lattice interfaces. As a result, in the surface-coated cutting tool of the present invention, even in high-speed heavy cutting work accompanied by high heat generation, and high load resulting from repetition or the like of intermittent impact acts on the cutting edge, the hard coating layer exhibits excellent chipping resistance, fracture resistance, spalling resistance, and allows a more prolonged usable lifespan.

BRIEF DESCRIPTION OF DRAWINGS

FIG. 7A is a schematic view showing a flat-plate polygonal crystal grain structure obtained by observing an upper layer composed of a reformed AlYO layer of coated tools B1 to B9 of the present invention, using the field-emission-type scanning electron microscope in the plane perpendicular to the layer thickness direction.

FIG. 7B is a schematic view showing a crystal grain structure having a substantially flat layer surface and having an elongated shape in the layer thickness direction, which is obtained by observation using the field-emission-type scanning electron microscope in the plane parallel to the layer thickness direction.

FIG. 7C is a schematic view showing a flat hexagonal crystal grain structure obtained by observing an upper layer composed of a reformed AlYO layer of coated tools B10 to B15 of the present invention, using the field-emission-type scanning electron microscope in the plane perpendicular to the layer thickness direction.

FIG. 11A is a schematic view showing a flat-plate polygonal crystal grain structure obtained by observing an upper layer composed of a reformed AlZrO layer of the coated tool C1 of the present invention, using the field-emission-type scanning electron microscope in the plane perpendicular to the layer thickness direction.

FIG. 11B is a schematic view showing a crystal grain structure having a substantially flat layer surface and having an elongated shape in the layer thickness direction, which is obtained by observation using the field-emission-type scanning electron microscope in the plane parallel to the layer thickness direction.

FIG. 11C is a schematic view showing a flat hexagonal crystal grain structure obtained by observing an upper layer composed of a reformed AlZrO layer of the coated tool C11 of the present invention, using the field-emission-type scanning electron microscope in the plane perpendicular to the layer thickness direction.

FIG. 14 is a tilt angle frequency distribution graph of the (0001) plane of a reformed $Al_2O_3$ layer which constitutes an intermediate layer of a hard coating layer of the coated tool D6 of the present invention.

DESCRIPTION OF EMBODIMENTS

Figure 18:
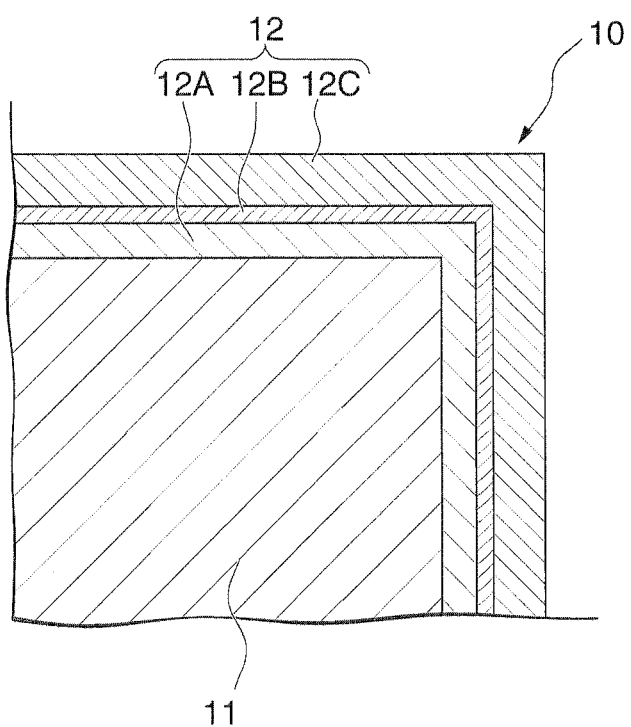
FIG. 18 is an enlarged sectional schematic view showing one embodiment of a surface-coated cutting tool of the present invention.

FIG. 18 is an enlarged sectional schematic view showing a surface-coated cutting tool 10 which is one embodiment of the present invention. In the drawing, reference numeral 11 is, for example, a body of a cutting insert or the like, and a hard coating layer 12 obtained by forming a lower layer 12A, an intermediate layer 12B, and an upper layer 12C in order, is formed on the overall surface of the tool substrate 11. The configuration of each part will be described below. The shape of the tool substrate 11 is appropriately set in conformity with the shape of a tool to which the invention is to be applied, and is not limited in the invention. Each embodiment will be described below.

First Embodiment (a) The conventional α-type $Al_2O_3$ layer in the conventional coated tool 1 is vapor-deposited, for example, using a normal chemical vapor deposition apparatus under the following conditions.

Composition of reaction gas: in vol. %, 6 to 10% of $AlCl_3$, 10 to 15% of $CO_2$, 3 to 5% of HCl, 0.05 to 0.2% of $H_2S$, and $H_2$ as balance Reaction atmosphere temperature: 1020 to 1050° C.
Reaction atmosphere pressure: 3 to 5 kPa On the other hand, the α-type $Al_2O_3$ layer in the present invention corresponding to the intermediate layer 12B is formed, using a normal chemical vapor deposition apparatus under the following conditions.

Figure 1A:
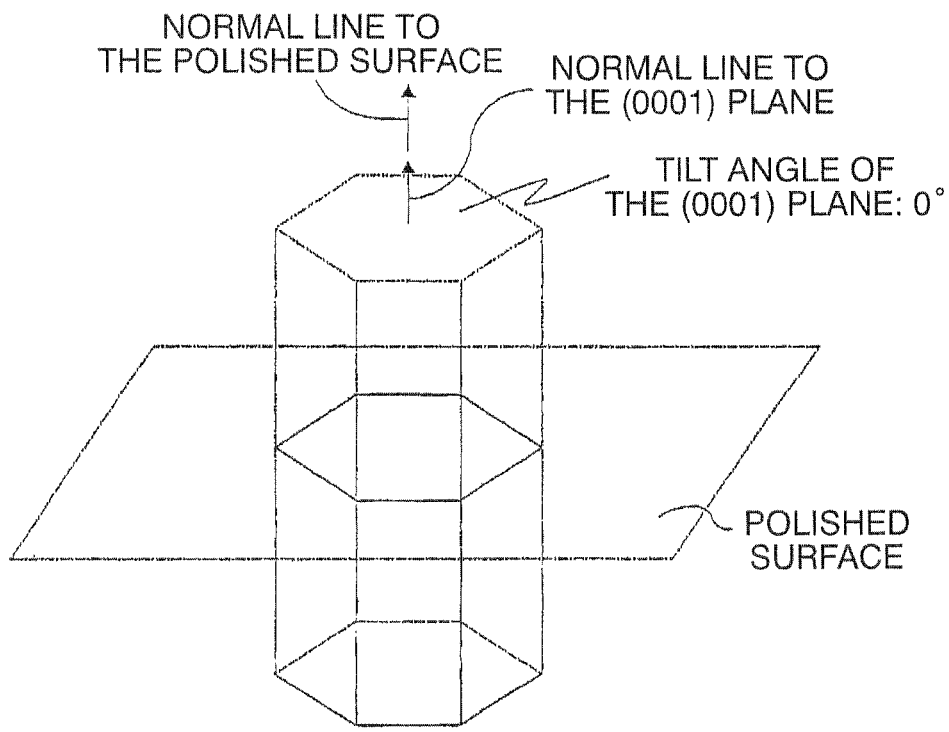
FIG. 1A is a schematic explanatory view showing the measurement range of a tilt angle when the (0001) plane of a crystal grain of an α-type $Al_2O_3$ layer which constitutes a hard coating layer is measured.
Figure 1B:
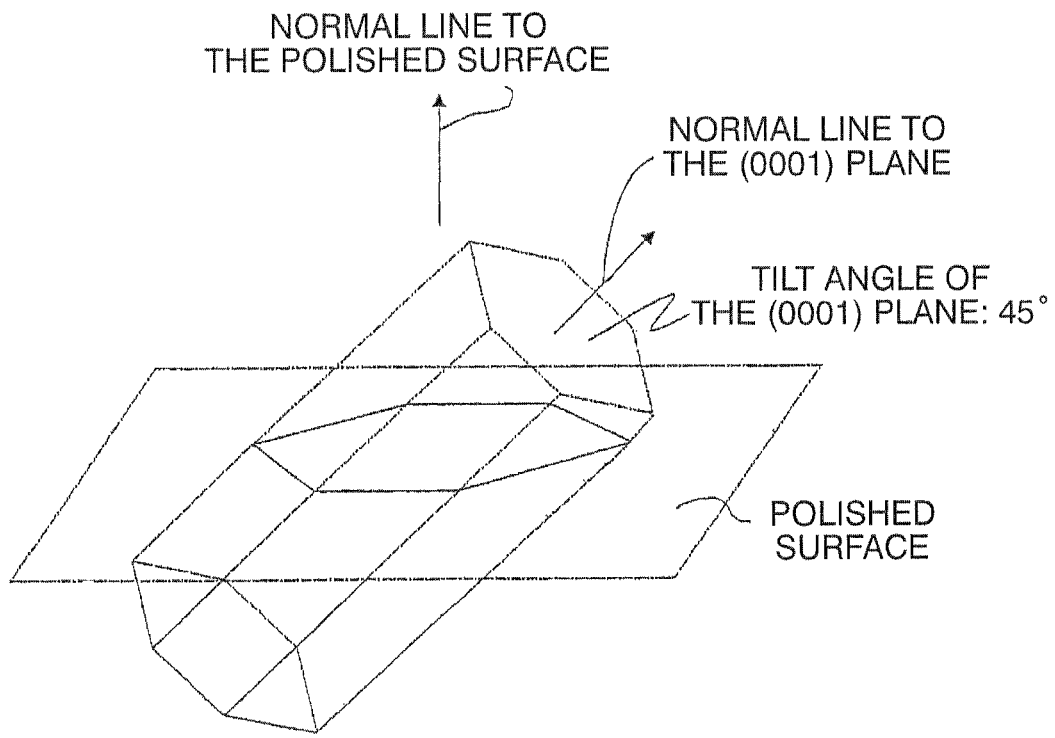
FIG. 1B is a schematic explanatory view showing the measurement range of a tilt angle when the (0001) plane of a crystal grain of an α-type $Al_2O_3$ layer which constitutes a hard coating layer is measured.
Figure 2:
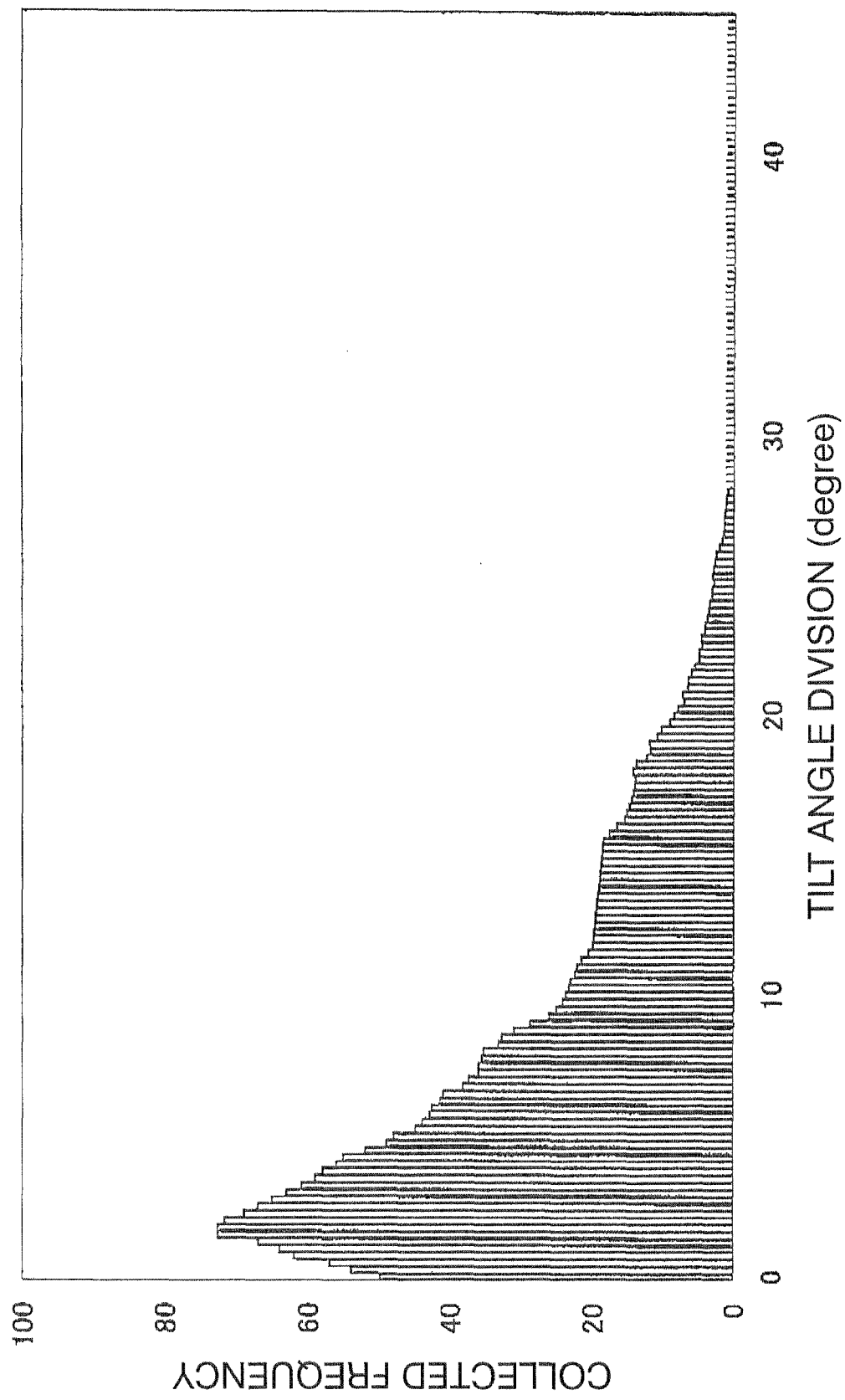
FIG. 2 is a tilt angle frequency distribution graph of the (0001) plane of a reformed α-type $Al_2O_3$ layer which constitutes an intermediate layer of a hard coating layer of a coated tool 1 of the present invention.

Composition of reaction gas: in vol. %, 3 to 10% of $AlCl_3$, 0.5 to 3% of $CO_2$, 0.01 to 0.3% of $C_2H_4$, and $H_2$ as balance Reaction atmosphere temperature: 750 to 900° C.
Reaction atmosphere pressure: 3 to 13 kPa An $Al_2O_3$ neclear is formed on the surface of a Ti compound layer which is the lower layer 12A under the low-temperature condition described above. In this case, it is desirable that the $Al_2O_3$ neclear is an $Al_2O_3$ neclear thin film having a mean layer thickness of 20 to 200 nm. Subsequently, the $Al_2O_3$ neclear thin film is heat treated in a condition where the reaction atmosphere is substituted to a hydrogen atmosphere of pressure: 3 to 13 kPa, and the reaction atmosphere temperature is increased to 1100 to 1200° C. Then, the α-type $Al_2O_3$ layer, which serves as the hard coating layer, is formed under a conventional condition. The resulting α-type $Al_2O_3$ layer (hereinafter referred to as a reformed α-type $Al_2O_3$ layer), which is vapor-deposited on the heat-treated neclear thin film, is analyzed with a field emission type scanning electron microscope as schematically represented in FIGS. 1A and 1B. In the analysis, individual crystal grains having a hexagonal crystal lattice present within the measurement range of a polished surface, are irradiated by an electron beam. Then, a tilt angle, which is the angle formed between the normal line to the (0001) plane of the crystal grain and the normal line to the polished surface of the cutting tool, is measured. The measured tilt angles belonging to a range of 0 to 45° are sectioned every pitch of 0.25°, and the frequencies existing in each section are collected, being represented by a tilt angle frequency distribution graph. As shown in FIG. 2, as an example, a sharp highest peak appears at a specific section of the tilt angle. Based on trial findings, it was found that the highest peak falls inside a tilt angle division ranging 0 to 10° and the total sum of frequencies existing in the range of 0 to 10° occupies a ratio of 45% or more of the total frequencies in the tilt-angle frequency distribution graph, when the atmosphere pressure of the chemical vapor deposition apparatus is kept between 5 and 8 KPa. The fact that the total sum of frequencies existing in the range of 0 to 10° occupies a ratio of 45% or more of the total frequencies, means that ratio of the (0001) plane orientation is high. This reformed α-type $Al_2O_3$ layer whose highest peak of the tilt angle division appears within the range of 0 to 10° in the tilt-angle frequency distribution graph has superior high-temperature strength compared to the conventional α-type $Al_2O_3$ layer of the conventional coated cutting tool 1. This reformed α-type $Al_2O_3$ also has excellent high-temperature hardness and heat resistance, as the conventional α-type $Al_2O_3$ layer of the conventional coated cutting tool 1 does.

(b) Forming the hard coating layer is further proceeded on the reformed α-type $Al_2O_3$ layer described above, as the intermediate layer 12B. A Ti-containing aluminum oxide layer having an α-type crystal structure in a chemically vapor-deposited state is vapor-deposited on the intermediate layer 12B as the upper layer 12C. In this way, the lower layer 12A composed of the Ti compound layer, the intermediate layer 12B composed of the reformed α-type $Al_2O_3$ layer, and the upper layer 12C composed of the Ti-containing aluminum oxide layer are vapor-deposited as a hard coating layer on the surface of the tool substrate 11. Since the coated cutting tool 10 with the configuration described above has even more superior high-temperature strength and surface properties, the coated cutting tool 10 exerts excellent chipping resistance, even under high-speed intermittent cutting conditions where high heat is generated and the cutting edges are subjected to intermittent impact loading repeatedly.

(c) The Ti-containing aluminum oxide layer which is the upper layer 12C can be formed on the reformed α-type $Al_2O_3$ layer, which is the intermediate layer 12B, under the following conditions. First, as a first step, first-step vapor deposition is performed for 30 minutes under the following conditions (i) to (iii).

(i) Composition of reaction gas (vol. %):
1 to 5% of $AlCl_3$
0.01 to 0.05% of $TiCl_4$
2 to 6% of $CO_2$
1 to 5% of HCl
0.10 to 0.30% of $H_2S$
$H_2$ as balance (ii) Reaction atmosphere temperature: 960 to 1010° C.
(iii) Reaction atmosphere pressure: 6 to 10 kPa Next, as a second step, vapor deposition is performed under the following conditions (i) to (iii).

(i) Composition of reaction gas (vol. %):
6 to 10% of $AlCl_3$
0.05 to 0.6% of $TiCl_4$
4 to 8% of $CO_2$
3 to 5% of HCl
0 to 0.05% of $H_2S$
$H_2$ as balance (ii) Reaction atmosphere temperature: 920 to 1000° C.
(iii) Reaction atmosphere pressure: 6 to 10 kPa By following the steps described above, a Ti-containing aluminum oxide layer (hereinafter referred to as a reformed AlTiO layer), which has an α-type crystal structure in a chemically vapor-deposited state, can be formed. The reformed AlTiO layer has a mean layer thickness of 1 to 15 μm, and the content ratio of the Ti component to the total amount of the Al component is 0.002 to 0.01 (as atomic ratio).

Figure 3A:
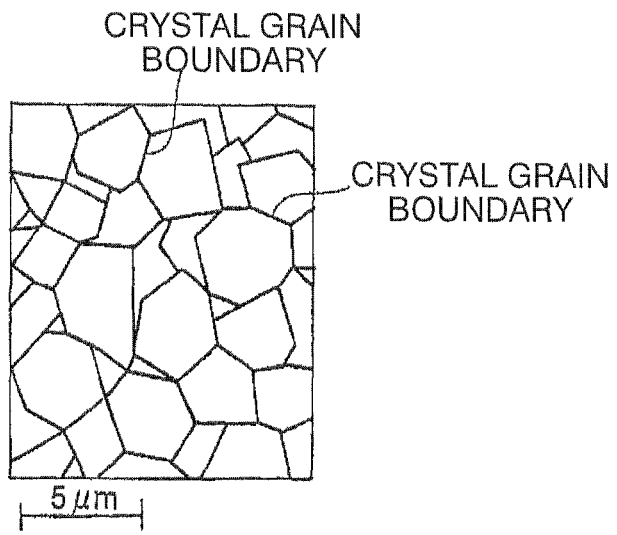
FIG. 3A is a schematic view showing a flat-plate polygonal crystal grain structure obtained by observing an upper layer composed of a reformed AlTiO layer of coated tools A1 to A9 of the present invention, using a field-emission-type scanning electron microscope in a plane perpendicular to a layer thickness direction.
Figure 3B:
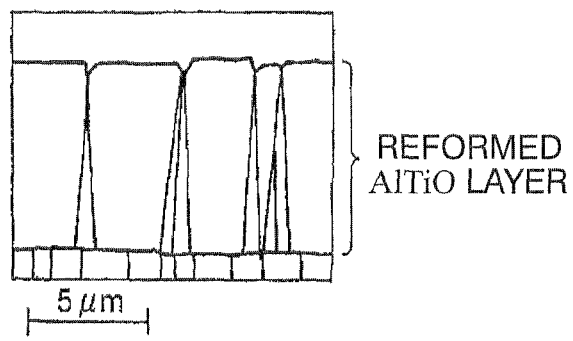
FIG. 3B is a schematic view showing a crystal grain structure having a substantially flat layer surface and having an elongated shape in the layer thickness direction, which is obtained by observation using the field-emission-type scanning electron microscope in a plane parallel to the layer thickness direction.

(d) When the texture of the reformed AlTiO layer is observed by the emission type scanning electron microscope, a flat-plate polygonal shape of a large-sized grain can be seen within a plane perpendicular to the layer thickness direction as shown in FIG. 3A. When the reformed AlTiO layer is observed in the plane parallel to the layer thickness direction as shown in FIG. 3B, it can be seen that the outer surface of the reformed AlTiO layer is substantially flat, and the reformed AlTiO layer has a texture made of the grains whose shapes are elongated in the layer thickness direction (hereinafter, the shape of the crystal grain described above is referred a flat-plate polygonal vertically elongated shape).

Figure 3C:
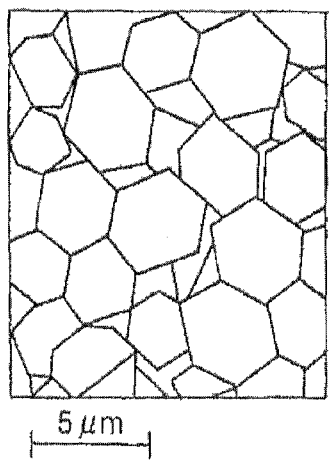
FIG. 3C is a schematic view showing a flat hexagonal crystal grain structure which is obtained by observing an upper layer composed of a reformed AlTiO layer of coated tools A10 to A15 of the present invention, using the field-emission-type scanning electron microscope in the plane perpendicular to the layer thickness direction.

When the vapor deposition of the reformed AlTiO layer is performed under further limited conditions, the texture exemplified in FIG. 3C is formed. In the further limited condition, the volume % of $TiCl_4$ is set 0.05 to 0.6, the volume % of $H_2S$ 0 to 0.03, and the reaction atmosphere temperature 960 to 980° C. in the second step vapor deposition, for example. As shown in FIG. 3C, when the reformed AlTiO layer is formed by the further limited condition, and is seen within the plane perpendicular to the layer thickness direction, the large-sized grains with a flat hexagonal shape are observed. When the reformed AlTiO layer is seen within the plane parallel to the layer thickness direction, it can be seen that the outer surface of the reformed AlTiO layer is substantially flat, as shown in FIG. 3B. In addition, the grains that have the elongated shape within the plane parallel to the layer thickness direction, account for 35% or more in area ratio, in the whole surface area perpendicular to the thickness direction of the layer.

(e) As in the reformed α-type $Al_2O_3$ layer, the reformed AlTiO layer is analyzed with the field-emission-type scanning electron microscope. In the analysis, individual crystal grains having a hexagonal crystal lattice present within the measurement range of a polished surface, are irradiated by an electron beam. Then, a tilt angle, which is the angle formed between the normal line to the (0001) plane of the crystal grain and the normal line to the polished surface of the cutting tool, is measured. The measured tilt angles belonging to a range of 0 to 45° are sectioned every pitch of 0.25°, and the frequencies existing in each section are collected, being represented by a tilt angle frequency distribution graph. In the tilt-angle frequency distribution graph, a sharp highest peak appears at a specific section of the tilt angle, and the total sum of frequencies existing in the range of 0 to 10° occupies a ratio of 60% or more of the total frequencies. This means that the reformed AlTiO layer with high (0001) plane orientation ratio is formed. The (0001) plane orientation ratio of the reformed AlTiO layer is higher than that of the conventional AlTiO layer of the conventional coated cutting tool, resulting even more superior high-temperature strength of the reformed AlTiO layer.

Figure 4:
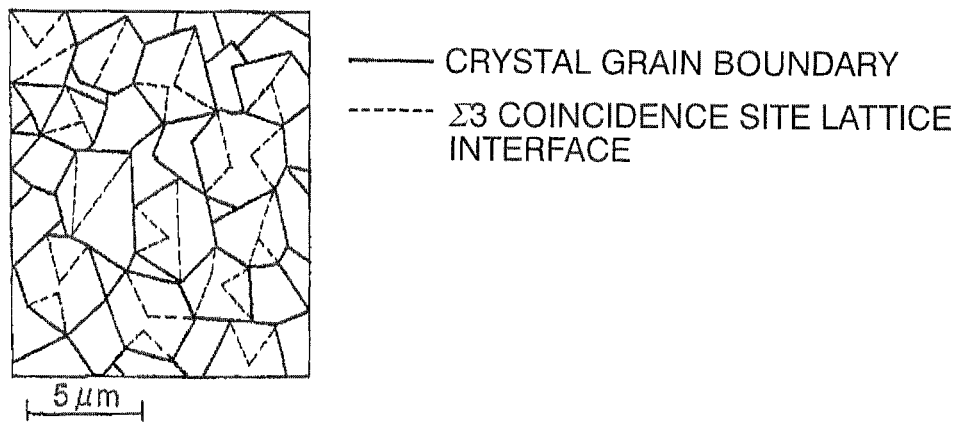
FIG. 4 is a grain boundary analysis view in the plane perpendicular to the layer thickness direction, which is obtained by measuring the upper layer composed of the reformed AlTiO layer of the coated tools A1 to A9 of the present invention, using the field-emission-type scanning electron microscope and an electronic backscattering diffraction image apparatus, showing a flat-plate polygonal grain boundary observed by the field-emission-type scanning electron microscope in a solid line, and showing a Σ3 coincidence site lattice interface within the crystal grain measured by the electronic backscattering diffraction image apparatus in a broken line.

(f) In addition, the reformed AlTiO layer is analyzed by the field-emission-type scanning electron microscope and an electronic backscattering diffraction image apparatus. In the analysis, individual crystal grains having a hexagonal crystal lattice present within the measurement range of a polished surface, are irradiated by an electron beam. Then, a tilt angle, which is the angle formed between the normal line to the (0001) plane of the crystal grain and the normal line to the polished surface of the cutting tool, is measured. Based on the measurement results, a crystallographic orientation relationship between the adjacent crystal lattices is calculated, and a distribution of lattice points (constituent atom sharing lattice points) is calculated. The constituent atom sharing lattice point is a lattice point that has a constituent atom shared by two crystal lattices forming the grain boundary at the grain boundary. A constituent atom sharing lattice point type in which N lattice points not sharing the constituent atom exist between the constituent atom sharing lattice points (where N is an even number of 2 or more in view of a crystal structure of corundum type hexagonal close packed crystal but does not include even numbers of 4, 8, 14, 24, and 26 when the upper limit of N is set to 28 in view of distribution frequency) is expressed as ΣN+1. When the reformed AlTiO layer is observed by the field-emission-type scanning electron microscope, it is seen that the reformed AlTiO layer includes the crystal grains with the flat-plate polygonal vertically elongated shape, as shown in FIG. 4. Among the crystal grains with the flat-plate polygonal vertically elongated shape, 60% or more of them are divided by at least one of crystal lattice interface with the constituent atom sharing lattice point type expressed by Σ3 (hereinafter referred as a Σ3 coincidence site lattice interface) inside.

(h) As described above, the upper layer composed of the reformed AlTiO layer has a high (0001) plane orientation rate, and a crystal plane at the surface thereof has the same orientation as a crystal plane (for example, (0001)) within the plane perpendicular to the layer thickness direction of this layer. Thus, outer surface of the upper layer is formed in the shape of a flat plate which is substantially flat (as seen within the plane parallel to the layer thickness direction), and shows excellent chipping resistance due to the surface properties thereof. Furthermore, the strength within the crystal grains is increased since the Σ3 coincidence site lattice interfaces are present inside the grains with the flat-plate polygonal vertically elongated shape. Therefore, the reformed AlTiO layer has excellent high-temperature hardness and high-temperature strength and shows excellent chipping resistance, compared to the conventional AlTiO layer.

(i) Accordingly, as the hard coating layer, the coated tool of the present invention includes the reformed α-type $Al_2O_3$ layer having a high (0001) plane orientation rate and having excellent high-temperature strength as the intermediate layer. Furthermore, the coated tool of the present invention includes the reformed AlTiO layer having excellent high-temperature hardness, high-temperature strength, and surface properties as the upper layer. The coated tool of the present invention has superior high-temperature hardness, heat resistance, and high-temperature strength as compared to the conventional coated tools 1 and 2. As a result, it exhibits excellent chipping resistance for a long-term use, even when the coated tool is used for high-speed intermittent cutting accompanied by high heat generation, and intermittent impact loading acts repeatedly on the cutting edge. The present invention has been made on the basis of the above knowledge, and the surface-coated cutting tool of the present invention includes the following configurations.

(1) Provided is a surface-coated cutting tool formed by vapor-depositing, on the surface of a tool substrate made of tungsten carbide-based cemented carbide or titanium carbonitride-based cermet, a hard coating layer including (a) to (c) below.

(a) The lower layer is a Ti compound layer composed of one or more of a titanium carbide layer, a titanium nitride layer, a titanium carbonitride layer, a titanium carboxide layer, and a titanium oxycarbonitride layer, all of which are formed by chemical vapor deposition, and having a total mean layer thickness of 3 to 20 μm.

(b) The intermediate layer is an aluminum oxide layer having a mean layer thickness of 1 to 5 μm and having an α-type crystal structure in a chemically vapor-deposited state.

(c) The upper layer is a Ti-containing aluminum oxide layer having a mean layer thickness of 2 to 15 μm and having an α-type crystal structure in a chemically vapor-deposited state.

The intermediate layer (b) has properties indicated by a tilt-angle frequency distribution graph in which the highest peak exists in a tilt angle division ranging 0 to 10° and the total sum of frequencies existing in the range of 0 to 10° occupies a ratio of 45% or more of the total frequencies in the tilt-angle frequency distribution graph. The tilt-angle frequency distribution graph is obtained by utilizing a field-emission-type scanning electron microscope. Electron beams are irradiated to individual crystal grains, which has a hexagonal crystal lattice and exists in a measurement range of a polished plane. A tilt angle formed by the normal line to the polished plane and the normal line to (0001) plane as a crystal plane of the crystal grains is measured. The measured tilt angles belonging to a range of 0 to 45° every pitch of 0.25° are sectioned. The frequencies existing in each section are collected.

When the texture of the upper layer of the above (c) is observed by the emission type scanning electron microscope, the upper layer is a Ti-containing aluminum oxide layer having a texture composed of crystal grains which have a flat-plate polygonal shape within the plane perpendicular to the layer thickness direction and have an elongated shape in the layer thickness direction within the plane parallel to the layer thickness direction.

The upper layer (c) has properties indicated by a tilt-angle frequency distribution graph in which the highest peak exists in a tilt angle division ranging 0 to 10° and the total sum of frequencies existing in the range of 0 to 10° occupies a ratio of 60% or more of the total frequencies in the tilt-angle frequency distribution graph. The tilt-angle frequency distribution graph is obtained by utilizing a field-emission-type scanning electron microscope. Electron beams are irradiated to individual crystal grains, which has a hexagonal crystal lattice and exists in a measurement range of a polished plane. A tilt angle formed by the normal line to the polished plane and the normal line to (0001) plane as a crystal plane of the crystal grains is measured. The measured tilt angles belonging to a range of 0 to 45° every pitch of 0.25° are sectioned. The frequencies existing in each section are collected.

The upper layer (c) is a Ti-containing aluminum oxide layer. Electron beams are irradiated to individual crystal grains within the measurement area on the polished surface with field-emission-type scanning electron microscope and an electron backscatter diffraction imaging device. Then, angles formed by normal lines of crystal lattice faces with hexagonal crystal lattices and the normal line to the polished surface are measured. Then, based on the measurement, a crystallographic orientation relationship between the adjacent crystal lattices is calculated. Then, a distribution of lattice points (constituent atom sharing lattice points) in which constituent atoms of a crystal lattice interface sharing one constituent atom between the crystal lattices is calculated. The constituent atom sharing lattice point type is expressed as $\Sigma N+1$, where "N" represents a number of lattice points (N) without a shared constituent atom between the constituent atom sharing lattice points. The constituent atom sharing lattice point type is even numbers more than 2 between crystal grains having a corundum type hexagonal close-packed structure. If the maximum number of N is set to 28 in view of distribution frequency, even numbers 4, 8, 14, 24, and 26 are excluded from the option for crystal grains having hexagonal close-packed structure. The upper layer (c) is a Y-containing aluminum oxide layer consisted of crystal grains, 60% or more of the grains being divided within each grain by at least one or more crystal lattice interfaces with a constituent atom sharing lattice point type expressed by $\Sigma 3$.

(2) When the texture of the upper layer (c) of the surface-coated cutting tool described above (as (1)) is observed by the emission type scanning electron microscope, crystal grains corresponding to 35% or more of the whole surface area perpendicular to the layer thickness direction, has a flat-plate polygonal shape within the plane perpendicular to the layer thickness direction and an elongated shape in the layer thickness direction within the plane parallel to the layer thickness direction.

(3) The surface roughness (Ra) of the upper layer (c) in the cutting tool described above (as (1) and (2)) ranges from 0.05 to 0.3 μm.

The configuration of the hard coating layer of the coated tool of this aspect will be described below in more detail.

(a) Ti Compound Layer (Lower Layer 12A)

The lower layer 12A is a Ti compound layer composed of one more of titanium carbide (hereinafter, referred to as TiC) layer, a titanium nitride (hereinafter, referred to as TiN) layer, a titanium carbonitride (hereinafter, referred to as TiCN) layer, a titanium carboxide (hereinafter, referred to as TiCO) layer, and a titanium oxycarbonitride (hereinafter, referred to as TiCNO) layer. The lower layer 12A is basically present as a lower layer of the reformed α-type $Al_2O_3$ layer which is the intermediate layer. It has superior toughness and abrasion resistance, contributing to improve high-temperature strength of the hard coating layer. In addition, the lower layer 12A adheres tightly to both the tool substrate and the reformed α-type $Al_2O_3$ layer, contributing an adhesive property of the hard coating layer to the tool substrate. If the total mean layer thickness is less than 3 μm, the improvements described above cannot be sufficiently obtained. On the other hand, if the total mean layer thickness exceeds 20 μm, thermal plastic deformation occurs easily, particularly when the cutting tool is used under high-speed intermittent cutting conditions where high heat is generated and a high load acts. Thermal plastic deformation causes uneven wear of the cutting tool. Accordingly, the total mean layer thickness is set to 3 to 20 μm.

(b) Reformed α-Type $Al_2O_3$ Layer (Intermediate Layer 12B)

In order to form the reformed α-type $Al_2O_3$ layer, which constitutes the intermediate layer 12B, as already described, an $Al_2O_3$ neclear is formed on the surface of the Ti compound layer, which is the lower layer, under the following low-temperature conditions.

A normal chemical vapor deposition apparatus is used. Composition of reaction gas includes 3 to 10% of $AlCl_3$, 0.5 to 3% of $CO_2$, 0.01 to 0.3% of $C_2H_4$ in vol. %, and $H_2$ as balance. Reaction atmosphere temperature is set at 750 to 900° C. Reaction atmosphere pressure is set at 3 to 13 kPa.

It is desirable that the $Al_2O_3$ neclear is an $Al_2O_3$ neclear thin film having a mean layer thickness of 20 to 200 nm. After the formation of the $Al_2O_3$ neclear, the reaction atmosphere is substituted with a hydrogen atmosphere with pressure of 3 to 13 kPa. Then, temperature of the reaction atmosphere is increased to 1100 to 1200° C. and the $Al_2O_3$ neclear thin film is heat treated. An α-type $Al_2O_3$ layer, which serves as the hard coating layer, is formed under normal conditions. By following steps described above, an α-type $Al_2O_3$ layer is vapor deposited on the heat-treated $Al_2O_3$ neclear thin film, resulting formation of the intermediate layer 12B.

The reformed α-type $Al_2O_3$ layer vapor deposited on the lower layer 12A is analyzed by the field-emission-type scanning electron microscope, as shown in FIGS. 1A and 1B. Electron beams are irradiated to the individual grains, which has a hexagonal crystal lattice and exists in a measurement range of a polished plane. A tilt angle formed by the normal line to the polished plane and the normal line to (0001) plane as a crystal plane of the crystal grains is measured. The measured tilt angles belonging to a range of 0 to 45° every pitch of 0.25° are sectioned. The frequencies existing in each section are collected and a tilt-angle frequency distribution graph is plotted. In the tilt-angle frequency distribution graph, the sharp highest peak exists in a tilt angle division ranging 0 to 10°, as shown in FIG. 2.

The highest peak position of the measured tilt angles in the tilt angle frequency distribution graph of the reformed α-type $Al_2O_3$ layer can be changed by performing heat-treatment after the formation of the $Al_2O_3$ neclear (thin film) with a predetermined layer thickness. In addition, the total sum of frequencies existing in the range of 0 to 10° occupies a ratio of 45% or more of the total frequencies in the tilt-angle frequency distribution graph (which means the (0001) plane orientation rate is high). Accordingly, whenever the thickness of the $Al_2O_3$ neclear (thin film) becomes too thin or too thick, the position of the highest peak of the measured tilt angles moves out of the range of 0 to 10°. In addition, the total sum of frequencies existing in the range of 0 to 10° becomes less than a ratio of 45% of the total frequencies in the tilt-angle frequency distribution graph. As a result, excellent high-temperature strength cannot be obtained.

The reformed α-type $Al_2O_3$ layer has superior high-temperature strength in addition to the excellent high-temperature hardness and heat resistance of the α-type $Al_2O_3$ layer of the conventional coated tool. Furthermore, by configuring the reformed α-type $Al_2O_3$ layer as an intermediate layer with a high (0001) plane orientation rate, the (0001) plane orientation rate of the reformed AlTiO layer vapor-deposited thereon can be increased. As a result, the surface properties of an upper layer composed of the reformed AlTiO layer can be improved, and high-temperature strength can be improved.

If the mean layer thickness of the intermediate layer composed of the reformed α-type $Al_2O_3$ layer is less than 1 μm, the hard coating layer cannot be provided with the above characteristics of the reformed α-type $Al_2O_3$ layer. On the other hand, if the mean layer thickness exceeds 5 μm, high temperature generated during cutting and high load subjected to the cutting edge leads to a higher rate of occurrence of thermal plastic deformation, which causes uneven wear of the cutting tool. As a result, the cutting tool is abrased faster. Thus, the mean layer thickness is set to 1 to 5 μm.

(c) Reformed AlTiO Layer (Upper Layer 12C)

As for the upper layer 12C composed of the reformed AlTiO layer chemically vapor-deposited on the intermediate layer 12B, an Al component which is a constituent component of the upper layer improves the high-temperature hardness and heat resistance of the layer. An extremely small amount (Ti/(Al+Ti) is 0.002 to 0.01 (as an atomic ratio) in a ratio accounted for in the total amount with Al) of Ti component contained in the upper layer improves the crystal grain boundary strength of the reformed AlTiO layer, and contributes to improving the high-temperature strength of the upper layer. If the content ratio of the Ti component in the upper layer is less than 0.002, the above functions cannot be obtained. On the other hand, if the content ratio of the Ti component exceeds 0.01, the grain boundary strength deteriorates as $TiO_2$ grains precipitate in the layer. Therefore, it is desirable that the content ratio of the Ti component (the value of the ratio of Ti/(Al+Ti)) in the upper layer accounted for in the total amount with the Al component is 0.002 to 0.01 (as an atomic ratio).

The reformed AlTiO layer can be vapor-deposited by adjusting chemical vapor deposition conditions of the composition of a reaction gas during vapor deposition, the reaction atmosphere temperature, and the reaction atmosphere pressure as follows, for example.

First, the first-step vapor deposition is performed for 30 minutes under the following conditions:
(i) Composition of reaction gas (vol. %):
1 to 5% of $AlCl_3$,
0.01 to 0.05% of $TiCl_4$,
2 to 6% of $CO_2$,
1 to 5% of HCl,
0.10 to 0.30% of $H_2S$, and
$H_2$ as balance,
(ii) Reaction atmosphere temperature: 960 to 1010° C., and
(iii) Reaction atmosphere pressure: 6 to 10 kPa, Second, the second-step vapor deposition is performed under the following conditions.
(i) Composition of reaction gas (vol. %):
6 to 10% of $AlCl_3$,
0.05 to 0.6% of $TiCl_4$,
4 to 8% of $CO_2$,
3 to 5% of HCl,
0 to 0.05% of $H_2S$, and
$H_2$ as balance,
(ii) Reaction atmosphere temperature: 920 to 1000° C., and
(iii) Reaction atmosphere pressure: 6 to 10 kPa.

When a vapor deposition layer with a mean layer thickness of 1 to 15 μm is formed as a film, by performing the first-step and the second-step vapor deposition in the conditions described above, the reformed AlTiO layer whose ratio of Ti/(Al+Ti) is 0.002 to 0.01 in atomic ratio, is formed.

When the reformed AlTiO layer is observed by the emission type scanning electron microscope, the textures shown in FIGS. 3A and 3B are observed. In FIG. 3A, the reformed AlTiO layer is viewed within the plane perpendicular to the layer thickness direction. In FIG. 3A, the texture containing large crystal grains with a flat-plate polygonal shape is formed. In FIG. 3B, the reformed AlTiO layer is viewed within the plane parallel to the layer thickness direction. In FIG. 3B, the outer surface of the reformed AlTiO layer is substantially flat. Also, the texture containing crystal grains with elongated shape is formed (Referred as a flat-plate polygonal elongated shape crystal grain).

As for the reformed AlTiO layer, similarly to the reformed α-type $Al_2O_3$ layer, which constitutes the intermediate layer, the tilt angle of the normal line to the (0001) plane to the normal line to a polished surface is measured and a tilt angle frequency graph is plotted. In the tilt angle frequency graph of the reformed AlTiO layer, a peak exists in a tilt angle division ranging 0 to 10° and the total sum of frequencies existing in the range of 0 to 10° occupies a ratio of 60% or more of the total frequencies in the tilt-angle frequency distribution graph. These results indicate that the (0001) plane orientation rate of the reformed AlTiO layer, which constitutes the upper layer, is high.

That is, as for the reformed AlTiO layer, since the (0001) plane orientation rate of the reformed α-type $Al_2O_3$ layer, which is the intermediate layer, is 45% or more, the reformed AlTiO layer is also formed as a layer having a high (0001) plane orientation rate (the (0001) plane orientation rate is 60% or more).

When the upper layer is viewed within the plane parallel to the layer thickness direction, the outer surface of the upper layer is formed in the shape of a substantially flat plate. Thus, the upper layer has a excellent surface property. Consequently, the upper layer shows superior chipping resistance as compared to the conventional AlTiO layer.

When the vapor deposition of the reformed AlTiO layer is performed under further limited conditions (for example, the conditions where volume percentages of $TiCl_4$ and $H_2S$ in the reaction gas are 0.05 to 0.2 vol. % and 0 to 0.03, respectively, and the reaction atmosphere temperature is set to 960 to 980° C., in the second-step vapor deposition), the texture shown in FIG. 3C is formed. In the texture, when it is viewed within the plane perpendicular to the layer thickness direction, there are large-sized crystal grains with a flat-plate hexagonal shape. When the texture is viewed within the plane parallel to the layer thickness direction, the outer surface of the upper layer is substantially flat and the crystal grains have an elongated shape stretched in the layer thickness direction, as shown in FIG. 3B. The ratio of the surface area occupied by the crystal grains having the flat-plate hexagonal elongated shape, to the whole surface area of the plane parallel to the layer thickness direction, accounts for 35% or more, in the upper layer formed in the further limited conditions.

The reformed AlTiO layer is analyzed with a field-emission-type scanning electron microscope and the electronic backscattering diffraction image apparatus. In the analysis, electron beams are irradiated to individual crystal grains within the measurement range of the polished surface. Then, angles between the normal line to each of crystal lattice planes with a hexagonal crystal lattice and the normal line to the polished surface are measured. From the measurement results, the crystal orientation relationship between adjacent crystal lattices is calculated. Then, distribution of lattice points (constituent atom sharing lattice points) is calculated. The constituent atom sharing lattice point is a lattice point that has a constituent atom shared by two crystal lattices forming the grain boundary at the grain boundary. A constituent atom sharing lattice point configuration is expressed by ΣN+1, where the number represented by N is the number of lattice points that have no constituent atom shared at the grain boundary between two constituent atom sharing lattice points with constituent atoms. The constituent atom sharing lattice point type is even numbers more than 2 between crystal grains having a corundum type hexagonal close-packed structure. If the maximum number of N is set to 28 in view of distribution frequency, even numbers 4, 8, 14, 24, and 26 are excluded from the option for crystal grains having hexagonal close-packed structure. As shown in FIG. 4, the crystal grains of the reformed AlTiO layer are divided by at least one of Σ3 coincidence site lattice interface within each crystal grain. The ratio of surface area occupied by the crystal grains that have the flat-plate polygonal elongated shape and divided by at least one of Σ3 coincidence site lattice interface, to the surface area occupied by crystal grains with the flat-plate polygonal elongated shape (including the flat-plate hexagonal elongated shape), is 60% or more.

The strength within the crystal grains of the reformed AlTiO layer is increased due to the presence of the Σ3 coincidence site lattice interface in the crystal grains with the flat-plate polygonal (including hexagonal) elongated shape. As a result, cracking of the reformed AlTiO layer is suppressed during high-speed intermittent cutting work where high load is subjected to the reformed AlTiO layer. Even if the cracking occurred, growth and spreading of the cracking would be prevented. Therefore, chipping resistance, fracture resistance, and spalling resistance are improved in the cutting tool having the reformed AlTiO layer.

Accordingly, the upper layer of the present invention, which has a high (0001) plane orientation rate, has flat surface properties, and is composed of the reformed AlTiO layer in which the Σ3 coincidence site lattice interfaces are present with in the flat-plate polygonal (including flat hexagonal) elongated crystal grains, exhibits excellent chipping resistance and abrasion resistance for a prolonged period of time without causing chipping, fracture, spalling, or the like and also without causing thermal plastic deformation, uneven wear, or the like, even in high-speed intermittent cutting work accompanied by high heat generation and high load subjected on the cutting edge.

If the layer thickness of the upper layer composed of the reformed AlTiO layer is less than 2 μm, the excellent characteristics of the upper layer cannot be sufficiently exhibited. On the other hand, if the layer thickness of the upper layer exceeds 15 μm, thermal plastic deformation, which causes uneven wear, easily occurs. In addition, a rate of occurrence of chipping is also increased. Therefore, the mean layer thickness of the upper layer is set to 2 to 15 μm.

Figure 5A:
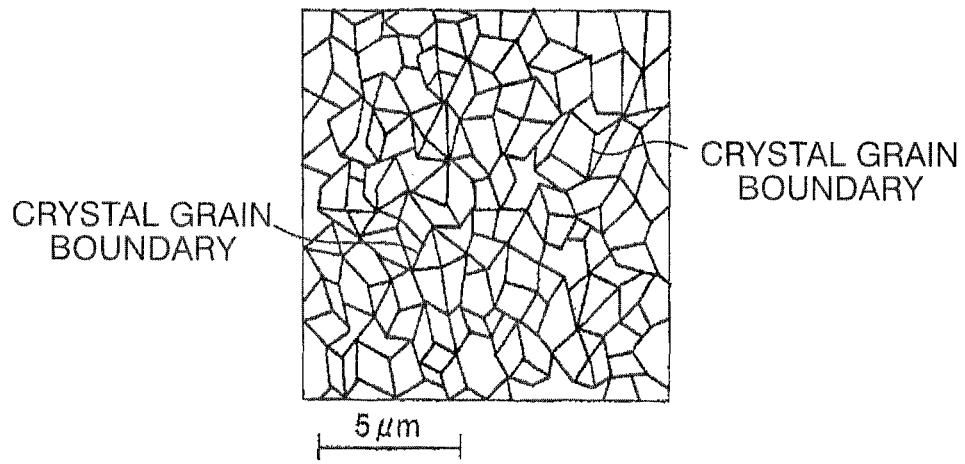
FIG. 5A is a schematic view showing a polygonal crystal grain structure which is obtained by observing an upper layer composed of a conventional AlTiO layer of the comparative coated tools A1 to A10, using the field-emission-type scanning electron microscope in the plane perpendicular to the layer thickness direction.
Figure 5B:
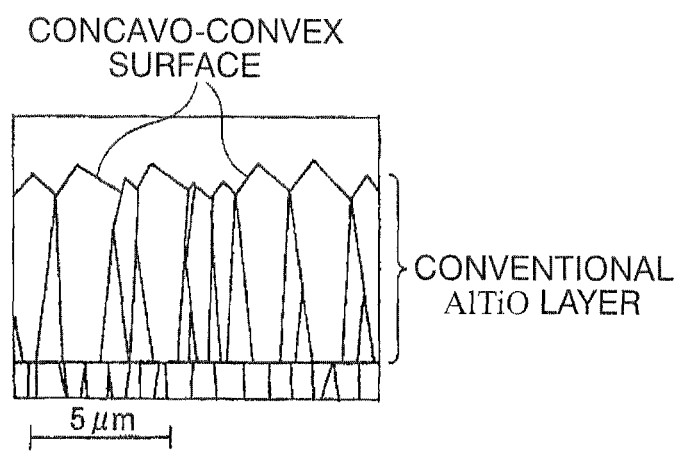
FIG. 5B is a schematic view showing a crystal grain structure having pyramidal concaves and convexes on the layer surface and having an elongated shape in the layer thickness direction, which is obtained by observation using the field-emission-type scanning electron microscope in the plane parallel to the layer thickness direction.

As a comparison, the conventional AlTiO layer (the layer described in the PTL 2 (Japanese Unexamined Patent Application Publication No. 2006-289556)), was analyzed by the field-emission-type scanning electron microscope and the electronic backscattering diffraction image apparatus. In the analysis, the texture of crystal grains and the constituent atom sharing lattice point configuration of the conventional AlTiO layer were analyzed. The texture of the crystal grains of the conventional AlTiO layer is shown in FIGS. 5A and 5B. As shown in FIGS. 5A and 5B, the texture of the crystal grains of the conventional AlTiO layer is made of pyramidal-shaped crystal grains with a polygonal elongated shape stretched to the layer thickness direction. The outer surface of the conventional AlTiO layer has protuberances and recesses along with the pyramidal shape of the crystal grains. Because of these, the abrasion resistance of the conventional AlTiO layer is inferior compared to that of the reformed AlTiO layer. In terms of the constituent atom sharing lattice point configuration, the ratio of surface area occupied by the pyramidal-shaped crystal grains, which have a polygonal elongated shape stretched to the layer thickness direction and contain a Σ3 coincidence site lattice interface within, to the surface area occupied by crystal grains, which consist the conventional AlTiO layer and have the convexoconcave polygonal elongated shape stretched to the layer thickness direction, is 40% or less. Therefore, the strength within the crystal grains is not improved as in the reformed AlTiO layer.

Accordingly, the conventional coated tool 2 in which the upper layer of the hard coating layer is composed of the conventional AlTiO layer cannot prevent occurrence of chipping, fracture, spalling, or the like and is inferior in tool performance, in high-speed intermittent cutting work accompanied by high heat generation and intermittent impact loading subjected on the cutting edge.

In the coated tool of the present invention, after the reformed AlTiO layer of the upper layer is formed, polishing processing using a grind stone or polishing processing using wet blasting can be performed on the surface of the upper layer, so that the surface roughness of the reformed AlTiO layer can be further adjusted. For example, the occurrence of welding to the surface-coated tool during cutting can be suppressed by adjusting the surface roughness of the reformed AlTiO layer to Ra 0.05 to 0.3 μm.

The surface roughness Ra in the present invention means the value of arithmetic mean roughness Ra defined by JIS B0601 (1994), and the measuring method thereof is not particularly limited.

Second Embodiment

A coated tool of the second embodiment of the present invention has the following configuration.

(a) The conventional α-type $Al_2O_3$ layer in the conventional coated tool 1 is vapor-deposited, for example, using a normal chemical vapor deposition apparatus under the following conditions.

Composition of reaction gas: in vol. %, 6 to 10% of $AlCl_3$, 10 to 15% of $CO_2$, 3 to 5% of HCl, 0.05 to 0.2% of $H_2S$, and $H_2$ as balance Reaction atmosphere temperature: 1020 to 1050° C.

Reaction atmosphere pressure: 3 to 5 kPa

In the second embodiment, an $Al_2O_3$ neclear is formed on the surface of a Ti compound layer, which is a lower layer, using a standard chemical vapor deposition apparatus under the following low-temperature conditions: composition of reaction gas, in vol. %, 3 to 10% of $AlCl_3$, 0.5 to 3% of $CO_2$, 0.01 to 0.3% of $C_2H_4$, and $H_2$ as balance; reaction atmosphere temperature, 750 to 900° C.; reaction atmosphere pressure, 3 to 13 kPa.

Figure 6:
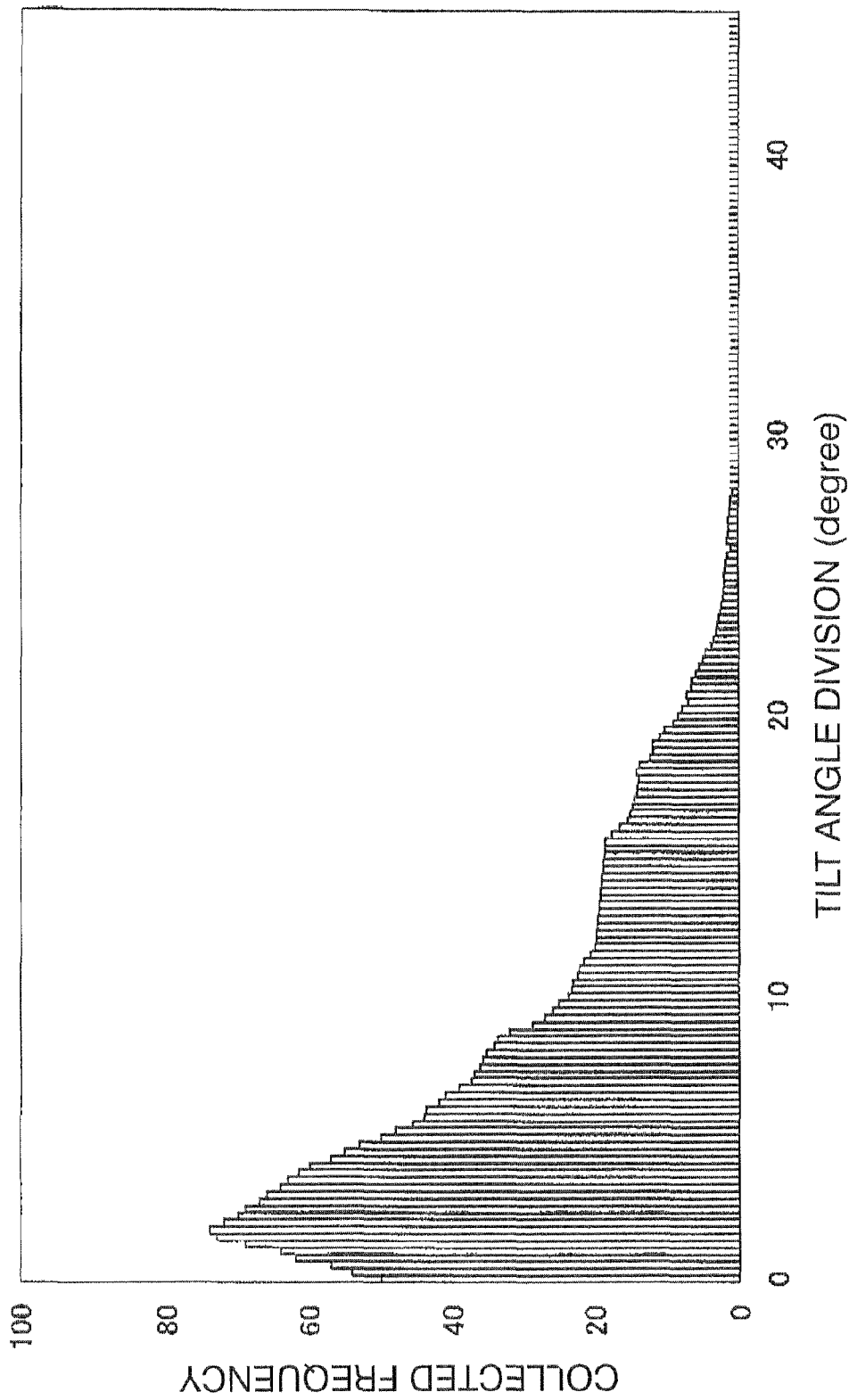
FIG. 6 is a tilt angle frequency distribution graph of the (0001) plane of a reformed α-type $Al_2O_3$ layer which constitutes an intermediate layer of a hard coating layer of a coated tool of the present invention.

An $Al_2O_3$ neclear is formed on the surface of a Ti compound layer which is the lower layer 12A under the low-temperature condition described above. In this case, it is desirable that the $Al_2O_3$ neclear is an $Al_2O_3$ neclear thin film having a mean layer thickness of 20 to 200 nm. Subsequently, the $Al_2O_3$ neclear thin film is heat treated in a condition where the reaction atmosphere is substituted to a hydrogen atmosphere of pressure: 3 to 13 kPa, and the reaction atmosphere temperature is increased to 1100 to 1200° C. Then, the α-type $Al_2O_3$ layer, which serves as the hard coating layer, is formed under a conventional condition. The resulting α-type $Al_2O_3$ layer (hereinafter referred to as a reformed α-type $Al_2O_3$ layer), which is vapor-deposited on the heat-treated neclear thin film, is analyzed with a field emission type scanning electron microscope as schematically represented in FIGS. 1A and 1B. In the analysis, individual crystal grains having a hexagonal crystal lattice present within the measurement range of a polished surface, are irradiated by an electron beam. Then, a tilt angle, which is the angle formed between the normal line to the (0001) plane of the crystal grain and the normal line to the polished surface of the cutting tool, is measured. The measured tilt angles belonging to a range of 0 to 45° are sectioned every pitch of 0.25°, and the frequencies existing in each section are collected, being represented by a tilt angle frequency distribution graph. As shown in FIG. 6, as an example, a sharp highest peak appears at a specific section of the tilt angle. Based on trial findings, it was found that the highest peak falls inside a tilt angle division ranging 0 to 10° and the total sum of frequencies existing in the range of 0 to 10° occupies a ratio of 45% or more of the total frequencies in the tilt-angle frequency distribution graph, when the atmosphere pressure of the chemical vapor deposition apparatus is kept between 5 and 8 KPa. The fact that the total sum of frequencies existing in the range of 0 to 10° occupies a ratio of 45% or more of the total frequencies, means that ratio of the (0001) plane orientation is high. This reformed α-type $Al_2O_3$ layer whose highest peak of the tilt angle division appears within the range of 0 to 10° in the tilt-angle frequency distribution graph has superior high-temperature strength compared to the conventional α-type $Al_2O_3$ layer of the conventional coated cutting tool 1. This reformed α-type $Al_2O_3$ also has excellent high-temperature hardness and heat resistance, as the conventional α-type $Al_2O_3$ layer of the conventional coated cutting tool 1 does.

(b) A hard coating layer is constructed by forming the reformed α-type $Al_2O_3$ layer vapor-deposited under the conditions described in the above (a) as the intermediate layer, and further by vapor-depositing a Y(Yttrium)-containing aluminum oxide layer having an α-type crystal structure in a chemically vapor-deposited state as the upper layer on the intermediate layer. Then, provided is a coated tool in which the lower layer composed of the Ti compound layer, the intermediate layer composed of the reformed α-type $Al_2O_3$ layer, and the upper layer composed of the Y-containing aluminum oxide layer are vapor-deposited as a hard coating layer on the surface of the tool substrate. The present inventor has found that this coated tool has superior high-temperature strength and surface properties, thereby exhibiting excellent chipping resistance, even under high-speed intermittent cutting conditions where intermittent impact load is subjected on the cutting edge.

(c) The Y-containing aluminum oxide layer which is the upper layer can be formed on the reformed α-type $Al_2O_3$ layer, which is the intermediate layer, under the following conditions. For example, first, as a first step, first-step vapor deposition is performed for 1 hour under the following conditions (i) to (iii).

(i) Composition of reaction gas (vol. %):
1 to 5% of $AlCl_3$,
0.05 to 0.1% of $YCl_3$,
2 to 6% of $CO_2$,
1 to 5% of HCl,
$H_2S$ of 0.25 to 0.75%, and
$H_2$ as balance
(ii) Reaction atmosphere temperature: 1020 to 1050° C.
(iii) Reaction atmosphere pressure: 3 to 5 kPa Next, as a second step, vapor deposition is performed under the following conditions (i) to (iii).

(i) Composition of reaction gas (vol. %):
6 to 10% of $AlCl_3$,
0.4 to 1.0% of $YCl_3$,
4 to 8% of $CO_2$,
3 to 5% of HCl,
$H_2S$ of 0.25 to 0.6%, and
$H_2$ as balance
(ii) Reaction atmosphere temperature: 920 to 1000° C.
(iii) Reaction atmosphere pressure: 6 to 10 kPa By following the steps described above, a Y-containing aluminum oxide layer (hereinafter referred to as a reformed AlYO layer), which has an α-type crystal structure in a chemically vapor-deposited state, can be formed. The reformed AlYO layer has a mean layer thickness of 1 to 15 μm, and the content ratio of the Y component to the total amount of the Al component is 0.0005 to 0.01 (as atomic ratio).

(d) When the texture of the reformed AlYO layer is observed by the emission type scanning electron microscope, a flat-plate polygonal shape of a large-sized grain can be seen within a plane perpendicular to the layer thickness direction as shown in FIG. 7A. When the reformed AlYO layer is observed in the plane parallel to the layer thickness direction as shown in FIG. 7B, it can be seen that the outer surface of the reformed AlYO layer is substantially flat, and the reformed AlYO layer has a texture made of the grains whose shapes are elongated in the layer thickness direction (hereinafter, the shape of the crystal grain described above is referred a flat-plate polygonal vertically elongated shape).

When the vapor deposition of the reformed AlYO layer is performed under further limited conditions, the texture exemplified in FIG. 7C is formed. In the further limited condition, the volume % of $YCl_3$ is set 0.6 to 0.8, the volume % of $H_2S$ 0.25 to 0.4, and the reaction atmosphere temperature 960 to 980° C. in the second step vapor deposition, for example. As shown in FIG. 7C, when the reformed AlYO layer is formed by the further limited condition, and is seen within the plane perpendicular to the layer thickness direction, the large-sized grains with a flat hexagonal shape are observed. When the reformed AlYO layer is seen within the plane parallel to the layer thickness direction, it can be seen that the outer surface of the reformed AlYO layer is substantially flat, as shown in FIG. 7B. In addition, the grains that have the elongated shape within the plane parallel to the layer thickness direction, account for 35% or more in area ratio, in the whole surface area perpendicular to the thickness direction of the layer.

(e) As in the reformed α-type $Al_2O_3$ layer, the reformed AlYO layer is analyzed with the field-emission-type scanning electron microscope. In the analysis, individual crystal grains having a hexagonal crystal lattice present within the measurement range of a polished surface, are irradiated by an electron beam. Then, a tilt angle, which is the angle formed between the normal line to the (0001) plane of the crystal grain and the normal line to the polished surface of the cutting tool, is measured. The measured tilt angles belonging to a range of 0 to 45° are sectioned every pitch of 0.25°, and the frequencies existing in each section are collected, being represented by a tilt angle frequency distribution graph. In the tilt-angle frequency distribution graph, a sharp highest peak appears at a specific section of the tilt angle, and the total sum of frequencies existing in the range of 0 to 10° occupies a ratio of 60% or more of the total frequencies. This means that the reformed AlYO layer with high (0001) plane orientation ratio is formed. The (0001) plane orientation ratio of the reformed AlYO layer is higher than that of the conventional AlYO layer of the conventional coated cutting tool, resulting even more superior high-temperature strength of the reformed AlYO layer.

Figure 8:
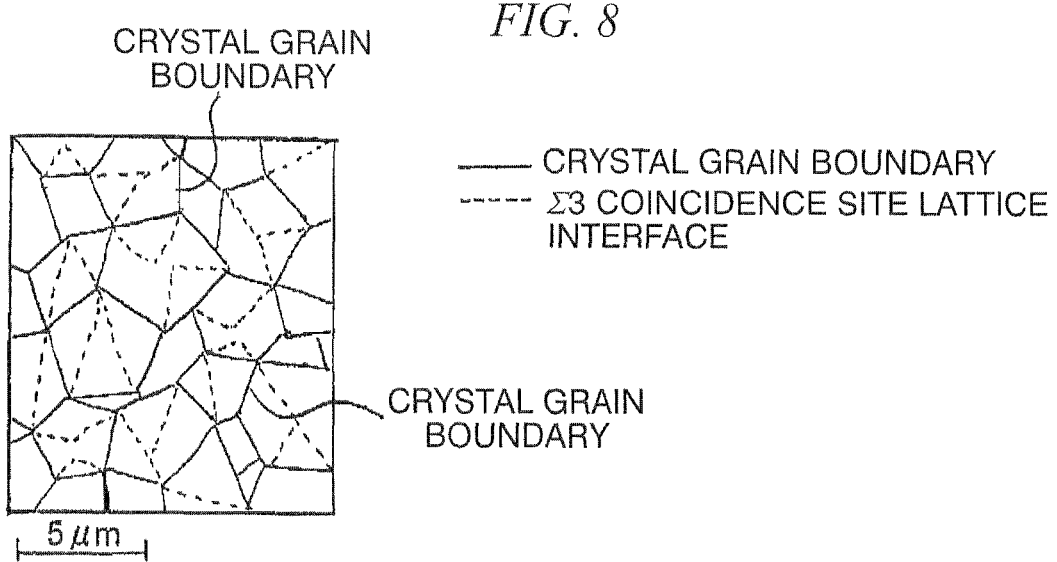
FIG. 8 is a grain boundary analysis view in the plane perpendicular to the layer thickness direction, which is obtained by measuring the upper layer composed of the reformed AlYO layer of the coated tools B1 to B9 of the present invention, using the field-emission-type scanning electron microscope and the electronic backscattering diffraction image apparatus, showing a flat-plate polygonal grain boundary observed by the field-emission-type scanning electron microscope in a solid line, and showing a Σ3 coincidence site lattice interface within the crystal grain measured by the electronic backscattering diffraction image apparatus in a broken line.

(f) In addition, the reformed AlYO layer is analyzed by the field-emission-type scanning electron microscope and an electronic backscattering diffraction image apparatus. In the analysis, individual crystal grains having a hexagonal crystal lattice present within the measurement range of a polished surface, are irradiated by an electron beam. Then, a tilt angle, which is the angle formed between the normal line to the (0001) plane of the crystal grain and the normal line to the polished surface of the cutting tool, is measured. Based on the measurement results, a crystallographic orientation relationship between the adjacent crystal lattices is calculated, and a distribution of lattice points (constituent atom sharing lattice points) in which constituent atoms of a crystal lattice interface sharing one constituent atom between the crystal lattices is calculated. A constituent atom sharing lattice point type in which N lattice points not sharing the constituent atom exist between the constituent atom sharing lattice points (where N is an even number of 2 or more in view of a crystal structure of corundum type hexagonal close packed crystal but does not include even numbers of 4, 8, 14, 24, and 26 when the upper limit of N is set to 28 in view of distribution frequency) is expressed as $\Sigma N+1$. When the reformed AlYO layer is observed by the field-emission-type scanning electron microscope, it is seen that the reformed AlYO layer includes the crystal grains with the flat-plate polygonal vertically elongated shape, as shown in FIG. 8. Among the crystal grains with the flat-plate polygonal vertically elongated shape, 60% or more of them are divided by at least one of crystal lattice interface with the constituent atom sharing lattice point type expressed by $\Sigma 3$ (hereinafter referred as a $\Sigma 3$ coincidence site lattice interface) in the crystal grains.

(h) As described above, the upper layer composed of the reformed AlYO layer has a high (0001) plane orientation rate, and a crystal plane at the surface thereof has the same orientation as a crystal plane (for example, (0001)) within the plane perpendicular to the layer thickness direction of this layer. Thus, outer surface of the upper layer is formed in the shape of a flat plate which is substantially flat (as seen within the plane parallel to the layer thickness direction), and shows excellent chipping resistance due to the surface properties thereof. Furthermore, the strength within the crystal grains is increased since the $\Sigma 3$ coincidence site lattice interfaces are present inside the grains with the flat-plate polygonal vertically elongated shape. Therefore, the reformed AlYO layer has excellent high-temperature hardness and high-temperature strength and shows excellent chipping resistance, compared to the conventional AlYO layer.

(i) Accordingly, as the hard coating layer, the coated tool of the present invention includes the reformed $\alpha$-type $Al_2O_3$ layer having a high (0001) plane orientation rate and having excellent high-temperature strength as the intermediate layer. Furthermore, the coated tool of the present invention includes the reformed AlYO layer having excellent high-temperature hardness, high-temperature strength, and surface properties as the upper layer. The coated tool of the present invention has superior high-temperature hardness, heat resistance, and high-temperature strength as compared to the conventional coated tools 1 and 2. As a result, it exhibits excellent chipping resistance for a long-term use, even when the coated tool is used for high-speed intermittent cutting accompanied by high heat generation, and intermittent impact loading acts repeatedly on the cutting blade. The second embodiment of the present invention has been made on the basis of the above knowledge, and the surface-coated cutting tool of the present invention includes the following configurations.

(1) Provided is a surface-coated cutting tool formed by vapor-depositing, on the surface of a tool substrate made of tungsten carbide-based cemented carbide or titanium carbonitride-based cermet, a hard coating layer including the above (a) to (c).

(a) The lower layer is a Ti compound layer composed of one or more of a titanium carbide layer, a titanium nitride layer, a titanium carbonitride layer, a titanium carboxide layer, and a titanium oxycarbonitride layer, all of which are formed by chemical vapor deposition, and having a total mean layer thickness of 3 to 20 μm.

(b) The intermediate layer is an aluminum oxide layer having a mean layer thickness of 1 to 5 μm and having an $\alpha$-type crystal structure in a chemically vapor-deposited state.

(c) The upper layer is a Y-containing aluminum oxide layer having a mean layer thickness of 2 to 15 μm and having an $\alpha$-type crystal structure in a chemically vapor-deposited state.

The intermediate layer (b) has properties indicated by a tilt-angle frequency distribution graph in which the highest peak exists in a tilt angle division ranging 0 to 10° and the total sum of frequencies existing in the range of 0 to 10° occupies a ratio of 45% or more of the total frequencies in the tilt-angle frequency distribution graph. The tilt-angle frequency distribution graph is obtained by utilizing a field-emission-type scanning electron microscope. Electron beams are irradiated to individual crystal grains, which has a hexagonal crystal lattice and exists in a measurement range of a polished plane. A tilt angle formed by the normal line to the polished plane and the normal line to (0001) plane as a crystal plane of the crystal grains is measured. The measured tilt angles belonging to a range of 0 to 45° every pitch of 0.25° are sectioned. The frequencies existing in each section are collected.

When the texture of the upper layer of the above (c) is observed by the emission type scanning electron microscope, the upper layer is a Y-containing aluminum oxide layer having a texture composed of crystal grains which have a flat-plate polygonal shape within the plane perpendicular to the layer thickness direction and have an elongated shape in the layer thickness direction within the plane parallel to the layer thickness direction.

The upper layer (c) has properties indicated by a tilt-angle frequency distribution graph in which the highest peak exists in a tilt angle division ranging 0 to 10° and the total sum of frequencies existing in the range of 0 to 10° occupies a ratio of 60% or more of the total frequencies in the tilt-angle frequency distribution graph. The tilt-angle frequency distribution graph is obtained by utilizing a field-emission-type scanning electron microscope. Electron beams are irradiated to individual crystal grains, which has a hexagonal crystal lattice and exists in a measurement range of a polished plane. A tilt angle formed by the normal line to the polished plane and the normal line to (0001) plane as a crystal plane of the crystal grains is measured. The measured tilt angles belonging to a range of 0 to 45° every pitch of 0.25° are sectioned. The frequencies existing in each section are collected.

The upper layer (c) is a Y-containing aluminum oxide layer. Electron beams are irradiated to individual crystal grains within the measurement area on the polished surface with field-emission-type scanning electron microscope and an electron backscatter diffraction imaging device. Then, angles formed by normal lines of crystal lattice faces with hexagonal crystal lattices and the normal line to the polished surface are measured. Then, based on the measurement, a crystallographic orientation relationship between the adjacent crystal lattices is calculated. Then, a distribution of lattice points (constituent atom sharing lattice points) in which constituent atoms of a crystal lattice interface sharing one constituent atom between the crystal lattices is calculated. The constituent atom sharing lattice point type is expressed as $\Sigma N+1$, where "N" represents a number of lattice points (N) without a shared constituent atom between the constituent atom sharing lattice points. The constituent atom sharing lattice point type is even numbers more than 2 between crystal grains having a corundum type hexagonal close-packed structure. If the maximum number of N is set to 28 in view of distribution frequency, even numbers 4, 8, 14, 24, and 26 are excluded from the option for crystal grains having hexagonal close-packed structure. The upper layer (c) is a Y-containing aluminum oxide layer consisted of crystal grains, 60% or more of the grains being divided within each grain by at least one or more crystal lattice interfaces with a constituent atom sharing lattice point type expressed by $\Sigma 3$.

(2) When the texture of the upper layer (c) of the surface-coated cutting tool described above (as (1)) is observed by the emission type scanning electron microscope, crystal grains corresponding to 35% or more of the whole surface area perpendicular to the layer thickness direction, has a flat-plate polygonal shape within the plane perpendicular to the layer thickness direction and an elongated shape in the layer thickness direction within the plane parallel to the layer thickness direction.

(3) The surface roughness (Ra) of the upper layer (c) in the cutting tool described above (as (1) and (2)) ranges from 0.05 to 0.3 μm.

The configuration of the hard coating layer of the coated tool of the second embodiment will be described below in more detail.

(a) Ti Compound Layer (Lower Layer 12A)

The lower layer 12A is a Ti compound layer composed of one more of titanium carbide (hereinafter, referred to as TiC) layer, a titanium nitride (hereinafter, referred to as TiN) layer, a titanium carbonitride (hereinafter, referred to as TiCN) layer, a titanium carboxide (hereinafter, referred to as TiCO) layer, and a titanium oxycarbonitride (hereinafter, referred to as TiCNO) layer. The lower layer 12A is basically present as a lower layer of the reformed α-type $Al_2O_3$ layer which is the intermediate layer. It has superior toughness and abrasion resistance, contributing to improve high-temperature strength of the hard coating layer. In addition, the lower layer 12A adheres tightly to both the tool substrate and the reformed α-type $Al_2O_3$ layer, contributing an adhesive property of the hard coating layer to the tool substrate. If the total mean layer thickness is less than 3 μm, the improvements described above cannot be sufficiently obtained. On the other hand, if the total mean layer thickness exceeds 20 μm, chipping occurs easily, particularly when the cutting tool is used under high-speed intermittent cutting conditions where high heat is generated and an intermittent load is subjected to the cutting tool. The chipping causes abnormal wear of the cutting tool. Accordingly, the total mean layer thickness is set to 3 to 20 μm.

(b) Reformed α-Type $Al_2O_3$ Layer (Intermediate Layer 12B)

In order to form the reformed α-type $Al_2O_3$ layer, which constitutes the intermediate layer 12B, as already described, an $Al_2O_3$ neclear is formed on the surface of the Ti compound layer, which is the lower layer, under the normal chemical vapor deposition apparatus under the following low-temperature conditions.

Composition of reaction gas: in vol. %, 3 to 10% of AlCl3, 0.5 to 3% of $CO_2$, 0.01 to 0.3% of $C_2H_4$, and $H_2$ as balance Reaction atmosphere temperature: 750 to 900° C.

Reaction atmosphere pressure: 3 to 13 kPa

It is desirable that the $Al_2O_3$ neclear is an $Al_2O_3$ neclear thin film having a mean layer thickness of 20 to 200 nm. After the formation of the $Al_2O_3$ neclear, the reaction atmosphere is substituted with a hydrogen atmosphere with pressure of 3 to 13 kPa. Then, temperature of the reaction atmosphere is increased to 1100 to 1200° C. and the $Al_2O_3$ neclear thin film is heat treated. An α-type $Al_2O_3$ layer, which serves as the hard coating layer, is formed under normal conditions. By following steps described above, an α-type $Al_2O_3$ layer is vapor deposited on the heat-treated $Al_2O_3$ neclear thin film, resulting formation of the intermediate layer 12B.

The intermediate layer 12 is analyzed by the field-emission-type scanning electron microscope, as shown in FIGS. 1A and 1B. Electron beams are irradiated to the individual grains, which has a hexagonal crystal lattice and exists in a measurement range of a polished plane. A tilt angle formed by the normal line to the polished plane and the normal line to (0001) plane as a crystal plane of the crystal grains is measured. The measured tilt angles belonging to a range of 0 to 45° every pitch of 0.25° are sectioned. The frequencies existing in each section are collected and a tilt-angle frequency distribution graph is plotted. In the tilt-angle frequency distribution graph, the sharp highest peak exists in a tilt angle division ranging 0 to 10°, as shown in FIG. 6.

The highest peak position of the measured tilt angles in the tilt angle frequency distribution graph of the reformed α-type $Al_2O_3$ layer can be changed by performing heat-treatment after the formation of the $Al_2O_3$ neclear (thin film) with a predetermined layer thickness. In addition, the total sum of frequencies existing in the range of 0 to 10° occupies a ratio of 45% or more of the total frequencies in the tilt-angle frequency distribution graph (which means the (0001) plane orientation rate is high). Accordingly, whenever the thickness of the $Al_2O_3$ neclear (thin film) becomes too thin or too thick, the position of the highest peak of the measured tilt angles moves out of the range of 0 to 10°. In addition, the total sum of frequencies existing in the range of 0 to 10° becomes less than a ratio of 45% of the total frequencies in the tilt-angle frequency distribution graph. As a result, excellent high-temperature strength cannot be obtained.

The reformed α-type $Al_2O_3$ layer has superior high-temperature strength in addition to the excellent high-temperature hardness and heat resistance of the α-type $Al_2O_3$ layer of the conventional coated tool. Furthermore, by configuring the reformed α-type $Al_2O_3$ layer as an intermediate layer with a high (0001) plane orientation rate, the (0001) plane orientation rate of the reformed AlYO layer vapor-deposited thereon can be increased. As a result, the surface properties of an upper layer composed of the reformed AlYO layer can be improved, and high-temperature strength can be improved.

If the mean layer thickness of the intermediate layer composed of the reformed α-type $Al_2O_3$ layer is less than 1 μm, the hard coating layer cannot be provided with the above characteristics of the reformed α-type $Al_2O_3$ layer. On the other hand, if the mean layer thickness exceeds 5 μm, high temperature generated during cutting and an intermittent load subjected to the cutting edge leads to a higher rate of occurrence of chipping, which causes abnormal wear of the cutting tool. As a result, the cutting tool is abrased faster. Thus, the mean layer thickness is set to 1 to 5 μm.

(c) Reformed AlYO Layer (Upper Layer 12C)

As for the upper layer 12C composed of the reformed AlYO layer chemically vapor-deposited on the intermediate layer 12B, an Al component which is a constituent component of the upper layer improves the high-temperature hardness and heat resistance of the layer. An extremely small amount (Y/(Al+Y) is 0.0005 to 0.01 (as an atomic ratio) in a ratio accounted for in the total amount with Al) of Y component contained in the upper layer improves the crystal grain boundary strength of the reformed AlYO layer, and contributes to improving the high-temperature strength of the upper layer. If the content ratio of the Y component in the upper layer is less than 0.0005, the above functions cannot be obtained. On the other hand, if the content ratio of the Y component exceeds 0.01, the grain boundary strength deteriorates as $Y_2O_3$ grains precipitate in the layer. Therefore, it is desirable that the content ratio of the Y component (the value of the ratio of Y/(Al+Y)) in the upper layer accounted for in the total amount with the Al component is 0.0005 to 0.01 (as an atomic ratio).

The reformed AlYO layer can be vapor-deposited by adjusting chemical vapor deposition conditions of the composition of a reaction gas during vapor deposition, the reaction atmosphere temperature, and the reaction atmosphere pressure as follows, for example.

First, the first-step vapor deposition is performed for 1 hour under the following conditions:
(i) Composition of reaction gas (vol. %):
1 to 5% of $AlCl_3$,
0.05 to 0.1% of $YCl_3$,
2 to 6% of $CO_2$,
1 to 5% of HCl,
0.25 to 0.75% of $H_2S$, and
$H_2$ as balance,
(ii) Reaction atmosphere temperature: 1020 to 1050° C., and
(iii) Reaction atmosphere pressure: 3 to 5 kPa, Second, the second-step vapor deposition is performed under the following conditions.
(i) Composition of reaction gas (vol. %):
6 to 10% of $AlCl_3$,
0.4 to 1.0% of $YCl_3$,
4 to 8% of $CO_2$,
3 to 5% of HCl,
0.25 to 0.6% of $H_2S$, and
$H_2$ as balance,
(ii) Reaction atmosphere temperature: 920 to 1000° C., and
(iii) Reaction atmosphere pressure: 6 to 10 kPa.

When a vapor deposition layer with a mean layer thickness of 1 to 15 μm is formed as a film, by performing the first-step and the second-step vapor deposition in the conditions described above, the reformed AlYO layer whose ratio of Y/(Al+Y) is 0.0005 to 0.01 in atomic ratio, is formed.

When the reformed AlYO layer is observed by the emission type scanning electron microscope, the textures shown in FIGS. 7A and 7B are observed. In FIG. 7A, the reformed AlTiO layer is viewed within the plane perpendicular to the layer thickness direction. In FIG. 7A, the texture containing large crystal grains with a flat-plate polygonal shape is formed. In FIG. 7B, the reformed AlYO layer is viewed within the plane parallel to the layer thickness direction. In FIG. 7B, the outer surface of the reformed AlYO layer is substantially flat. Also, the texture containing crystal grains with elongated shape is formed (Referred as a flat-plate polygonal elongated shape crystal grain).

As for the reformed AlYO layer, similarly to the reformed α-type $Al_2O_3$ layer, which constitutes the intermediate layer, the tilt angle of the normal line to the (0001) plane to the normal line to a polished surface is measured and a tilt angle frequency graph is plotted. In the tilt angle frequency graph of the reformed AlYO layer, a peak exists in a tilt angle division ranging 0 to 10° and the total sum of frequencies existing in the range of 0 to 10° occupies a ratio of 60% or more of the total frequencies in the tilt-angle frequency distribution graph. These results indicate that the (0001) plane orientation rate of the reformed AlYO layer, which constitutes the upper layer, is high.

That is, as for the reformed AlYO layer, since the (0001) plane orientation rate of the reformed α-type $Al_2O_3$ layer, which is the intermediate layer, is 45% or more, the reformed AlYO layer is also formed as a layer having a high (0001) plane orientation rate (the (0001) plane orientation rate is 60% or more).

When the upper layer is viewed within the plane parallel to the layer thickness direction, the outer surface of the upper layer is formed in the shape of a substantially flat plate. Thus, the upper layer has a excellent surface property. Consequently, the upper layer shows superior chipping resistance as compared to the conventional AlYO layer.

When the vapor deposition of the reformed AlYO layer is performed under further limited conditions (for example, the conditions where volume percentage of $H_2S$ in the reaction gas is 0.5 to 0.75 vol. %, and the reaction atmosphere temperature is set to 1020 to 1030° C., in the first-step vapor deposition, and volume percentages of $YCl_3$ and $H_2S$ in the reaction gas are 0.6 to 0.8 vol. % and 0.25 to 0.4 vol %, respectively, and the reaction atmosphere temperature is set to 960 to 980° C., in the second-step vapor deposition), the texture shown in FIG. 7C is formed. In the texture, when it is viewed within the plane perpendicular to the layer thickness direction, there are large-sized crystal grains with a flat-plate hexagonal shape. When the texture is viewed within the plane parallel to the layer thickness direction, the outer surface of the upper layer is substantially flat and the crystal grains have an elongated shape stretched in the layer thickness direction, as shown in FIG. 7B. The ratio of the surface area occupied by the crystal grains having the flat-plate hexagonal elongated shape, to the whole surface area of the plane parallel to the layer thickness direction, accounts for 35% or more, in the upper layer formed in the further limited conditions.

The reformed AlYO layer is analyzed with a field-emission-type scanning electron microscope and the electronic backscattering diffraction image apparatus. In the analysis, electron beams are irradiated to individual crystal grains within the measurement range of the polished surface. Then, angles between the normal line to each of crystal lattice planes with a hexagonal crystal lattice and the normal line to the polished surface are measured. From the measurement results, the crystal orientation relationship between adjacent crystal lattices is calculated. Then, distribution of lattice points (constituent atom sharing lattice points) is calculated. The constituent atom sharing lattice point is a lattice point that has a constituent atom shared by two crystal lattices forming the grain boundary at the grain boundary. A constituent atom sharing lattice point configuration is expressed by $\Sigma N+1$, where the number represented by N is the number of lattice points that have no constituent atom shared at the grain boundary between two constituent atom sharing lattice points with constituent atoms. The constituent atom sharing lattice point type is even numbers more than 2 between crystal grains having a corundum type hexagonal close-packed structure. If the maximum number of N is set to 28 in view of distribution frequency, even numbers 4, 8, 14, 24, and 26 are excluded from the option for crystal grains having hexagonal close-packed structure. As shown in FIG. 8, the crystal grains of the reformed AlYO layer are divided by at least one of Σ3 coincidence site lattice interface within each crystal grain. The ratio of surface area occupied by the crystal grains that have the flat-plate polygonal elongated shape and divided by at least one of Σ3 coincidence site lattice interface, to the surface area occupied by crystal grains with the flat-plate polygonal elongated shape (including the flat-plate hexagonal elongated shape), is 60% or more.

The strength within the crystal grains of the reformed AlYO layer is increased due to the presence of the Σ3 coincidence site lattice interface in the crystal grains with the flat-plate polygonal (including hexagonal) elongated shape. As a result, cracking of the reformed AlYO layer is suppressed during high-speed intermittent cutting work where high load is subjected to the reformed AlYO layer. Even if the cracking occurred, growth and spreading of the cracking would be prevented. Therefore, chipping resistance, fracture resistance, and spalling resistance are improved in the cutting tool having the reformed AlYO layer.

Accordingly, the upper layer of the present invention, which has a high (0001) plane orientation rate, has flat surface properties, and is composed of the reformed AlYO layer in which the Σ3 coincidence site lattice interfaces are present with in the flat-plate polygonal (including flat hexagonal) elongated crystal grains, exhibits excellent chipping resistance and abrasion resistance for a prolonged period of time without causing chipping, fracture, spalling, or the like and also without causing uneven wear, or the like, even in high-speed intermittent cutting work accompanied by high heat generation and intermittent load subjected on the cutting edge.

If the layer thickness of the upper layer composed of the reformed AlYO layer is less than 2 μm, the excellent characteristics of the upper layer cannot be sufficiently exhibited. On the other hand, if the layer thickness of the upper layer exceeds 15 μm, a rate of occurrence of chipping is increased. Therefore, the mean layer thickness of the upper layer is set to 2 to 15 μm.

Figure 9A:
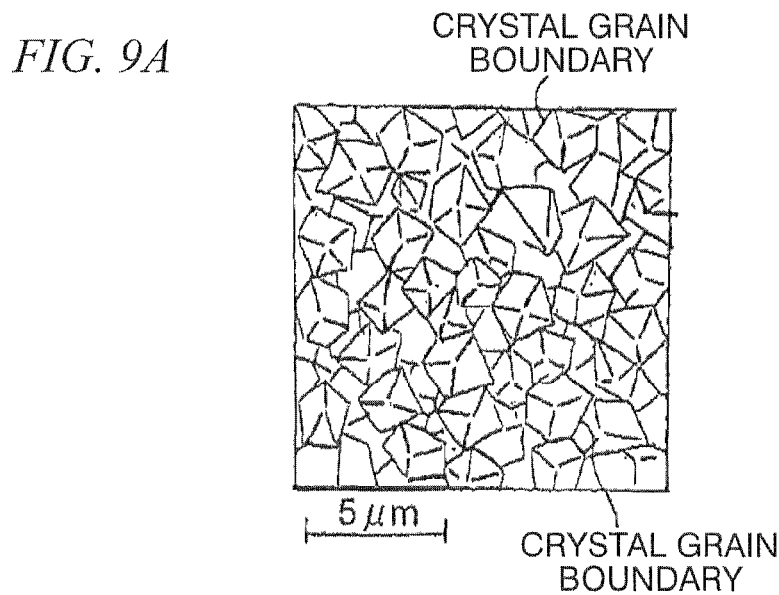
FIG. 9A is a schematic view showing a polygonal crystal grain structure which is obtained by observing an upper layer composed of a conventional AlYO layer of the comparative coated tools B1 to B10, using the field-emission-type scanning electron microscope in the plane perpendicular to the layer thickness direction.
Figure 9B:
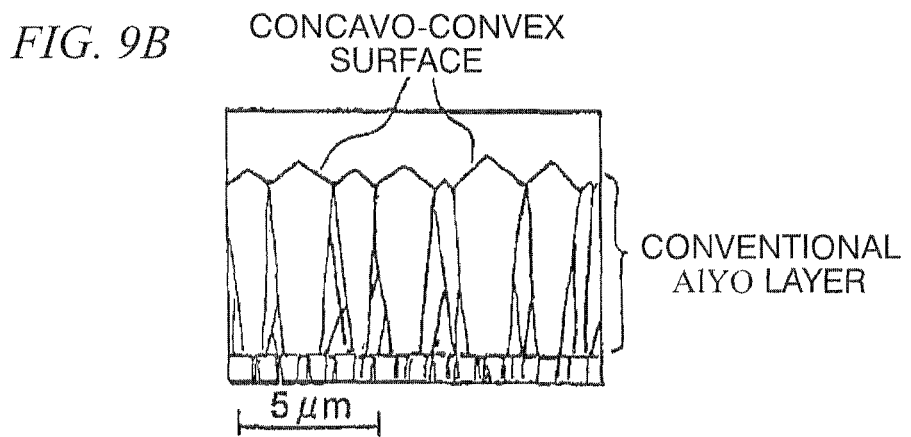
FIG. 9B is a schematic view showing a crystal grain structure having pyramidal concaves and convexes on the layer surface and having an elongated shape in the layer thickness direction, which is obtained by observation using the fieldemission-type scanning electron microscope in the plane parallel to the layer thickness direction.

As a comparison, the conventional AlYO layer (the layer described in the PTL 4), was analyzed by the field-emission-type scanning electron microscope and the electronic back-scattering diffraction image apparatus. In the analysis, the texture of crystal grains and the constituent atom sharing lattice point configuration of the conventional AlYO layer were analyzed. The texture of the crystal grains of the conventional AlYO layer is shown in FIGS. 9A and 9B. As shown in FIGS. 9A and 9B, the texture of the crystal grains of the conventional AlYO layer is made of pyramidal-shaped crystal grains with a polygonal elongated shape stretched to the layer thickness direction. The outer surface of the conventional AlYO layer has protuberances and recesses along with the pyramidal shape of the crystal grains. Because of these, the abrasion resistance of the conventional AlYO layer is inferior compared to that of the reformed AlYO layer. In terms of the constituent atom sharing lattice point configuration, the ratio of surface area occupied by the pyramidal-shaped crystal grains, which have a polygonal elongated shape stretched to the layer thickness direction and contain a Σ3 coincidence site lattice interface within, to the surface area occupied by crystal grains, which consist the conventional AlYO layer and have the convexoconcave polygonal elongated shape stretched to the layer thickness direction, is 40% or less. Therefore, the strength within the crystal grains is not improved as in the reformed AlYO layer.

Accordingly, the conventional coated tool 2 in which the upper layer of the hard coating layer is composed of the conventional AlYO layer cannot prevent occurrence of chipping, fracture, spalling, or the like and is inferior in tool performance, in high-speed intermittent cutting work accompanied by high heat generation and repeated intermittent impact loading subjected on the cutting edge. In addition, uneven wear or the like occurs in the conventional coated tool 2.

In the coated tool of the present invention, after the reformed AlYO layer of the upper layer is formed, polishing processing using a grind stone or polishing processing using wet blasting can be performed on the surface of the upper layer, so that the surface roughness of the reformed AlYO layer can be further adjusted. For example, the occurrence of welding to the surface-coated tool during cutting can be suppressed by adjusting the surface roughness of the reformed AlYO layer to Ra 0.05 to 0.3 μm.

The surface roughness Ra in the present invention means the value of arithmetic mean roughness Ra defined by JIS B0601 (1994), and the measuring method thereof is not particularly limited.

Third Embodiment

A third embodiment of the present invention includes the following aspects.

(a) The conventional α-type $Al_2O_3$ layer in the conventional coated tool 1 is vapor-deposited, for example, using a normal chemical vapor deposition apparatus under the following conditions.

Composition of reaction gas: in vol. %, 6 to 10% of $AlCl_3$, 10 to 15% of $CO_2$, 3 to 5% of HCl, 0.05 to 0.2% of $H_2S$, and $H_2$ as balance Reaction atmosphere temperature: 1020 to 1050° C.

Reaction atmosphere pressure: 3 to 5 kPa

On the other hand, the α-type $Al_2O_3$ layer in the present invention corresponding to the intermediate layer is formed, using a normal chemical vapor deposition apparatus under the following low-temperature conditions.

Composition of reaction gas: in vol. %, 3 to 10% of $AlCl_3$, 0.5 to 3% of $CO_2$, 0.01 to 0.3% of $C_2H_4$, and $H_2$ as balance Reaction atmosphere temperature: 750 to 900° C.

Reaction atmosphere pressure: 3 to 13 kPa

Figure 10:
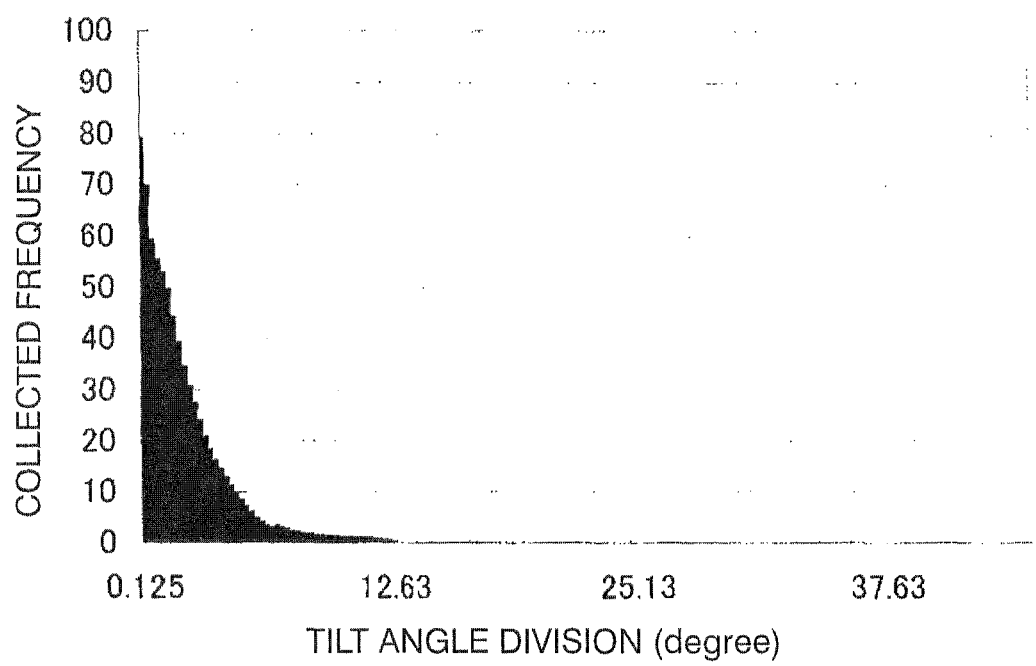
FIG. 10 is a tilt angle frequency distribution graph of the (0001) plane of a reformed α-type $Al_2O_3$ layer which constitutes an intermediate layer of the hard coating layer of the coated tool C14 of the present invention.

In this case, it is desirable that the $Al_2O_3$ neclear is an $Al_2O_3$ neclear thin film having a mean layer thickness of 20 to 200 nm. Subsequently, the $Al_2O_3$ neclear thin film is heat treated in a condition where the reaction atmosphere is substituted to a hydrogen atmosphere of pressure: 3 to 13 kPa, and the reaction atmosphere temperature is increased to 1100 to 1200° C. Then, the α-type $Al_2O_3$ layer, which serves as the hard coating layer, is formed under a conventional condition. The resulting reformed α-type $Al_2O_3$ layer (hereinafter referred to as a reformed α-type $Al_2O_3$ layer), which is vapor-deposited on the heat-treated neclear thin film, is analyzed with a field emission type scanning electron microscope as schematically represented in FIGS. 1A and 1B. In the analysis, individual crystal grains having a hexagonal crystal lattice present within the measurement range of a polished surface, are irradiated by an electron beam. Then, a tilt angle, which is the angle formed between the normal line to the (0001) plane of the crystal grain and the normal line to the polished surface of the cutting tool, is measured. The measured tilt angles belonging to a range of 0 to 45° are sectioned every pitch of 0.25°, and the frequencies existing in each section are collected, being represented by a tilt angle frequency distribution graph. As shown in FIG. 10, as an example, a sharp highest peak appears at a specific section of the tilt angle. Based on trial findings, it was found that the highest peak falls inside a tilt angle division ranging 0 to 10° and the total sum of frequencies existing in the range of 0 to 10° occupies a ratio of 45% or more of the total frequencies in the tilt-angle frequency distribution graph, when the atmosphere pressure of the chemical vapor deposition apparatus is kept between 5 and 8 KPa. The fact that the total sum of frequencies existing in the range of 0 to 10° occupies a ratio of 45% or more of the total frequencies, means that ratio of the (0001) plane orientation is high. This reformed α-type $Al_2O_3$ layer whose highest peak of the tilt angle division appears within the range of 0 to 10° in the tilt-angle frequency distribution graph has superior high-temperature strength compared to the conventional α-type $Al_2O_3$ layer of the conventional coated cutting tool 1. This reformed α-type $Al_2O_3$ also has excellent high-temperature hardness and heat resistance, as the conventional α-type $Al_2O_3$ layer of the conventional coated cutting tool 1 does.

(b) Forming the hard coating layer is further proceeded on the reformed α-type $Al_2O_3$ layer described above, as the intermediate layer. A Zr-containing aluminum oxide layer having an α-type crystal structure in a chemically vapor-deposited state is vapor-deposited on the intermediate layer as the upper layer. In this way, the lower layer composed of the Ti compound layer, the intermediate layer composed of the reformed α-type $Al_2O_3$ layer, and the upper layer composed of the Zr-containing aluminum oxide layer are vapor-deposited as a hard coating layer on the surface of the tool substrate. The coated cutting tool with the configuration described above has even more superior high-temperature strength and surface properties. The coated cutting tool exerts excellent chipping resistance and abrasion resistance, even under high-speed intermittent cutting conditions where high heat is generated and the cutting edges are subjected to intermittent impact loading repeatedly.

(c) The Zr-containing aluminum oxide layer can be formed on the reformed α-type $Al_2O_3$ layer, under the following conditions. First, as a first step, first-step vapor deposition is performed for 1 hour under the following conditions (i) to (iii).

(i) Composition of reaction gas (vol. %):
1 to 5% of $AlCl_3$
0.05 to 0.1% of $ZrCl_4$
2 to 6% of $CO_2$
1 to 5% of HCl
0.25 to 0.75% of $H_2S$
$H_2$ as balance (ii) Reaction atmosphere temperature: 1020 to 1050° C.
(iii) Reaction atmosphere pressure: 3 to 5 kPa Next, as a second step, vapor deposition is performed under the following conditions (i) to (iii).

(i) Composition of reaction gas (vol. %):
6 to 10% of $AlCl_3$
0.6 to 1.2% of $ZrCl_4$
4 to 8% of $CO_2$
3 to 5% of HCl
0.25 to 0.6% of $H_2S$
$H_2$ as balance (ii) Reaction atmosphere temperature: 920 to 1000° C.
(iii) Reaction atmosphere pressure: 6 to 10 kPa By following the steps described above, a Zr-containing aluminum oxide layer (hereinafter referred to as a reformed AlZrO layer), which has an α-type crystal structure in a chemically vapor-deposited state, can be formed. The reformed AlZrO layer has a mean layer thickness of 2 to 15 μm, and the content ratio of the Zr component to the total amount of the Al component is 0.002 to 0.01 (as atomic ratio).

(d) When the texture of the reformed AlZrO layer is observed by the emission type scanning electron microscope, a flat-plate polygonal shape of a large-sized grain can be seen within a plane perpendicular to the layer thickness direction as shown in FIG. 11A. When the reformed AlZrO layer is observed in the plane parallel to the layer thickness direction as shown in FIG. 11B, it can be seen that the outer surface of the reformed AlZrO layer is substantially flat, and the reformed AlZrO layer has a texture made of the grains whose shapes are elongated in the layer thickness direction (hereinafter, the shape of the crystal grain described above is referred a flat-plate polygonal vertically elongated shape).

When the vapor deposition of the reformed AlZrO layer is performed under further limited conditions, the texture exemplified in FIG. 11C is formed. In the further limited condition, the volume % of $H_2S$ is set 0.50 to 0.75, and the reaction atmosphere temperature 1020 to 1030° C. in the first step vapor deposition, and the volume % of $ZrCl_4$ is set 0.6 to 0.9, the volume % of $H_2S$ 0.25 to 0.4, and the reaction atmosphere temperature 960 to 980° C. in the second step vapor deposition, for example. As shown in FIG. 11C, when the reformed AlZrO layer is formed by the further limited condition, and is seen within the plane perpendicular to the layer thickness direction, the large-sized grains with a flat hexagonal shape are observed. When the reformed AlZrO layer is seen within the plane parallel to the layer thickness direction, it can be seen that the outer surface of the reformed AlZrO layer is substantially flat, as shown in FIG. 11B. In addition, the grains that have the elongated shape within the plane parallel to the layer thickness direction, account for 35% or more in area ratio, in the whole surface area perpendicular to the thickness direction of the layer.

(e) As in the reformed α-type $Al_2O_3$ layer, the reformed AlZrO layer is analyzed with the field-emission-type scanning electron microscope. In the analysis, individual crystal grains having a hexagonal crystal lattice present within the measurement range of a polished surface, are irradiated by an electron beam. Then, a tilt angle, which is the angle formed between the normal line to the (0001) plane of the crystal grain and the normal line to the polished surface of the cutting tool, is measured. The measured tilt angles belonging to a range of 0 to 45° are sectioned every pitch of 0.25°, and the frequencies existing in each section are collected, being represented by a tilt angle frequency distribution graph. In the tilt-angle frequency distribution graph, a sharp highest peak appears at a specific section of the tilt angle, and the total sum of frequencies existing in the range of 0 to 10° occupies a ratio of 60% or more of the total frequencies. This means that the reformed AlZrO layer with high (0001) plane orientation ratio is formed. The (0001) plane orientation ratio of the reformed AlZrO layer is higher than that of the conventional AlZrO layer of the conventional coated cutting tool, resulting even more superior high-temperature strength of the reformed AlZrO layer.

Figure 12:
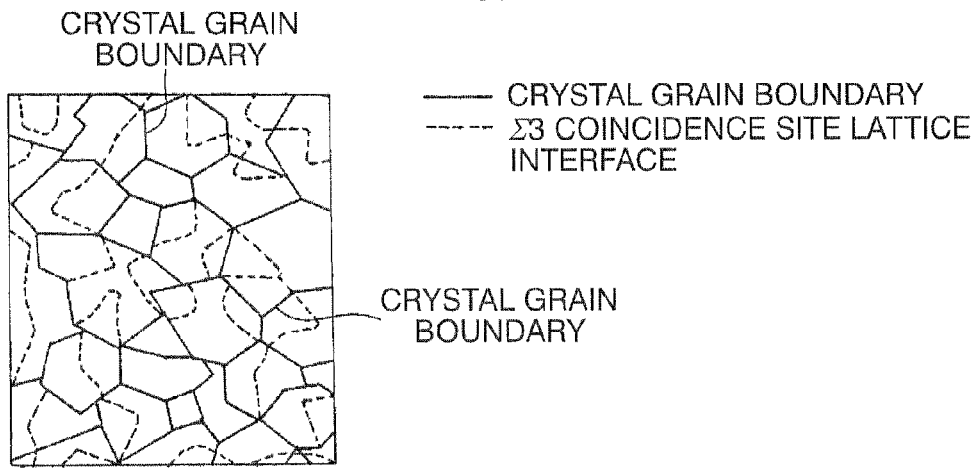
FIG. 12 is a grain boundary analysis view in the plane perpendicular to the layer thickness direction, which is obtained by measuring the upper layer composed of the reformed AlZrO layer of the coated tool C1 of the present invention, using the field-emission-type scanning electron microscope and the electronic backscattering diffraction image apparatus, showing a flat-plate polygonal grain boundary observed by the field-emission-type scanning electron microscope in a solid line, and showing a Σ3 coincidence site lattice interface within the crystal grain measured by the electronic backscattering diffraction image apparatus in a broken line.

(f) In addition, the reformed AlZrO layer is analyzed by the field-emission-type scanning electron microscope and an electronic backscattering diffraction image apparatus. In the analysis, individual crystal grains having a hexagonal crystal lattice present within the measurement range of a polished surface, are irradiated by an electron beam. Then, a tilt angle, which is the angle formed between the normal line to the (0001) plane of the crystal grain and the normal line to the polished surface of the cutting tool, is measured. Based on the measurement results, a crystallographic orientation relationship between the adjacent crystal lattices is calculated, and a distribution of lattice points (constituent atom sharing lattice points) is calculated. The constituent atom sharing lattice point is a lattice point that has a constituent atom shared by two crystal lattices forming the grain boundary at the grain boundary. A constituent atom sharing lattice point type in which N lattice points not sharing the constituent atom exist between the constituent atom sharing lattice points (where N is an even number of 2 or more in view of a crystal structure of corundum type hexagonal close packed crystal but does not include even numbers of 4, 8, 14, 24, and 26 when the upper limit of N is set to 28 in view of distribution frequency) is expressed as ΣN+1. When the reformed AlZrO layer is observed by the field-emission-type scanning electron microscope, it is seen that the reformed AlZrO layer includes the crystal grains with the flat-plate polygonal vertically elongated shape, as shown in FIG. 12. Among the crystal grains with the flat-plate polygonal vertically elongated shape, 60% or more of them are divided by at least one of crystal lattice interface with the constituent atom sharing lattice point type expressed by Σ3 (hereinafter referred as a Σ3 coincidence site lattice interface) inside.

(h) As described above, the upper layer composed of the reformed AlZrO layer has a high (0001) plane orientation rate, and a crystal plane at the surface thereof has the same orientation as a crystal plane (for example, (0001)) within the plane perpendicular to the layer thickness direction of this layer. Thus, outer surface of the upper layer is formed in the shape of a flat plate which is substantially flat (as seen within the plane parallel to the layer thickness direction), and shows excellent chipping resistance due to the surface properties thereof. Furthermore, the strength within the crystal grains is increased since the Σ3 coincidence site lattice interfaces are present inside the grains with the flat-plate polygonal vertically elongated shape. Therefore, the reformed AlZrO layer has excellent high-temperature hardness and high-temperature strength and shows excellent chipping resistance, compared to the conventional AlZrO layer.

(i) Accordingly, as the hard coating layer, the coated tool of the present invention includes the reformed α-type $Al_2O_3$ layer having a high (0001) plane orientation rate and having excellent high-temperature strength as the intermediate layer. Furthermore, the coated tool of the present invention includes the reformed AlZrO layer having excellent high-temperature hardness, high-temperature strength, and surface properties as the upper layer. The coated tool of the present invention has superior high-temperature hardness, heat resistance, and high-temperature strength as compared to the conventional coated tools 1 and 2. As a result, it exhibits excellent chipping resistance and abrasion resistance for a long-term use, even when the coated tool is used for high-speed intermittent cutting accompanied by high heat generation, and intermittent impact loading acts repeatedly on the cutting edge, against a high hardness steel. The present invention has been made on the basis of the above knowledge, and the surface-coated cutting tool of the present invention includes the following configurations.

(1) Provided is a surface-coated cutting tool formed by vapor-depositing, on the surface of a tool substrate made of tungsten carbide-based cemented carbide or titanium carbonitride-based cermet, a hard coating layer including the following (a) to (c).

(a) The lower layer is a Ti compound layer composed of one or more of a titanium carbide layer, a titanium nitride layer, a titanium carbonitride layer, a titanium carboxide layer, and a titanium oxycarbonitride layer, all of which are formed by chemical vapor deposition, and having a total mean layer thickness of 3 to 20 μm.

(b) The intermediate layer is an aluminum oxide layer having a mean layer thickness of 1 to 5 μm and having an α-type crystal structure in a chemically vapor-deposited state.

(c) The upper layer is a Zr-containing aluminum oxide layer having a mean layer thickness of 2 to 15 μm and having an α-type crystal structure in a chemically vapor-deposited state.

The intermediate layer (b) has properties indicated by a tilt-angle frequency distribution graph in which the highest peak exists in a tilt angle division ranging 0 to 10° and the total sum of frequencies existing in the range of 0 to 10° occupies a ratio of 45% or more of the total frequencies in the tilt-angle frequency distribution graph. The tilt-angle frequency distribution graph is obtained by utilizing a field-emission-type scanning electron microscope. Electron beams are irradiated to individual crystal grains, which has a hexagonal crystal lattice and exists in a measurement range of a polished plane. A tilt angle formed by the normal line to the polished plane and the normal line to (0001) plane as a crystal plane of the crystal grains is measured. The measured tilt angles belonging to a range of 0 to 45° every pitch of 0.25° are sectioned. The frequencies existing in each section are collected.

When the texture of the upper layer of the above (c) is observed by the emission type scanning electron microscope, the upper layer is a Zr-containing aluminum oxide layer having a texture composed of crystal grains which have a flat-plate polygonal shape within the plane perpendicular to the layer thickness direction and have an elongated shape in the layer thickness direction within the plane parallel to the layer thickness direction.

The upper layer (c) has properties indicated by a tilt-angle frequency distribution graph in which the highest peak exists in a tilt angle division ranging 0 to 10° and the total sum of frequencies existing in the range of 0 to 10° occupies a ratio of 60% or more of the total frequencies in the tilt-angle frequency distribution graph. The tilt-angle frequency distribution graph is obtained by utilizing a field-emission-type scanning electron microscope. Electron beams are irradiated to individual crystal grains, which has a hexagonal crystal lattice and exists in a measurement range of a polished plane. A tilt angle formed by the normal line to the polished plane and the normal line to (0001) plane as a crystal plane of the crystal grains is measured. The measured tilt angles belonging to a range of 0 to 45° every pitch of 0.25° are sectioned. The frequencies existing in each section are collected.

Moreover, the upper layer (c) is a Zr-containing aluminum oxide layer consisted of crystal grains, 60% or more of the grains being divided within each grain by at least one or more crystal lattice interfaces with a constituent atom sharing lattice point type expressed by Σ3. The constituent atom sharing lattice point type is expressed as ΣN+1, where "N" represents a number of lattice points (N) without a shared constituent atom between the constituent atom sharing lattice points. The constituent atom sharing lattice point type is even numbers more than 2 between crystal grains having a corundum type hexagonal close-packed structure. If the maximum number of N is set to 28 in view of distribution frequency, even numbers 4, 8, 14, 24, and 26 are excluded from the option for crystal grains having hexagonal close-packed structure. To obtain data related to the constituent atom sharing lattice point type, first, electron beams are irradiated to individual crystal grains within the measurement area on the polished surface with field-emission-type scanning electron microscope and an electron backscatter diffraction imaging device. Then, angles formed by normal lines of crystal lattice faces with hexagonal crystal lattices and the normal line to the polished surface are measured. Then, based on the measurement, a crystallographic orientation relationship between the adjacent crystal lattices is calculated. Then, a distribution of lattice points (constituent atom sharing lattice points) in which constituent atoms of a crystal lattice interface sharing one constituent atom between the crystal lattices is calculated. Then, finally, "N" representing a number of lattice points (N) without a shared constituent atom between the constituent atom sharing lattice points, is obtained.

(2) When the texture of the upper layer (c) of the surface-coated cutting tool described above (as (1)) is observed by the emission type scanning electron microscope, crystal grains corresponding to 35% or more of the whole surface area perpendicular to the layer thickness direction, has a flat-plate polygonal shape within the plane perpendicular to the layer thickness direction and an elongated shape in the layer thickness direction within the plane parallel to the layer thickness direction.

(3) The surface roughness (Ra) of the upper layer (c) in the cutting tool described above (as (1) and (2)) ranges from 0.05 to 0.3 μm.

The configuration of the hard coating layer of the coated tool of this embodiment will be described below in more detail.

(a) Ti Compound Layer (Lower Layer 12A)

The lower layer 12A is a Ti compound layer composed of one more of titanium carbide (hereinafter, referred to as TiC) layer, a titanium nitride (hereinafter, referred to as TiN) layer, a titanium carbonitride (hereinafter, referred to as TiCN) layer, a titanium carboxide (hereinafter, referred to as TiCO) layer, and a titanium oxycarbonitride (hereinafter, referred to as TiCNO) layer. The lower layer 12A is basically present as a lower layer of the reformed α-type $Al_2O_3$ layer which is the intermediate layer. It has superior toughness and abrasion resistance, contributing to improve high-temperature strength of the hard coating layer. In addition, the lower layer 12A adheres tightly to both the tool substrate and the reformed α-type $Al_2O_3$ layer, contributing an adhesive property of the hard coating layer to the tool substrate. If the total mean layer thickness is less than 3 μm, the improvements described above cannot be sufficiently obtained. On the other hand, if the total mean layer thickness exceeds 20 μm, thermal plastic deformation occurs easily, particularly when the cutting tool is used under high-speed intermittent cutting conditions where an intermittent and blasting high loads are subjected on the cutting edge. Thermal plastic deformation causes uneven wear of the cutting tool. Accordingly, the total mean layer thickness is set to 3 to 20 μm.

(b) Reformed α-Type $Al_2O_3$ Layer (Intermediate Layer 12B)

In order to form the reformed α-type $Al_2O_3$ layer, which constitutes the intermediate layer 12B, as already described, an $Al_2O_3$ neclear is formed on the surface of the Ti compound layer, which is the lower layer, under the following low-temperature conditions.

A normal chemical vapor deposition apparatus is used. Composition of reaction gas includes 3 to 10% of $AlCl_3$, 0.5 to 3% of $CO_2$, 0.01 to 0.3% of $C_2H_4$ in vol. %, and $H_2$ as balance. Reaction atmosphere temperature is set at 750 to 900° C. Reaction atmosphere pressure is set at 3 to 13 kPa.

It is desirable that the $Al_2O_3$ neclear is an $Al_2O_3$ neclear thin film having a mean layer thickness of 20 to 200 nm. After the formation of the $Al_2O_3$ neclear, the reaction atmosphere is substituted with a hydrogen atmosphere with pressure of 3 to 13 kPa. Then, temperature of the reaction atmosphere is increased to 1100 to 1200° C. and the $Al_2O_3$ neclear thin film is heat treated. An α-type $Al_2O_3$ layer, which serves as the hard coating layer, is formed under normal conditions. By following steps described above, an α-type $Al_2O_3$ layer is vapor deposited on the heat-treated $Al_2O_3$ neclear thin film, resulting formation of the intermediate layer.

The reformed α-type $Al_2O_3$ layer vapor deposited on the lower layer 12A is analyzed by the field-emission-type scanning electron microscope, as shown in FIGS. 1A and 1B. Electron beams are irradiated to the individual grains, which has a hexagonal crystal lattice and exists in a measurement range of a polished plane. A tilt angle formed by the normal line to the polished plane and the normal line to (0001) plane as a crystal plane of the crystal grains is measured. The measured tilt angles belonging to a range of 0 to 45° every pitch of 0.25° are sectioned. The frequencies existing in each section are collected and a tilt-angle frequency distribution graph is plotted. In the tilt-angle frequency distribution graph, the sharp highest peak exists in a tilt angle division ranging 0 to 10°, as shown in FIG. 10.

The highest peak position of the measured tilt angles in the tilt angle frequency distribution graph of the reformed α-type $Al_2O_3$ layer can be changed by performing heat-treatment after the formation of the $Al_2O_3$ neclear (thin film) with a predetermined layer thickness. In addition, the total sum of frequencies existing in the range of 0 to 10° occupies a ratio of 60% or more of the total frequencies in the tilt-angle frequency distribution graph (which means the (0001) plane orientation rate is high). Accordingly, whenever the thickness of the $Al_2O_3$ neclear (thin film) becomes too thin or too thick, the position of the highest peak of the measured tilt angles moves out of the range of 0 to 10°. In addition, the total sum of frequencies existing in the range of 0 to 10° becomes less than a ratio of 60% of the total frequencies in the tilt-angle frequency distribution graph. As a result, excellent high-temperature strength cannot be obtained.

The reformed α-type $Al_2O_3$ layer has superior high-temperature strength in addition to the excellent high-temperature hardness and heat resistance of the α-type $Al_2O_3$ layer of the conventional coated tool. Furthermore, by configuring the reformed α-type $Al_2O_3$ layer as an intermediate layer with a high (0001) plane orientation rate, the (0001) plane orientation rate of the reformed AlZrO layer vapor-deposited thereon can be increased. As a result, the surface properties of an upper layer composed of the reformed AlZrO layer can be improved, and high-temperature strength can be improved.

If the mean layer thickness of the intermediate layer composed of the reformed α-type $Al_2O_3$ layer is less than 1 μm, the hard coating layer cannot be provided with the above characteristics of the reformed α-type $Al_2O_3$ layer. On the other hand, if the mean layer thickness exceeds 5 μm, high temperature generated during cutting and an intermittent and blasting high load subjected to the cutting edge leads to a higher rate of occurrence of thermal plastic deformation, which causes uneven wear of the cutting tool. As a result, the cutting tool is abrased faster. Thus, the mean layer thickness is set to 1 to 5 μm.

(c) Reformed AlZrO Layer (Upper Layer 12C)

As for the upper layer 12C composed of the reformed AlZrO layer chemically vapor-deposited on the intermediate layer 12B, an Al component which is a constituent component of the upper layer improves the high-temperature hardness and heat resistance of the layer. An extremely small amount (Zr/(Al+Zr) is 0.002 to 0.01 (as an atomic ratio) in a ratio accounted for in the total amount with Al) of Zr component contained in the upper layer improves the crystal grain boundary strength of the reformed AlZrO layer, and contributes to improving the high-temperature strength of the upper layer. If the content ratio of the Zr component in the upper layer is less than 0.002, the above functions cannot be obtained. On the other hand, if the content ratio of the Zr component exceeds 0.01, the grain boundary strength deteriorates as $ZrO_2$ grains precipitate in the layer. Therefore, it is desirable that the content ratio of the Zr component (the value of the ratio of Zr/(Al+Zr)) in the upper layer accounted for in the total amount with the Al component is 0.002 to 0.01 (as an atomic ratio).

The reformed AlZrO layer can be vapor-deposited by adjusting chemical vapor deposition conditions of the composition of a reaction gas during vapor deposition, the reaction atmosphere temperature, and the reaction atmosphere pressure as follows, for example.

First, the first-step vapor deposition is performed for 1 hour under the following conditions:
   (i) Composition of reaction gas (vol. %):
     1 to 5% of $AlCl_3$,
     0.05 to 0.1% of $ZrCl_4$,
     2 to 6% of $CO_2$,
     1 to 5% of HCl,
     0.25 to 0.75% of $H_2S$, and
     $H_2$ as balance,
   (ii) Reaction atmosphere temperature: 1020 to 1050° C., and
   (iii) Reaction atmosphere pressure: 3 to 5 kPa, Second, the second-step vapor deposition is performed under the following conditions.
   (i) Composition of reaction gas (vol. %):
     6 to 10% of $AlCl_3$,
     0.6 to 1.2% of $ZrCl_4$,
     4 to 8% of $CO_2$,
     3 to 5% of HCl,
     0.25 to 0.6% of $H_2S$, and
     $H_2$ as balance,
   (ii) Reaction atmosphere temperature: 920 to 1000° C., and
   (iii) Reaction atmosphere pressure: 6 to 10 kPa.

When a vapor deposition layer with a mean layer thickness of 1 to 15 μm is formed as a film, by performing the first-step and the second-step vapor deposition in the conditions described above, the reformed AlZrO layer whose ratio of Zr/(Al+Zr) is 0.002 to 0.01 in atomic ratio, is formed.

When the reformed AlZrO layer is observed by the emission type scanning electron microscope, the textures shown in FIGS. 11A and 11B are observed. In FIG. 11A, the reformed AlZrO layer is viewed within the plane perpendicular to the layer thickness direction. In FIG. 11A, the texture containing large crystal grains with a flat-plate polygonal shape is formed. In FIG. 11B, the reformed AlZrO layer is viewed within the plane parallel to the layer thickness direction. In FIG. 11B, the outer surface of the reformed AlZrO layer is substantially flat. Also, the texture containing crystal grains with elongated shape is formed (Referred as a flat-plate polygonal elongated shape crystal grain).

As for the reformed AlZrO layer, similarly to the reformed α-type $Al_2O_3$ layer, which constitutes the intermediate layer, the tilt angle of the normal line to the (0001) plane to the normal line to a polished surface is measured and a tilt angle frequency graph is plotted. In the tilt angle frequency graph of the reformed AlZrO layer, a peak exists in a tilt angle division ranging 0 to 10° and the total sum of frequencies existing in the range of 0 to 10° occupies a ratio of 60% or more of the total frequencies in the tilt-angle frequency distribution graph. These results indicate that the (0001) plane orientation rate of the reformed AlZrO layer, which constitutes the upper layer, is high.

That is, as for the reformed AlZrO layer, since the (0001) plane orientation rate of the reformed α-type $Al_2O_3$ layer, which is the intermediate layer, is 45% or more, the reformed AlZrO layer is also formed as a layer having a high (0001) plane orientation rate (the (0001) plane orientation rate is 60% or more).

When the upper layer is viewed within the plane parallel to the layer thickness direction, the outer surface of the upper layer is formed in the shape of a substantially flat plate. Thus, the upper layer has a excellent surface property. Consequently, the upper layer shows superior chipping resistance as compared to the conventional AlZrO layer.

When the vapor deposition of the reformed AlZrO layer is performed under further limited conditions (for example, the conditions where a volume percentage of $H_2S$ in the reaction gas are 0.50 to 0.75 and the reaction atmosphere temperature is set to 1020 to 1030° C. in the first-step vapor deposition, and volume percentages of $ZrCl_4$ and $H_2S$ in the reaction gas are 0.6 to 0.9 vol. % and 0.25 to 0.4, respectively, and the reaction atmosphere temperature is set to 960 to 980° C., in the second-step vapor deposition), the texture shown in FIG. 11C is formed. In the texture, when it is viewed within the plane perpendicular to the layer thickness direction, there are large-sized crystal grains with a flat-plate hexagonal shape. When the texture is viewed within the plane parallel to the layer thickness direction, the outer surface of the upper layer is substantially flat and the crystal grains have an elongated shape stretched in the layer thickness direction, as shown in FIG. 11B. The ratio of the surface area occupied by the crystal grains having the flat-plate hexagonal elongated shape, to the whole surface area of the plane parallel to the layer thickness direction, accounts for 35% or more, in the upper layer formed in the further limited conditions.

The reformed AlZrO layer is analyzed with a field-emission-type scanning electron microscope and the electronic backscattering diffraction image apparatus. In the analysis, electron beams are irradiated to individual crystal grains within the measurement range of the polished surface. Then, angles between the normal line to each of crystal lattice planes with a hexagonal crystal lattice and the normal line to the polished surface are measured. From the measurement results, the crystal orientation relationship between adjacent crystal lattices is calculated. Then, distribution of lattice points (constituent atom sharing lattice points) is calculated. The constituent atom sharing lattice point is a lattice point that has a constituent atom shared by two crystal lattices forming the grain boundary at the grain boundary. A constituent atom sharing lattice point configuration is expressed by $\Sigma N+1$, where the number represented by N is the number of lattice points that have no constituent atom shared at the grain boundary between two constituent atom sharing lattice points with constituent atoms. The constituent atom sharing lattice point type is even numbers more than 2 between crystal grains having a corundum type hexagonal close-packed structure. If the maximum number of N is set to 28 in view of distribution frequency, even numbers 4, 8, 14, 24, and 26 are excluded from the option for crystal grains having hexagonal close-packed structure. As shown in FIG. 12, the crystal grains of the reformed AlZrO layer are divided by at least one of Σ3 coincidence site lattice interface within each crystal grain. The ratio of surface area occupied by the crystal grains that have the flat-plate polygonal elongated shape and divided by at least one of Σ3 coincidence site lattice interface, to the surface area occupied by crystal grains with the flat-plate polygonal elongated shape (including the flat-plate hexagonal elongated shape), is 60% or more.

The strength within the crystal grains of the reformed AlZrO layer is increased due to the presence of the Σ3 coincidence site lattice interface in the crystal grains with the flat-plate polygonal (including hexagonal) elongated shape. As a result, cracking of the reformed AlZrO layer is suppressed during high-speed intermittent cutting work where high load is subjected to the reformed AlZrO layer, against a high hardness steel. Even if the cracking occurred, growth and spreading of the cracking would be prevented. Therefore, chipping resistance, fracture resistance, and spalling resistance are improved in the cutting tool having the reformed AlZrO layer.

Accordingly, the upper layer of the present invention, which has a high (0001) plane orientation rate, has flat surface properties, and is composed of the reformed AlZrO layer in which the Σ3 coincidence site lattice interfaces are present with in the flat-plate polygonal (including flat hexagonal) elongated crystal grains, exhibits excellent chipping resistance and abrasion resistance for a prolonged period of time without causing chipping, fracture, spalling, or the like and also without causing thermal plastic deformation, uneven wear, or the like, even in high-speed intermittent cutting work against a high hardness steel accompanied by high heat generation and intermittent and blasting high loads subjected on the cutting edge.

If the layer thickness of the upper layer composed of the reformed AlZrO layer is less than 2 μm, the excellent characteristics of the upper layer cannot be sufficiently exhibited. On the other hand, if the layer thickness of the upper layer exceeds 15 μm, thermal plastic deformation, which causes uneven wear, easily occurs. In addition, a rate of occurrence of chipping is also increased. Therefore, the mean layer thickness of the upper layer is set to 2 to 15 μm.

Figure 13A:
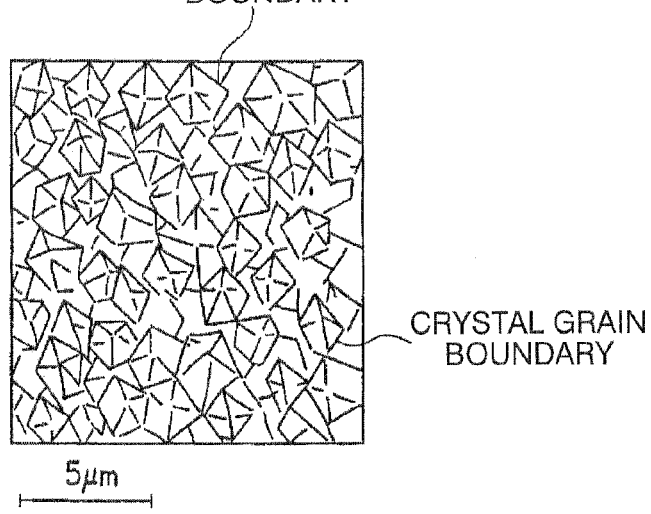
FIG. 13A is a schematic view showing a polygonal crystal grain structure obtained by observing an upper layer composed of a conventional AlZrO layer of the comparative coated tool C1, using the field-emission-type scanning electron microscope in the plane perpendicular to the layer thickness direction.
Figure 13B:
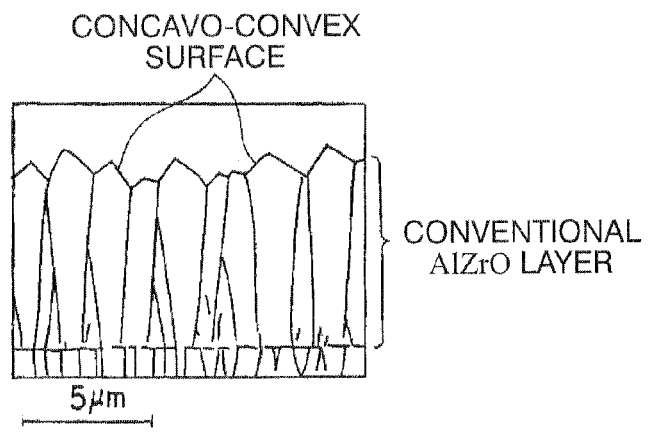
FIG. 13B is a schematic view showing a crystal grain structure having pyramidal concaves and convexes on the layer surface and having an elongated shape in the layer thickness direction, which is obtained by observation using the field-emission-type scanning electron microscope in the plane parallel to the layer thickness direction.

As a comparison, the conventional AlZrO layer (the layer described in the PTL 3), was analyzed by the field-emission-type scanning electron microscope and the electronic backscattering diffraction image apparatus. In the analysis, the texture of crystal grains and the constituent atom sharing lattice point configuration of the conventional AlZrO layer were analyzed. The texture of the crystal grains of the conventional AlZrO layer is shown in FIGS. 13A and 13B. As shown in FIGS. 13A and 13B, the texture of the crystal grains of the conventional AlZrO layer is made of pyramidal-shaped crystal grains with a polygonal elongated shape stretched to the layer thickness direction. The outer surface of the conventional AlZrO layer has protuberances and recesses along with the pyramidal shape of the crystal grains. Because of these, the abrasion resistance of the conventional AlZrO layer is inferior compared to that of the reformed AlZrO layer. In terms of the constituent atom sharing lattice point configuration, the ratio of surface area occupied by the pyramidal-shaped crystal grains, which have a polygonal elongated shape stretched to the layer thickness direction and contain a Σ3 coincidence site lattice interface within, to the surface area occupied by crystal grains, which consist the conventional AlZrO layer and have the convexoconcave polygonal elongated shape stretched to the layer thickness direction, is 40% or less. Therefore, the strength within the crystal grains is not improved as in the reformed AlZrO layer.

Accordingly, the conventional coated tool in which the upper layer of the hard coating layer is composed of the conventional AlZrO layer cannot prevent occurrence of chipping, fracture, spalling, or the like, in high-speed intermittent cutting work accompanied by high heat generation and intermittent impact loading subjected on the cutting edge. Thus, thermal deformation and uneven wear occur easily in the conventional coated tool with the conventional AlZrO layer. Therefore the conventional cutting tool with the conventional AlZrO layer is inferior compared to the one with reformed AlZrO layer, in tool performance.

In the coated tool of the present invention, after the reformed AlZrO layer of the upper layer is formed, polishing processing using a grind stone or polishing processing using wet blasting can be performed on the surface of the upper layer, so that the surface roughness of the reformed AlZrO layer can be further adjusted. For example, the occurrence of welding to the surface-coated tool during cutting can be suppressed by adjusting the surface roughness of the reformed AlZrO layer to Ra 0.05 to 0.3 μm.

The surface roughness Ra in the present invention means the value of arithmetic mean roughness Ra defined by JIS B0601 (1994), and the measuring method thereof is not particularly limited.

Fourth Embodiment (a) As for the Cr-containing aluminum oxide layer (hereinafter referred to as a conventional AlTiO layer) in the above conventional coated tool, a Cr-containing $Al_2O_3$ neclear is formed on the surface of a Ti compound layer which is a lower layer, for example, using the normal chemical vapor deposition apparatus under the following conditions:
Composition of reaction gas: in vol. %, 0.05 to 0.2% of $H_2S$
2.3 to 4% of $AlCl_3$,
0.04 to 0.26% of $CrCl_3$,
6 to 8% of $CO_2$,
1.5 to 3% of HCl,
0.05 to 0.2% of $H_2S$, and
$H_2$ as balance,
Reaction atmosphere temperature: 750 to 900° C., and
Reaction atmosphere pressure: 6 to 10 kPa.

It is desirable that the Cr-containing $Al_2O_3$ neclear is a neclear thin film with a mean layer thickness of 20 to 200 nm (0.02 to 0.2 μm), and the content ratio of Cr accounted for in the total amount with Al (Cr/(Al+Cr)) satisfies 0.01 to 0.1 (as an atomic ratio). Subsequently, the Cr-containing $Al_2O_3$ neclear thin film is heat-treated under conditions where the heating atmosphere temperature is increased to 1100 to 1200° C. in a hydrogen atmosphere of pressure: 6 to 10 kPa.

Next, under the following conditions:
Composition of reaction gas: in vol. %,
2.3 to 4% of $AlCl_3$,
0.04 to 0.26% of $CrCl_3$,
6 to 8% of $CO_2$,
1.5 to 3% of HCl,
0.05 to 0.2% of $H_2S$, and
$H_2$ as balance,
Reaction atmosphere temperature: 1020 to 1050° C., and
Reaction atmosphere pressure: 6 to 10 kPa,
the conventional Cr-containing $Al_2O_3$ layer is vapor-deposited, similarly, by forming a Cr-containing $Al_2O_3$ layer (it is desirable that the content ratio (Cr/(Al+Cr)) of Cr accounted for in the total amount with Al satisfies 0.01 to 0.1 in atomic ratio).

The conventional Cr-containing $Al_2O_3$ has a properties indicated by a tilt-angle frequency distribution graph in which the highest peak exist in a tilt angle division ranging 0 to 10° and the sum of frequencies existing in the range of 0 to 10° occupies a ratio of 45% or more of the total frequencies in the tilt-angle distribution graph as shown in FIG. 14 as an example (this sum of the frequencies and the height of the highest peak are in a proportional relation), the tilt angle frequency distribution graph being obtained by utilizing a field-emission-type scanning electron microscope as shown in schematic explanatory views in FIGS. 1A and 1B, irradiating electron beams to individual crystal grains with a hexagonal crystal lattice existing in a measurement range of a polished surface of the tool substrate, measuring a tilt angle formed by the normal line to the polished surface and the normal line to (0001) plane as a crystal plane of the crystal grains, sectioning the measured tilt angles belonging to a range of 0 to 45° every pitch of 0.25°, and collecting the frequencies existing in each section.

The conventional Cr-containing $Al_2O_3$ layer has excellent high-temperature hardness, heat resistance, and high-temperature strength and is excellent in mechanical thermal shock resistance. Therefore, when this layer is vapor-deposited as the upper layer of the hard coated layer, the layer exhibits excellent chipping resistance even in high-speed intermittent cutting work accompanied by mechanical thermal shock.

However, as described also in the section "Technical Problem", when the conventional coated tool in which the conventional Cr-containing $Al_2O_3$ is formed as an upper layer of a hard coating layer is used, for example, for high-speed heavy cutting work of difficult-to-cut materials, such as stainless steel or ductile cast iron, that is, high-speed heavy cutting work accompanied by high heat generation, and high load of a high feed rate and a high depth of cut acts on the cutting edge, the high-temperature strength and surface properties of the hard coating layer cannot be satisfied. Therefore, there is a problem in that chipping (fine chipping) easily occurs at the cutting edge.

Thus, by vapor-depositing, as an intermediate layer, an aluminum oxide layer (hereinafter referred to as a reformed $Al_2O_3$ layer) having an α-type crystal structure with a high (0001) plane orientation rate in which, in a tilt angle frequency distribution graph, the highest peak appears within a range of 0 to 10 degrees, and the total sum of the frequencies present within a range of 0 to 10 degrees accounts for the ratio of 45% or more of the total frequency in the tilt angle frequency distribution graph, on the lower layer of the conventional coated tool, and by vapor-depositing, as an upper layer, a Cr-containing Al$_2$O$_3$ layer (hereinafter referred to as a reformed Cr-containing Al$_2$O$_3$ layer) with increased crystal grain boundary strength, on this reformed Al$_2$O$_3$ layer, thereby forming the structure of a hard coating layer as the three-layer structure of the lower layer, intermediate layer, and upper layer, the present inventors have found out that a coated tool, capable of forming a hard coating layer having excellent high-temperature strength and surface properties and including a hard coating layer having excellent high-temperature strength and surface properties, exhibits excellent tool characteristics for a long-term use without causing chipping (fine chipping) at the cutting edge even when being used high-speed heavy cutting work of difficult-to-cut materials, such as stainless steel and ductile cast iron.

This invention has been made on the basis of the above knowledge, and provides a surface-coated cutting tool formed by vapor-depositing, (1) on the surface of a tool substrate made of tungsten carbide-based cemented carbide or titanium carbonitride-based cermet, a hard coating layer including the following layers (a) to (c):

(a) A lower layer is a Ti compound layer composed of one or more a titanium carbide layer, a titanium nitride layer, a titanium carbonitride layer, a titanium carboxide layer, and a titanium oxycarbonitride layer, all of which are formed by chemical vapor deposition, and having a total mean layer thickness of 3 to 20 µm, (b) an intermediate layer is an aluminum oxide layer having a mean layer thickness of 1 to 5 µm, and having an α-type crystal structure in a chemically vapor-deposited state, and (c) an upper layer is a Cr-containing aluminum oxide layer having a mean layer thickness of 2 to 15 µm, and having an α-type crystal structure in a chemically vapor-deposited state.

(d) As for the intermediate layer of the above (b), when the field-emission-type scanning electron microscope is used to individually irradiate crystal grains having a hexagonal crystal lattice present within the measurement range of a polished surface of the tool substrate with an electron beam, and to measure the tilt angle of the normal line to the (0001) plane, which is a crystal plane of each crystal grain, to the normal line to the polished surface, and the measured tilt angles which are within a range of 0 to 45 degrees among the measured tilt angles are divided at every pitch of 0.25 degrees, and are expressed by a tilt angle frequency distribution graph obtained by summing the frequencies present within the respective divisions, the intermediate layer shows a tilt angle frequency distribution graph in which the highest peak is present in the tilt angle division within a range of 0 to 10 degrees, and the total sum of the frequencies present within a range of 0 to 10 degrees accounts for the ratio of 45% or more of the total frequency in the tilt angle frequency distribution graph.

(e) When the texture of the upper layer of the above (c) the upper layer is observed by a field emission type scanning electron microscope, the upper layer is a Cr-containing aluminum layer having a texture composed of crystal grains which have a flat-plate polygonal shape within a plane perpendicular to a layer thickness direction, and an elongated shape in the layer thickness direction within a plane parallel to the layer thickness direction. When the field-emission-type scanning electron microscope is used to individually irradiate crystal grains having a hexagonal crystal lattice present within the measurement range of a polished surface of the tool substrate with an electron beam, and to measure the tilt angle which is the angle formed between the normal line to the (0001) plane of the crystal grain and the normal line to the polished surface of the cutting tool, is measured. The measured tilt angles belonging to a range of 0 to 45° are sectioned every pitch of 0.25°, and the frequencies existing in each section are collected, being represented by a tilt angle frequency distribution graph. In the tilt-angle frequency distribution graph, a sharp highest peak appears at a specific section of the tilt angle, and the total sum of frequencies existing in the range of 0 to 10° occupies a ratio of 60% or more of the total frequencies. Moreover, as for the upper layer of the above (c), when the field-emission-type scanning electron microscope and the electronic backscattering diffraction image apparatus are used to individually irradiate crystal grains present within the measurement range of a polished surface with an electron beam, and to measure an angle at which the normal line to each of crystal lattice planes composed of a hexagonal crystal lattice crosses the normal line to the surface of a base; from these measurement results, the crystal orientation relationship between adjacent crystal lattices is calculated. Then the distribution of lattice points (constituent atom sharing lattice points) where respective constituent atoms which constitute a crystal lattice interface sharing one constituent atom between the crystal lattices is calculated. A constituent atom sharing lattice point type in which N lattice points not sharing the constituent atom exist between the constituent atom sharing lattice points (where N is an even number of 2 or more in view of a crystal structure of corundum type hexagonal close packed crystal but does not include even numbers of 4, 8, 14, 24, and 26 when the upper limit of N is set to 28 in view of distribution frequency) is expressed as ΣN+1. The upper layer is a Cr-containing aluminum oxide layer in which, among the crystal grains with the flat-plate polygonal vertically elongated shape, 60% or more of them are divided by at least one of crystal lattice interface with the constituent atom sharing lattice point type expressed by Σ3 (hereinafter referred as a Σ3 coincidence site lattice interface) inside.

(2) In the surface-coated cutting tool of this embodiment described in the above (1), when the texture of the upper layer of the above (c) is observed by the emission type scanning electron microscope, the crystal grains, which have a flat hexagonal shape within the plane perpendicular to the layer thickness direction and have an elongated shape in the layer thickness direction within the plane parallel to the layer thickness direction, may account for the area ratio of 35% or more of the whole within the plane perpendicular to the layer thickness direction.

(3) The surface-coated cutting tool described in either the above (1) or (2) in which the upper layer of the above (c) has a surface roughness (Ra) within a range of 0.05 to 0.3 µm. The constituent layers of the hard coating layer of the coated tool of this invention will be described below in more detail.

(a) Ti Compound Layer (Lower Layer 12A).

The lower layer is a Ti compound layer composed of one more of titanium carbide (hereinafter, referred to as TiC) layer, a titanium nitride (hereinafter, referred to as TiN) layer, a titanium carbonitride (hereinafter, referred to as TiCN) layer, a titanium carboxide (hereinafter, referred to as TiCO) layer, and a titanium oxycarbonitride (hereinafter, referred to as TiCNO) layer. The lower layer is basically present as a lower layer of the reformed Al$_2$O$_3$ layer which is the intermediate layer. It has superior toughness and abrasion resistance, contributing to improve high-temperature strength of the hard coating layer. In addition, the lower layer adheres tightly to both the tool substrate and the reformed Al$_2$O$_3$ layer, contributing an adhesive property of the hard coating layer to the tool substrate. If the total mean layer thickness is less than 3 the improvements described above cannot be sufficiently obtained. On the other hand, if the total mean layer thickness exceeds 20 µm, thermal plastic deformation occurs easily, particularly when the cutting tool is used under high-speed heavy cutting conditions where high heat is generated and a high load is subjected on the cutting edge of the cutting tool. Thermal plastic deformation causes uneven wear of the cutting tool. Accordingly, the total mean layer thickness is set to 3 to 20 μm.

(b) Reformed $Al_2O_3$ Layer (Intermediate Layer 12B)

In order to form the reformed $Al_2O_3$ layer, which constitutes the intermediate layer, as already described, an $Al_2O_3$ neclear is formed on the surface of the Ti compound layer, which is the lower layer, under the following low-temperature conditions.

A normal chemical vapor deposition apparatus is used. Composition of reaction gas includes 3 to 10% of $AlCl_3$, 0.5 to 3% of $CO_2$, 0.01 to 0.3% of $C_2H_4$ in vol. %, and $H_2$ as balance. Reaction atmosphere temperature is set at 750 to 900° C. Reaction atmosphere pressure is set at 3 to 13 kPa.

It is desirable that the $Al_2O_3$ neclear is an $Al_2O_3$ neclear thin film having a mean layer thickness of 20 to 200 nm. The reaction atmosphere is substituted with a hydrogen atmosphere with pressure of 3 to 13 kPa. Then, temperature of the reaction atmosphere is increased to 1100 to 1200° C. and the $Al_2O_3$ neclear thin film is heat treated. An α-type $Al_2O_3$ layer, which serves as the hard coating layer, is formed under normal conditions. By following steps described above, an α-type $Al_2O_3$ layer is vapor deposited on the heat-treated $Al_2O_3$ neclear thin film.

The reformed $Al_2O_3$ layer vapor deposited on the lower layer is analyzed by the field-emission-type scanning electron microscope, as shown in FIGS. 1A and 1B. Electron beams are irradiated to the individual grains, which has a hexagonal crystal lattice and exists in a measurement range of a polished plane. A tilt angle formed by the normal line to the polished plane and the normal line to (0001) plane as a crystal plane of the crystal grains is measured. The measured tilt angles belonging to a range of 0 to 45° every pitch of 0.25° are sectioned. The frequencies existing in each section are collected and a tilt-angle frequency distribution graph is plotted. In the tilt-angle frequency distribution graph, the sharp highest peak exists in a tilt angle division ranging 0 to 10°, and the total sum of frequencies existing in the range of 0 to 10° occupies a ratio of 45% or more of the total frequencies. as shown in FIG. 14, demonstrating that the (0001) plane orientation ratio of the reformed $Al_2O_3$ layer is high.

The reformed $Al_2O_3$ layer has superior high-temperature strength in addition to the excellent high-temperature hardness and heat resistance of the $Al_2O_3$ layer of the conventional coated tool. Furthermore, by configuring the reformed $Al_2O_3$ layer as an intermediate layer with a high (0001) plane orientation rate, the (0001) plane orientation rate of the reformed Cr-containing $Al_2O_3$ layer vapor-deposited thereon can be increased. As a result, the surface properties of an upper layer composed of the reformed Cr-containing $Al_2O_3$ layer can be improved, and high-temperature strength can be improved.

If the mean layer thickness of the intermediate layer composed of the reformed $Al_2O_3$ layer is less than 1 μm, the hard coating layer cannot be provided with the above characteristics of the reformed $Al_2O_3$ layer. On the other hand, if the mean layer thickness exceeds 5 μm, high temperature generated during cutting and high load subjected to the cutting edge leads to a higher rate of occurrence of thermal plastic deformation, which causes uneven wear of the cutting tool. As a result, the cutting tool is abrased faster. Thus, the mean layer thickness is set to 1 to 5 μm.

(c) Reformed Cr-Containing $Al_2O_3$ Layer (Upper Layer 12C)

As for the upper layer composed of the reformed Cr-containing $Al_2O_3$ layer chemically vapor-deposited on the intermediate layer, an Al component which is a constituent component of the upper layer improves the high-temperature hardness and heat resistance of the layer. An extremely small amount (Cr/(Al+Cr) is 0.01 to 0.1 (as an atomic ratio) in a ratio accounted for in the total amount with Al) of Cr component contained in the upper layer improves the crystal grain boundary strength of the reformed Cr-containing $Al_2O_3$ layer, and contributes to improving the high-temperature strength of the upper layer. If the content ratio of the Cr component in the upper layer is less than 0.01, the above functions cannot be obtained. On the other hand, if the content ratio of the Cr component exceeds 0.1, the grain boundary strength deteriorates as Cr oxide grains precipitate in the layer. Therefore, it is desirable that the content ratio of the Cr component (the value of the ratio of Cr/(Al+Cr)) in the upper layer accounted for in the total amount with the Al component is 0.01 to 0.1 (as an atomic ratio).

The reformed Cr-containing $Al_2O_3$ layer can be vapor-deposited by adjusting chemical vapor deposition conditions of the composition of a reaction gas during vapor deposition, the reaction atmosphere temperature, and the reaction atmosphere pressure as follows, for example.

First, deposition is performed for about 1 hour under the following conditions (referred as an initial condition hereinafter):

(i) Composition of reaction gas (vol. %):
2.3 to 4% of $AlCl_3$,
0.04 to 0.26% of $CrCl_3$,
6 to 8% of $CO_2$,
1.5 to 3% of HCl,
0.05 to 0.2% of $H_2S$, and
$H_2$ as balance,
(ii) Reaction atmosphere temperature: 930 to 970° C., and
(iii) Reaction atmosphere pressure: 6 to 10 kPa, Second, vapor deposition is performed under the following conditions (referred as a film formation condition herein after).

(i) Composition of reaction gas (vol. %):
2.3 to 4% of $AlCl_3$,
0.04 to 0.26% of $CrCl_3$,
6 to 8% of $CO_2$,
1.5 to 3% of HCl,
0.05 to 0.2% of $H_2S$, and
$H_2$ as balance,
(ii) Reaction atmosphere temperature: 1020 to 1050° C., and
(iii) Reaction atmosphere pressure: 6 to 10 kPa.

When a vapor deposition layer with a mean layer thickness of 2 to 15 μm is formed as a film, by performing deposition in the initial and the film forming conditions described above, the reformed Cr-containing $Al_2O_3$ layer whose ratio of Cr/ (Al+Cr) is 0.01 to 0.1 in atomic ratio is formed.

Figure 15A:
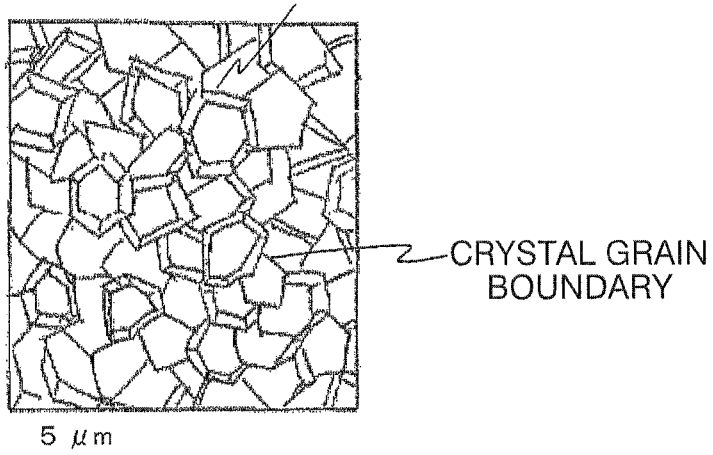
FIG. 15A is a schematic view showing a flat-plate polygonal crystal grain structure which is obtained by observing an upper layer composed of a reformed Cr-containing $Al_2O_3$ layer of the coated tool D1 of the present invention, using a field emission type scanning electron microscope in a plane perpendicular to a layer thickness direction.
Figure 15B:
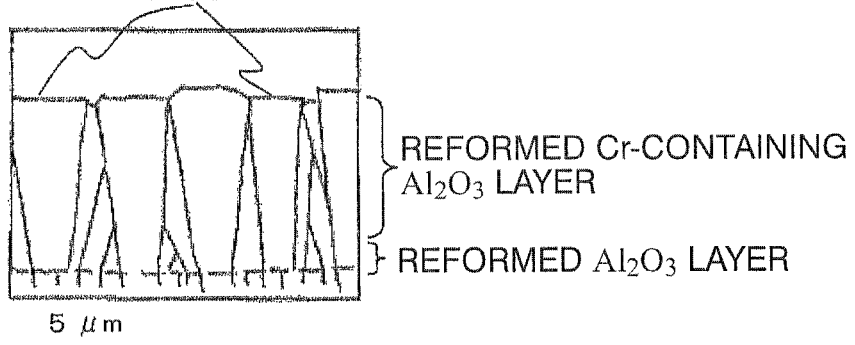
FIG. 15B is a schematic view showing a crystal grain structure having a substantially flat layer surface and having an elongated shape in the layer thickness direction, which is obtained by observation using the field-emission-type scanning electron microscope in the plane parallel to the layer thickness direction.

When the reformed Cr-containing $Al_2O_3$ layer is observed by the emission type scanning electron microscope, the textures shown in FIGS. 15A and 15B are observed. In FIG. 15A, the reformed Cr-containing $Al_2O_3$ layer is viewed within the plane perpendicular to the layer thickness direction. In FIG. 15A, the texture containing large crystal grains with a flat-plate polygonal shape is formed. In FIG. 15B, the reformed Cr-containing $Al_2O_3$ layer is viewed within the plane parallel to the layer thickness direction. In FIG. 15B, the outer surface of the reformed Cr-containing $Al_2O_3$ layer is substantially flat. Also, the texture containing crystal grains with elongated shape is formed (Referred as a flat-plate polygonal elongated shape crystal grain).

As for the reformed Cr-containing $Al_2O_3$ layer, similarly to the reformed α-type $Al_2O_3$ layer, which constitutes the intermediate layer, the tilt angle of the normal line to the (0001) plane to the normal line to a polished surface is measured and a tilt angle frequency graph is plotted. In the tilt angle frequency graph of the reformed Cr-containing $Al_2O_3$ layer, a peak exists in a tilt angle division ranging 0 to 10° and the total sum of frequencies existing in the range of 0 to 10° occupies a ratio of 60% or more of the total frequencies in the tilt-angle frequency distribution graph. These results indicate that the (0001) plane orientation rate of the reformed Cr-containing $Al_2O_3$ layer, which constitutes the upper layer, is high.

That is, as for the reformed Cr-containing $Al_2O_3$ layer, since the (0001) plane orientation rate of the reformed α-type $Al_2O_3$ layer, which is the intermediate layer, is 45% or more, the reformed Cr-containing $Al_2O_3$ layer is also formed as a layer having a high (0001) plane orientation rate (the (0001) plane orientation rate is 60% or more). When the upper layer is viewed within the plane parallel to the layer thickness direction, the outer surface of the upper layer is formed in the shape of a substantially flat plate. Thus, the upper layer has a excellent surface property. Consequently, the upper layer shows superior chipping resistance as compared to the conventional Cr-containing $Al_2O_3$ layer.

Figure 15C:
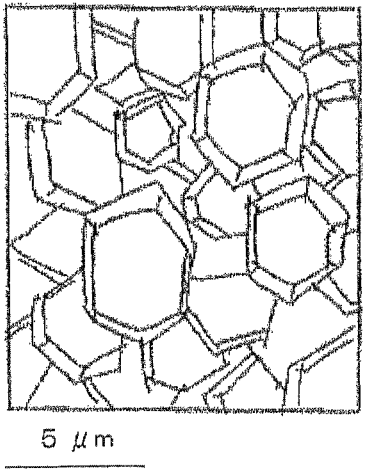
FIG. 15C is a schematic view showing a flat hexagonal crystal grain structure which is obtained by observing an upper layer composed of a reformed Cr-containing $Al_2O_3$ layer of the coated tool D11 of the present invention, using a field emission type scanning electron microscope in a plane perpendicular to a layer thickness direction.

When the vapor deposition of the reformed Cr-containing $Al_2O_3$ layer is performed under further limited conditions (for example, ratios of HCl gas and $H_2S$ gas are set relatively higher, and the pressure of the reaction atmosphere is set relatively loser in the initial and the film formation conditions), the texture shown in FIG. 15C is formed. In the texture, when it is viewed within the plane perpendicular to the layer thickness direction, there are large-sized crystal grains with a flat-plate hexagonal shape. When the texture is viewed within the plane parallel to the layer thickness direction, the outer surface of the upper layer is substantially flat and the crystal grains have an elongated shape stretched in the layer thickness direction, as shown in FIG. 15B. The ratio of the surface area occupied by the crystal grains having the flat-plate hexagonal elongated shape, to the whole surface area of the plane parallel to the layer thickness direction, accounts for 35% or more, in the upper layer formed in the further limited conditions.

Figure 16:
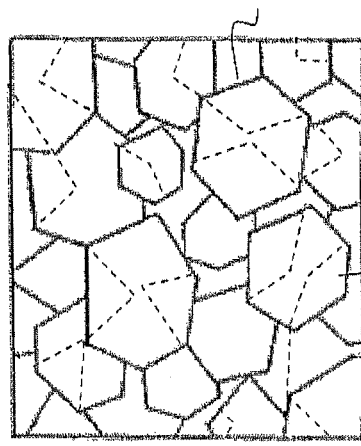
FIG. 16 is a grain boundary analysis view in the plane perpendicular to the layer thickness direction, which is obtained by measuring the upper layer composed of the reformed Cr-containing $Al_2O_3$ layer of the coated tool D1 of the present invention, using the field-emission-type scanning electron microscope and an electronic backscattering diffraction image apparatus, showing a flat-plate polygonal grain boundary observed by the field-emission-type scanning electron microscope in a solid line, and showing a Σ3 coincidence site lattice interface within the crystal grain measured by the electronic backscattering diffraction image apparatus in a broken line.

The reformed Cr-containing $Al_2O_3$ layer is analyzed with a field-emission-type scanning electron microscope and the electronic backscattering diffraction image apparatus. In the analysis, electron beams are irradiated to individual crystal grains within the measurement range of the polished surface. Then, angles between the normal line to each of crystal lattice planes with a hexagonal crystal lattice and the normal line to the polished surface are measured. From the measurement results, the crystal orientation relationship between adjacent crystal lattices is calculated. Then, distribution of lattice points (constituent atom sharing lattice points) is calculated. The constituent atom sharing lattice point is a lattice point that has a constituent atom shared by two crystal lattices forming the grain boundary at the grain boundary. A constituent atom sharing lattice point configuration is expressed by $\Sigma N+1$, where the number represented by N is the number of lattice points that have no constituent atom shared at the grain boundary between two constituent atom sharing lattice points with constituent atoms. The constituent atom sharing lattice point type is even numbers more than 2 between crystal grains having a corundum type hexagonal close-packed structure. If the maximum number of N is set to 28 in view of distribution frequency, even numbers 4, 8, 14, 24, and 26 are excluded from the option for crystal grains having hexagonal close-packed structure. As shown in FIG. 16, the crystal grains of the reformed Cr-containing $Al_2O_3$ layer are divided by at least one of Σ3 coincidence site lattice interface within each crystal grain. The ratio of surface area occupied by the crystal grains that have the flat-plate polygonal elongated shape and divided by at least one of Σ3 coincidence site lattice interface, to the surface area occupied by crystal grains with the flat-plate polygonal elongated shape (including the flat-plate hexagonal elongated shape), is 60% or more.

The strength within the crystal grains of the reformed Cr-containing $Al_2O_3$ layer is increased due to the presence of the Σ3 coincidence site lattice interface in the crystal grains with the flat-plate polygonal (including hexagonal) elongated shape. As a result, cracking of the reformed Cr-containing $Al_2O_3$ layer is suppressed during high-speed intermittent cutting against a work that is difficult to be cut. In the condition, high load is subjected to the cutting edge of the coated cutting tool under a high heat condition. Even if the cracking occurred, growth and spreading of the cracking would be prevented. Therefore, chipping resistance, fracture resistance, and spalling resistance are improved in the cutting tool having the reformed Cr-containing $Al_2O_3$ layer.

Accordingly, the upper layer of the present invention, which has a high (0001) plane orientation rate, has flat surface properties, and is composed of the reformed Cr-containing $Al_2O_3$ layer in which the Σ3 coincidence site lattice interfaces are present with in the flat-plate polygonal (including flat hexagonal) elongated crystal grains, exhibits excellent chipping resistance and abrasion resistance for a prolonged period of time without causing chipping, fracture, spalling, or the like and also without causing thermal plastic deformation, uneven wear, or the like, even in high-speed heavy cutting against a cutting work that is difficult to be cut, such as one made of stainless steel, ductile cast iron, or the like accompanied by high heat generation and high load subjected on the cutting edge with deep depth cut.

If the layer thickness of the upper layer composed of the reformed Cr-containing $Al_2O_3$ layer is less than 2 μm, the excellent characteristics of the upper layer cannot be sufficiently exhibited. On the other hand, if the layer thickness of the upper layer exceeds 15 μm, thermal plastic deformation, which causes uneven wear, easily occurs. In addition, a rate of occurrence of chipping is also increased. Therefore, the mean layer thickness of the upper layer is set to 2 to 15 μm.

Figure 17A:
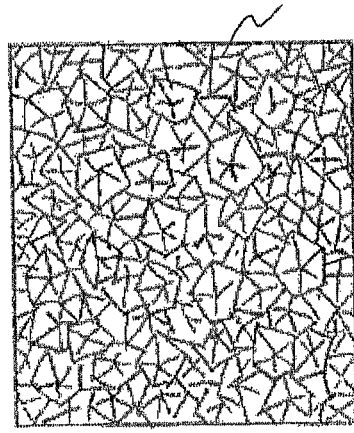
FIG. 17A is a schematic view showing a polygonal crystal grain structure which is obtained by observing an upper layer composed of a conventional Cr-containing $Al_2O_3$ layer of the conventional coated tool 1, using a field emission type scanning electron microscope in a plane perpendicular to a layer thickness direction.
Figure 17B:
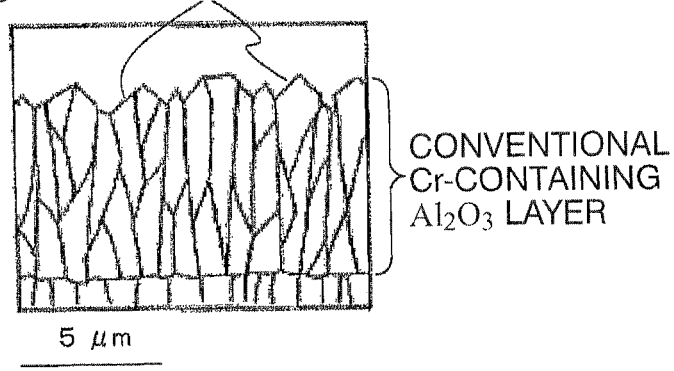
FIG. 17B is a schematic view showing a crystal grain structure having pyramidal concaves and convexes on the layer surface and having an elongated shape in the layer thickness direction, which is obtained by observation using the field-emission-type scanning electron microscope in the plane parallel to the layer thickness direction.

As a comparison, the conventional Cr-containing $Al_2O_3$ layer (the layer described in the PTL 2 (Japanese Unexamined Patent Application Publication No. 2006-289556)), was analyzed by the field-emission-type scanning electron microscope and the electronic backscattering diffraction image apparatus. In the analysis, the texture of crystal grains and the constituent atom sharing lattice point configuration of the conventional Cr-containing $Al_2O_3$ layer were analyzed. The texture of the crystal grains of the conventional Cr-containing $Al_2O_3$ layer is shown in FIGS. 17A and 17B. As shown in FIGS. 17A and 17B, the texture of the crystal grains of the conventional Cr-containing $Al_2O_3$ layer is made of pyramidal-shaped crystal grains with a polygonal elongated shape stretched to the layer thickness direction. The outer surface of the conventional Cr-containing $Al_2O_3$ layer has protuberances and recesses along with the pyramidal shape of the crystal grains. Because of these, the abrasion resistance of the conventional Cr-containing $Al_2O_3$ layer is inferior compared to that of the reformed Cr-containing $Al_2O_3$ layer.

In terms of the constituent atom sharing lattice point configuration, the ratio of surface area occupied by the pyramidal-shaped crystal grains, which have a polygonal elongated shape stretched to the layer thickness direction and contain a Σ3 coincidence site lattice interface within, to the surface area occupied by crystal grains, which consist the conventional Cr-containing $Al_2O_3$ layer and have the convexoconcave polygonal elongated shape stretched to the layer thickness direction, is 40% or less. Therefore, the strength within the crystal grains is not improved as in the reformed Cr-containing $Al_2O_3$ layer.

Accordingly, the conventional coated tool in which the upper layer of the hard coating layer is composed of the conventional Cr-containing $Al_2O_3$ layer cannot prevent occurrence of chipping, fracture, spalling, and thermal deformation and uneven wear occur. Thus, the conventional coated tool is inferior in tool performance, in high-speed heavy cutting work accompanied by high heat generation and heavy impact loading subjected on the cutting edge, such as cutting against a cutting work made of stainless steel, ductile cast iron, or the like.

In the coated tool of the present invention, after the reformed Cr-containing $Al_2O_3$ layer of the upper layer is formed, polishing processing using a grind stone or polishing processing using wet blasting can be performed on the surface of the upper layer, so that the surface roughness of the reformed Cr-containing $Al_2O_3$ layer can be further adjusted. For example, the occurrence of welding to the surface-coated tool during cutting can be suppressed by adjusting the surface roughness of the reformed Cr-containing $Al_2O_3$ layer to Ra 0.05 to 0.3 μm.

The surface roughness Ra in the present invention means the value of arithmetic mean roughness Ra defined by JIS B0601 (1994), and the measuring method thereof is not particularly limited.

Fifth Embodiment

The fifth embodiment of the present invention has the following configuration.

(a) The conventional α-type $Al_2O_3$ layer in the conventional coated tool 1 is vapor-deposited, for example, using a normal chemical vapor deposition apparatus under the following conditions.

Composition of reaction gas: in vol. %, 6 to 10% of $AlCl_3$, 10 to 15% of $CO_2$, 3 to 5% of HCl, 0.05 to 0.2% of $H_2S$, and $H_2$ as balance Reaction atmosphere temperature: 1020 to 1050° C.

Reaction atmosphere pressure: 3 to 5 kPa

Similarly, the α-type $Al_2O_3$ layer in the present invention corresponding to the intermediate layer is formed, using a normal chemical vapor deposition apparatus under the following conditions.

Composition of reaction gas: in vol. %, 3 to 10% of $AlCl_3$, 0.5 to 3% of $CO_2$, 0.01 to 0.3% of $C_2H_4$, and $H_2$ as balance Reaction atmosphere temperature: 750 to 900° C.

Reaction atmosphere pressure: 3 to 13 kPa

An $Al_2O_3$ neclear is formed on the surface of a Ti compound layer which is the lower layer under the low-temperature condition described above. In this case, it is desirable that the $Al_2O_3$ neclear is an $Al_2O_3$ neclear thin film having a mean layer thickness of 20 to 200 nm. Subsequently, the $Al_2O_3$ neclear thin film is heat treated in a condition where the reaction atmosphere is substituted to a hydrogen atmosphere of pressure: 3 to 13 kPa, and the reaction atmosphere temperature is increased to 1100 to 1200° C. Then, the α-type $Al_2O_3$ layer, which serves as the hard coating layer, is formed under a conventional condition. The resulting α-type $Al_2O_3$ layer (hereinafter referred to as a reformed α-type $Al_2O_3$ layer), which is vapor-deposited on the heat-treated neclear thin film, is analyzed with a field emission type scanning electron microscope as schematically represented in FIGS. 1A and 1B. In the analysis, individual crystal grains having a hexagonal crystal lattice present within the measurement range of a polished surface, are irradiated by an electron beam. Then, a tilt angle, which is the angle formed between the normal line to the (0001) plane of the crystal grain and the normal line to the polished surface of the cutting tool, is measured. The measured tilt angles belonging to a range of 0 to 45° are sectioned every pitch of 0.25°, and the frequencies existing in each section are collected, being represented by a tilt angle frequency distribution graph. Based on a test result, it was found that the total sum of frequencies existing in the range of 0 to 10° occupies a ratio of 45% or more of the total frequencies in the tilt-angle frequency distribution graph, when the atmosphere pressure of the chemical vapor deposition apparatus is kept between 5 and 8 KPa. The fact that the total sum of frequencies existing in the range of 0 to 10° occupies a ratio of 45% or more of the total frequencies, means that ratio of the (0001) plane orientation is high. This reformed α-type $Al_2O_3$ layer has superior high-temperature strength compared to the conventional α-type $Al_2O_3$ layer of the conventional coated cutting tool 1. This reformed α-type $Al_2O_3$ also has excellent high-temperature hardness and heat resistance, as the conventional α-type $Al_2O_3$ layer of the conventional coated cutting tool 1 does.

(b) Forming the hard coating layer is further proceeded on the reformed α-type $Al_2O_3$ layer described above, as the intermediate layer. A B-containing aluminum oxide layer having an α-type crystal structure in a chemically vapor-deposited state is vapor-deposited on the intermediate layer as the upper layer. In this way, the lower layer composed of the Ti compound layer, the intermediate layer composed of the reformed α-type $Al_2O_3$ layer, and the upper layer composed of the B-containing aluminum oxide layer are vapor-deposited as a hard coating layer on the surface of the tool substrate. The coated cutting tool with the configuration described above has even more superior high-temperature strength and surface properties. The coated cutting tool exerts excellent chipping resistance, even under high-speed intermittent cutting conditions where high heat is generated and the cutting edges are subjected to intermittent impact loading repeatedly.

(c) The B-containing aluminum oxide layer which is the upper layer can be formed on the reformed α-type $Al_2O_3$ layer, which is the intermediate layer, under the following conditions. First, as a first step, first-step vapor deposition is performed for 60 minutes under the following conditions (i) to (iii).

(i) Composition of reaction gas (vol. %):
1 to 5% of $AlCl_3$
0 to 0.01% of $BCl_3$
2 to 6% of $CO_2$
1 to 5% of HCl
0.25 to 0.75% of $H_2S$
$H_2$ as balance (ii) Reaction atmosphere temperature: 960 to 1010° C.

(iii) Reaction atmosphere pressure: 6 to 10 kPa

Next, as a second step, vapor deposition is performed under the following conditions (i) to (iii).

(i) Composition of reaction gas (vol. %):
6 to 10% of $AlCl_3$
0.02 to 0.2% of $BCl_3$
4 to 8% of $CO_2$
3 to 5% of HCl
0.25 to 0.6% of $H_2S$
$H_2$ as balance (ii) Reaction atmosphere temperature: 960 to 1010° C.

(iii) Reaction atmosphere pressure: 6 to 10 kPa

By following the steps described above, a B-containing aluminum oxide layer (hereinafter referred to as a reformed AlBO layer), which has an α-type crystal structure in a chemically vapor-deposited state, can be formed. The reformed AlBO layer has a mean layer thickness of 1 to 15 μm, and the content ratio of the B component to the total amount of the Al component is 0.002 to 0.01 (as atomic ratio).

(d) When the texture of the reformed AlBO layer is observed by the emission type scanning electron microscope, a flat-plate polygonal shape of a large-sized grain can be seen within a plane perpendicular to the layer thickness direction. When the reformed AlBO layer is observed in the plane parallel to the layer thickness direction, it can be seen that the outer surface of the reformed AlBO layer is substantially flat, and the reformed AlBO layer has a texture made of the grains whose shapes are elongated in the layer thickness direction (hereinafter, the shape of the crystal grain described above is referred a flat-plate polygonal vertically elongated shape).

When the vapor deposition of the reformed AlBO layer is performed under further limited conditions (for example, the volume % of $H_2S$ is set 0.50 to 0.75, and the reaction atmosphere temperature 1000 to 1010° C. in the first vapor deposition, and the volume % s of $BCl_3$ and $H_2S$ are set 0.05 to 0.15 and 0.25 to 0.4, respectively, and the reaction atmosphere temperature 960 to 980° C. in the second vapor deposition), a texture described below is formed. When the texture is viewed within the plane perpendicular to the layer thickness direction, the large-sized grains with a flat hexagonal shape are observed. When the reformed AlBO layer is seen within the plane parallel to the layer thickness direction, it can be seen that the outer surface of the reformed AlBO layer is substantially flat. In addition, the grains that have the elongated shape within the plane parallel to the layer thickness direction, account for 35% or more in area ratio, in the whole surface area perpendicular to the thickness direction of the layer.

(e) As in the reformed α-type $Al_2O_3$ layer, the reformed AlBO layer is analyzed with the field-emission-type scanning electron microscope. In the analysis, individual crystal grains having a hexagonal crystal lattice present within the measurement range of a polished surface, are irradiated by an electron beam. Then, a tilt angle, which is the angle formed between the normal line to the (0001) plane of the crystal grain and the normal line to the polished surface of the cutting tool, is measured. The measured tilt angles belonging to a range of 0 to 45° are sectioned every pitch of 0.25°, and the frequencies existing in each section are collected, being represented by a tilt angle frequency distribution graph. In the tilt-angle frequency distribution graph, a sharp highest peak appears at a specific section of the tilt angle, and the total sum of frequencies existing in the range of 0 to 10° occupies a ratio of 60% or more of the total frequencies. This means that the reformed AlBO layer with high (0001) plane orientation ratio is formed. The (0001) plane orientation ratio of the reformed AlBO layer is higher than that of the conventional AlBO layer of the conventional coated cutting tool, resulting even more superior high-temperature strength of the reformed AlBO layer.

(f) In addition, the reformed AlBO layer is analyzed by the field-emission-type scanning electron microscope and an electronic backscattering diffraction image apparatus. In the analysis, individual crystal grains having a hexagonal crystal lattice present within the measurement range of a polished surface, are irradiated by an electron beam. Then, a tilt angle, which is the angle formed between the normal line to the (0001) plane of the crystal grain and the normal line to the polished surface of the cutting tool, is measured. Based on the measurement results, a crystallographic orientation relationship between the adjacent crystal lattices is calculated, and a distribution of lattice points (constituent atom sharing lattice points) is calculated. The constituent atom sharing lattice point is a lattice point that has a constituent atom shared by two crystal lattices forming the grain boundary at the grain boundary. A constituent atom sharing lattice point type in which N lattice points not sharing the constituent atom exist between the constituent atom sharing lattice points (where N is an even number of 2 or more in view of a crystal structure of corundum type hexagonal close packed crystal but does not include even numbers of 4, 8, 14, 24, and 26 when the upper limit of N is set to 28 in view of distribution frequency) is expressed as ΣN+1. When the reformed AlBO layer is observed by the field-emission-type scanning electron microscope, it is seen that the reformed AlBO layer includes the crystal grains with the flat-plate polygonal vertically elongated shape. Among the crystal grains with the flat-plate polygonal vertically elongated shape, 60% or more of them are divided by at least one of crystal lattice interface with the constituent atom sharing lattice point type expressed by Σ3 (hereinafter referred as a Σ3 coincidence site lattice interface) inside.

(h) As described above, the upper layer composed of the reformed AlBO layer has a high (0001) plane orientation rate, and a crystal plane at the surface thereof has the same orientation as a crystal plane (for example, (0001)) within the plane perpendicular to the layer thickness direction of this layer. Thus, outer surface of the upper layer is formed in the shape of a flat plate which is substantially flat (as seen within the plane parallel to the layer thickness direction), and shows excellent chipping resistance due to the surface properties thereof. Furthermore, the strength within the crystal grains is increased since the Σ3 coincidence site lattice interfaces are present inside the grains with the flat-plate polygonal vertically elongated shape. Therefore, the reformed AlBO layer has excellent high-temperature hardness and high-temperature strength and shows excellent chipping resistance, compared to the conventional AlBO layer.

(i) Accordingly, as the hard coating layer of the present embodiment, the coated tool of the present invention includes the reformed α-type $Al_2O_3$ layer having a high (0001) plane orientation rate and having excellent high-temperature strength as the intermediate layer. Furthermore, the coated tool of the present invention includes the reformed AlBO layer having excellent high-temperature hardness, high-temperature strength, and surface properties as the upper layer. The coated tool of the present invention has superior high-temperature hardness, heat resistance, and high-temperature strength as compared to the conventional coated tools 1 and 2. As a result, it exhibits excellent chipping resistance for a long-term use, even when the coated tool is used for high-speed intermittent cutting accompanied by high heat generation, and intermittent impact loading acts repeatedly on the cutting edge. The present embodiment has been made on the basis of the above knowledge and includes the following configurations.

(1) Provided is a surface-coated cutting tool formed by vapor-depositing, on the surface of a tool substrate made of tungsten carbide-based cemented carbide or titanium carbonitride-based cermet, a hard coating layer including (a) to (c) below.

(a) The lower layer is a Ti compound layer composed of one or more of a titanium carbide layer, a titanium nitride layer, a titanium carbonitride layer, a titanium carboxide layer, and a titanium oxycarbonitride layer, all of which are formed by chemical vapor deposition, and having a total mean layer thickness of 3 to 20 μm.

(b) The intermediate layer is an aluminum oxide layer having a mean layer thickness of 1 to 5 μm and having an α-type crystal structure in a chemically vapor-deposited state.

(c) The upper layer is a B-containing aluminum oxide layer having a mean layer thickness of 2 to 15 μm and having an α-type crystal structure in a chemically vapor-deposited state.

The intermediate layer (b) has properties indicated by a tilt-angle frequency distribution graph in which the highest peak exists in a tilt angle division ranging 0 to 10° and the total sum of frequencies existing in the range of 0 to 10° occupies a ratio of 45% or more of the total frequencies in the tilt-angle frequency distribution graph. The tilt-angle frequency distribution graph is obtained by utilizing a field-emission-type scanning electron microscope. Electron beams are irradiated to individual crystal grains, which has a hexagonal crystal lattice and exists in a measurement range of a polished plane. A tilt angle formed by the normal line to the polished plane and the normal line to (0001) plane as a crystal plane of the crystal grains is measured. The measured tilt angles belonging to a range of 0 to 45° every pitch of 0.25° are sectioned. The frequencies existing in each section are collected.

When the texture of the upper layer of the above (c) is observed by the emission type scanning electron microscope, the upper layer is a B-containing aluminum oxide layer having a texture composed of crystal grains which have a flat-plate polygonal shape within the plane perpendicular to the layer thickness direction and have an elongated shape in the layer thickness direction within the plane parallel to the layer thickness direction.

The upper layer (c) has properties indicated by a tilt-angle frequency distribution graph in which the highest peak exists in a tilt angle division ranging 0 to 10° and the total sum of frequencies existing in the range of 0 to 10° occupies a ratio of 60% or more of the total frequencies in the tilt-angle frequency distribution graph. The tilt-angle frequency distribution graph is obtained by utilizing a field-emission-type scanning electron microscope. Electron beams are irradiated to individual crystal grains, which has a hexagonal crystal lattice and exists in a measurement range of a polished plane. A tilt angle formed by the normal line to the polished plane and the normal line to (0001) plane as a crystal plane of the crystal grains is measured. The measured tilt angles belonging to a range of 0 to 45° every pitch of 0.25° are sectioned. The frequencies existing in each section are collected.

Moreover, the upper layer (c) is a B-containing aluminum oxide layer consisted of crystal grains, 60% or more of the grains being divided within each grain by at least one or more crystal lattice interfaces with a constituent atom sharing lattice point type expressed by Σ3. The constituent atom sharing lattice point type is expressed as ΣN+1, where "N" represents a number of lattice points (N) without a shared constituent atom between the constituent atom sharing lattice points. The constituent atom sharing lattice point type is even numbers more than 2 between crystal grains having a corundum type hexagonal close-packed structure. If the maximum number of N is set to 28 in view of distribution frequency, even numbers 4, 8, 14, 24, and 26 are excluded from the option for crystal grains having hexagonal close-packed structure. To obtain data related to the constituent atom sharing lattice point type, first, electron beams are irradiated to individual crystal grains within the measurement area on the polished surface with field-emission-type scanning electron microscope and an electron backscatter diffraction imaging device. Then, angles formed by normal lines of crystal lattice faces with hexagonal crystal lattices and the normal line to the polished surface are measured. Then, based on the measurement, a crystallographic orientation relationship between the adjacent crystal lattices is calculated. Then, a distribution of lattice points (constituent atom sharing lattice points) in which constituent atoms of a crystal lattice interface sharing one constituent atom between the crystal lattices is calculated. Then, finally, "N" representing a number of lattice points (N) without a shared constituent atom between the constituent atom sharing lattice points, is obtained.

(2) When the texture of the upper layer (c) of the surface-coated cutting tool described above (as (1)) is observed by the emission type scanning electron microscope, crystal grains corresponding to 35% or more of the whole surface area perpendicular to the layer thickness direction, has a flat-plate polygonal shape within the plane perpendicular to the layer thickness direction and an elongated shape in the layer thickness direction within the plane parallel to the layer thickness direction.

(3) The surface roughness (Ra) of the upper layer (c) in the cutting tool described above (as (1) and (2)) ranges from 0.05 to 0.3 μm.

The configuration of the hard coating layer of the coated tool of this aspect will be described below in more detail.

(a) Ti Compound Layer (Lower Layer 12A)

The lower layer is a Ti compound layer composed of one more of titanium carbide (hereinafter, referred to as TiC) layer, a titanium nitride (hereinafter, referred to as TiN) layer, a titanium carbonitride (hereinafter, referred to as TiCN) layer, a titanium carboxide (hereinafter, referred to as TiCO) layer, and a titanium oxycarbonitride (hereinafter, referred to as TiCNO) layer. The lower layer is basically present as a lower layer of the reformed α-type $Al_2O_3$ layer which is the intermediate layer. It has superior toughness and abrasion resistance, contributing to improve high-temperature strength of the hard coating layer. In addition, the lower layer adheres tightly to both the tool substrate and the reformed α-type $Al_2O_3$ layer, contributing an adhesive property of the hard coating layer to the tool substrate. If the total mean layer thickness is less than 3 μm, the improvements described above cannot be sufficiently obtained. On the other hand, if the total mean layer thickness exceeds 20 μm, thermal plastic deformation occurs easily, particularly when the cutting tool is used under high-speed intermittent cutting conditions where a high load is subjected on the cutting edge intermittently and explosively. Thermal plastic deformation causes uneven wear of the cutting tool. Accordingly, the total mean layer thickness is set to 3 to 20 μm.

(b) Reformed α-Type $Al_2O_3$ Layer (Intermediate Layer 12B)

In order to form the reformed α-type $Al_2O_3$ layer, which constitutes the intermediate layer 12B, as already described, an $Al_2O_3$ neclear is formed on the surface of the Ti compound layer, which is the lower layer, under the following low-temperature conditions.

A normal chemical vapor deposition apparatus is used. Composition of reaction gas includes 3 to 10% of $AlCl_3$, 0.5 to 3% of $CO_2$, 0.01 to 0.3% of $C_2H_4$ in vol. %, and $H_2$ as balance. Reaction atmosphere temperature is set at 750 to 900° C. Reaction atmosphere pressure is set at 3 to 13 kPa.

It is desirable that the $Al_2O_3$ neclear is an $Al_2O_3$ neclear thin film having a mean layer thickness of 20 to 200 nm. After the formation of the $Al_2O_3$ neclear, the reaction atmosphere is substituted with a hydrogen atmosphere with pressure of 3 to 13 kPa. Then, temperature of the reaction atmosphere is increased to 1100 to 1200° C. and the $Al_2O_3$ neclear thin film is heat treated. An α-type $Al_2O_3$ layer, which serves as the hard coating layer, is formed under normal conditions. By following steps described above, an α-type $Al_2O_3$ layer is vapor deposited on the heat-treated $Al_2O_3$ neclear thin film, resulting formation of the intermediate layer.

The reformed α-type $Al_2O_3$ layer vapor deposited on the lower layer is analyzed by the field-emission-type scanning electron microscope, as shown in FIGS. 1A and 1B. Electron beams are irradiated to the individual grains, which has a hexagonal crystal lattice and exists in a measurement range of a polished plane. A tilt angle formed by the normal line to the polished plane and the normal line to (0001) plane as a crystal plane of the crystal grains is measured. The measured tilt angles belonging to a range of 0 to 45° every pitch of 0.25° are sectioned. The frequencies existing in each section are collected and a tilt-angle frequency distribution graph is plotted. In the tilt-angle frequency distribution graph, the sharp highest peak exists in a tilt angle division ranging 0 to 10°, as shown in FIG. 2.

The highest peak position of the measured tilt angles in the tilt angle frequency distribution graph of the reformed α-type $Al_2O_3$ layer can be changed by performing heat-treatment after the formation of the $Al_2O_3$ neclear (thin film) with a predetermined layer thickness. In addition, the total sum of frequencies existing in the range of 0 to 10° occupies a ratio of 45% or more of the total frequencies in the tilt-angle frequency distribution graph (which means the (0001) plane orientation rate is high). Accordingly, whenever the thickness of the $Al_2O_3$ neclear (thin film) becomes too thin or too thick, the position of the highest peak of the measured tilt angles moves out of the range of 0 to 10°. In addition, the total sum of frequencies existing in the range of 0 to 10° becomes less than a ratio of 45% of the total frequencies in the tilt-angle frequency distribution graph. As a result, excellent high-temperature strength cannot be obtained.

The reformed α-type $Al_2O_3$ layer has superior high-temperature strength in addition to the excellent high-temperature hardness and heat resistance of the α-type $Al_2O_3$ layer of the conventional coated tool. Furthermore, by configuring the reformed α-type $Al_2O_3$ layer as an intermediate layer with a high (0001) plane orientation rate, the (0001) plane orientation rate of the reformed AlBO layer vapor-deposited thereon can be increased. As a result, the surface properties of an upper layer composed of the reformed AlBO layer can be improved, and high-temperature strength can be improved.

If the mean layer thickness of the intermediate layer composed of the reformed α-type $Al_2O_3$ layer is less than 1 the hard coating layer cannot be provided with the above characteristics of the reformed α-type $Al_2O_3$ layer. On the other hand, if the mean layer thickness exceeds 5 μm, high temperature generated during cutting and high load subjected to the cutting edge leads to a higher rate of occurrence of thermal plastic deformation, which causes uneven wear of the cutting tool. As a result, the cutting tool is abrased faster. Thus, the mean layer thickness is set to 1 to 5 μm.

(c) Reformed AlBO Layer (Upper Layer 12C)

As for the upper layer 12C composed of the reformed AlBO layer chemically vapor-deposited on the intermediate layer 12B, an Al component which is a constituent component of the upper layer improves the high-temperature hardness and heat resistance of the layer. An extremely small amount (B/(Al+B) is 0.001 to 0.01 (as an atomic ratio) in a ratio accounted for in the total amount with Al) of B component contained in the upper layer improves the crystal grain boundary strength of the reformed AlBO layer, and contributes to improving the high-temperature strength of the upper layer. If the content ratio of the B component in the upper layer is less than 0.001, the above functions cannot be obtained. On the other hand, if the content ratio of the B component exceeds 0.01, the grain boundary strength deteriorates as $BO_2$ grains precipitate in the layer. Therefore, it is desirable that the content ratio of the B component (the value of the ratio of B/(Al+B)) in the upper layer accounted for in the total amount with the Al component is 0.001 to 0.01 (as an atomic ratio).

The reformed AlBO layer can be vapor-deposited by adjusting chemical vapor deposition conditions of the composition of a reaction gas during vapor deposition, the reaction atmosphere temperature, and the reaction atmosphere pressure as follows, for example.

First, the first-step vapor deposition is performed for 60 minutes under the following conditions:
  (i) Composition of reaction gas (vol. %):
    1 to 5% of $AlCl_3$,
    0 to 0.01% of $BCl_3$,
    2 to 6% of $CO_2$,
    1 to 5% of HCl,
    0.25 to 0.75% of $H_2S$, and
    $H_2$ as balance,
  (ii) Reaction atmosphere temperature: 960 to 1010° C., and
  (iii) Reaction atmosphere pressure: 6 to 10 kPa, Second, the second-step vapor deposition is performed under the following conditions.
  (i) Composition of reaction gas (vol. %):
    6 to 10% of $AlCl_3$,
    0.02 to 0.2% of $BCl_3$,
    4 to 8% of $CO_2$,
    3 to 5% of HCl,
    0.25 to 0.6% of $H_2S$, and
    $H_2$ as balance,
  (ii) Reaction atmosphere temperature: 920 to 1010° C., and
  (iii) Reaction atmosphere pressure: 6 to 10 kPa.

When a vapor deposition layer with a mean layer thickness of 1 to 15 μm is formed as a film, by performing the first-step and the second-step vapor deposition in the conditions described above, the reformed AlBO layer whose ratio of B/(Al+B) is 0.001 to 0.01 in atomic ratio, is formed.

When the reformed AlBO layer is observed by the emission type scanning electron microscope, the textures shown in FIGS. 3A and 3B are observed. The reformed AlBO layer is viewed within the plane perpendicular to the layer thickness direction. The texture containing large crystal grains with a flat-plate polygonal shape is formed. The reformed AlBO layer is viewed within the plane parallel to the layer thickness direction. The outer surface of the reformed AlBO layer is substantially flat. Also, the texture containing crystal grains with elongated shape is formed (Referred as a flat-plate polygonal elongated shape crystal grain).

As for the reformed AlBO layer, similarly to the reformed α-type $Al_2O_3$ layer, which constitutes the intermediate layer, the tilt angle of the normal line to the (0001) plane to the normal line to a polished surface is measured and a tilt angle frequency graph is plotted. In the tilt angle frequency graph of the reformed AlBO layer, a peak exists in a tilt angle division ranging 0 to 10° and the total sum of frequencies existing in the range of 0 to 10° occupies a ratio of 60% or more of the total frequencies in the tilt-angle frequency distribution graph. These results indicate that the (0001) plane orientation rate of the reformed AlBO layer, which constitutes the upper layer, is high.

That is, as for the reformed AlBO layer, since the (0001) plane orientation rate of the reformed α-type $Al_2O_3$ layer, which is the intermediate layer, is 45% or more, the reformed AlBO layer is also formed as a layer having a high (0001) plane orientation rate (the (0001) plane orientation rate is 60% or more).

When the upper layer is viewed within the plane parallel to the layer thickness direction, the outer surface of the upper layer is formed in the shape of a substantially flat plate. Thus, the upper layer has a excellent surface property. Consequently, the upper layer shows superior chipping resistance as compared to the conventional AlBO layer.

When the vapor deposition of the reformed AlBO layer is performed under further limited conditions (for example, the conditions where volume percentage of $H_2S$ in the reaction gas is 0.05 to 0.75 vol. %, and the reaction atmosphere temperature is set to 1000 to 1010° C. in the first-step vapor deposition, and volume percentages of $BCl_3$ and $H_2S$ in the reaction gas are set 0.05 to 0.15 vol. % and 0.25 to 0.4 vol. %, respectively and the reaction atmosphere temperature is set to 960 to 980° C. in the second-step vapor deposition), a texture described below is formed. In the texture, when it is viewed within the plane perpendicular to the layer thickness direction, there are large-sized crystal grains with a flat-plate hexagonal shape. When the texture is viewed within the plane parallel to the layer thickness direction, the outer surface of the upper layer is substantially flat and the crystal grains have an elongated shape stretched in the layer thickness direction. The ratio of the surface area occupied by the crystal grains having the flat-plate hexagonal elongated shape, to the whole surface area of the plane parallel to the layer thickness direction, accounts for 35% or more, in the upper layer formed in the further limited conditions.

The reformed AlBO layer is analyzed with a field-emission-type scanning electron microscope and the electronic backscattering diffraction image apparatus. In the analysis, electron beams are irradiated to individual crystal grains within the measurement range of the polished surface. Then, angles between the normal line to each of crystal lattice planes with a hexagonal crystal lattice and the normal line to the polished surface are measured. From the measurement results, the crystal orientation relationship between adjacent crystal lattices is calculated. Then, distribution of lattice points (constituent atom sharing lattice points) is calculated. The constituent atom sharing lattice point is a lattice point that has a constituent atom shared by two crystal lattices forming the grain boundary at the grain boundary. A constituent atom sharing lattice point configuration is expressed by $\Sigma N+1$, where the number represented by N is the number of lattice points that have no constituent atom shared at the grain boundary between two constituent atom sharing lattice points with constituent atoms. The constituent atom sharing lattice point type is even numbers more than 2 between crystal grains having a corundum type hexagonal close-packed structure. If the maximum number of N is set to 28 in view of distribution frequency, even numbers 4, 8, 14, 24, and 26 are excluded from the option for crystal grains having hexagonal close-packed structure. The crystal grains of the reformed AlBO layer are divided by at least one of $\Sigma 3$ coincidence site lattice interface within each crystal grain. The ratio of surface area occupied by the crystal grains that have the flat-plate polygonal elongated shape and divided by at least one of $\Sigma 3$ coincidence site lattice interface, to the surface area occupied by crystal grains with the flat-plate polygonal elongated shape (including the flat-plate hexagonal elongated shape), is 60% or more.

The strength within the crystal grains of the reformed AlBO layer is increased due to the presence of the $\Sigma 3$ coincidence site lattice interface in the crystal grains with the flat-plate polygonal (including hexagonal) elongated shape. As a result, cracking of the reformed AlBO layer is suppressed during high-speed intermittent cutting work where high load is subjected to the reformed AlBO layer. Even if the cracking occurred, growth and spreading of the cracking would be prevented. Therefore, chipping resistance, fracture resistance, and spalling resistance are improved in the cutting tool having the reformed AlBO layer.

Accordingly, the upper layer of the present invention, which has a high (0001) plane orientation rate, has flat surface properties, and is composed of the reformed AlBO layer in which the $\Sigma 3$ coincidence site lattice interfaces are present in the flat-plate polygonal (including flat hexagonal) elongated crystal grains, and exhibits excellent chipping resistance and abrasion resistance for a prolonged period of time without causing chipping, fracture, spalling, or the like and also without causing thermal plastic deformation, uneven wear, or the like, even in high-speed intermittent cutting work accompanied by high heat generation and high load subjected on the cutting edge.

If the layer thickness of the upper layer composed of the reformed AlBO layer is less than 2 μm, the excellent characteristics of the upper layer cannot be sufficiently exhibited. On the other hand, if the layer thickness of the upper layer exceeds 15 μm, thermal plastic deformation, which causes uneven wear, easily occurs. In addition, a rate of occurrence of chipping is also increased. Therefore, the mean layer thickness of the upper layer is set to 2 to 15 μm.

As a comparison, the conventional AlBO layer (the layer described in the PTL 6), was analyzed by the field-emission-type scanning electron microscope and the electronic backscattering diffraction image apparatus. In the analysis, the texture of crystal grains and the constituent atom sharing lattice point configuration of the conventional AlBO layer were analyzed. The texture of the crystal grains of the conventional AlBO layer is made of pyramidal-shaped crystal grains with a polygonal elongated shape stretched to the layer thickness direction. The outer surface of the conventional AlBO layer has protuberances and recesses along with the pyramidal shape of the crystal grains. Because of these, the abrasion resistance of the conventional AlBO layer is inferior compared to that of the reformed AlBO layer.

In terms of the constituent atom sharing lattice point configuration, the ratio of surface area occupied by the convexoconcave polygonal elongated crystal grains, which contain a $\Sigma 3$ coincidence site lattice interface within, to the surface area occupied by the convexoconcave elongated crystal grains consisting the conventional AlBO layer was 40% or less. Therefore, the strength within the crystal grains is not improved as in the reformed AlBO layer.

Accordingly, the conventional coated tool 6 in which the upper layer of the hard coating layer is composed of the conventional AlBO layer cannot prevent occurrence of chipping, fracture, spalling, or the like and is inferior in tool performance, in high-speed intermittent cutting work accompanied by high heat generation and intermittent impact loading subjected on the cutting edge.

In the coated tool of the present invention, after the reformed AlBO layer of the upper layer is formed, polishing processing using a grind stone or polishing processing using wet blasting can be performed on the surface of the upper layer, so that the surface roughness of the reformed AlBO layer can be further adjusted. For example, the occurrence of welding to the surface-coated tool during cutting can be suppressed by adjusting the surface roughness of the reformed AlBO layer to Ra 0.05 to 0.3 μm.

The surface roughness Ra in the present invention means the value of arithmetic mean roughness Ra defined by JIS B0601 (1994), and the measuring method thereof is not particularly limited.

Sixth Embodiment (a) The conventional α-type $Al_2O_3$ layer in the conventional coated tool 1 is vapor-deposited, for example, using a normal chemical vapor deposition apparatus under the following conditions.

Composition of reaction gas: in vol. %, 6 to 10% of $AlCl_3$, 10 to 15% of $CO_2$, 3 to 5% of HCl, 0.05 to 0.2% of $H_2S$, and $H_2$ as balance Reaction atmosphere temperature: 1020 to 1050° C.
Reaction atmosphere pressure: 3 to 5 kPa Similarly, in the sixth embodiment of the present invention, an $Al_2O_3$ neclear is formed on the surface of the lower layer made of the Ti compound layer, using a normal chemical vapor deposition apparatus under the following conditions.

Composition of reaction gas: in vol. %, 3 to 10% of $AlCl_3$, 0.5 to 3% of $CO_2$, 0.01 to 0.3% of $C_2H_4$, and $H_2$ as balance Reaction atmosphere temperature: 750 to 900° C.
Reaction atmosphere pressure: 3 to 13 kPa An $Al_2O_3$ neclear is formed on the surface of a Ti compound layer which is the lower layer under the low-temperature condition described above. In this case, it is desirable that the $Al_2O_3$ neclear is an $Al_2O_3$ neclear thin film having a mean layer thickness of 20 to 200 nm. Subsequently, the $Al_2O_3$ neclear thin film is heat treated in a condition where the reaction atmosphere is substituted to a hydrogen atmosphere of pressure: 3 to 13 kPa, and the reaction atmosphere temperature is increased to 1100 to 1200° C. Then, the α-type $Al_2O_3$ layer, which serves as the hard coating layer, is formed under a conventional condition. The resulting α-type $Al_2O_3$ layer (hereinafter referred to as a reformed α-type $Al_2O_3$ layer), which is vapor-deposited on the heat-treated neclear thin film, is analyzed with a field emission type scanning electron microscope as schematically represented in FIGS. 1A and 1B. In the analysis, individual crystal grains having a hexagonal crystal lattice present within the measurement range of a polished surface, are irradiated by an electron beam. Then, a tilt angle, which is the angle formed between the normal line to the (0001) plane of the crystal grain and the normal line to the polished surface of the cutting tool, is measured. The measured tilt angles belonging to a range of 0 to 45° are sectioned every pitch of 0.25°, and the frequencies existing in each section are collected, being represented by a tilt angle frequency distribution graph. Based on a test result, it was found that the total sum of frequencies existing in the range of 0 to 10° occupies a ratio of 45% or more of the total frequencies in the tilt-angle frequency distribution graph, when the atmosphere pressure of the chemical vapor deposition apparatus is kept between 5 and 8 KPa. The fact that the total sum of frequencies existing in the range of 0 to 10° occupies a ratio of 45% or more of the total frequencies, means that ratio of the (0001) plane orientation is high. This reformed α-type $Al_2O_3$ layer has superior high-temperature strength compared to the conventional α-type $Al_2O_3$ layer of the conventional coated cutting tool 1. This reformed α-type $Al_2O_3$ also has excellent high-temperature hardness and heat resistance, as the conventional α-type $Al_2O_3$ layer of the conventional coated cutting tool 1 does.

(b) Forming the hard coating layer is further proceeded on the reformed α-type $Al_2O_3$ layer described above, as the intermediate layer. A Ti- and Zr-containing aluminum oxide layer having an α-type crystal structure in a chemically vapor-deposited state is vapor-deposited on the intermediate layer as the upper layer. In this way, the lower layer composed of the Ti compound layer, the intermediate layer composed of the reformed α-type $Al_2O_3$ layer, and the upper layer composed of the Ti- and Zr-containing aluminum oxide layer are vapor-deposited as a hard coating layer on the surface of the tool substrate. The coated cutting tool with the configuration described above has even more superior high-temperature strength and surface properties. The coated cutting tool exerts excellent chipping resistance, even under high-speed intermittent cutting conditions where high heat is generated and the cutting edges are subjected to intermittent impact loading repeatedly.

(c) The Ti- and Zr-containing aluminum oxide layer which is the upper layer can be formed on the reformed α-type $Al_2O_3$ layer, which is the intermediate layer, under the following conditions. First, as a first step, first-step vapor deposition is performed for 60 minutes under the following conditions (i) to (iii).

(i) Composition of reaction gas (vol. %):
1 to 5% of $AlCl_3$
0 to 0.01% of $TiCl_4$
0.05 to 0.1 of $ZrCl_4$
2 to 6% of $CO_2$
1 to 5% of HCl
0.25 to 0.75% of $H_2S$
$H_2$ as balance
(ii) Reaction atmosphere temperature: 960 to 1010° C.
(iii) Reaction atmosphere pressure: 6 to 10 kPa Next, as a second step, vapor deposition is performed under the following conditions (i) to (iii).

(i) Composition of reaction gas (vol. %):
6 to 10% of $AlCl_3$
0.05 to 0.6% of $TiCl_4$
0.6 to 1.2 of $ZrCl_4$
2 to 10% of $CO_2$
3 to 5% of HCl
0 to 0.5% of $H_2S$
$H_2$ as balance
(ii) Reaction atmosphere temperature: 940 to 980° C.
(iii) Reaction atmosphere pressure: 6 to 10 kPa By following the steps described above, a Ti- and Zr-containing aluminum oxide layer (hereinafter referred to as a reformed AlTiZrO layer), which has an α-type crystal structure in a chemically vapor-deposited state, can be formed. The reformed AlTiZrO layer has a mean layer thickness of 1 to 15 µm, and the content ratio of the Ti component to the total amount of the Al component is 0.002 to 0.01 (as atomic ratio), and the content ratio of the Zr component to the total amount of the Al component is 0.002 to 0.01 (as atomic ratio).

(d) When the texture of the reformed AlTiZrO layer is observed by the emission type scanning electron microscope, a flat-plate polygonal shape of a large-sized grain can be seen within a plane perpendicular to the layer thickness direction. When the reformed AlTiZrO layer is observed in the plane parallel to the layer thickness direction, it can be seen that the outer surface of the reformed AlTiZrO layer is substantially flat, and the reformed AlTiZrO layer has a texture made of the grains whose shapes are elongated in the layer thickness direction (hereinafter, the shape of the crystal grain described above is referred a flat-plate polygonal vertically elongated shape).

When the vapor deposition of the reformed AlTiZrO layer is performed under further limited conditions (for example, the volume % of $TiCl_4$, $ZrCl_4$, and $H_2S$ are set 0, 0.05 to 0.1, and 0.50 to 0.75 respectively, and the reaction atmosphere temperature 990 to 1010° C. in the first vapor deposition, and the volume % of $TiCl_4$, $ZrCl_4$ and $H_2S$ are set 0.05 to 0.2, 0.05 to 0.1 and 0.05 to 0.1, respectively, and the reaction atmosphere temperature 940 to 960° C. in the second vapor deposition), a texture described below is formed. When the texture is viewed within the plane perpendicular to the layer thickness direction, the large-sized grains with a flat hexagonal shape are observed. When the reformed AlTiZrO layer is seen within the plane parallel to the layer thickness direction, it can be seen that the outer surface of the reformed AlTiZrO layer is substantially flat. In addition, the grains that have the elongated shape within the plane parallel to the layer thickness direction, account for 35% or more in area ratio, in the whole surface area perpendicular to the thickness direction of the layer.

(e) As in the reformed α-type $Al_2O_3$ layer, the reformed AlTiZrO layer is analyzed with the field-emission-type scanning electron microscope. In the analysis, individual crystal grains having a hexagonal crystal lattice present within the measurement range of a polished surface, are irradiated by an electron beam. Then, a tilt angle, which is the angle formed between the normal line to the (0001) plane of the crystal grain and the normal line to the polished surface of the cutting tool, is measured. The measured tilt angles belonging to a range of 0 to 45° are sectioned every pitch of 0.25°, and the frequencies existing in each section are collected, being represented by a tilt angle frequency distribution graph. In the tilt-angle frequency distribution graph, a sharp highest peak appears at a specific section of the tilt angle, and the total sum of frequencies existing in the range of 0 to 10° occupies a ratio of 60% or more of the total frequencies. This means that the reformed AlTiZrO layer with high (0001) plane orientation ratio is formed. The (0001) plane orientation ratio of the reformed AlTiZrO layer is higher than that of the conventional AlTiZrO layer of the conventional coated cutting tool, resulting even more superior high-temperature strength of the reformed AlTiZrO layer.

(f) In addition, the reformed AlTiZrO layer is analyzed by the field-emission-type scanning electron microscope and an electronic backscattering diffraction image apparatus. In the analysis, individual crystal grains having a hexagonal crystal lattice present within the measurement range of a polished surface, are irradiated by an electron beam. Then, a tilt angle, which is the angle formed between the normal line to the (0001) plane of the crystal grain and the normal line to the polished surface of the cutting tool, is measured. Based on the measurement results, a crystallographic orientation relationship between the adjacent crystal lattices is calculated, and a distribution of lattice points (constituent atom sharing lattice points) is calculated. The constituent atom sharing lattice point is a lattice point that has a constituent atom shared by two crystal lattices forming the grain boundary at the grain boundary. A constituent atom sharing lattice point type in which N lattice points not sharing the constituent atom exist between the constituent atom sharing lattice points (where N is an even number of 2 or more in view of a crystal structure of corundum type hexagonal close packed crystal but does not include even numbers of 4, 8, 14, 24, and 26 when the upper limit of N is set to 28 in view of distribution frequency) is expressed as ΣN+1. When the reformed AlTiZrO layer is observed by the field-emission-type scanning electron microscope, it is seen that the reformed AlTiZrO layer includes the crystal grains with the flat-plate polygonal vertically elongated shape. Among the crystal grains with the flat-plate polygonal vertically elongated shape, 60% or more of them are divided by at least one of crystal lattice interface with the constituent atom sharing lattice point type expressed by Σ3 (hereinafter referred as a Σ3 coincidence site lattice interface) inside.

(h) As described above, the upper layer composed of the reformed AlTiZrO layer has a high (0001) plane orientation rate, and a crystal plane at the surface thereof has the same orientation as a crystal plane (for example, (0001)) within the plane perpendicular to the layer thickness direction of this layer. Thus, outer surface of the upper layer is formed in the shape of a flat plate which is substantially flat (as seen within the plane parallel to the layer thickness direction), and shows excellent chipping resistance due to the surface properties thereof. Furthermore, the strength within the crystal grains is increased since the Σ3 coincidence site lattice interfaces are present inside the grains with the flat-plate polygonal vertically elongated shape. Therefore, the reformed AlTiZrO layer has excellent high-temperature hardness and high-temperature strength and shows excellent chipping resistance, compared to the conventional AlTiZrO layer.

(i) Accordingly, as the hard coating layer of the present embodiment, the coated tool of the present invention includes the reformed α-type $Al_2O_3$ layer having a high (0001) plane orientation rate and having excellent high-temperature strength as the intermediate layer. Furthermore, the coated tool of the present invention includes the reformed AlTiZrO layer having excellent high-temperature hardness, high-temperature strength, and surface properties as the upper layer. The coated tool of the present invention has superior high-temperature hardness, heat resistance, and high-temperature strength as compared to the conventional coated tools 1 and 2. As a result, it exhibits excellent chipping resistance for a long-term use, even when the coated tool is used for high-speed intermittent cutting accompanied by high heat generation, and intermittent impact loading acts repeatedly on the cutting edge. The present embodiment has been made on the basis of the above knowledge and includes the following configurations.

(1) Provided is a surface-coated cutting tool formed by vapor-depositing, on the surface of a tool substrate made of tungsten carbide-based cemented carbide or titanium carbonitride-based cermet, a hard coating layer including (a) to (c) below.

(a) The lower layer is a Ti compound layer composed of one or more of a titanium carbide layer, a titanium nitride layer, a titanium carbonitride layer, a titanium carboxide layer, and a titanium oxycarbonitride layer, all of which are formed by chemical vapor deposition, and having a total mean layer thickness of 3 to 20 μm.

(b) The intermediate layer is an aluminum oxide layer having a mean layer thickness of 1 to 5 μm and having an α-type crystal structure in a chemically vapor-deposited state.

(c) The upper layer is a Ti- and Zr-containing aluminum oxide layer having a mean layer thickness of 2 to 15 μm and having an α-type crystal structure in a chemically vapor-deposited state, and contains Ti and Zr.

The intermediate layer (b) has properties indicated by a tilt-angle frequency distribution graph in which the highest peak exists in a tilt angle division ranging 0 to 10° and the total sum of frequencies existing in the range of 0 to 10° occupies a ratio of 45% or more of the total frequencies in the tilt-angle frequency distribution graph. The tilt-angle frequency distribution graph is obtained by utilizing a field-emission-type scanning electron microscope. Electron beams are irradiated to individual crystal grains, which has a hexagonal crystal lattice and exists in a measurement range of a polished plane. A tilt angle formed by the normal line to the polished plane and the normal line to (0001) plane as a crystal plane of the crystal grains is measured. The measured tilt angles belonging to a range of 0 to 45° every pitch of 0.25° are sectioned. The frequencies existing in each section are collected.

When the texture of the upper layer of the above (c) is observed by the emission type scanning electron microscope, the upper layer is a Ti- and Zr-containing aluminum oxide layer having a texture composed of crystal grains which have a flat-plate polygonal shape within the plane perpendicular to the layer thickness direction and have an elongated shape in the layer thickness direction within the plane parallel to the layer thickness direction.

The upper layer (c) has properties indicated by a tilt-angle frequency distribution graph in which the highest peak exists in a tilt angle division ranging 0 to 10° and the total sum of frequencies existing in the range of 0 to 10° occupies a ratio of 60% or more of the total frequencies in the tilt-angle frequency distribution graph. The tilt-angle frequency distribution graph is obtained by utilizing a field-emission-type scanning electron microscope. Electron beams are irradiated to individual crystal grains, which has a hexagonal crystal lattice and exists in a measurement range of a polished plane. A tilt angle formed by the normal line to the polished plane and the normal line to (0001) plane as a crystal plane of the crystal grains is measured. The measured tilt angles belonging to a range of 0 to 45° every pitch of 0.25° are sectioned. The frequencies existing in each section are collected.

Moreover, the upper layer (c) is a Ti- and Zr-containing aluminum oxide layer consisted of crystal grains, 60% or more of the grains being divided within each grain by at least one or more crystal lattice interfaces with a constituent atom sharing lattice point type expressed by Σ3. The constituent atom sharing lattice point type is expressed as ΣN+1, where "N" represents a number of lattice points (N) without a shared constituent atom between the constituent atom sharing lattice points. The constituent atom sharing lattice point type is even numbers more than 2 between crystal grains having a corundum type hexagonal close-packed structure. If the maximum number of N is set to 28 in view of distribution frequency, even numbers 4, 8, 14, 24, and 26 are excluded from the option for crystal grains having hexagonal close-packed structure. To obtain data related to the constituent atom sharing lattice point type, first, electron beams are irradiated to individual crystal grains within the measurement area on the polished surface with field-emission-type scanning electron microscope and an electron backscatter diffraction imaging device. Then, angles formed by normal lines of crystal lattice faces with hexagonal crystal lattices and the normal line to the polished surface are measured. Then, based on the measurement, a crystallographic orientation relationship between the adjacent crystal lattices is calculated. Then, a distribution of lattice points (constituent atom sharing lattice points) in which constituent atoms of a crystal lattice interface sharing one constituent atom between the crystal lattices is calculated. Then, finally, "N" representing a number of lattice points (N) without a shared constituent atom between the constituent atom sharing lattice points, is obtained.

(2) When the texture of the upper layer (c) of the surface-coated cutting tool described above (as (1)) is observed by the emission type scanning electron microscope, crystal grains corresponding to 35% or more of the whole surface area perpendicular to the layer thickness direction, has a flat-plate polygonal shape within the plane perpendicular to the layer thickness direction and an elongated shape in the layer thickness direction within the plane parallel to the layer thickness direction.

(3) The surface roughness (Ra) of the upper layer (c) in the cutting tool described above (as (1) and (2)) ranges from 0.05 to 0.3

The configuration of the hard coating layer of the coated tool of this aspect will be described below in more detail.

(a) Ti Compound Layer (Lower Layer 12A)

The lower layer is a Ti compound layer composed of one more of titanium carbide (hereinafter, referred to as TiC) layer, a titanium nitride (hereinafter, referred to as TiN) layer, a titanium carbonitride (hereinafter, referred to as TiCN) layer, a titanium carboxide (hereinafter, referred to as TiCO) layer, and a titanium oxycarbonitride (hereinafter, referred to as TiCNO) layer. The lower layer is basically present as a lower layer of the reformed α-type $Al_2O_3$ layer which is the intermediate layer. It has superior toughness and abrasion resistance, contributing to improve high-temperature strength of the hard coating layer. In addition, the lower layer adheres tightly to both the tool substrate and the reformed α-type $Al_2O_3$ layer, contributing an adhesive property of the hard coating layer to the tool substrate. If the total mean layer thickness is less than 3 μm, the improvements described above cannot be sufficiently obtained. On the other hand, if the total mean layer thickness exceeds 20 μm, thermal plastic deformation occurs easily, particularly when the cutting tool is used under high-speed intermittent cutting conditions where a high load is subjected on the cutting edge intermittently and explosively. Thermal plastic deformation causes uneven wear of the cutting tool. Accordingly, the total mean layer thickness is set to 3 to 20 μm.

(b) Reformed α-Type $Al_2O_3$ Layer (Intermediate Layer 12B)

In order to form the reformed α-type $Al_2O_3$ layer, which constitutes the intermediate layer 12B, as already described, an $Al_2O_3$ neclear is formed on the surface of the Ti compound layer, which is the lower layer, under the following low-temperature conditions.

A normal chemical vapor deposition apparatus is used. Composition of reaction gas includes 3 to 10% of $AlCl_3$, 0.5 to 3% of $CO_2$, 0.01 to 0.3% of $C_2H_4$ in vol. %, and $H_2$ as balance. Reaction atmosphere temperature is set at 750 to 900° C. Reaction atmosphere pressure is set at 3 to 13 kPa.

It is desirable that the $Al_2O_3$ neclear is an $Al_2O_3$ neclear thin film having a mean layer thickness of 20 to 200 nm. After the formation of the $Al_2O_3$ neclear, the reaction atmosphere is substituted with a hydrogen atmosphere with pressure of 3 to 13 kPa. Then, temperature of the reaction atmosphere is increased to 1100 to 1200° C. and the $Al_2O_3$ neclear thin film is heat treated. An α-type $Al_2O_3$ layer, which serves as the hard coating layer, is formed under normal conditions. By following steps described above, an α-type $Al_2O_3$ layer is vapor deposited on the heat-treated $Al_2O_3$ neclear thin film, resulting formation of the intermediate layer.

The reformed α-type $Al_2O_3$ layer vapor deposited on the lower layer is analyzed by the field-emission-type scanning electron microscope, as shown in FIGS. 1A and 1B. Electron beams are irradiated to the individual grains, which has a hexagonal crystal lattice and exists in a measurement range of a polished plane. A tilt angle formed by the normal line to the polished plane and the normal line to (0001) plane as a crystal plane of the crystal grains is measured. The measured tilt angles belonging to a range of 0 to 45° every pitch of 0.25° are sectioned. The frequencies existing in each section are collected and a tilt-angle frequency distribution graph is plotted. In the tilt-angle frequency distribution graph, the sharp highest peak exists in a tilt angle division ranging 0 to 10°.

The highest peak position of the measured tilt angles in the tilt angle frequency distribution graph of the reformed α-type $Al_2O_3$ layer can be changed by performing heat-treatment after the formation of the $Al_2O_3$ neclear (thin film) with a predetermined layer thickness. In addition, the total sum of frequencies existing in the range of 0 to 10° occupies a ratio of 45% or more of the total frequencies in the tilt-angle frequency distribution graph (which means the (0001) plane orientation rate is high). Accordingly, whenever the thickness of the $Al_2O_3$ neclear (thin film) becomes too thin or too thick, the position of the highest peak of the measured tilt angles moves out of the range of 0 to 10°. In addition, the total sum of frequencies existing in the range of 0 to 10° becomes less than a ratio of 45% of the total frequencies in the tilt-angle frequency distribution graph. As a result, excellent high-temperature strength cannot be obtained.

The reformed α-type $Al_2O_3$ layer has superior high-temperature strength in addition to the excellent high-temperature hardness and heat resistance of the α-type $Al_2O_3$ layer of the conventional coated tool. Furthermore, by configuring the reformed α-type $Al_2O_3$ layer as an intermediate layer with a high (0001) plane orientation rate, the (0001) plane orientation rate of the reformed AlTiZrO layer vapor-deposited thereon can be increased. As a result, the surface properties of an upper layer composed of the reformed AlTiZrO layer can be improved, and high-temperature strength can be improved.

If the mean layer thickness of the intermediate layer composed of the reformed α-type $Al_2O_3$ layer is less than 1 μm, the hard coating layer cannot be provided with the above characteristics of the reformed α-type $Al_2O_3$ layer. On the other hand, if the mean layer thickness exceeds 5 μm, high temperature generated during cutting and high load subjected to the cutting edge leads to a higher rate of occurrence of thermal plastic deformation, which causes uneven wear of the cutting tool. As a result, the cutting tool is abrased faster. Thus, the mean layer thickness is set to 1 to 5 μm.

(c) Reformed AlTiZrO Layer (Upper Layer 12C)

As for the upper layer 12C composed of the reformed AlTiZrO layer chemically vapor-deposited on the intermediate layer 12B, an Al component which is a constituent component of the upper layer improves the high-temperature hardness and heat resistance of the layer. An extremely small amount (Ti/(Al+Ti+Zr)) is 0.002 to 0.01 (as an atomic ratio) in a ratio accounted for in the total amount with Al) of Ti component and an extremely small amount (Zr/(Al+Ti+Zr)) is 0.002 to 0.1 (as an atomic ratio) in a ratio accounted for in the total amount with Al) of Zr component contained in the upper layer improves the crystal grain boundary strength of the reformed AlTiZrO layer, and contributes to improving the high-temperature strength of the upper layer. If the content ratio of the Ti and Zr components in the upper layer is less than 0.002, the above functions cannot be obtained. On the other hand, if the content ratio of the Ti and Zr components exceeds 0.01, the grain boundary strength deteriorates as Ti oxide and Zr oxide grains precipitate in the layer. Therefore, it is desirable that the content ratio of the Ti component (the value of the ratio of Ti/(Al+Ti+Zr)) and the content ratio of the Zr component (the value of the ratio of Zr/(Al+Ti+Zr)) in the upper layer accounted for in the total amount with the Al component is 0.002 to 0.01 (as an atomic ratio).

The reformed AlTiZrO layer can be vapor-deposited by adjusting chemical vapor deposition conditions of the composition of a reaction gas during vapor deposition, the reaction atmosphere temperature, and the reaction atmosphere pressure as follows, for example.

First, the first-step vapor deposition is performed for 60 minutes under the following conditions:

(i) Composition of reaction gas (vol. %):
1 to 5% of $AlCl_3$,
0 to 0.01% of $TiCl_4$,
0.05 to 0.1% of $ZrCl_4$
2 to 6% of $CO_2$,
1 to 5% of HCl,
0.25 to 0.75% of $H_2S$, and
$H_2$ as balance,
(ii) Reaction atmosphere temperature: 960 to 1010° C., and
(iii) Reaction atmosphere pressure: 6 to 10 kPa, Second, the second-step vapor deposition is performed under the following conditions.

(i) Composition of reaction gas (vol. %):
6 to 10% of $AlCl_3$,
0.05 to 0.6% of $TiCl_4$,
0.6 to 1.2% of $ZrCl_4$
2 to 10% of $CO_2$,
3 to 5% of HCl,
0 to 0.5% of $H_2S$, and
$H_2$ as balance,
(ii) Reaction atmosphere temperature: 940 to 980° C., and
(iii) Reaction atmosphere pressure: 6 to 10 kPa.

When a vapor deposition layer with a mean layer thickness of 2 to 15 μm is formed as a film, by performing the first-step and the second-step vapor deposition in the conditions described above, the reformed AlTiZrO layer whose ratio of Ti to Al component is 0.002 to 0.01 and that of Zr to Al component is 0.002 to 0.01 in atomic ratio, is formed.

When the reformed AlTiZrO layer is observed by the emission type scanning electron microscope, the textures shown in FIGS. 3A and 3B are observed. The reformed AlTiZrO layer is viewed within the plane perpendicular to the layer thickness direction. The texture containing large crystal grains with a flat-plate polygonal shape is formed. The reformed AlTiZrO layer is viewed within the plane parallel to the layer thickness direction. The outer surface of the reformed AlTiZrO layer is substantially flat. Also, the texture containing crystal grains with elongated shape is formed (Referred as a flat-plate polygonal elongated shape crystal grain).

As for the reformed AlTiZrO layer, similarly to the reformed α-type $Al_2O_3$ layer, which constitutes the intermediate layer, the tilt angle of the normal line to the (0001) plane to the normal line to a polished surface is measured and a tilt angle frequency graph is plotted. In the tilt angle frequency graph of the reformed AlTiZrO layer, a peak exists in a tilt angle division ranging 0 to 10° and the total sum of frequencies existing in the range of 0 to 10° occupies a ratio of 60% or more of the total frequencies in the tilt-angle frequency distribution graph. These results indicate that the (0001) plane orientation rate of the reformed AlTiZrO layer, which constitutes the upper layer, is high.

That is, as for the reformed AlTiZrO layer, since the (0001) plane orientation rate of the reformed α-type $Al_2O_3$ layer, which is the intermediate layer, is 45% or more, the reformed AlTiZrO layer is also formed as a layer having a high (0001) plane orientation rate (the (0001) plane orientation rate is 60% or more).

When the upper layer is viewed within the plane parallel to the layer thickness direction, the outer surface of the upper layer is formed in the shape of a substantially flat plate. Thus, the upper layer has a excellent surface property. Consequently, the upper layer shows superior chipping resistance as compared to the conventional AlTiZrO layer.

When the vapor deposition of the reformed AlTiZrO layer is performed under further limited conditions (for example, the conditions where volume percentages of $TiCl_4$, $ZrCl_4$, and $H_2S$ in the reaction gas are 0, 0.05 to 0.1, and 0.5 to 0.75 vol. %, respectively, and the reaction atmosphere temperature is set to 990 to 1010° C. in the first-step vapor deposition, and volume percentages of $TiCl_4$, $ZrCl_4$, and $H_2S$ in the reaction gas are set 0.05 to 0.2 vol. %, 0.05 to 0.1, and 0.05 to 0.1 vol. %, respectively and the reaction atmosphere temperature is set to 940 to 960° C. in the second-step vapor deposition), a texture described below is formed. In the texture, when it is viewed within the plane perpendicular to the layer thickness direction, there are large-sized crystal grains with a flat-plate hexagonal shape. When the texture is viewed within the plane parallel to the layer thickness direction, the outer surface of the upper layer is substantially flat and the crystal grains have an elongated shape stretched in the layer thickness direction. The ratio of the surface area occupied by the crystal grains having the flat-plate hexagonal elongated shape, to the whole surface area of the plane parallel to the layer thickness direction, accounts for 35% or more, in the upper layer formed in the further limited conditions.

The reformed AlTiZrO layer is analyzed with a field-emission-type scanning electron microscope and the electronic backscattering diffraction image apparatus. In the analysis, electron beams are irradiated to individual crystal grains within the measurement range of the polished surface. Then, angles between the normal line to each of crystal lattice planes with a hexagonal crystal lattice and the normal line to the polished surface are measured. From the measurement results, the crystal orientation relationship between adjacent crystal lattices is calculated. Then, distribution of lattice points (constituent atom sharing lattice points) is calculated. The constituent atom sharing lattice point is a lattice point that has a constituent atom shared by two crystal lattices forming the grain boundary at the grain boundary. A constituent atom sharing lattice point configuration is expressed by $\Sigma N+1$, where the number represented by N is the number of lattice points that have no constituent atom shared at the grain boundary between two constituent atom sharing lattice points with constituent atoms. The constituent atom sharing lattice point type is even numbers more than 2 between crystal grains having a corundum type hexagonal close-packed structure. If the maximum number of N is set to 28 in view of distribution frequency, even numbers 4, 8, 14, 24, and 26 are excluded from the option for crystal grains having hexagonal close-packed structure. The crystal grains of the reformed AlTiZrO layer are divided by at least one of $\Sigma 3$ coincidence site lattice interface within each crystal grain. The ratio of surface area occupied by the crystal grains that have the flat-plate polygonal elongated shape and divided by at least one of $\Sigma 3$ coincidence site lattice interface, to the surface area occupied by crystal grains with the flat-plate polygonal elongated shape (including the flat-plate hexagonal elongated shape), is 60% or more.

The strength within the crystal grains of the reformed AlTiZrO layer is increased due to the presence of the $\Sigma 3$ coincidence site lattice interface in the crystal grains with the flat-plate polygonal (including hexagonal) elongated shape. As a result, cracking of the reformed AlTiZrO layer is suppressed during high-speed heavy cutting work where high load is subjected to the reformed AlTiZrO layer. Even if the cracking occurred, growth and spreading of the cracking would be prevented. Therefore, chipping resistance, fracture resistance, and spalling resistance are improved in the cutting tool having the reformed AlTiZrO layer.

Accordingly, the upper layer of the present invention, which has a high (0001) plane orientation rate, has flat surface properties, and is composed of the reformed AlTiZrO layer in which the $\Sigma 3$ coincidence site lattice interfaces are present with in the flat-plate polygonal (including flat hexagonal) elongated crystal grains, exhibits excellent chipping resistance and abrasion resistance for a prolonged period of time without causing chipping, fracture, spalling, or the like and also without causing thermal plastic deformation, uneven wear, or the like, even in high-speed intermittent cutting work accompanied by high heat generation and high load subjected on the cutting edge.

If the layer thickness of the upper layer composed of the reformed AlTiZrO layer is less than 2 μm, the excellent characteristics of the upper layer cannot be sufficiently exhibited. On the other hand, if the layer thickness of the upper layer exceeds 15 μm, thermal plastic deformation, which causes uneven wear, easily occurs. In addition, a rate of occurrence of chipping is also increased. Therefore, the mean layer thickness of the upper layer is set to 2 to 15 μm.

As a comparison, the conventional AlTiZrO layer (the layer described in the PTL 7), was analyzed by the field-emission-type scanning electron microscope and the electronic backscattering diffraction image apparatus. In the analysis, the texture of crystal grains and the constituent atom sharing lattice point configuration of the conventional AlTiZrO layer were analyzed. The texture of the crystal grains of the conventional AlTiZrO layer is made of pyramidal-shaped crystal grains with a polygonal elongated shape stretched to the layer thickness direction. The outer surface of the conventional AlTiZrO layer has protuberances and recesses along with the pyramidal shape of the crystal grains. Because of these, the abrasion resistance of the conventional AlTiZrO layer is inferior compared to that of the reformed AlTiZrO layer.

In terms of the constituent atom sharing lattice point configuration, the ratio of surface area occupied by the pyramidal-shaped crystal grains, which have a polygonal elongated shape stretched to the layer thickness direction and contain a $\Sigma 3$ coincidence site lattice interface within, to the surface area occupied by crystal grains, which consist the conventional AlTiZrO layer and have the convexoconcave polygonal elongated shape stretched to the layer thickness direction, is 12% or less. Therefore, the strength within the crystal grains is not improved as in the reformed AlTiZrO layer.

Accordingly, the conventional coated tool 7 in which the upper layer of the hard coating layer is composed of the conventional AlTiZrO layer cannot prevent occurrence of chipping, fracture, spalling, or the like and is inferior in tool performance, in high-speed intermittent cutting work accompanied by high heat generation and intermittent impact loading subjected on the cutting edge.

In the coated tool of the present invention, after the reformed AlTiZrO layer of the upper layer is formed, polishing processing using a grind stone or polishing processing using wet blasting can be performed on the surface of the upper layer, so that the surface roughness of the reformed AlTiZrO layer can be further adjusted. For example, the occurrence of welding to the surface-coated tool during cutting can be suppressed by adjusting the surface roughness of the reformed AlTiZrO layer to Ra 0.05 to 0.3 μm.

The surface roughness Ra in the present invention means the value of arithmetic mean roughness Ra defined by JIS B0601 (1994), and the measuring method thereof is not particularly limited.

Although the embodiments of the present invention have been described, the invention is limited to these embodiments. The same effects as those of the respective embodiments can be obtained even if two or more kinds of elements selected from a group consisting of Ti, Y, Zr, Cr, and B are appropriately combined and used as added elements to the upper layer.

Next, the coated tool of the present invention will be specifically described by means of examples.

Example 1

The following powders, each having a mean particle size within a range of 2 to 4 μm, were prepared as raw materials for substrates: WC powder, TiC powder, ZrC powder, VC powder, TaC powder, NbC powder, $Cr_3C_2$ powder, TiN powder, TaN powder, and Co powder. These raw powders were compounded with each other in the compounding compositions shown in Table 1, mixed with each other in an acetone solution having wax added thereto for 24 hours using a ball mill, and were then dried under reduced pressure. Thereafter, the resultant powder mixture was press-formed into a green compact having a predetermined shape at a pressure of 98 MPa. The green compact was then sintered in a vacuum under the following conditions: a pressure of 5 Pa, a predetermined temperature within a range of 1370° C. to 1470° C., and a holding duration of 1 hour. After sintering, cutting edges were subjected to honing (R: 0.07 mm) to manufacture bodies 1A to 1E made of WC-based cemented carbide and having a throwaway tip shape defined in ISO-CNMG120408.

Additionally, the following powders, each having a mean particle size within a range of 0.5 to 2 μm, were prepared as raw materials: TiCN (TiC/TiN=50/50 in weight ratio) powder, $Mo_2C$ power, ZrC power, NbC powder, TaC powder, WC power, Co powder and Ni powder. These raw powders were compounded with each other in the compounding compositions shown in Table 2, were wet-mixed with each other for 24 hours using a ball mill, and were dried. Thereafter, the resulting powder mixture was press-formed into a green compact at a pressure of 98 MPa. The green compact was then sintered in a nitrogen atmosphere under the following conditions: a pressure of 1.3 kPa, a temperature of 1540° C., and a holding duration of 1 hour. After sintering, cutting edges were subjected to honing (R: 0.07 mm) to manufacture bodies 1a to 1e made of TiCN-based cermet and having a tip shape defined in ISO CNMG120418.

Subsequently, these bodies 1A to 1E and the bodies 1a to 1e were loaded into a normal chemical vapor deposition apparatus.

(a) First, Ti compound layers with target layer thicknesses shown in Table 7 were vapor-deposited as lower layers of hard coating layers under the conditions shown in Table 3 (1-TiCN in Table 3 shows the formation conditions of TiCN layers with a longitudinal growth crystalline structure disclosed in Japanese Unexamined Patent Application Publication No. 6-8010, and the others show the formation conditions of a normal granular crystalline structure).

(b) Subsequently, reformed α-type $Al_2O_3$ layers with target layer thicknesses shown in Table 8 were vapor-deposited as intermediate layers of the hard coating layers under the conditions shown in Table 4.

(c) Next, coated tools A1 to A15 of the present invention were manufactured, respectively, by vapor-depositing reformed AlTiO layers with target layer thicknesses similarly shown in Table 8 as upper layers of hard coating layers according to the vapor deposition conditions shown in Table 5.

For the purpose of comparison, comparative coated tools A1 to A10 (equivalent to the conventional coated tool 2) provided with hard coating layers composed of Ti compound layers and conventional AlTiO layers with target layer thicknesses shown in Table 9 were manufactured, respectively, by forming lower layers of hard coating layers under the conditions shown in Table 3 and forming upper layers under the conditions (equivalent to the vapor deposition conditions of the conventional AlTiO layers disclosed in PTL 2 Japanese Unexamined Patent Application Publication No. 2006-289556)) shown in Table 6.

The type of the bodies, the type of the lower layers, and the thickness of the lower layers in the comparative coated tools A1 to A10 are the same as those of the coated tools A1 to A10 of the present invention, respectively.

Moreover, for reference, the reference coated tools A11 to A15 (equivalent to the conventional coated tool 1) provided with hard coating layers composed of Ti compound layers and conventional α-type $Al_2O_3$ layers with target layer thicknesses shown in Table 9 were manufactured, respectively, by forming lower layers of hard coating layers under the conditions shown in Table 3 and forming α-type $Al_2O_3$ layers under the conditions (equivalent to the vapor deposition conditions of the conventional α-type $Al_2O_3$ layers disclosed in PTL 1 (Japanese Unexamined Patent Application Publication No. 2006-198735)) shown in Table 6.

The type of the bodies, the type of the lower layers, and the thickness of the lower layers in the reference tools A11 to A15 are the same as those of the coated tools A11 to A15 of the present invention, respectively.

Post-processing composed of wet blasting processing with projection pressure 0.15 MPa and $Al_2O_3$ grains of 200 meshes was performed on the surfaces of some reformed AlTiO layers of the coated tools of the present invention, and the surfaces of some conventional AlTiO layers of the comparative coated tools. As the post-processing, polishing processing using an elastic grind stone may be adopted.

Tables 8 and 9 show the values of the surface roughness (Ra (μm)) of the reformed AlTiO layers (those marked by * in Table 8) of the coated tools of the present invention which were subjected to post-processing and the conventional AlTiO layers (those marked by * in Table 9) of the comparative coated tools. (For reference, the values of Ra regarding the coated tools of the present invention and the comparative coated tools which were not subjected to post-processing are also shown in Tables 8 and 9.)

Subsequently, as for the reformed α-type $Al_2O_3$ layers which constitute the intermediate layers of the hard coating layers of the coated tools A1 to A15 of the present invention, the reformed AlTiO layers which constitute the upper layers of the hard coating layers, the conventional AlTiO layers of the comparative coated tools A1 to A10, and the α-type $Al_2O_3$ layers of the reference coated tools A11 to A15, tilt angle frequency distribution graphs were plotted, respectively, using the field-emission-type scanning electron microscope.

The tilt angle frequency distribution graphs were plotted by setting the respective layers in the coated tools A1 to A15 of the present invention, the comparative coated tools A1 to A10, and the reference coated tools A11 to A15 within a lens barrel of the field-emission-type scanning electron microscope, with the surfaces of the layers as polished surfaces; individually irradiated crystal grains having a hexagonal crystal lattice present within the measurement range of each polished surface with an electron beam having an acceleration voltage of 15 kV with an irradiating current of 1 nA at an angle of incidence of 70 degrees with respect to each polished surface, thereby measuring the tilt angle of the normal line to the (0001) plane, which is a crystal plane of each crystal grain, to the normal line to each polished surface, at intervals of 0.1 μm/step for a region 30×50 μm, using the electronic backscattering diffraction image apparatus; and on the basis of these measurement results, dividing the measured tilt angles which are within a range of 0 to 45 degrees among the measured tilt angles at every pitch of 0.25 degrees, and summing the frequencies present within the respective divisions.

As an example of the tilt angle frequency distribution graphs, FIG. 2 shows a tilt angle frequency distribution graph of the (0001) plane of a reformed α-type $Al_2O_3$ layer which constitutes an intermediate layer of a hard coating layer of a coated tool S1 of the present invention.

The "surface" in this invention includes not only a face parallel to the surface of a base, but also a face which inclines to the surface of the base, for example, the cutting face of a layer.

As a result, in the obtained tilt angle frequency distribution graphs of the reformed α-type $Al_2O_3$ layers and reformed AlTiO layers of the coated tools of the present invention, the conventional AlTiO layers of the comparative coated tools A1 to A10, and the conventional α-type $Al_2O_3$ layers of the reference coated tools A11 to A15, as shown in Tables 8 and 9, respectively, the distributions of the measured tilt angles of the (0001) plane in the reformed α-type $Al_2O_3$ layers and reformed AlTiO layers of the coated tools of the present invention show a tilt angle frequency distribution graph in which the highest peak appears in the tilt angle division within a range of 0 to 10 degrees, respectively. On the other hand, the distribution of the measured tilt angles of the (0001) plane in the conventional AlTiO layers of the comparative coated tools A1 to A10 shows a tilt angle frequency distribution graph in which the highest peak does not present in an unbiased manner within a range of 0 to 45 degrees.

Tables 8 and 9 show the ratios of the frequencies present in the tilt angle division within a range of 0 to 10 degrees, which are accounted for in the overall tilt angle frequency distribution graph.

Subsequently, as for the reformed AlTiO layers which constitute the upper layers of the coated tools A1 to A15 of the present invention, and the conventional AlTiO layers of the comparative coated tools A1 to A10, the crystal grain structure and the constituent atom sharing lattice point configuration were inspected using the field-emission-type scanning electron microscope and the electronic backscattering diffraction image apparatus.

First, when the reformed AlTiO layers of the coated tools A1 to A15 of the present invention and the conventional AlTiO layers of the comparative coated tools A1 to A10 were observed using the field-emission-type scanning electron microscope, the flat-plate polygonal (including flat hexagonal) and elongated crystal grain structure of a large grain size shown typically in FIGS. 3A and 3B were observed in the coated tools A1 to A15 of the present invention (FIG. 3A is a schematic view of the texture of the coated tools A1 to A9 of the present invention as seen within the plane perpendicular to the layer thickness direction, and FIG. 3C is a schematic view of the texture composed of flat hexagonal and elongated crystal grains of a large grain size, of the coated tools A10 to A15 of the present invention as seen within the plane perpendicular to the layer thickness direction).

On the other hand, as shown typically in FIGS. 5A and 5B, a polygonal and elongated crystal grain structure was observed in the comparative coated tools A1 to A10. However, the grain size of each crystal grain was small as compared to that of the present invention, and as being clear from FIG. 5B, pyramidal irregularities were formed in the layer surface (FIGS. 5A and 5B are schematic views of the texture of the comparative coated tools A1 to A10).

Subsequently, as for the reformed AlTiO layers of the coated tools A1 to A15 of the present invention, and the conventional AlTiO layers of the comparative coated tools A1 to A10, the area ratios of crystal grains in which the Σ3 coincidence site lattice interfaces are present inside the crystal grains which constitute each layer were measured.

First, as for the reformed AlTiO layers of the coated tools A1 to A15 of the present invention, when the respective layers are within a lens barrel of the field-emission-type scanning electron microscope, with the surfaces of the layers as polished surfaces; crystal grains having a hexagonal crystal lattice present within the measurement range of each polished surface are individually irradiated with an electron beam having an acceleration voltage of 15 kV with an irradiating current of 1 nA at an angle of incidence of 70 degrees with respect to each polished surface, thereby measuring the angle at which the normal line to each of crystal lattice planes of the crystal grains crosses the normal line to each base surface, at intervals of 0.1 µm/step for a region 30×50 µm, using the electronic backscattering diffraction image apparatus; and from these measurement results, the crystal orientation relationship between adjacent crystal lattices is calculated, and the distribution of lattice points (constituent atom sharing lattice points) where respective constituent atoms which constitute a crystal lattice interface sharing one constituent atom between the crystal lattices is calculated; and a constituent atom sharing lattice point configuration in which N (here, N is any even number equal to or greater than 2 in a crystal structure of a corundum-type hexagonal close-packing crystal, but when the upper limit of N is 28 from the viewpoint of a distribution frequency, even numbers 4, 8, 14, 24, and 26 do not exist) lattice points which do not share any constituent atoms between the constituent atom sharing lattice points are present is expressed by ΣN+1, the area ratios of crystal grain in which at least one or more Σ3 coincidence site lattice interfaces are present inside the crystal grains among all the crystal grains present within the measurement range of the reformed AlTiO layers were obtained, and the values of the area ratios were shown in Table 8 as Σ3 coincidence site lattice interface ratio (%).

Next, even as for the conventional AlTiO layers of the comparative coated tools A1 to A10, by the same method as the case of the coated tools of the present inventions, the area ratios of crystal grains in which at least one or more Σ3 coincidence site lattice interfaces are present inside the crystal grains among all the crystal grains present within the measurement range of the conventional reformed AlTiO layers were obtained, and the values of the area ratios were shown in Table 9 as a Σ3 coincidence site lattice interface ratio (%).

As shown in Tables 8 and 9, in the reformed AlTiO layers of the coated tools A1 to A15 of the present invention, the area ratios of crystal grains in which at least one or more Σ3 coincidence site lattice interfaces are present inside the crystal grains are 60% or more. On the other hand, in the conventional AlTiO layers of the comparative coated tools A1 to A10, the area ratios of crystal grains in which at least one or more Σ3 coincidence site lattice interfaces are present inside the crystal grains are 40% or less. It can be understood from this that the rate at which the Σ3 coincidence site lattice interfaces are present inside crystal grains is very small.

Subsequently, as for the reformed AlTiO layers of the coated tools A1 to A15 of the present invention, and the conventional AlTiO layers of the comparative coated tools A1 to A10, the area ratios of flat hexagonal crystal grains of a large grain size present within the plane perpendicular to the layer thickness direction were obtained using the field-emission-type scanning electron microscope. These values are shown in Tables 8 and 9.

Here, the "flat hexagonal crystal grains of a large grain size" means polygonal crystal grains in which the mean value of ten grains is 3 to 8 µm when the diameter of grains present within the plane perpendicular to the layer thickness direction observed by the field-emission-type scanning electron microscope is measured, and six vertex angles whose angle of vertex is 100 to 140° are provided.

Subsequently, although the thicknesses of the respective constituent layers in the hard coating layers of the coated tools A1 to A15 of the present invention, the comparative coated tools A1 to A10, and the reference coated tools A11 to A15 were measured using the scanning electron microscope (longitudinal-section measurement), substantially the same mean layer thicknesses (mean value of five-point measurements) as the target layer thicknesses were shown in all cases.

Next, all the coated tools A1 to A15 of the present invention, the comparative coated tools A1 to A10, and the reference coated tools A11 to A15 were screw-fixed to a tip portion of a bite made of tool steel by a fixing jig, and in this state, were subjected to a dry high-speed intermittent cutting test (normal cutting speed is 200 m/min) on bearing steel under the following conditions (referred to as cutting condition A):

Workpiece: a round bar of JIS-SUJ2 (HRC62) with four longitudinal grooves equally-spaced in the length direction,
Cutting speed: 250 m/min,
Depth of cut: 1.5 mm,
Feed rate: 0.15 mm/rev, and
Cutting time: 5 minutes, a dry high-speed intermittent cutting test (normal cutting speed is 200 m/min) on alloy tool steel under the following conditions (referred to as cutting condition B):
Workpiece: a round bar of JIS-SKD11 (HRC58) with four longitudinal grooves equally-spaced in the length direction,
Cutting speed: 300 m/min,
Depth of cut: 1.5 mm,
Feed rate: 0.15 mm/rev, and
Cutting time: 5 minutes, and a dry high-speed intermittent cutting test (normal cutting speed is 150 m/min) on carbon tool steel under the following conditions (referred to as cutting condition C):
Workpiece: a round bar of JIS-SK3 (HRC61) with four longitudinal grooves equally-spaced in the length direction,
Cutting speed: 250 m/min,
Depth of cut: 1.5 mm,
Feed rate: 0.15 mm/rev, and
Cutting time: 5 minutes, and the flank wear widths of the cutting edges were measured in all the cutting tests. These test results are shown in Table 10.

TABLE 1

| | Type | Compounding composition (Mass %) | | | | | | | | | |
|---|---|---|---|---|---|---|---|---|---|---|---|
| | | Co | TiC | ZrC | VC | TaC | NbC | $Cr_3C_2$ | TiN | TaN | WC |
| Tool substrate | 1A | 7 | — | — | — | — | — | — | — | — | Balance |
| | 1B | 5.7 | — | — | — | 1.5 | 0.5 | — | 1.2 | — | Balance |
| | 1C | 5.7 | 2.3 | — | — | — | — | 1 | — | — | Balance |
| | 1D | 8.5 | — | 0.5 | — | — | — | 0.5 | — | — | Balance |
| | 1E | 12.5 | 2 | — | — | — | — | — | 1 | 2 | Balance |

TABLE 2

| | Type | Compounding composition (Mass %) | | | | | | | |
|---|---|---|---|---|---|---|---|---|---|
| | | Co | Ni | ZrC | TaC | NbC | $Mo_2C$ | WC | TiCN |
| Tool substrate | 1a | 12 | 6 | — | 10 | — | 10 | 16 | Balance |
| | 1b | 7 | 7 | — | 5 | — | 7.5 | — | Balance |
| | 1c | 5 | — | — | — | 1 | 6 | 10 | Balance |
| | 1d | 9 | 6 | — | 11 | 2 | — | — | Balance |
| | 1e | 8 | 5 | 1 | 8 | — | 10 | 10 | Balance |

TABLE 3

| | Hard coating layer (Lower layer) | | Formation conditions (Reaction atmosphere pressure given in kPa and temperature given in ° C.) | | |
|---|---|---|---|---|---|
| Type | Composition (Numbers indicate atomic ratio) | | Composition of reaction gas (Vol. %) | Reaction atmosphere | |
| | | | | Pressure | Temperature |
| TiC layer | TiC | | $TiCl_4$: 4.2%, $CH_4$: 8.5%, $H_2$: Balance | 7 | 1020 |
| TiN layer (First layer) | TiN | | $TiCl_4$: 4.2%, $N_2$: 30%, $H_2$: Balance | 30 | 900 |
| TiN layer (Other layer) | TiN | | $TiCl_4$: 4.2%, $N_2$: 35%, $H_2$: Balance | 50 | 1040 |
| l—$TiC_{0.5}N_{0.5}$ layer | $TiC_{0.5}N_{0.5}$ | | $TiCl_4$: 4.2%, $N_2$: 20%, $CH_3CN$: 0.6%, $H_2$: Balance | 7 | 900 |
| TiCN layer | $TiC_{0.5}N_{0.5}$ | | $TiCl_4$: 4.2%, $N_2$: 20%, $CH_4$: 4%, $H_2$: Balance | 12 | 1020 |
| TiCO layer | $TiC_{0.5}O_{0.5}$ | | $TiCl_4$: 4.2%, CO: 4%, $H_2$: Balance | 7 | 1020 |
| TiCNO layer | $TiC_{0.3}N_{0.3}O_{0.4}$ | | $TiCl_4$: 4.2%, CO: 3%, $CH_4$: 3%, $N_2$: 20%, $H_2$: Balance | 20 | 1020 |
| α-Type $Al_2O_3$ layer | α-$Al_2O_3$ | | $AlCl_3$: 2.2%, $CO_2$: 5.5%, HCl: 2.2%, $H_2S$: 0.2%, $H_2$: Balance | 7 | 1000 |

TABLE 4

| | | | Neclear thin film formation conditions | | | Heat treatment | |
|---|---|---|---|---|---|---|---|
| | | | | Reaction atmosphere | | Reaction atmosphere | |
| Type | Formation symbol | | Composition of reaction gas (Vol. %) | Pressure/ kPa | Temperature/° C. | Pressure/ kPa | Temperature/° C. |
| Neclear thin film (1A) | 1A | | $AlCl_3$: 3%, $CO_2$: 0.5%, $C_2H_4$: 0.01%, $H_2$: Balance | 3 | 800 | 3 | 1100 |
| Neclear thin film (1B) | 1B | | $AlCl_3$: 6%, $CO_2$: 1.5%, $C_2H_4$: 0.12%, $H_2$: Balance | 7 | 750 | 7 | 1200 |

TABLE 4-continued

| | | | Neclear thin film formation conditions | | Heat treatment | |
|---|---|---|---|---|---|---|
| | | | Reaction atmosphere | | Reaction atmosphere | |
| Type | Formation symbol | Composition of reaction gas (Vol. %) | Pressure/ kPa | Temperature/° C. | Pressure/ kPa | Temperature/° C. |
| Neclear thin film (1C) | 1C | $AlCl_3$: 10%, $CO_2$: 3%, $C_2H_4$: 0.3%, $H_2$: Balance | 13 | 900 | 13 | 1000 |

*Formation conditions of normal α-type $Al_2O_3$ layer after formation of various kinds of neclear thin films are described in Table 3

TABLE 5

| Reformed AlTiO layer | | Formation conditions (Reaction atmosphere pressure given in kPa, and temperature given in ° C.) | | |
|---|---|---|---|---|
| | | | Reaction atmosphere | |
| Formation symbol | | Composition of reaction gas (Vol. %) | Pressure | Temperature |
| 1A | First step | $AlCl_3$: 1%, $TiCl_4$: 0.03%, HCl: 3%, $CO_2$: 2%, $H_2S$: 0.25%, $H_2$: Balance | 7 | 1010 |
| | Second step | $AlCl_3$: 6%, $TiCl_4$: 0.6%, HCl: 3%, $CO_2$: 5%, $H_2S$: 0.%, $H_2$: Balance | 7 | 950 |
| 1B | First step | $AlCl_3$: 2%, $TiCl_4$: 0.04%, HCl: 1%, $CO_2$: 3%, $H_2S$: 0.30%, $H_2$: Balance | 8 | 1000 |
| | Second step | $AlCl_3$: 7%, $TiCl_4$: 0.45%, HCl: 4%, $CO_2$: 6%, $H_2S$: 0.05%, $H_2$: Balance | 10 | 970 |
| 1C | First step | $AlCl_3$: 3%, $TiCl_4$: 0.01%, HCl: 4%, $CO_2$: 4%, $H_2S$: 0.15%, $H_2$: Balance | 8 | 960 |
| | Second step | $AlCl_3$: 8%, $TiCl_4$: 0.20%, HCl: 4%, $CO_2$: 6%, $H_2S$: 0.04%, $H_2$: Balance | 9 | 920 |
| 1D | First step | $AlCl_3$: 4%, $TiCl_4$: 0.05%, HCl: 5%, $CO_2$: 5%, $H_2S$: 0.2%, $H_2$: Balance | 9 | 980 |
| | Second step | $AlCl_3$: 10%, $TiCl_4$: 0.06%, HCl: 3%, $CO_2$: 8%, $H_2S$: 0.04%, $H_2$: Balance | 9 | 1000 |
| 1E | First step | $AlCl_3$: 5%, $TiCl_4$: 0.02%, HCl: 5%, $CO_2$: 6%, $H_2S$: 0.1%, $H_2$: Balance | 8 | 1000 |
| | Second step | $AlCl_3$: 9%, $TiCl_4$: 0.05%, HCl: 5%, $CO_2$: 5%, $H_2S$: 0.02%, $H_2$: Balance | 8 | 960 |
| 1F | First step | $AlCl_3$: 3%, $TiCl_4$: 0.01%, HCl: 2%, $CO_2$: 4%, $H_2S$: 0.1%, $H_2$: Balance | 6 | 970 |
| | Second step | $AlCl_3$: 8%, $TiCl_4$: 0.05%, HCl: 3%, $CO_2$: 4%, $H_2S$: 0.01%, $H_2$: Balance | 6 | 970 |

TABLE 6

| Conventional AlTiO layer | | Formation conditions (Reaction atmosphere pressure given in kPa and temperature given in ° C.) | | |
|---|---|---|---|---|
| Type | Composition (Numbers indicate atomic ratio) | Composition of reaction gas (Vol. %) | Reaction atmosphere | |
| | | | Pressure | Temperature |
| Neclear thin film (1a) | $(Al_{0.995}Ti_{0.005})_2O_3$ | $AlCl_3$: 4%, $TiCl_4$: 0.02%, $CO_2$: 2%, HCl: 1.5%, $H_2S$: 0.05%, $H_2$: Balance | 7 | 870 |
| Neclear thin film (1b) | $(Al_{0.99}Ti_{0.01})_2O_3$ | $AlCl_3$: 3.8%, $TiCl_4$: 0.04%, $CO_2$: 2%, HCl: 1.5%, $H_2S$: 0.05%, $H_2$: Balance | 7 | 870 |
| Neclear thin film (1c) | $(Al_{0.98}Ti_{0.02})_2O_3$ | $AlCl_3$: 3.5%, $TiCl_4$: 0.05%, $CO_2$: 2%, HCl: 1.5%, $H_2S$: 0.05%, $H_2$: Balance | 7 | 870 |
| Neclear thin film (1d) | $(Al_{0.97}Ti_{0.03})_2O_3$ | $AlCl_3$: 3.2%, $TiCl_4$: 0.06%, $CO_2$: 2%, HCl: 1.5%, $H_2S$: 0.05%, $H_2$: Balance | 7 | 870 |
| Neclear thin film (1e) | $(Al_{0.96}Ti_{0.04})_2O_3$ | $AlCl_3$: 3%, $TiCl_4$: 0.08%, $CO_2$: 2%, HCl: 1.5%, $H_2S$: 0.05%, $H_2$: Balance | 7 | 870 |
| Neclear thin film (1f) | $(Al_{0.955}Ti_{0.045})_2O_3$ | $AlCl_3$: 2.6%, $TiCl_4$: 0.1%, $CO_2$: 2%, HCl: 1.5%, $H_2S$: 0.05%, $H_2$: Balance | 7 | 870 |
| Neclear thin film (1g) | $(Al_{0.95}Ti_{0.05})_2O_3$ | $AlCl_3$: 2.3%, $TiCl_4$: 0.13%, $CO_2$: 2%, HCl: 1.5%, $H_2S$: 0.05%, $H_2$: Balance | 7 | 870 |
| Reformed layer (1A) | $(Al_{0.995}Ti_{0.005})_2O_3$ | $AlCl_3$: 4%, $TiCl_4$: 0.02%, $CO_2$: 4%, HCl: 2.5%, $H_2S$: 0.2%, $H_2$: Balance | 7 | 1020 |
| Reformed layer (1B) | $(Al_{0.99}Ti_{0.01})_2O_3$ | $AlCl_3$: 3.8%, $TiCl_4$: 0.04%, $CO_2$: 4%, HCl: 2.5%, $H_2S$: 0.2%, $H_2$: Balance | 7 | 1020 |
| Reformed layer (1C) | $(Al_{0.98}Ti_{0.02})_2O_3$ | $AlCl_3$: 3.5%, $TiCl_4$: 0.05%, $CO_2$: 4%, HCl: 2.5%, $H_2S$: 0.2%, $H_2$: Balance | 7 | 1020 |
| Reformed layer (1D) | $(Al_{0.97}Ti_{0.03})_2O_3$ | $AlCl_3$: 3.2%, $TiCl_4$: 0.06%, $CO_2$: 4%, HCl: 2.5% $H_2S$: 0.2%, $H_2$: Balance | 7 | 1020 |

TABLE 6-continued

| Conventional AlTiO layer | | Formation conditions (Reaction atmosphere pressure given in kPa and temperature given in °C.) | | |
|---|---|---|---|---|
| Type | Composition (Numbers indicate atomic ratio) | Composition of reaction gas (Vol. %) | Reaction atmosphere Pressure | Temperature |
| Reformed layer (1E) | $(Al_{0.96}Ti_{0.04})_2O_3$ | $AlCl_3$: 3%, $TiCl_4$: 0.08%, $CO_2$: 4%, HCl: 2.5% $H_2S$: 0.2%, $H_2$: Balance | 7 | 1020 |
| Reformed layer (1F) | $(Al_{0.955}Ti_{0.045})_2O_3$ | $AlCl_3$: 2.6%, $TiCl_4$: 0.1%, $CO_2$: 4%, HCl: 2.5% $H_2S$: 0.2%, $H_2$: Balance | 7 | 1020 |
| Reformed layer (1G) | $(Al_{0.95}Ti_{0.05})_2O_3$ | $AlCl_3$: 2.3%, $TiCl_4$: 0.13%, $CO_2$: 4%, HCl: 2.5% $H_2S$: 0.2%, $H_2$: Balance | 7 | 1020 |

TABLE 7

| | | Tool | Lower layer of hard coating layer [Ti compound layer] | | | |
|---|---|---|---|---|---|---|
| Type | | substrate symbol | First layer (μm) | Second layer (μm) | Third layer (μm) | Fourth layer (μm) |
| Coated tool of the present invention | A1 | 1a | TiN (1) | l-TiCN (17.5) | TiN (1) | TiCNO (0.5) |
| | A2 | 1A | TiCN (1) | l-TiCN (8.5) | TiCO (0.5) | — |
| | A3 | 1b | TiN (1) | l-TiCN (4) | TiC (4) | TiCNO (1) |
| | A4 | 1B | TiC (1) | l-TiCN (9) | — | — |
| | A5 | 1c | TiN (1) | l-TiCN (4.5) | TiCNO (0.5) | — |
| | A6 | 1C | TiN (0.5) | l-TiCN (1.5) | TiC (0.5) | TiCNO (0.5) |
| | A7 | 1d | TiN (0.5) | l-TiCN (10) | TiC (2) | TiCNO (0.3) |
| | A8 | 1D | TiN (1) | TiCN (19) | — | — |
| | A9 | 1e | TiC (0.5) | l-TiCN (9) | TiCO (0.5) | — |
| | A10 | 1E | TiN (1) | TiC (1) | TiCN (7) | TiCO (1) |
| | A11 | 1A | TiN (0.3) | l-TiCN (5) | TiCNO (0.7) | TiCO (0.1) |
| | A12 | 1a | TiN (1) | l-TiCN (10) | TiCO (0.5) | — |
| | A13 | 1B | TiN (0.5) | l-TiCN (12) | TiN (0.5) | TiCNO (0.2) |
| | A14 | 1b | TiN (0.6) | l-TiCN (7) | TiCNO (0.3) | — |
| | A15 | 1C | TiN (0.4) | l-TiCN (3) | TiCN (0.5) | TiCO (0.1) |

(Numbers in the parentheses of lower layer column indicate target layer thickness)

TABLE 8

| | | | Hard coating layer Intermediate layer [Reformed α-type $Al_2O_3$ layer] | | | |
|---|---|---|---|---|---|---|
| Type | | Tool substrate symbol | Formation symbol of intermediate layer | Target layer thickness (μm) | Tilt angle division where (0001) plane shows highest peak (Degree) | Frequency ratio of tilt angle division of 0 to 10 degrees (%) |
| Coated tool of the present invention | A1 | 1a | 1A | 1 | 1.50-1.75 | 60 |
| | A2 | 1A | 1B | 1 | 2.75-3.00 | 52 |
| | A3 | 1b | 1C | 2 | 2.00-2.25 | 65 |
| | A4 | 1B | 1A | 2 | 5.25-5.50 | 70 |
| | A5 | 1c | 1B | 3 | 2.25-2.50 | 83 |
| | A6 | 1C | 1B | 3 | 3.50-3.75 | 97 |
| | A7 | 1d | 1C | 4 | 4.25-4.50 | 84 |
| | A8 | 1D | 1C | 4 | 3.25-3.50 | 86 |
| | A9 | 1e | 1A | 5 | 2.00-2.25 | 89 |

TABLE 8-continued

| | | | | | | |
|---|---|---|---|---|---|---|
| | A10 | 1E | 1B | 5 | 5.25-5.50 | 82 |
| | A11 | 1A | 1B | 2 | 2.25-2.50 | 72 |
| | A12 | 1a | 1C | 2 | 1.75-2.00 | 83 |
| | A13 | 1B | 1A | 3 | 0.50-0.75 | 92 |
| | A14 | 1b | 1B | 2 | 0.25-0.50 | 88 |
| | A15 | 1C | 1C | 3 | 1.25-1.50 | 85 |

| | | | Hard coating layer Upper layer [Reformed AlTiO layer] | | |
|---|---|---|---|---|---|
| Type | | Formation symbol of upper layer | Content ratio of Ti [Ti/(Al + Ti)] (atomic ratio) | Target layer thickness (μm) | Tilt angle division where (0001) plane shows highest peak (Degree) |
| Coated tool of the present invention | A1 | 1A | 0.015 | 5 | 1.50-1.75 |
| | A2 | 1B | 0.0075 | 2 | 3.25-3.50 |
| | A3 | 1C | 0.005 | 4 | 2.00-2.25 |
| | A4 | 1D | 0.004 | 15 | 5.00-5.25 |
| | A5 | 1C | 0.005 | 13 | 2.25-2.50 |
| | A6 | 1A | 0.01 | 10 | 3.50-3.75 |
| | A7 | 1B | 0.0075 | 7 | 4.00-4.25 |
| | A8 | 1C | 0.005 | 6 | 3.00-3.25 |
| | A9 | 1D | 0.004 | 14 | 2.25-2.50 |
| | A10 | 1E | 0.003 | 3 | 1.75-2.00 |
| | A11 | 1F | 0.002 | 4 | 1.50-1.75 |
| | A12 | 1E | 0.003 | 5 | 0.25-0.50 |
| | A13 | 1F | 0.002 | 6 | 0.25-0.50 |
| | A14 | 1E | 0.003 | 3 | 0.50-0.75 |
| | A15 | 1E | 0.003 | 4 | 0.25-0.50 |

| | | Hard coating layer Upper layer [Reformed AlTiO layer] | | | |
|---|---|---|---|---|---|
| Type | | Frequency ratio of tilt angle division of 0 to 10 degrees (%) | Crystal grain ratio having Σ3 coincidence site lattice interface therein (Area %) | Surface ratio of flat hexagonal crystal grain (Area %) | Surface roughness Ra (μm) |
| Coated tool of the present invention | A1 | 71 | 65 | 11 | 0.3* |
| | A2 | 67 | 60 | 5 | 0.4 |
| | A3 | 71 | 73 | 22 | 0.5 |
| | A4 | 72 | 61 | 11 | 0.5 |
| | A5 | 74 | 72 | 14 | 0.6 |
| | A6 | 98 | 84 | 19 | 0.8 |
| | A7 | 87 | 77 | 26 | 0.7 |
| | A8 | 89 | 78 | 18 | 0.05* |
| | A9 | 71 | 82 | 15 | 0.7 |
| | A10 | 85 | 75 | 35 | 0.8 |
| | A11 | 74 | 83 | 78 | 0.1* |
| | A12 | 86 | 84 | 67 | 0.2* |
| | A13 | 95 | 77 | 84 | 0.5 |
| | A14 | 90 | 86 | 72 | 0.3* |
| | A15 | 87 | 79 | 77 | 0.6 |

TABLE 9

| | | Hard coating layer Intermediate layer [Conventional α-type Al$_2$O$_3$ layer] | | | |
|---|---|---|---|---|---|
| Type | | Formation symbol of intermediate layer | Target layer thickness (μm) | Tilt angle division where (0001) plane shows highest peak (Degree) | Frequency ratio of tilt angle division of 0 to 10 degrees (%) |
| Comparative coated tool | A1 | — | — | — | — |
| | A2 | — | — | — | — |
| | A3 | — | — | — | — |
| | A4 | — | — | — | — |
| | A5 | — | — | — | — |
| | A6 | — | — | — | — |
| | A7 | — | — | — | — |
| | A8 | — | — | — | — |
| | A9 | — | — | — | — |
| | A10 | — | — | — | — |

TABLE 9-continued

| Type | | | | | |
|---|---|---|---|---|---|
| Reference coated tool | A11 | 1A | 2 | 1.50-1.75 | 55 |
| | A12 | 1B | 7 | 2.00-2.25 | 63 |
| | A13 | 1C | 10 | 3.00-3.25 | 48 |
| | A14 | 1A | 8 | 1.25-1.50 | 65 |
| | A15 | 1B | 5 | 1.75-2.00 | 71 |

| | | Hard coating layer Upper layer [Conventional AlTiO layer] | | | |
|---|---|---|---|---|---|
| | | Formation symbol of upper layer | Content ratio of Ti [Ti/ | Target | Tilt angle division where (0001) plane |
| Type | | Neclear thin film / Reformed layer | (Al + Ti)] (atomic ratio | layer thickness (μm) | shows highest peak (Degree) |
| Comparative coated tool | A1 | 1a / 1B | 0.01 | 3 | 15.25-15.50 |
| | A2 | 1b / 1A | 0.005 | 5 | 20.00-20.25 |
| | A3 | 1c / 1C | 0.015 | 10 | 35.25-35.50 |
| | A4 | 1e / 1D | 0.02 | 14 | 27.75-30.00 |
| | A5 | 1d / 1E | 0.025 | 17 | 17.25-17.50 |
| | A6 | 1f / 1F | 0.04 | 15 | 22.25-22.50 |
| | A7 | 1g / 1A | 0.005 | 7 | 23.50-23.75 |
| | A8 | 1b / 1G | 0.05 | 9 | 32.50-32.75 |
| | A9 | 1a / 1B | 0.01 | 8 | 34.00-34.25 |
| | A10 | 1c / 1C | 0.015 | 6 | 35.25-35.50 |
| Reference coated tool | A11 | — | — | — | — |
| | A12 | — | — | — | — |
| | A13 | — | — | — | — |
| | A14 | — | — | — | — |
| | A15 | — | — | — | — |

| | | Hard coating layer Upper layer [Conventional AlTiO layer] | | | |
|---|---|---|---|---|---|
| | | Frequency ratio of tilt angle division of 0 to 10 degrees | Crystal grain ratio having Σ3 coincidence site lattice interface therein | Surface ratio of flat hexagonal crystal grain | Surface roughness Ra |
| Type | | (%) | (Area %) | (Area %) | (μm) |
| Comparative coated tool | A1 | 15 | 11 | 0 | 0.5 |
| | A2 | 11 | 6 | 0 | 0.3 * |
| | A3 | 7 | 4 | 0 | 0.6 |
| | A4 | 18 | 12 | 0 | 0.8 |
| | A5 | 5 | 17 | 0 | 0.9 |
| | A6 | 14 | 11 | 0 | 0.8 |
| | A7 | 7 | 15 | 0 | 0.1 * |
| | A8 | 6 | 11 | 0 | 0.6 |
| | A9 | 5 | 2 | 0 | 0.05 * |
| | A10 | 11 | 0 | 0 | 0.6 |
| Reference coated tool | A11 | — | — | — | — |
| | A12 | — | — | — | — |
| | A13 | — | — | — | — |
| | A14 | — | — | — | — |
| | A15 | — | — | — | — |

(Note)
The mark * in the column "Surface roughness" indicates that wet blasting processing was performed.

TABLE 10

| | | Flank wear width (mm) | | | | | Cutting test result (min) | | |
|---|---|---|---|---|---|---|---|---|---|
| Type | | Cutting condition (A) | Cutting condition (B) | Cutting condition (C) | Type | | Cutting condition (A) | Cutting condition (B) | Cutting condition (C) |
| Coated tool of the present invention | A1 | 0.23 | 0.21 | 0.19 | Comparative coated tool | A1 | 1.3 * | 1.5 | 1.4 * |
| | A2 | 0.35 | 0.33 | 0.31 | | A2 | 2.7 * | 2.5 | 2.3 |
| | A3 | 0.28 | 0.26 | 0.25 | | A3 | 3.8 | 3.6 | 3.5 |
| | A4 | 0.36 | 0.34 | 0.32 | | A4 | 1.5 * | 1.4 * | 1.3 |
| | A5 | 0.37 | 0.35 | 0.34 | | A5 | 1.5 * | 1.4 * | 1.2 * |
| | A6 | 0.38 | 0.34 | 0.33 | | A6 | 1.3 * | 1.2 * | 1.0 * |
| | A7 | 0.30 | 0.28 | 0.26 | | A7 | 3.6 | 3.5 | 3.4 |
| | A8 | 0.31 | 0.28 | 0.27 | | A8 | 3.4 | 3.3 * | 3.2 |
| | A9 | 0.37 | 0.35 | 0.34 | | A9 | 3.5 | 3.2 | 3.0 |
| | A10 | 0.16 | 0.14 | 0.14 | | A10 | 2.9 | 2.7 | 2.5 |

TABLE 10-continued

| | Flank wear width (mm) | | | | | Cutting test result (min) | | |
|---|---|---|---|---|---|---|---|---|
| Type | Cutting condition (A) | Cutting condition (B) | Cutting condition (C) | Type | | Cutting condition (A) | Cutting condition (B) | Cutting condition (C) |
| A11 | 0.17 | 0.15 | 0.13 | Reference | A11 | 1.6 * | 1.4 * | 1.3 * |
| A12 | 0.18 | 0.16 | 0.14 | coated tool | A12 | 3.8 | 3.6 * | 3.7 |
| A13 | 0.15 | 0.12 | 0.13 | | A13 | 3.9 | 3.7 | 3.6 |
| A14 | 0.17 | 0.15 | 0.14 | | A14 | 3.9 | 3.8 | 3.8 |
| A15 | 0.17 | 0.16 | 0.15 | | A15 | 2.7 * | 2.6 | 2.4 |

Cutting test results of comparative coated tools and reference coated tools show cutting times (min) until the tools come to the end of their usable lifespan due to chipping or flank wear (usable lifespan determination criterion: Flank wear width of 0.5 mm).
In addition, the mark * in columns indicates a case where tools come to the end of their usable lifespan due to chipping.

From the results shown in Tables 8 to 10, as for the coated tools A1 to A15 of the present invention, the (0001) plane orientation rate of the reformed α-type $Al_2O_3$ layers which are the intermediate layers of the hard coating layers show a high ratio of 45% or more, and have excellent high-temperature strength. In addition, the reformed AlTiO layers which constitute the upper layers have the texture of the flat-plate polygonal (flat hexagonal) elongated crystal grains, and the (0001) plane orientation rate show a high ratio of 60% or more. As the area ratio of crystal grains in which at least one or more Σ3 coincidence site lattice interfaces are present inside the crystal grains is as high as 60% or more, or as post-processing is performed on the reformed AlTiO layers and the surface smoothness thereof is further improved, the reformed AlTiO layers have superior high-temperature strength, and strength within the crystal grains, and have superior surface flatness. As a result, in high-speed intermittent cutting work accompanied by high heat generation, and intermittent impact loading acts on the cutting edge, the hard coating layers exhibit superior chipping resistance, show excellent cutting performance for a long-term use, and allows a more prolonged usable lifespan.

On the other hand, it is clear that the comparative coated tools A1 to A10 in which the hard coating layers are composed of the Ti compound layers and the conventional AlTiO layers and the reference coated tools A11 to A15 in which the hard coating layers are composed of the Ti compound layers and the conventional α-type $Al_2O_3$ layers, come to the end of their usable lifespan in a relatively short time due to occurrence of chipping, promotion of abrasion, or the like.

Example 2

The following powders, each having a mean particle size within a range of 2 to 4 μm, were prepared as raw materials: WC powder, TiC powder, ZrC powder, VC powder, TaC powder, NbC powder, $Cr_3C_2$ powder, TiN powder, TaN powder, and Co powder. These raw powders were compounded with each other in the compounding compositions shown in Table 11, mixed with each other in an acetone solution having wax added thereto for 24 hours using a ball mill, and were then dried under reduced pressure. Thereafter, the resultant powder mixture was press-formed into a green compact having a predetermined shape at a pressure of 98 MPa. The green compact was then sintered in a vacuum under the following conditions: a pressure of 5 Pa, a predetermined temperature within a range of 1370° C. to 1470° C., and a holding duration of 1 hour. After sintering, cutting edges were subjected to honing (R: 0.07 mm) to manufacture bodies 2A to 2E made of WC-based cemented carbide and having a throwaway tip shape defined in ISO CNMG120408MA.

Additionally, the following powders, each having a mean particle size within a range of 0.5 to 2 μm, were prepared as raw materials for substrates: TiCN (TiC/TiN=50/50 in weight ratio) powder, $Mo_2C$ power, ZrC power, NbC powder, TaC powder, WC power, Co powder and Ni powder. These raw powders were compounded with each other in the compounding compositions shown in Table 12, were wet-mixed with each other for 24 hours using a ball mill, and were dried. Thereafter, the resulting powder mixture was press-formed into a green compact at a pressure of 98 MPa. The green compact was then sintered in a nitrogen atmosphere under the following conditions: a pressure of 1.3 kPa, a temperature of 1540° C., and a holding duration of 1 hour. After sintering, cutting edges were subjected to honing (R: 0.07 mm) to manufacture bodies 2a to 2e made of TiCN-based cermet and having a tip shape defined in ISO Standard CNMG120408MA.

Subsequently, these bodies 2A to 2E and the bodies 2a to 2e were loaded into a normal chemical vapor deposition apparatus.

(a) First, Ti compound layers with target layer thicknesses shown in Table 17 were vapor-deposited as lower layers of hard coating layers under the conditions shown in Table 13 (1-TiCN in Table 13 shows the formation conditions of TiCN layers with a longitudinal growth crystalline structure disclosed in Japanese Unexamined Patent Application Publication No. 6-8010, and the others show the formation conditions of a normal granular crystalline structure).

(b) Subsequently, reformed α-type $Al_2O_3$ layers with target layer thicknesses shown in Table 18 were vapor-deposited as intermediate layers of the hard coating layers under the conditions shown in Table 14.

(c) Next, coated tools B1 to B15 of the present invention were manufactured, respectively, by vapor-depositing reformed AlYO layers with target layer thicknesses similarly shown in Table 18 as upper layers of hard coating layers according to the vapor deposition conditions shown in Table 15.

For the purpose of comparison, comparative coated tools B1 to B10 (equivalent to the conventional coated tool 2) provided with hard coating layers composed of Ti compound layers and conventional AlYO layers with target layer thicknesses shown in Table 19 were manufactured, respectively, by forming lower layers of hard coating layers under the conditions shown in Table 13 and forming upper layers under the conditions (equivalent to the vapor deposition conditions of the conventional AlYO layers disclosed in PTL 4)) shown in Table 16.

The type of the bodies, the type of the lower layers, and the thickness of the lower layers in the comparative coated tools B1 to B10 are the same as those of the coated tools B1 to B10 of the present invention, respectively.

Moreover, for reference, reference coated tools B11 to B15 (equivalent to the conventional coated tool 1) provided with hard coating layers composed of Ti compound layers and conventional α-type $Al_2O_3$ layers with target layer thicknesses shown in Table 19 were manufactured, respectively, by forming lower layers of hard coating layers under the conditions shown in Table 13 and forming α-type $Al_2O_3$ layers under the conditions (equivalent to the vapor deposition conditions of the conventional α-type $Al_2O_3$ layers disclosed in PTL 1) shown in Table 16.

The type of the bodies, the type of the lower layers, and the thickness of the lower layers in the reference coated tools B11 to B15 are the same as those of the coated tools B11 to B15 of the present invention, respectively.

Post-processing composed of wet blasting processing with projection pressure 0.15 MPa and $Al_2O_3$ grains of 200 meshes was performed on the surfaces of some reformed AlYO layers of the coated tools of the present invention, and the surfaces of some conventional AlYO layers of the comparative coated tools. As the post-processing, polishing processing using an elastic grind stone may be adopted.

Tables 18 and 19 show the values of the surface roughness (Ra (μm)) of the reformed AlYO layers (those marked by * in Table 18) of the coated tools of the present invention which were subjected to post-processing and the conventional AlYO layers (those marked by in Table 19) of the comparative coated tools. (For reference, the values of Ra regarding the coated tools of the present invention and the comparative coated tools which were not subjected to post-processing are also shown in Tables 18 and 19.).

Subsequently, as for the reformed α-type $Al_2O_3$ layers which constitute the intermediate layers of the hard coating layers of the coated tools B1 to B15 of the present invention, the reformed AlYO layers which constitute the upper layers of the hard coating layers, the conventional AlYO layers of the comparative coated tools B1 to B10, and the α-type $Al_2O_3$ layers of the reference coated tools B11 to B15, tilt angle frequency distribution graphs were plotted, respectively, using the field-emission-type scanning electron microscope.

The tilt angle frequency distribution graphs were plotted by setting the respective layers in the coated tools B1 to B15 of the present invention, the comparative coated tools B1 to B10, and the reference coated tools B11 to B15 within a lens barrel of the field-emission-type scanning electron microscope, with the surfaces of the layers as polished surfaces; individually irradiated crystal grains having a hexagonal crystal lattice present within the measurement range of each polished surface with an electron beam having an acceleration voltage of 15 kV with an irradiating current of 1 nA at an angle of incidence of 70 degrees with respect to each polished surface, thereby measuring the tilt angle of the normal line to the (0001) plane, which is a crystal plane of each crystal grain, to the normal line to each polished surface, at intervals of 0.1 μm/step for a region 30×50 μm, using the electronic backscattering diffraction image apparatus; and on the basis of these measurement results, dividing the measured tilt angles which are within a range of 0 to 45 degrees among the measured tilt angles at every pitch of 0.25 degrees, and summing the frequencies present within the respective divisions.

As an example of the tilt angle frequency distribution graphs, FIG. 6 shows a tilt angle frequency distribution graph of the (0001) plane of a reformed α-type $Al_2O_3$ layer which constitutes an intermediate layer of a hard coating layer of a coated tool 1 of the present invention.

The "surface" in this invention includes not only a face parallel to the surface of a base, but also a face which inclines to the surface of the base, for example, the cutting face of a layer.

As a result, in the obtained tilt angle frequency distribution graphs of the reformed α-type $Al_2O_3$ layers and reformed AlYO layers of the coated tools of the present invention, the conventional AlYO layers of the comparative coated tools B1 to B10, and the conventional α-type $Al_2O_3$ layers of the reference coated tools B11 to B15, as shown in Tables 18 and 19, respectively, the distributions of the measured tilt angles of the (0001) plane in the reformed α-type $Al_2O_3$ layers and reformed AlYO layers of the coated tools of the present invention show a tilt angle frequency distribution graph in which the highest peak appears in the tilt angle division within a range of 0 to 10 degrees, respectively. On the other hand, the distribution of the measured tilt angles of the (0001) plane in the conventional AlYO layers of the comparative coated tools B1 to B10 shows a tilt angle frequency distribution graph in which the highest peak does not present in an unbiased manner within a range of 0 to 45 degrees.

Tables 18 and 19 show the ratios of the frequencies present in the tilt angle division within a range of 0 to 10 degrees, which are accounted for in the overall tilt angle frequency distribution graph.

Subsequently, as for the reformed AlYO layers which constitute the upper layers of the coated tools B1 to B15 of the present invention, and the conventional AlYO layers of the comparative coated tools B1 to B10, the crystal grain structure and the constituent atom sharing lattice point configuration were inspected using the field-emission-type scanning electron microscope and the electronic backscattering diffraction image apparatus.

First, when the reformed AlYO layers of the coated tools B1 to B15 of the present invention and the conventional AlYO layers of the comparative coated tools B1 to B10 were observed using the field-emission-type scanning electron microscope, the flat-plate polygonal (including flat hexagonal) and elongated crystal grain structure of a large grain size shown typically in FIGS. 7A and 7B were observed in the coated tools B1 to B15 of the present invention (FIG. 7A is a schematic view of the texture of the coated tools B1 to B9 of the present invention as seen within the plane perpendicular to the layer thickness direction, and FIG. 7C is a schematic view of the texture composed of flat hexagonal and elongated crystal grains of a large grain size, of the coated tools B10 to B15 of the present invention as seen within the plane perpendicular to the layer thickness direction).

On the other hand, as shown typically in FIGS. 9A and 9B, a polygonal and elongated crystal grain structure was observed in the comparative coated tools B1 to B10. However, the grain size of each crystal grain was small as compared to that of the present invention, and as being clear from FIG. 9B, pyramidal irregularities were formed in the layer surface (FIGS. 9A and 9B are schematic views of the texture of the comparative coated tools B1 to B10).

Subsequently, as for the reformed AlYO layers of the coated tools B1 to B15 of the present invention, and the conventional AlYO layers of the comparative coated tools B1 to B10, the area ratios of crystal grains in which the Σ3 coincidence site lattice interfaces are present inside the crystal grains which constitute each layer were measured.

First, as for the reformed AlYO layers of the coated tools B1 to B15 of the present invention, when the respective layers are within a lens barrel of the field-emission-type scanning electron microscope, with the surfaces of the layers as polished surfaces; crystal grains having a hexagonal crystal lattice present within the measurement range of each polished surface are individually irradiated with an electron beam having an acceleration voltage of 15 kV with an irradiating current of 1 nA at an angle of incidence of 70 degrees with respect to each polished surface, thereby measuring the angle at which the normal line to each of crystal lattice planes of the crystal grains crosses the normal line to each base surface, at intervals of 0.1 μm/step for a region 30×50 using the electronic backscattering diffraction image apparatus; and from these measurement results, the crystal orientation relationship between adjacent crystal lattices is calculated, and the distribution of lattice points (constituent atom sharing lattice points) where respective constituent atoms which constitute a crystal lattice interface sharing one constituent atom between the crystal lattices is calculated; and a constituent atom sharing lattice point configuration in which N (here, N is any even number equal to or greater than 2 in a crystal structure of a corundum-type hexagonal close-packing crystal, but when the upper limit of N is 28 from the viewpoint of a distribution frequency, even numbers 4, 8, 14, 24, and 26 do not exist) lattice points which do not share any constituent atoms between the constituent atom sharing lattice points are present is expressed by ΣN+1, the area ratios of crystal grain in which at least one or more Σ3 coincidence site lattice interfaces are present inside the crystal grains among all the crystal grains present within the measurement range of the reformed AlYO layers were obtained, and the values of the area ratios were shown in Table 18 as a Σ3 coincidence site lattice interface ratio (%).

Next, even as for the conventional AlYO layers of the comparative coated tools B1 to B10, by the same method as the case of the coated tools of the present inventions, the area ratios of crystal grains in which at least one or more Σ3 coincidence site lattice interfaces are present inside the crystal grains among all the crystal grains present within the measurement range of the conventional reformed AlYO layers were obtained, and the values of the area ratios were shown in Table 19 as Σ3 coincidence site lattice interface ratio (%).

As shown in Tables 18 and 19, in the reformed AlYO layers of the coated tools B1 to B15 of the present invention, the area ratios of crystal grains in which at least one or more Σ3 coincidence site lattice interfaces are present inside the crystal grains are 60% or more. On the other hand, in the conventional AlYO layers of the comparative coated tools B1 to B10, the area ratios of crystal grains in which at least one or more Σ3 coincidence site lattice interfaces are present inside the crystal grains are 40% or less. It can be understood from this that the rate at which the Σ3 coincidence site lattice interfaces are present inside crystal grains is very small.

Subsequently, as for the reformed AlYO layers of the coated tools B1 to B15 of the present invention, and the conventional AlYO layers of the comparative coated tools B1 to B10, the area ratios of flat hexagonal crystal grains of a large grain size present within the plane perpendicular to the layer thickness direction were obtained using the field-emission-type scanning electron microscope. These values are shown in Tables 18 and 19.

Here, the "flat hexagonal crystal grains of a large grain size" means polygonal crystal grains in which the mean value of ten grains is 3 to 8 μm when the diameter of grains present within the plane perpendicular to the layer thickness direction observed by the field-emission-type scanning electron microscope is measured, and six vertex angles whose angle of vertex is 100 to 140° are provided.

Subsequently, although the thicknesses of the respective constituent layers in the hard coating layers of the coated tools B1 to B15 of the present invention, the comparative coated tools B1 to B10, and the reference coated tools B11 to B15 were measured using the scanning electron microscope (longitudinal-section measurement), substantially the same mean layer thicknesses (mean value of five-point measurements) as the target layer thicknesses were shown in all cases.

Next, all the coated tools B1 to B15 of the present invention, the comparative coated tools B1 to B10, and the reference coated tools B11 to B15 were screw-fixed to a tip portion of a bite made of tool steel by a fixing jig, and in this state, were subjected to a dry high-speed intermittent cutting test (normal cutting speed is 200 m/min) on bearing steel under the following conditions (referred to as cutting condition A):

Workpiece: a round bar of JIS-SUJ2 (HRC62) with four longitudinal grooves equally-spaced in the length direction,
Cutting speed: 250 m/min,
Depth of cut: 1.5 mm,
Feed rate: 0.15 mm/rev, and
Cutting time: 5 minutes,
a dry high-speed intermittent cutting test (normal cutting speed is 200 m/min) on alloy tool steel under the following conditions (referred to as cutting condition B):
Workpiece: a round bar of JIS-SKD11 (HRC58) with four longitudinal grooves equally-spaced in the length direction,
Cutting speed: 300 m/min,
Depth of cut: 1.5 mm,
Feed rate: 0.15 mm/rev, and
Cutting time: 5 minutes, and
a dry high-speed intermittent cutting test (normal cutting speed is 150 m/min) on carbon tool steel under the following conditions (referred to as cutting condition C):
Workpiece: a round bar of JIS-SK3 (HRC61) with four longitudinal grooves equally-spaced in the length direction,
Cutting speed: 250 m/min,
Depth of cut: 1.5 mm,
Feed rate: 0.15 mm/rev, and
Cutting time: 5 minutes, and
the flank wear width of the cutting edges were measured in all the cutting tests. These test results are shown in Table 12.

TABLE 11

| | | Compounding composition (Mass %) | | | | | | | | | |
|---|---|---|---|---|---|---|---|---|---|---|---|
| Type | | Co | TiC | ZrC | VC | TaC | NbC | $Cr_3C_2$ | TiN | TaN | WC |
| Tool substrate | 2A | 7 | — | — | — | — | — | — | — | — | Balance |
| | 2B | 5.7 | — | — | — | 1.5 | 0.5 | — | 1.2 | — | Balance |
| | 2C | 5.7 | 2.3 | — | — | — | — | 1 | — | — | Balance |
| | 2D | 8.5 | — | 0.5 | — | — | — | 0.5 | — | — | Balance |
| | 2E | 12.5 | 2 | — | — | — | — | — | 1 | 2 | Balance |

TABLE 12

| | Type | Co | Ni | ZrC | TaC | NbC | Mo$_2$C | WC | TiCN |
|---|---|---|---|---|---|---|---|---|---|
| Tool substrate | 2a | 12 | 6 | — | 10 | — | 10 | 16 | Balance |
| | 2b | 7 | 7 | — | 5 | — | 7.5 | — | Balance |
| | 2c | 5 | — | — | — | 1 | 6 | 10 | Balance |
| | 2d | 9 | 6 | — | 11 | 2 | — | — | Balance |
| | 2e | 8 | 5 | 1 | 8 | — | 10 | 10 | Balance |

Compounding composition (Mass %)

TABLE 13

Hard coating layer (Lower layer)

| Type | Composition (Numbers Indicate atomic ratio) | Composition of reaction gas (Vol. %) | Reaction atmosphere Pressure | Temperature |
|---|---|---|---|---|
| TiC layer | TiC | TiCl$_4$: 4.2%, CH$_4$: 8.5%, H$_2$: Balance | 7 | 1020 |
| TiN layer (First layer) | TiN | TiCl$_4$: 4.2%, N$_2$: 30%, H$_2$: Balance | 30 | 900 |
| TiN layer (Other layer) | TiN | TiCl$_4$: 4.2%, N$_2$: 35%, H$_2$: Balance | 50 | 1040 |
| l—TiC$_{0.5}$N$_{0.5}$ layer | TiC$_{0.5}$N$_{0.5}$ | TiCl$_4$: 4.2%, N$_2$: 20%, CH$_3$CN: 0.6%, H$_2$: Balance | 7 | 900 |
| TiCN layer | TiC$_{0.5}$N$_{0.5}$ | TiCl$_4$: 4.2%, N$_2$: 20%, CH$_4$: 4%, H$_2$: Balance | 12 | 1020 |
| TiCO layer | TiC$_{0.5}$O$_{0.5}$ | TiCl$_4$: 4.2%, CO: 4%, H$_2$: Balance | 7 | 1020 |
| TiCNO layer | TiC$_{0.3}$N$_{0.3}$O$_{0.4}$ | TiCl$_4$: 4.2%, CO: 3%, CH$_4$: 3%, N$_2$: 20%, H$_2$: Balance | 20 | 1020 |
| α-Type Al$_2$O$_3$ layer | α-Al$_2$O$_3$ | AlCl$_3$: 2.2%, CO$_2$: 5.5%, HCl: 2.2%, H$_2$S: 0.2%, H$_2$: Balance | 7 | 1000 |

TABLE 14

| Type | Formation symbol | Composition of reaction gas (Vol. %) | Neclear thin film formation conditions — Reaction atmosphere Pressure/kPa | Temperature/°C | Heat treatment — Reaction atmosphere Pressure/kPa | Temperature/°C |
|---|---|---|---|---|---|---|
| Neclear thin film (2A) | 2A | AlCl$_3$: 3%, CO$_2$: 0.5%, C$_2$H$_4$: 0.01%, H$_2$: Balance | 3 | 800 | 3 | 1100 |
| Neclear thin film (2B) | 2B | AlCl$_3$: 6%, CO$_2$: 1.5%, C$_2$H$_4$: 0.12%, H$_2$: Balance | 7 | 750 | 7 | 1200 |
| Neclear thin film (2C) | 2C | AlCl$_3$: 10%, CO$_2$: 3%, C$_2$H$_4$: 0.3%, H$_2$: Balance | 13 | 900 | 13 | 1000 |

*Formation conditions of normal α-type Al$_2$O$_3$ layer after formation of various kinds of neclear thin films are described in Table 13

TABLE 15

Reformed AlYO layer

| Formation symbol | | Composition of reaction gas (Vol. %) | Reaction atmosphere Pressure | Temperature |
|---|---|---|---|---|
| 2A | First step | AlCl$_3$: 1%, YCl$_3$: 0.1%, HCl: 3%, CO$_2$: 2%, H$_2$S: 0.25%, H$_2$: Balance | 3 | 1020 |
| | Second step | AlCl$_3$: 6%, YCl$_3$: 1%, HCl: 3%, CO$_2$: 5%, H$_2$S: 0.4%, H$_2$: Balance | 6 | 1000 |
| 2B | First step | AlCl$_3$: 2%, YCl$_3$: 0.08%, HCl: 1%, CO$_2$: 3%, H$_2$S: 0.30%, H$_2$: Balance | 4 | 1020 |
| | Second step | AlCl$_3$: 7%, YCl$_3$: 0.9%, HCl: 4%, CO$_2$: 6%, H$_2$S: 0.3%, H$_2$: Balance | 8 | 980 |
| 2C | First step | AlCl$_3$: 3%, YCl$_3$: 0.06%, HCl: 4%, CO$_2$: 4%, H$_2$S: 0.45%, H$_2$: Balance | 5 | 1040 |
| | Second step | AlCl$_3$: 8%, YCl$_3$: 0.6%, HCl: 4%, CO$_2$: 6%, H$_2$S: 0.25%, H$_2$: Balance | 10 | 950 |
| 2D | First step | AlCl$_3$: 4%, YCl$_3$: 0.08%, HCl: 5%, CO$_2$: 5%, H$_2$S: 0.35%, H$_2$: Balance | 5 | 1050 |
| | Second step | AlCl$_3$: 10%, YCl$_3$: 0.4%, HCl: 3%, CO$_2$: 8%, H$_2$S: 0.6%, H$_2$: Balance | 8 | 920 |
| 2E | First step | AlCl$_3$: 5%, YCl$_3$: 0.05%, HCl: 5%, CO$_2$: 6%, H$_2$S: 0.50%, H$_2$: Balance | 5 | 1020 |
| | Second step | AlCl$_3$: 9%, YCl$_3$: 0.6%, HCl: 5%, CO$_2$: 5%, H$_2$S: 0.4%, H$_2$: Balance | 6 | 960 |
| 2F | First step | AlCl$_3$: 3%, YCl$_3$: 0.05%, HCl: 2%, CO$_2$: 4%, H$_2$S: 0.75%, H$_2$: Balance | 5 | 1020 |
| | Second step | AlCl$_3$: 8%, YCl$_3$: 0.7%, HCl: 3%, CO$_2$: 4%, H$_2$S: 0.3%, H$_2$: Balance | 7 | 970 |

TABLE 16

| Conventional AlYO layer | Formation conditions (Reaction atmosphere Pressure given in KPa and temperature given in °C.) | | |
|---|---|---|---|
| Formation symbol | Composition of reaction gas (Vol. %) | Reaction atmosphere Pressure | Temperature |
| (2a) | $AlCl_3$: 6%, $YCl_3$: 1%, $CO_2$: 4%, $H_2$: Balance | 10 | 1000 |
| (2b) | $AlCl_3$: 7%, $YCl_3$: 0.9%, $CO_2$: 6%, $H_2$: Balance | 9 | 1000 |
| (2c) | $AlCl_3$: 8%, $YCl_3$: 0.6%, $CO_2$: 7%, $H_2$: Balance | 8 | 1020 |
| (2d) | $AlCl_3$: 10%, $YCl_3$: 0.4%, $CO_2$: 8%, $H_2$: Balance | 7 | 1020 |

TABLE 17

| Type | Tool substrate symbol | Lower layer of hard coating layer [Ti compound layer] | | | |
|---|---|---|---|---|---|
| | | First layer (μm) | Second layer (μm) | Third layer (μm) | Fourth layer (μm) |
| Coated tool of the present invention | B1 2a | TiN (1) | l-TiCN (17.5) | TiN (1) | TiCNO (0.5) |
| | B2 2A | TiCN (1) | l-TiCN (8.5) | TiCO (0.5) | — |
| | B3 2b | TiN (1) | l-TiCN (4) | TiC (4) | TiCNO (1) |
| | B4 2B | TiC (1) | l-TiCN (9) | — | — |
| | B5 2c | TiN (1) | l-TiCN (4.5) | TiCNO (0.5) | — |
| | B6 2C | TiN (0.5) | l-TiCN (1.5) | TiC (0.5) | TiCNO (0.5) |
| | B7 2d | TiN (0.5) | l-TiCN (10) | TiC (2) | TiCNO (0.3) |
| | B8 2D | TiN (1) | TiCN (19) | — | — |
| | B9 2e | TiC (0.5) | l-TiCN (9) | TiCO (0.5) | — |
| | B10 2E | TiN (1) | TiC (1) | TiCN (7) | TiCO (1) |
| | B11 2A | TiN (0.3) | l-TiCN (5) | TiCNO (0.7) | TiCO (0.1) |
| | B12 2a | TiN (1) | l-TiCN (10) | TiCO (0.5) | — |
| | B13 2B | TiN (0.5) | l-TiCN (12) | TiN (0.5) | TiCNO (0.2) |
| | B14 2b | TiN (0.6) | l-TiCN (7) | TiCNO (0.3) | — |
| | B15 2C | TiN (0.4) | l-TiCN (3) | TiCN (0.5) | TiCO (0.1) |

(Numbers in the parentheses of lower layer column indicate target layer thickness)

TABLE 18

| Type | Tool substrate symbol | Hard coating layer Intermediate layer [Reformed α-type $Al_2O_3$ layer] | | | |
|---|---|---|---|---|---|
| | | Formation symbol of intermediate layer | Target layer thickness (μm) | Tilt angle division where (0001) plane shows highest peak (Degree) | Frequency ratio of tilt angle division of 0 to 10 degrees (%) |
| Coated tool of the present invention | B1 2a | 2A | 1 | 1.50-1.75 | 60 |
| | B2 2A | 2B | 1 | 2.75-3.00 | 52 |
| | B3 2b | 2C | 2 | 2.00-2.25 | 65 |
| | B4 2B | 2A | 2 | 5.25-5.50 | 70 |
| | B5 2c | 2B | 3 | 2.25-2.50 | 83 |
| | B6 2C | 2B | 3 | 3.50-3.75 | 97 |
| | B7 2d | 2C | 4 | 4.25-4.50 | 84 |
| | B8 2D | 2C | 4 | 3.25-3.50 | 86 |
| | B9 2e | 2A | 5 | 2.00-2.25 | 89 |
| | B10 2E | 2B | 5 | 5.25-5.50 | 82 |
| | B11 2A | 2B | 2 | 2.25-2.50 | 72 |
| | B12 2a | 2C | 2 | 1.75-2.00 | 83 |
| | B13 2B | 2A | 3 | 0.50-0.75 | 92 |

TABLE 18-continued

| | | | | | | |
|---|---|---|---|---|---|---|
| | B14 | 2b | 2B | 2 | 0.25-0.50 | 88 |
| | B15 | 2C | 2C | 3 | 1.25-1.50 | 85 |

| | | Hard coating layer Upper layer [Reformed AlTiO layer] | | | |
|---|---|---|---|---|---|
| Type | | Formation symbol of upper layer | Content ratio of Y [Y/(Al + Y)] (atomic ratio) | Target layer thickness (μm) | Tilt angle division where (0001) plane shows highest peak (Degree) |
| Coated tool of the present invention | B1 | 2A | 0.01 | 6 | 1.50-1.75 |
| | B2 | 2B | 0.004 | 2 | 2.75-3.00 |
| | B3 | 2C | 0.001 | 3 | 2.25-2.50 |
| | B4 | 2D | 0.0005 | 14 | 5.25-5.50 |
| | B5 | 2C | 0.001 | 15 | 2.50-2.75 |
| | B6 | 2A | 0.01 | 10 | 3.25-3.50 |
| | B7 | 2B | 0.04 | 6 | 4.25-4.50 |
| | B8 | 2C | 0.001 | 7 | 3.25-3.50 |
| | B9 | 2D | 0.0005 | 4 | 2.00-2.25 |
| | B10 | 2E | 0.0006 | 8 | 5.00-5.25 |
| | B11 | 2F | 0.0008 | 5 | 2.25-2.50 |
| | B12 | 2E | 0.0006 | 6 | 1.50-1.75 |
| | B13 | 2F | 0.0008 | 4 | 0.50-0.75 |
| | B14 | 2E | 0.0006 | 3 | 0.25-0.50 |
| | B15 | 2E | 0.0006 | 5 | 1.25-1.50 |

| | | Hard coating layer Upper layer [Reformed AlTiO layer] | | | |
|---|---|---|---|---|---|
| Type | | Frequency ratio of tilt angle division of 0 to 10 degrees (%) | Crystal grain ratio Having Σ3 coincidence site lattice interface therein (Area %) | Surface ratio of flat hexagonal crystal grain (Area %) | Surface roughness Ra (μm) |
| Coated tool of the present invention | B1 | 72 | 64 | 10 | 0.3 * |
| | B2 | 66 | 61 | 5 | 0.4 |
| | B3 | 71 | 72 | 21 | 0.5 |
| | B4 | 72 | 59 | 9 | 0.5 |
| | B5 | 74 | 70 | 12 | 0.6 |
| | B6 | 95 | 83 | 18 | 0.9 |
| | B7 | 85 | 76 | 26 | 0.8 |
| | B8 | 88 | 77 | 22 | 0.7 |
| | B9 | 70 | 69 | 15 | 0.05 |
| | B10 | 84 | 75 | 39 | 0.6 |
| | B11 | 75 | 81 | 35 | 0.2 * |
| | B12 | 87 | 82 | 42 | 0.1 * |
| | B13 | 96 | 89 | 72 | 0.5 |
| | B14 | 91 | 79 | 67 | 0.3 * |
| | B15 | 88 | 83 | 62 | 0.5 |

(Note)
The mark * in the column "Surface roughness" indicates that wet blasting processing was performed.

TABLE 19

| | | Hard coating layer Intermediate layer [Conventional α-type Al$_2$O$_3$ layer] | | | |
|---|---|---|---|---|---|
| Type | | Formation symbol of intermediate layer | Target layer thickness (μm) | Tilt angle division where (0001) plane shows highest peak (Degree) | Frequency ratio of tilt angle division of 0 to 10 degrees (%) |
| Comparative coated tool | B1 | — | — | — | — |
| | B2 | — | — | — | — |
| | B3 | — | — | — | — |
| | B4 | — | — | — | — |
| | B5 | — | — | — | — |
| | B6 | — | — | — | — |
| | B7 | — | — | — | — |
| | B8 | — | — | — | — |
| | B9 | — | — | — | — |
| | B10 | — | — | — | — |

TABLE 19-continued

| | | | | | |
|---|---|---|---|---|---|
| Reference coated tool | B11 | 2A | 2 | 1.50-1.75 | 55 |
| | B12 | 2B | 7 | 2.00-2.25 | 63 |
| | B13 | 2C | 10 | 3.00-3.25 | 48 |
| | B14 | 2A | 8 | 1.25-1.50 | 65 |
| | B15 | 2B | 5 | 1.75-2.00 | 71 |

Hard coating layer
Upper layer [Conventional AlYO layer]

| Type | | Formation symbol of upper layer | Content ratio of Y [Y/(Al + Y)] (atomic ratio) | Target layer thickness (μm) | Tilt angle division where (0001) plane shows highest peak (Degree) |
|---|---|---|---|---|---|
| Comparative coated tool | B1 | 2a | 0.01 | 7 | 15.50-15.75 |
| | B2 | 2b | 0.004 | 3 | 17.75-20.00 |
| | B3 | 2c | 0.001 | 5 | 37.00-37.25 |
| | B4 | 2d | 0.0005 | 16 | 30.00-30.25 |
| | B5 | 2c | 0.001 | 18 | 17.50-17.75 |
| | B6 | 2d | 0.0005 | 13 | 2.025-20.50 |
| | B7 | 2a | 0.01 | 10 | 25.50-25.75 |
| | B8 | 2b | 0.004 | 11 | 32.50-32.75 |
| | B9 | 2c | 0.001 | 9 | 34.00-34.25 |
| | B10 | 2d | 0.0005 | 13 | 35.50-35.75 |
| Reference coated tool | B11 | — | — | — | — |
| | B12 | — | — | — | — |
| | B13 | — | — | — | — |
| | B14 | — | — | — | — |
| | B15 | — | — | — | — |

Hard coating layer
Upper layer [Conventional AlYO layer]

| Type | | Frequency ratio of tilt angle division of 0 to 10 degrees (%) | Crystal grain ratio having Σ3 coincidence site lattice interface therein (Area %) | Surface ratio of flat hexagonal crystal grain (Area %) | Surface roughness Ra (μm) |
|---|---|---|---|---|---|
| Comparative coated tool | B1 | 14 | 5 | 0 | 0.6 |
| | B2 | 9 | 3 | 0 | 0.05 * |
| | B3 | 3 | 4 | 0 | 0.5 |
| | B4 | 5 | 10 | 0 | 0.7 |
| | B5 | 4 | 6 | 3 | 0.8 |
| | B6 | 6 | 3 | 0 | 0.6 |
| | B7 | 3 | 0 | 5 | 0.1 * |
| | B8 | 7 | 2 | 0 | 0.6 |
| | B9 | 2 | 3 | 0 | 0.3 * |
| | B10 | 5 | 4 | 11 | 0.6 |
| Reference coated tool | B11 | — | — | — | — |
| | B12 | — | — | — | — |
| | B13 | — | — | — | — |
| | B14 | — | — | — | — |
| | B15 | — | — | — | — |

(Note)
The mark * in the column "Surface roughness" indicates that wet blasting processing was performed.

TABLE 20

| | | Flank wear width (mm) | | | | Cutting test result (min) | | |
|---|---|---|---|---|---|---|---|---|
| Type | | Cutting condition (A) | Cutting condition (B) | Cutting condition (C) | Type | Cutting condition (A) | Cutting condition (B) | Cutting condition (C) |
| Coated tool of the present invention | B1 | 0.20 | 0.18 | 0.19 | Comparative coated tool | B1 | 2.1 * | 3.0 | 2.9 |
| | B2 | 0.35 | 0.33 | 0.31 | | B2 | 0.4 * | 0.4 * | 0.2 * |
| | B3 | 0.26 | 0.24 | 0.23 | | B3 | 0.5 * | 0.5 * | 1.0 * |
| | B4 | 0.34 | 0.32 | 0.27 | | B4 | 0.6 * | 0.5 * | 0.4 * |
| | B5 | 0.32 | 0.30 | 0.28 | | B5 | 0.8 * | 0.6 * | 0.4 * |
| | B6 | 0.31 | 0.28 | 0.29 | | B6 | 0.6 * | 0.5 * | 0.5 * |
| | B7 | 0.25 | 0.25 | 0.24 | | B7 | 1.8 * | 1.6 * | 1.5 * |
| | B8 | 0.27 | 0.27 | 0.22 | | B8 | 1.8 * | 1.7 * | 1.6 * |
| | B9 | 0.26 | 0.24 | 0.23 | | B9 | 1.9 * | 1.6 | 1.4 * |
| | B10 | 0.19 | 0.19 | 0.17 | | B10 | 2.5 | 2.4 * | 2.3 |
| | B11 | 0.16 | 0.14 | 0.13 | Reference coated tool | B11 | 2.5 | 2.5 * | 2.4 |
| | B12 | 0.15 | 0.14 | 0.14 | | B12 | 2.0 * | 2.6 | 2.2 |

TABLE 20-continued

| | Flank wear width (mm) | | | | Cutting test result (min) | | |
|---|---|---|---|---|---|---|---|
| Type | Cutting condition (A) | Cutting condition (B) | Cutting condition (C) | Type | Cutting condition (A) | Cutting condition (B) | Cutting condition (C) |
| B13 | 0.14 | 0.12 | 0.13 | B13 | 1.0 * | 1.5 * | 2.5 |
| B14 | 0.17 | 0.15 | 0.14 | B14 | 2.2 * | 2.1 * | 2.6 |
| B15 | 0.17 | 0.16 | 0.15 | B15 | 2.2 | 2.0 * | 1.8 * |

Cutting test results of comparative coated tools and reference coated tools show cutting times (min) until the tools come to the end of their usable lifespan due to chipping or flank wear (usable lifespan determination criterion: Flank wear width of 0.5 mm).
In addition, mark * in columns indicates a case where tools come to the end of their usable lifespan due to chipping.

From the results shown in Tables 18 to 20, as for the coated tools B1 to B15 of the present invention, the (0001) plane orientation rate of the reformed α-type $Al_2O_3$ layers which are the intermediate layers of the hard coating layers show a high ratio of 45% or more, and have excellent high-temperature strength. In addition, the reformed AlYO layers which constitute the upper layers have the texture of the flat-plate polygonal (flat hexagonal) elongated crystal grains, and the (0001) plane orientation rate show a high ratio of 60% or more, the surface ratios of crystal grains in which at least one or more Σ3 coincidence site lattice interfaces are present inside the crystal grains are as high as 60% or more, or post-processing is performed on the reformed AlYO layers and the surface smoothness thereof is further improved. Thereby, the reformed AlYO layers have superior high-temperature strength, and strength within the crystal grains, and have superior surface flatness. As a result, in high-speed intermittent cutting work accompanied by high heat generation, and intermittent impact loading acts on the cutting edge, the hard coating layers exhibit superior chipping resistance, show excellent cutting performance for a long-term use, and allows a more prolonged usable lifespan.

On the other hand, it is clear that the comparative coated tools B1 to B10 in which the hard coating layers are composed of the AlYO layer and the conventional Ti compound layers and the reference coated tools B11 to B15 in which the hard coating layers are composed of the Ti compound layers and the conventional α-type $Al_2O_3$ layers, come to the end of their usable lifespan in a relatively short time due to occurrence of chipping, promotion of abrasion, or the like.

Example 3

The following powders, each having a mean particle size within a range of 2 to 4 μm, were prepared as raw materials: WC powder, TiC powder, ZrC powder, VC powder, TaC powder, NbC powder, $Cr_3C_2$ powder, TiN powder, TaN powder, and Co powder. These raw powders were compounded with each other in the compounding compositions shown in Table 21, mixed with each other in an acetone solution having wax added thereto for 24 hours using a ball mill, and were then dried under reduced pressure. Thereafter, the resultant powder mixture was press-formed into a green compact having a predetermined shape at a pressure of 98 MPa. The green compact was then sintered in a vacuum under the following conditions: a pressure of 5 Pa, a predetermined temperature within a range of 1370° C. to 1470° C., and a holding duration of 1 hour. After sintering, cutting edges were subjected to honing (R: 0.07 mm) to manufacture bodies 3A to 3E made of WC-based cemented carbide and having a throwaway tip shape defined in ISO CNMG120408MA.

Additionally, the following powders, each having a mean particle size within a range of 0.5 to 2 μm, were prepared as raw materials for substrates: TiCN (TiC/TiN=50/50 in weight ratio) powder, $Mo_2C$ power, ZrC power, NbC powder, TaC powder, WC power, Co powder and Ni powder. These raw powders were compounded with each other in the compounding compositions shown in Table 22, were wet-mixed with each other for 24 hours using a ball mill, and were dried. Thereafter, the resulting powder mixture was press-formed into a green compact at a pressure of 98 MPa. The green compact was then sintered in a nitrogen atmosphere under the following conditions: a pressure of 1.3 kPa, a temperature of 1540° C., and a holding duration of 1 hour. After sintering, cutting edges were subjected to honing (R: 0.07 mm) to manufacture bodies 3a to 3e made of TiCN-based cermet and having a tip shape defined in ISO Standard CNMG120408MA.

Subsequently, these bodies 3A to 3E and the bodies 3a to 3e were loaded into a normal chemical vapor deposition apparatus.

(a) First, Ti compound layers with target layer thicknesses shown in Table 27 were vapor-deposited as lower layers of hard coating layers under the conditions shown in Table 23 (1-TiCN in Table 23 shows the formation conditions of TiCN layers with a longitudinal growth crystalline structure disclosed in Japanese Unexamined Patent Application Publication No. 6-8010, and the others show the formation conditions of a normal granular crystalline structure).

(b) Subsequently, reformed α-type $Al_2O_3$ layers with target layer thicknesses shown in Table 28 were vapor-deposited as intermediate layers of the hard coating layers under the conditions shown in Table 24.

(c) Next, coated tools C1 to C15 of the present invention were manufactured, respectively, by vapor-depositing reformed AlZrO layers with target layer thicknesses similarly shown in Table 28 as upper layers of hard coating layers according to the vapor deposition conditions shown in Table 25.

For the purpose of comparison, comparative coated tools C1 to C10 (equivalent to the conventional coated tool 2) provided with hard coating layers composed of Ti compound layers and conventional AlZrO layers with target layer thicknesses shown in Table 29 were manufactured, respectively, by forming lower layers of hard coating layers under the conditions shown in Table 23 and forming upper layers under the conditions (equivalent to the vapor deposition conditions of the conventional AlZrO layers disclosed in PTL 3)) shown in Table 26.

The type of the bodies, the type of the lower layers, and the thickness of the lower layers in the comparative coated tools C1 to C10 are the same as those of the coated tools C1 to C10 of the present invention, respectively.

Moreover, for reference, reference coated tools C11 to C15 (equivalent to the conventional coated tool 1) provided with hard coating layers composed of Ti compound layers and conventional α-type Al$_2$O$_3$ layers with target layer thicknesses shown in Table 29 were manufactured, respectively, by forming lower layers of hard coating layers under the conditions shown in Table 23 and forming α-type Al$_2$O$_3$ layers under the conditions (equivalent to the vapor deposition conditions of the conventional α-type Al$_2$O$_3$ layers disclosed in PTL 1) shown in Table 26.

The type of the bodies, the type of the lower layers, and the thickness of the lower layers in the reference coated tools C11 to C15 are the same as those of the coated tools C11 to C15 of the present invention, respectively.

Post-processing composed of wet blasting processing with projection pressure 0.15 MPa and Al$_2$O$_3$ grains of 200 meshes was performed on the surfaces of some reformed AlZrO layers of the coated tools of the present invention, and the surfaces of some conventional AlZrO layers of the comparative coated tools. As the post-processing, polishing processing using an elastic grind stone may be adopted.

Tables 28 and 29 show the values of the surface roughness (Ra (µm)) of the reformed AlZrO layers (those marked by * in Table 28) of the coated tools of the present invention which were subjected to post-processing and the conventional AlZrO layers (those marked by * in Table 29) of the comparative coated tools. (For reference, the values of Ra regarding the coated tools of the present invention and the comparative coated tools which were not subjected to post-processing are also shown in Tables 28 and 29.)

Subsequently, as for the reformed α-type Al$_2$O$_3$ layers which constitute the intermediate layers of the hard coating layers of the coated tools C1 to C15 of the present invention, the reformed AlZrO layers which constitute the upper layers of the hard coating layers, the conventional AlZrO layers of the comparative coated tools C1 to C10, and the α-type Al$_2$O$_3$ layers of the reference coated tools C11 to C15, tilt angle frequency distribution graphs were plotted, respectively, using the field-emission-type scanning electron microscope.

The tilt angle frequency distribution graphs were plotted by setting the respective layers in the coated tools C1 to C15 of the present invention, the comparative coated tools C1 to C10, and the reference coated tools C11 to C15 within a lens barrel of the field-emission-type scanning electron microscope, with the surfaces of the layers as polished surfaces; individually irradiated crystal grains having a hexagonal crystal lattice present within the measurement range of each polished surface with an electron beam having an acceleration voltage of 15 kV with an irradiating current of 1 nA at an angle of incidence of 70 degrees with respect to each polished surface, thereby measuring the tilt angle of the normal line to the (0001) plane, which is a crystal plane of each crystal grain, to the normal line to each polished surface, at intervals of 0.1 µm/step for a region 30×50 µm, using the electronic backscattering diffraction image apparatus; and on the basis of these measurement results, dividing the measured tilt angles which are within a range of 0 to 45 degrees among the measured tilt angles at every pitch of 0.25 degrees, and summing the frequencies present within the respective divisions.

As an example of the tilt angle frequency distribution graphs, FIG. 10 shows a tilt angle frequency distribution graph of the (0001) plane of a reformed α-type Al$_2$O$_3$ layer which constitutes an intermediate layer of a hard coating layer of a coated tool C14 of the present invention.

The "surface" in this invention includes not only a face parallel to the surface of a base, but also a face which inclines to the surface of the base, for example, the cutting face of a layer.

As a result, in the obtained tilt angle frequency distribution graphs of the reformed α-type Al$_2$O$_3$ layers and reformed AlZrO layers of the coated tools of the present invention, the conventional AlZrO layers of the comparative coated tools C1 to C10, and the conventional α-type Al$_2$O$_3$ layers of the reference coated tools C11 to C15, as shown in Tables 28 and 29, respectively, the distributions of the measured tilt angles of the (0001) plane in the reformed α-type Al$_2$O$_3$ layers and reformed AlZrO layers of the coated tools of the present invention show a tilt angle frequency distribution graph in which the highest peak appears in the tilt angle division within a range of 0 to 10 degrees, respectively. On the other hand, the distribution of the measured tilt angles of the (0001) plane in the conventional AlZrO layers of the comparative coated tools C1 to C10 shows a tilt angle frequency distribution graph in which the highest peak does not present in an unbiased manner within a range of 0 to 45 degrees.

Tables 28 and 29 show the ratios of the frequencies present in the tilt angle division within a range of 0 to 10 degrees, which are accounted for in the overall tilt angle frequency distribution graph.

Subsequently, as for the reformed AlZrO layers which constitute the upper layers of the coated tools C1 to C15 of the present invention, and the conventional AlZrO layers of the comparative coated tools C1 to C10, the crystal grain structure and the constituent atom sharing lattice point configuration were inspected using the field-emission-type scanning electron microscope and the electronic backscattering diffraction image apparatus. First, when the reformed AlZrO layers of the coated tools C1 to C15 of the present invention and the conventional AlZrO layers of the comparative coated tools C1 to C10 were observed using the field-emission-type scanning electron microscope, the flat-plate polygonal (including flat hexagonal) and elongated crystal grain structure of a large grain size shown typically in FIGS. 11A and 11B were observed in the coated tools C1 to C15 of the present invention (FIG. 11A is a schematic view of the texture of the coated tools C1 to C9 of the present invention as seen within the plane perpendicular to the layer thickness direction, and FIG. 11C is a schematic view of the texture composed of flat hexagonal and elongated crystal grains of a large grain size, of the coated tools C10 to C15 of the present invention as seen within the plane perpendicular to the layer thickness direction). On the other hand, as shown typically in FIGS. 13A and 13B, a polygonal and elongated crystal grain structure was observed in the comparative coated tools C1 to C10. However, the grain size of each crystal grain was small as compared to that of the present invention, and as being clear from FIG. 13B, pyramidal irregularities were formed in the layer surface (FIGS. 13A and 13B are schematic views of the texture of the comparative coated tool C1).

Subsequently, as for the reformed AlZrO layers of the coated tools C1 to C15 of the present invention, and the conventional AlZrO layers of the comparative coated tools C1 to C10, the area ratios of crystal grains in which the Σ3 coincidence site lattice interfaces are present inside the crystal grains which constitute each layer were measured.

First, as for the reformed AlZrO layers of the coated tools C1 to C15 of the present invention, when the respective layers are within a lens barrel of the field-emission-type scanning electron microscope, with the surfaces of the layers as polished surfaces; crystal grains having a hexagonal crystal lattice present within the measurement range of each polished surface are individually irradiated with an electron beam having an acceleration voltage of 15 kV with an irradiating current of 1 nA at an angle of incidence of 70 degrees with respect to each polished surface, thereby measuring the angle at which the normal line to each of crystal lattice planes of the crystal grains crosses the normal line to each base surface, at intervals of 0.1 μm/step for a region 30×50 μm, using the electronic backscattering diffraction image apparatus; and from these measurement results, the crystal orientation relationship between adjacent crystal lattices is calculated, and the distribution of lattice points (constituent atom sharing lattice points) where respective constituent atoms which constitute a crystal lattice interface sharing one constituent atom between the crystal lattices is calculated; and a constituent atom sharing lattice point configuration in which N (here, N is any even number equal to or greater than 2 in a crystal structure of a corundum-type hexagonal close-packing crystal, but when the upper limit of N is 28 from the viewpoint of a distribution frequency, even numbers 4, 8, 14, 24, and 26 do not exist) lattice points which do not share any constituent atoms between the constituent atom sharing lattice points are present is expressed by $\Sigma N+1$, the area ratios of crystal grain in which at least one or more $\Sigma 3$ coincidence site lattice interfaces are present inside the crystal grains among all the crystal grains present within the measurement range of the reformed AlZrO layers were obtained, and the values of the area ratios were shown in Table 28 as a $\Sigma 3$ coincidence site lattice interface ratio (%).

Next, even as for the conventional AlZrO layers of the comparative coated tools C1 to C10, by the same method as the case of the coated tools of the present inventions, the area ratios of crystal grains in which at least one or more $\Sigma 3$ coincidence site lattice interfaces are present inside the crystal grains among all the crystal grains present within the measurement range of the conventional reformed AlZrO layers were obtained, and the values of the area ratios were shown in Table 29 as a $\Sigma 3$ coincidence site lattice interface ratio (%).

As shown in Tables 28 and 29, in the reformed AlZrO layers of the coated tools C1 to C15 of the present invention, the area ratios of crystal grains in which at least one or more $\Sigma 3$ coincidence site lattice interfaces are present inside the crystal grains are 60% or more. On the other hand, in the conventional AlZrO layers of the comparative coated tools C1 to C10, the area ratios of crystal grains in which at least one or more $\Sigma 3$ coincidence site lattice interfaces are present inside the crystal grains are 40% or less. It can be understood from this that the rate at which the $\Sigma 3$ coincidence site lattice interfaces are present inside crystal grains is very small.

Subsequently, as for the reformed AlZrO layers of the coated tools C1 to C15 of the present invention, and the conventional AlZrO layers of the comparative coated tools C1 to C10, the area ratios of flat hexagonal crystal grains of a large grain size present within the plane perpendicular to the layer thickness direction were obtained using the field-emission-type scanning electron microscope. These values are shown in Tables 28 and 29.

Here, the "flat hexagonal crystal grains of a large grain size" means polygonal crystal grains in which the mean value of ten grains is 3 to 8 μm when the diameter of grains present within the plane perpendicular to the layer thickness direction observed by the field-emission-type scanning electron microscope is measured, and six vertex angles whose angle of vertex is 100 to 140° are provided.

Subsequently, although the thicknesses of the respective constituent layers in the hard coating layers of the coated tools C1 to C15 of the present invention, the comparative coated tools C1 to C10, and the reference coated tools C11 to C15 were measured using the scanning electron microscope (longitudinal-section measurement), substantially the same mean layer thicknesses (mean value of five-point measurements) as the target layer thicknesses were shown in all cases.

Next, all the coated tools C1 to C15 of the present invention, the comparative coated tools C1 to C10, and the reference coated tools C11 to C15 were screw-fixed to a tip portion of a bite made of tool steel by a fixing jig, and in this state, were subjected to a dry high-speed intermittent cutting test (normal cutting speed is 200 m/min) on bearing steel under the following conditions (referred to as cutting condition A):
Workpiece: a round bar of JIS-SUJ2 (HRC62) with four longitudinal grooves equally-spaced in the length direction,
Cutting speed: 250 m/min,
Depth of cut: 1.5 mm,
Feed rate: 0.15 mm/rev, and
Cutting time: 5 minutes,
a dry high-speed intermittent cutting test (normal cutting speed is 200 m/min) on alloy tool steel under the following conditions (referred to as cutting condition B):
Workpiece: a round bar of JIS-SKD11 (HRC58) with four longitudinal grooves equally-spaced in the length direction,
Cutting speed: 300 m/min,
Depth of cut: 1.5 mm,
Feed rate: 0.15 mm/rev, and
Cutting time: 5 minutes, and
a dry high-speed intermittent cutting test (normal cutting speed is 150 m/min) on carbon tool steel under the following conditions (referred to as cutting condition C):
Workpiece: a round bar of JIS-SK3 (HRC61) with four longitudinal grooves equally-spaced in the length direction,
Cutting speed: 250 m/min,
Depth of cut: 1.5 mm,
Feed rate: 0.15 mm/rev, and
Cutting time: 5 minutes, and
the flank wear widths of the cutting edges were measured in all the cutting tests. These test results are shown in Table 30.

TABLE 21

| | | Compounding composition (Mass %) | | | | | | | | | |
|---|---|---|---|---|---|---|---|---|---|---|---|
| Type | | Co | TiC | ZrC | VC | TaC | NbC | $Cr_3C_2$ | TiN | TaN | WC |
| Tool substrate | 3A | 7 | — | — | — | — | — | — | — | — | Balance |
| | 3B | 5.7 | — | — | — | 1.5 | 0.5 | — | 1.2 | — | Balance |
| | 3C | 5.7 | 2.3 | — | — | — | — | 1 | — | — | Balance |
| | 3D | 8.5 | — | 0.5 | — | — | — | 0.5 | — | — | Balance |
| | 3E | 12.5 | 2 | — | — | — | — | — | 1 | 2 | Balance |

TABLE 22

| | Type | Co | Ni | ZrC | TaC | NbC | Mo$_2$C | WC | TiCN |
|---|---|---|---|---|---|---|---|---|---|
| Tool substrate | 3a | 12 | 6 | — | 10 | — | 10 | 16 | Balance |
| | 3b | 7 | 7 | — | 5 | — | 7.5 | — | Balance |
| | 3c | 5 | — | — | — | 1 | 6 | 10 | Balance |

Compounding composition (Mass %)

TABLE 22-continued

| Type | Co | Ni | ZrC | TaC | NbC | Mo$_2$C | WC | TiCN |
|---|---|---|---|---|---|---|---|---|
| 3d | 9 | 6 | — | 11 | 2 | — | — | Balance |
| 3e | 8 | 5 | 1 | 8 | — | 10 | 10 | Balance |

Compounding composition (Mass %)

TABLE 23

Formation conditions (Reaction atmosphere pressure given in kPa and temperature given in °C.)

| | Hard coating layer (Lower layer) | | | Reaction atmosphere | |
|---|---|---|---|---|---|
| Type | Composition (Numbers indicate atomic ratio) | Composition of reaction gas (Vol. %) | | Pressure | Temperature |
| TiC layer | TiC | TiCl$_4$: 4.2%, CH$_4$: 8.5%, H$_2$: Balance | | 7 | 1020 |
| TiN layer (First layer) | TiN | TiCl$_4$: 4.2%, N$_2$: 30%, H$_2$: Balance | | 30 | 900 |
| TiN layer (Other layer) | TiN | TiCl$_4$: 4.2%, N$_2$: 35%, H$_2$: Balance | | 50 | 1040 |
| I—TiC$_{0.5}$N$_{0.5}$ layer | TiC$_{0.5}$N$_{0.5}$ | TiCl$_4$: 4.2%, N$_2$: 20%, CH$_3$CN: 0.6%, H$_2$: Balance | | 7 | 900 |
| TiCN layer | TiC$_{0.5}$N$_{0.5}$ | TiCl$_4$: 4.2%, N$_2$: 20%, CH$_4$: 4%, H$_2$: Balance | | 12 | 1020 |
| TiCO layer | TiC$_{0.5}$O$_{0.5}$ | TiCl$_4$: 4.2%, CO: 4%, H$_2$: Balance | | 7 | 1020 |
| TiCNO layer | TiC$_{0.3}$N$_{0.3}$O$_{0.4}$ | TiCl$_4$: 4.2%, CO: 3%, CH$_4$: 3%, N$_2$: 20%, H$_2$: Balance | | 20 | 1020 |
| α-Type Al$_2$O$_3$ layer | α-Al$_2$O$_3$ | AlCl$_3$: 2.2%, CO$_2$: 5.5%, HCl: 2.2%, H$_2$S: 0.2%, H$_2$: Balance | | 7 | 1000 |

TABLE 24

| | | | Neclear thin film formation conditions | | Heat treatment | |
|---|---|---|---|---|---|---|
| | | | | Reaction atmosphere | Reaction atmosphere | |
| Type | Formation symbol | Composition of reaction gas (Vol. %) | | Pressure/ kPa | Temperature/°C. | Pressure/ kPa | Temperature/°C. |
| Neclear thin film (3A) | 3A | AlCl$_3$: 3%, CO$_2$: 0.5%, C$_2$H$_4$: 0.01%, H$_2$: Balance | | 3 | 800 | 3 | 1100 |
| Neclear thin film (3B) | 3B | AlCl$_3$: 6%, CO$_2$: 1.5%, C$_2$H$_4$: 0.12%, H$_2$: Balance | | 7 | 750 | 7 | 1200 |
| Neclear thin film (3C) | 3C | AlCl$_3$: 10%, CO$_2$: 3%, C$_2$H$_4$: 0.3%, H$_2$: Balance | | 13 | 900 | 13 | 1000 |

*Formation conditions of normal α-type Al$_2$O$_3$ layer after formation of various kinds of neclear thin films are described in Table 23

TABLE 25

Formation conditions (Reaction atmosphere pressure given in kPa and temperature given in °C.)

| Reformed AlZrO layer | | | Reaction atmosphere | |
|---|---|---|---|---|
| Formation symbol | | Composition of reaction gas (Vol. %) | Pressure | Temperature |
| 3A | First step | AlCl$_3$: 1%, ZrCl$_4$: 0.07%, HCl: 3%, CO$_2$: 2%, H$_2$S: 0.25%, H$_2$: Balance | 3 | 1020 |
| | Second step | AlCl$_3$: 6%, ZrCl$_4$: 1.2%, HCl: 3%, CO$_2$: 5%, H$_2$S: 0.4%, H$_2$: Balance | 3 | 940 |
| 3B | First step | AlCl$_3$: 2%, ZrCl$_4$: 0.1%, HCl: 1%, CO$_2$: 3%, H$_2$S: 0.30%, H$_2$: Balance | 4 | 1030 |
| | Second step | AlCl$_3$: 7%, ZrCl$_4$: 1.0%, HCl: 4%, CO$_2$: 6%, H$_2$S: 0.3%, H$_2$: Balance | 4 | 920 |
| 3C | First step | AlCl$_3$: 3%, ZrCl$_4$: 0.08%, HCl: 4%, CO$_2$: 4%, H$_2$S: 0.45%, H$_2$: Balance | 5 | 1040 |
| | Second step | AlCl$_3$: 8%, ZrCl$_4$: 0.8%, HCl: 4%, CO$_2$: 6%, H$_2$S: 0.25%, H$_2$: Balance | 5 | 980 |
| 3D | First step | AlCl$_3$: 4%, ZrCl$_4$: 0.06%, HCl: 5%, CO$_2$: 5%, H$_2$S: 0.35%, H$_2$: Balance | 3 | 1020 |
| | Second step | AlCl$_3$: 10%, ZrCl$_4$: 0.6%, HCl: 3%, CO$_2$: 8%, H$_2$S: 0.6%, H$_2$: Balance | 3 | 960 |
| 3E | First step | AlCl$_3$: 5%, ZrCl$_4$: 0.05%, HCl: 5%, CO$_2$: 6%, H$_2$S: 0.50%, H$_2$: Balance | 4 | 1050 |
| | Second step | AlCl$_3$: 9%, ZrCl$_4$: 0.9%, HCl: 5%, CO$_2$: 5%, H$_2$S: 0.4%, H$_2$: Balance | 4 | 1000 |
| 3F | First step | AlCl$_3$: 3%, ZrCl$_4$: 0.1%, HCl: 2%, CO$_2$: 4%, H$_2$S: 0.75%, H$_2$: Balance | 5 | 1020 |
| | Second step | AlCl$_3$: 8%, ZrCl$_4$: 0.7%, HCl: 3%, CO$_2$: 4%, H$_2$S: 0.3%, H$_2$: Balance | 5 | 950 |

TABLE 26

| Type | Conventional AlZrO layer Composition (Numbers indicate atomic ratio) | Formation conditions (Reaction atmosphere pressure given in kPa and temperature given in °C.) Composition of reaction gas (Vol. %) | Reaction atmosphere Pressure | Temperature |
|---|---|---|---|---|
| Neclear thin film (3a) | $(Al_{0.995}Zr_{0.003})_2O_3$ | $AlCl_3$: 4%, $ZrCl_4$: 0.02%, $CO_2$: 1.8%, HCl: 1.5%, $H_2S$: 0.05%, $H_2$: Balance | 8 | 850 |
| Neclear thin film (3b) | $(Al_{0.99}Zr_{0.01})_2O_3$ | $AlCl_3$: 3.8%, $ZrCl_4$: 0.04%, $CO_2$: 1.8%, HCl: 1.5%, $H_2S$: 0.05%, $H_2$: Balance | 8 | 850 |
| Neclear thin film (3c) | $(Al_{0.98}Zr_{0.02})_2O_3$ | $AlCl_3$: 3.5%, $ZrCl_4$: 0.05%, $CO_2$: 1.8%, HCl: 1.5%, $H_2S$: 0.05%, $H_2$: Balance | 8 | 850 |
| Neclear thin film (3d) | $(Al_{0.97}Zr_{0.03})_2O_3$ | $AlCl_3$: 3.2%, $ZrCl_4$: 0.06%, $CO_2$: 1.8%, HCl: 1.5%, $H_2S$: 0.05%, $H_2$: Balance | 8 | 850 |
| Neclear thin film (3e) | $(Al_{0.96}Zr_{0.04})_2O_3$ | $AlCl_3$: 3%, $ZrCl_4$: 0.08%, $CO_2$: 1.8%, HCl: 1.5%, $H_2S$: 0.05%, $H_2$: Balance | 8 | 850 |
| Neclear thin film (3f) | $(Al_{0.955}Zr_{0.045})_2O_3$ | $AlCl_3$: 2.6%, $ZrCl_4$: 0.1%, $CO_2$: 1.8%, HCl: 1.5%, $H_2S$: 0.05%, $H_2$: Balance | 8 | 850 |
| Neclear thin film (3g) | $(Al_{0.95}Zr_{0.05})_2O_3$ | $AlCl_3$: 2.3%, $ZrCl_4$: 0.13%, $CO_2$: 1.8%, HCl: 1.5%, $H_2S$: 0.05%, $H_2$: Balance | 8 | 850 |
| Reformed layer(3A) | $(Al_{0.995}Zr_{0.003})_2O_3$ | $AlCl_3$: 4%, $ZrCl_4$: 0.02%, $CO_2$: 4%, HCl: 2.5%, $H_2S$: 0.2%, $H_2$: Balance | 8 | 1040 |
| Reformed layer(3B) | $(Al_{0.99}Zr_{0.01})_2O_3$ | $AlCl_3$: 3.8%, $ZrCl_4$: 0.04%, $CO_2$: 4%, HCl: 2.5%, $H_2S$: 0.2%, $H_2$: Balance | 8 | 1040 |
| Reformed layer(3C) | $(Al_{0.98}Zr_{0.02})_2O_3$ | $AlCl_3$: 3.5%, $ZrCl_4$: 0.05%, $CO_2$: 4%, HCl: 2.5%, $H_2S$: 0.2%, $H_2$: Balance | 8 | 1040 |
| Reformed layer(3D) | $(Al_{0.97}Zr_{0.03})_2O_3$ | $AlCl_3$: 3.2%, $ZrCl_4$: 0.06%, $CO_2$: 4%, HCl: 2.5%, $H_2S$: 0.2%, $H_2$: Balance | 8 | 1040 |
| Reformed layer(3E) | $(Al_{0.96}Zr_{0.04})_2O_3$ | $AlCl_3$: 3%, $ZrCl_4$: 0.08%, $CO_2$: 4%, HCl: 2.5%, $H_2S$: 0.2%, $H_2$: Balance | 8 | 1040 |
| Reformed layer(3F) | $(Al_{0.955}Zr_{0.045})_2O_3$ | $AlCl_3$: 2.6%, $ZrCl_4$: 0.1%, $CO_2$: 4%, HCl: 2.5%, $H_2S$: 0.2%, $H_2$: Balance | 8 | 1040 |
| Reformed layer(3G) | $(Al_{0.95}Zr_{0.05})_2O_3$ | $AlCl_3$: 2.3%, $ZrCl_4$: 0.13%, $CO_2$: 4%, HCl: 2.5%, $H_2S$: 0.2%, $H_2$: Balance | 8 | 1040 |

TABLE 27

| Type | Tool substrate symbol | Lower layer of hard coating layer [Ti compound layer] First layer (μm) | Second layer (μm) | Third layer (μm) | Fourth layer (μm) |
|---|---|---|---|---|---|
| Coated tool of the present invention | C1 | 3a | TiN (1) | 1-TiCN (17.5) | TiN (1) | TiCNO (0.5) |
| | C2 | 3A | TiCN (1) | 1-TiCN (8.5) | TiCO (0.5) | — |
| | C3 | 3b | TiN (1) | 1-TiCN (4) | TiC (4) | TiCNO (1) |
| | C4 | 3B | TiC (1) | 1-TiCN (9) | — | — |
| | C5 | 3c | TiN (1) | 1-TiCN (4.5) | TiCNO (0.5) | — |
| | C6 | 3C | TiN (0.5) | 1-TiCN (1.5) | TiC (0.5) | TiCNO (0.5) |
| | C7 | 3d | TiN (0.5) | 1-TiCN (10) | TiC (2) | TiCNO (0.3) |
| | C8 | 3D | TiN (1) | TiCN (19) | — | — |
| | C9 | 3e | TiC (0.5) | 1-TiCN (9) | TiCO (0.5) | — |
| | C10 | 3E | TiN (1) | TiC (1) | TiCN (7) | TiCO (1) |
| | C11 | 3A | TiN (0.3) | 1-TiCN (5) | TiCNO (0.7) | TiCO (0.1) |
| | C12 | 3a | TiN (1) | 1-TiCN (10) | TiCO (0.5) | — |
| | C13 | 3B | TiN (0.5) | 1-TiCN (12) | TiN (0.5) | TiCNO (0.2) |

TABLE 27-continued

| Type | Tool substrate symbol | Lower layer of hard coating layer [Ti compound layer] | | | |
|---|---|---|---|---|---|
| | | First layer (μm) | Second layer (μm) | Third layer (μm) | Fourth layer (μm) |
| C14 | 3b | TiN (0.6) | 1-TiCN (7) | TiCNO (0.3) | — |
| C15 | 3C | TiN (0.4) | 1-TiCN (3) | TiCN (0.5) | TiCO (0.1) |

(Numbers in the parentheses of lower layer column indicate target layer thickness)

TABLE 28

| | | Hard coating layer Intermediate layer [Reformed α-type Al$_2$O$_3$ layer] | | | |
|---|---|---|---|---|---|
| Type | Tool substrate symbol | Formation symbol of intermediate layer | Target layer thickness (μm) | Tilt angle division where (0001) plane shows highest peak (Degree) | Frequency ratio of tilt angle division of 0 to 10 degrees (%) |
| Coated tool of the present invention | C1 | 3a | 3A | 1 | 1.50-1.75 | 60 |
| | C2 | 3A | 3B | 1 | 2.75-3.00 | 52 |
| | C3 | 3b | 3C | 2 | 2.00-2.25 | 65 |
| | C4 | 3B | 3A | 2 | 5.25-5.50 | 70 |
| | C5 | 3c | 3B | 3 | 2.25-2.50 | 83 |
| | C6 | 3C | 3B | 3 | 3.50-3.75 | 97 |
| | C7 | 3d | 3C | 4 | 4.25-4.50 | 84 |
| | C8 | 3D | 3C | 4 | 3.25-3.50 | 86 |
| | C9 | 3e | 3A | 5 | 2.00-2.25 | 89 |
| | C10 | 3E | 3B | 5 | 5.25-5.50 | 82 |
| | C11 | 3A | 3B | 2 | 2.25-2.50 | 72 |
| | C12 | 3a | 3C | 2 | 1.75-2.00 | 83 |
| | C13 | 3B | 3A | 3 | 0.50-0.75 | 92 |
| | C14 | 3b | 3B | 2 | 0.25-0.50 | 88 |
| | C15 | 3C | 3C | 3 | 1.25-1.50 | 85 |

| | | Hard coating layer Upper layer [Reformed AlZrO layer] | | | |
|---|---|---|---|---|---|
| Type | | Formation symbol of upper layer | Content ratio of Zr [Zr/(Al + Zr)] (Atomic ratio) | Target layer thickness (μm) | Tilt angle division where (0001) plane shows highest peak (Degree) |
| Coated tool of the present invention | C1 | 3A | 0.01 | 5 | 1.50-1.75 |
| | C2 | 3B | 0.008 | 2 | 3.00-3.25 |
| | C3 | 3C | 0.003 | 4 | 2.00-2.25 |
| | C4 | 3D | 0.002 | 15 | 5.25-5.50 |
| | C5 | 3D | 0.002 | 13 | 2.25-2.50 |
| | C6 | 3C | 0.003 | 10 | 3.75-4.00 |
| | C7 | 3B | 0.009 | 7 | 4.25-4.50 |
| | C8 | 3A | 0.01 | 6 | 3.25-3.50 |
| | C9 | 3B | 0.008 | 14 | 2.00-2.25 |
| | C10 | 3C | 0.003 | 3 | 5.25-5.50 |
| | C11 | 3E | 0.004 | 4 | 2.20-2.25 |
| | C12 | 3F | 0.006 | 5 | 1.75-2.00 |
| | C13 | 3E | 0.004 | 6 | 0.50-0.75 |
| | C14 | 3E | 0.004 | 3 | 0.25-0.50 |
| | C15 | 3F | 0.006 | 4 | 1.25-1.50 |

| | | Hard coating layer Upper layer [Reformed AlZrO layer] | | | |
|---|---|---|---|---|---|
| Type | | Frequency ratio of tilt angle division of 0 to 10 degrees (%) | Crystal grain ratio having Σ3 coincidence site lattice interface therein (Area %) | Surface ratio of flat hexagonal crystal grain (Area %) | Surface roughness Ra (μm) |
| Coated tool of the present invention | C1 | 72 | 65 | 12 | 0.3 * |
| | C2 | 68 | 60 | 3 | 0.5 |
| | C3 | 74 | 72 | 20 | 0.5 |
| | C4 | 71 | 63 | 8 | 0.6 |
| | C5 | 85 | 77 | 15 | 0.8 |
| | C6 | 97 | 83 | 18 | 0.7 |

TABLE 28-continued

|  |  |  |  |  |
|---|---|---|---|---|
| C7 | 86 | 74 | 27 | 0.2 * |
| C8 | 87 | 79 | 20 | 0.6 |
| C9 | 93 | 80 | 14 | 0.8 |
| C10 | 89 | 74 | 35 | 0.1 * |
| C11 | 87 | 82 | 52 | 0.5 |
| C12 | 84 | 87 | 63 | 0.2 * |
| C13 | 95 | 79 | 74 | 0.5 |
| C14 | 91 | 83 | 82 | 0.3 * |
| C15 | 92 | 75 | 54 | 0.6 |

(Note)
Then mark * in the column "Surface roughness" indicates that wet blasting processing was performed.

TABLE 29

| | | Hard coating layer Intermediate layer [Conventional α-type $Al_2O_3$ layer] | | | |
|---|---|---|---|---|---|
| Type | | Formation symbol of intermediate layer | Target layer thickness (μm) | Tilt angle division where (0001) plane shows highest peak (Degree) | Frequency ratio of tilt angle division of 0 to 10 degrees (%) |
| Comparative coated tool | C1 | — | — | — | — |
| | C2 | — | — | — | — |
| | C3 | — | — | — | — |
| | C4 | — | — | — | — |
| | C5 | — | — | — | — |
| | C6 | — | — | — | — |
| | C7 | — | — | — | — |
| | C8 | — | — | — | — |
| | C9 | — | — | — | — |
| | C10 | — | — | — | — |
| Reference coated tool | C11 | 3A | 2 | 1.50-1.75 | 55 |
| | C12 | 3B | 7 | 2.00-2.25 | 63 |
| | C13 | 3C | 10 | 3.00-3.25 | 48 |
| | C14 | 3A | 8 | 1.25-1.50 | 65 |
| | C15 | 3B | 5 | 1.75-2.00 | 71 |

| | | Hard coating layer Upper layer [Conventional AlZrO layer] | | | | |
|---|---|---|---|---|---|---|
| | | Formation symbol of upper layer | | Content ratio of Zr [Zr/ (Al + Zr)] (atomic ratio) | Target layer thickness (μm) | Tilt angle division where (0001) plane shows highest peak (Degree) |
| Type | | Neclear thin film | Reformed layer | | | |
| Comparative coated tool | C1 | 3a | 3A | 0.003 | 3 | 15.00-15.25 |
| | C2 | 3b | 3B | 0.012 | 5 | 20.25-20.50 |
| | C3 | 3c | 3C | 0.022 | 10 | 35.00-35.25 |
| | C4 | 3d | 3D | 0.03 | 15 | 25.50-25.75 |
| | C5 | 3e | 3E | 0.037 | 17 | 27.75-30.00 |
| | C6 | 3f | 3F | 0.042 | 14 | 17.25-17.50 |
| | C7 | 3g | 3G | 0.05 | 7 | 22.00-22.25 |
| | C8 | 3a | 3A | 0.003 | 8 | 23.25-23.50 |
| | C9 | 3b | 3B | 0.011 | 6 | 32.25-32.50 |
| | C10 | 3c | 3C | 0.021 | 9 | 34.75-35.00 |
| Reference coated tool | C11 | — | — | — | — | — |
| | C12 | — | — | — | — | — |
| | C13 | — | — | — | — | — |
| | C14 | — | — | — | — | — |
| | C15 | — | — | — | — | — |

| | | Hard coating layer Upper layer [Conventional AlZrO layer] | | | |
|---|---|---|---|---|---|
| Type | | Frequency ratio of tilt angle division of 0 to 10 degrees (%) | Crystal grain ratio Having Σ3 coincidence site lattice interface therein (Area %) | Surface ratio of flat hexagonal crystal grain (Area %) | Surface roughness Ra (μm) |
| Comparative coated tool | C1 | 15 | 10 | 0 | 0.5 |
| | C2 | 10 | 7 | 0 | 0.2 * |
| | C3 | 5 | 8 | 0 | 0.6 |
| | C4 | 17 | 15 | 0 | 0.8 |

TABLE 29-continued

|  |  |  |  |  |  |
|---|---|---|---|---|---|
|  | C5 | 3 | 20 | 0 | 0.9 |
|  | C6 | 8 | 17 | 0 | 0.8 |
|  | C7 | 7 | 14 | 0 | 0.1 * |
|  | C8 | 6 | 12 | 0 | 0.6 |
|  | C9 | 5 | 3 | 0 | 0.2 * |
|  | C10 | 12 | 2 | 0 | 0.6 |
| Reference | C11 | — | — | — | — |
| coated tool | C12 | — | — | — | — |
|  | C13 | — | — | — | — |
|  | C14 | — | — | — | — |
|  | C15 | — | — | — | — |

(Note)
The mark * in the column "Surface roughness" indicates that wet blasting processing was performed.

TABLE 30

| Type | | Flank wear width (mm) | | | Type | | Cutting test result (min) | | |
|---|---|---|---|---|---|---|---|---|---|
| | | Cutting condition (A) | Cutting condition (B) | Cutting condition (C) | | | Cutting condition (A) | Cutting condition (B) | Cutting condition (C) |
| Coated tool | C1 | 0.28 | 0.27 | 0.25 | Comparative | C1 | 1.4 | 1.7 | 1.5 |
| of the | C2 | 0.44 | 0.40 | 0.42 | cutting tool | C2 | 2.8 | 3.5 | 3.2 |
| present | C3 | 0.35 | 0.31 | 0.32 | | C3 | 2.5 * | 2.7 | 2.8 |
| invention | C4 | 0.45 | 0.43 | 0.42 | | C4 | 1.3 * | 1.8 * | 1.7 * |
| | C5 | 0.46 | 0.42 | 0.42 | | C5 | 1.5 * | 1.9 * | 1.6 * |
| | C6 | 0.34 | 0.32 | 0.33 | | C6 | 1.4 * | 1.6 * | 1.4 * |
| | C7 | 0.41 | 0.37 | 0.38 | | C7 | 3.2 | 4.0 | 3.8 |
| | C8 | 0.28 | 0.25 | 0.27 | | C8 | 2.9 * | 3.4 | 3.2 * |
| | C9 | 0.27 | 0.24 | 0.26 | | C9 | 3.0 | 3.8 | 3.5 |
| | C10 | 0.45 | 0.42 | 0.44 | | C10 | 2.8 * | 3.2 | 3.0 * |
| | C11 | 0.18 | 0.16 | 0.17 | Reference | C11 | 2.0 | 2.0 * | 1.8 * |
| | C12 | 0.17 | 0.15 | 0.15 | cutting tool | C12 | 3.1 * | 3.3 | 3.2 |
| | C13 | 0.16 | 0.14 | 0.14 | | C13 | 2.2 | 2.5 | 2.3 |
| | C14 | 0.29 | 0.25 | 0.26 | | C14 | 3.1 | 3.4 | 3.3 |
| | C15 | 0.14 | 0.11 | 0.13 | | C15 | 2.3 | 2.6 | 2.4 |

Cutting test results of comparative coated tools and reference coated tools show cutting times (min) until the tools come to the end of their usable lifespan due to chipping or flank wear (usable lifespan determination criterion: Flank wear width of 0.5 mm).
In addition, mark * in columns indicates a case where tools come to the end of their usable lifespan due to chipping.

From the results shown in Tables 28 to 30, as for the coated tools C1 to C15 of the present invention, the (0001) plane orientation rate of the reformed α-type $Al_2O_3$ layers which are the intermediate layers of the hard coating layers show a high ratio of 45% or more, and have excellent high-temperature strength. In addition, the reformed AlZrO layers which constitute the upper layers have the texture of the flat-plate polygonal (flat hexagonal) elongated crystal grains, and the (0001) plane orientation rate show a high ratio of 60% or more, the surface ratios of crystal grains in which at least one or more Σ3 coincidence site lattice interfaces are present inside the crystal grains are as high as 60% or more, or post-processing is performed on the reformed AlZrO layers and the surface smoothness thereof is further improved. Thereby, the reformed AlZrO layers have superior high-temperature strength, and strength within the crystal grains, and have superior surface flatness. As a result, in high-speed intermittent cutting work of high-hardness steel, such as quenching materials for alloy tool steel or bearing steel, accompanied by high heat generation, and intermittent impact loading acts on the cutting edge, the hard coating layers exhibit superior chipping resistance, show excellent cutting performance for a long-term use, and allows a more prolonged usable lifespan.

On the other hand, it is clear that the comparative coated tools C1 to C10 in which the hard coating layers are composed of the AlZrO layer and the conventional Ti compound layers and the reference coated tools C11 to C15 in which the hard coating layers are composed of the Ti compound layers and the conventional α-type $Al_2O_3$ layers, come to the end of their usable lifespan in a relatively short time due to occurrence of chipping, promotion of abrasion, or the like.

As described above, even in high-speed intermittent cutting work of high-hardness steel accompanied by high heat generation, and intermittent and impacting high load acts repeatedly on the cutting edge as well as in cutting work of various kinds of steel or cast iron, or the like under normal conditions, the coated tools of this invention exhibit excellent chipping resistance without occurrence of chipping, and show excellent cutting performance for a prolonged period of time. Therefore, it is possible to satisfactorily cope with the demands for high performance of a cutting device, for labor saving and energy saving in cutting work, and cost reduction.

Example 4

The following powders, each having a mean particle size within a range of 2 to 4 μm, were prepared as raw materials: WC powder, TiC powder, ZrC powder, VC powder, TaC powder, NbC powder, $Cr_3C_2$ powder, TiN powder, and Co powder. These raw powders were compounded with each other in the compounding compositions shown in Table 31, mixed with each other in an acetone solution having wax added thereto for 24 hours using a ball mill, and were then dried under reduced pressure. Thereafter, the resultant powder mixture was press-formed into a green compact having a predetermined shape at a pressure of 105 MPa. The green compact was then sintered in a vacuum under the following conditions: a pressure of 5 Pa, a predetermined temperature within a range of 1370° C. to 1470° C., and a holding duration of 1 hour. After sintering, cutting edges were subjected to honing (R: 0.07 mm) to manufacture bodies 4A to 4E made of WC-based cemented carbide and having a throwaway tip shape defined in ISO CNMG120408.

Additionally, the following powders, each having a mean particle size within a range of 0.5 to 2 μm, were prepared as raw materials: TiCN (TiC/TiN=50/50 in weight ratio) powder, $Mo_2C$ power, ZrC power, NbC powder, TaC powder, WC power, Co powder and Ni powder. These raw powders were compounded with each other in the compounding compositions shown in Table 22, were wet-mixed with each other for 24 hours using a ball mill, and were dried. Thereafter, the resulting powder mixture was press-formed into a green compact at a pressure of 98 MPa. The green compact was then sintered in a nitrogen atmosphere under the following conditions: a pressure of 1.3 kPa, a temperature of 1540° C., and a holding duration of 1 hour. After sintering, cutting edges were subjected to honing (R: 0.07 mm) to manufacture bodies 4a to 4e made of TiCN-based cermet and having a tip shape defined in ISO CNMG120408.

Subsequently, these bodies 4A to 4E and the bodies 4a to 4e were loaded into a normal chemical vapor deposition apparatus.

(a) First, Ti compound layers with target layer thicknesses shown in Table 37 were vapor-deposited as lower layers of hard coating layers under the conditions shown in Table 33 (1-TiCN in Table 33 shows the formation conditions of TiCN layers with a longitudinal growth crystalline structure disclosed in Japanese Unexamined Patent Application Publication No. 6-8010, and the others show the formation conditions of a normal granular crystalline structure).

(b) Subsequently, reformed $Al_2O_3$ layers with target layer thicknesses shown in Table 38 were vapor-deposited as intermediate layers of the hard coating layers under the conditions shown in Table 34.

(c) Next, coated tools D1 to D15 of the present invention were manufactured, respectively, by vapor-depositing reformed Cr-containing $Al_2O_3$ layers with target layer thicknesses similarly shown in Table 38 as upper layers of hard coating layers according to the vapor deposition conditions (initial conditions or film formation conditions) shown in Table 35.

For the purpose of comparison, comparative coated tools D1 to D15 were manufactured, respectively, by vapor-depositing Ti compound layers with target layer thicknesses shown in Table 37 under the conditions shown in Table 33 as lower layers of hard coating layers, and then vapor-depositing conventional Cr-containing $Al_2O_3$ layers with target layer thicknesses shown in Table 39 under the conditions (neclear formation conditions and film formation conditions, equivalent to the vapor deposition conditions of the conventional Cr-containing $Al_2O_3$ layers disclosed in PTL 5) shown in Table 36 as upper layers of the hard coating layers.

The type of the bodies, the type of the lower layers, and the thickness of the lower layers in the conventional coated tools D1 to D15 are the same as those of the coated tools D1 to D15 of the present invention, respectively.

Post-processing composed of wet blasting processing with projection pressure 0.15 MPa and $Al_2O_3$ grains of 200 meshes was performed on the surfaces of some reformed Cr-containing $Al_2O_3$ layers of the coated tools of the present invention, and the surfaces of some conventional Cr-containing $Al_2O_3$ layers of the comparative coated tools. As the post-processing, polishing processing using an elastic grind stone may be adopted.

Tables 38 and 39 show the values of the surface roughness (Ra (μm)) of the reformed Cr-containing $Al_2O_3$ layers (those marked by * in Table 38) of the coated tools of the present invention which were subjected to post-processing and the conventional Cr-containing $Al_2O_3$ layers (those marked by * in Table 39) of the conventional coated tools. (For reference, the values of Ra regarding the coated tools of the present invention and the conventional coated tools which were not subjected to post-processing are also shown in Tables 38 and 39.)

Subsequently, as for the reformed $Al_2O_3$ layers which constitute the intermediate layers of the hard coating layers of the coated tools D1 to D15 of the present invention, the reformed Cr-containing $Al_2O_3$ layers which constitute the upper layers of the hard coating layers, and the conventional Cr-containing $Al_2O_3$ layers of the conventional coated tools D1 to D15, tilt angle frequency distribution graphs were plotted, respectively, using the field-emission-type scanning electron microscope.

The tilt angle frequency distribution graphs were plotted by setting the respective layers in the coated tools D1 to D15 of the present invention, and the conventional coated tools D1 to D15 within a lens barrel of the field-emission-type scanning electron microscope, with the surfaces of the layers as polished surfaces; individually irradiated crystal grains having a hexagonal crystal lattice present within the measurement range of each polished surface with an electron beam having an acceleration voltage of 15 kV with an irradiating current of 1 nA at an angle of incidence of 70 degrees with respect to each polished surface, thereby measuring the tilt angle of the normal line to the (0001) plane, which is a crystal plane of each crystal grain, to the normal line to each polished surface, at intervals of 0.1 μm/step for a region 30×50 using the electronic backscattering diffraction image apparatus; and on the basis of these measurement results, dividing the measured tilt angles which are within a range of 0 to 45 degrees among the measured tilt angles at every pitch of 0.25 degrees, and summing the frequencies present within the respective divisions.

As an example of the tilt angle frequency distribution graphs, FIG. 14 shows a tilt angle frequency distribution graph of the (0001) plane of a reformed α-type $Al_2O_3$ layer which constitutes an intermediate layer of a hard coating layer of a coated tool D14 of the present invention. The "surface" in this invention includes not only a face parallel to the surface of a base, but also a face which inclines to the surface of the base, for example, the cutting face of a layer.

As a result, in the obtained tilt angle frequency distribution graphs of the reformed $Al_2O_3$ layers and reformed Cr-containing $Al_2O_3$ layers of the coated tools of the present invention, and the conventional Cr-containing $Al_2O_3$ layers of the conventional coated tools D1 to D15, as shown in Tables 38 and 39, respectively, the distributions of the measured tilt angles of the (0001) plane in the reformed $Al_2O_3$ layers and reformed Cr-containing $Al_2O_3$ layers of the coated tools of the present invention show a tilt angle frequency distribution graph in which the highest peak appears in the tilt angle division within a range of 0 to 10 degrees, respectively.

Similarly, the distribution of the measured tilt angles of the (0001) plane in the conventional reformed Cr-containing $Al_2O_3$ layers of the conventional coated tools D1 to D15 also shows a tilt angle frequency distribution graph in which the highest peak appears in the tilt angle division within a range of 0 to 10 degrees Tables 38 and 39 show the ratios of the frequencies present in the tilt angle division within a range of 0 to 10 degrees, which are accounted for in the overall tilt angle frequency distribution graph.

Subsequently, as for the reformed Cr-containing Al$_2$O$_3$ layers which constitute the upper layers of the coated tools D1 to D15 of the present invention, and the conventional Cr-containing Al$_2$O$_3$ layers of the conventional coated tools D1 to D15, the crystal grain structure and the constituent atom sharing lattice point configuration were inspected using the field-emission-type scanning electron microscope and the electronic backscattering diffraction image apparatus.

First, when the reformed Cr-containing Al$_2$O$_3$ layers of the coated tools D1 to D15 of the present invention and the conventional Cr-containing Al$_2$O$_3$ layers of the conventional coated tools D1 to D15 were observed using the field-emission-type scanning electron microscope, the flat-plate polygonal (including flat hexagonal) and elongated crystal grain structure of a large grain size shown typically in FIGS. 15A and 15B were observed in the coated tools D1 to D15 of the present invention (FIG. 15A is a schematic view of the texture of the coated tool D1 of the present invention as seen within the plane perpendicular to the layer thickness direction, and FIG. 15C is a schematic view of the texture composed of flat hexagonal and elongated crystal grains of a large grain size, of the coated tools D11 of the present invention as seen within the plane perpendicular to the layer thickness direction).

On the other hand, as shown typically in FIGS. 17A and 17B, a polygonal and elongated crystal grain structure was observed in the conventional coated tools D1 to D15. However, the grain size of each crystal grain was small as compared to that of the present invention, and as being clear from FIG. 17B, pyramidal irregularities were formed in the layer surface (FIGS. 17A and 17B are schematic views of the texture of the conventional coated tool 1).

Subsequently, as for the reformed Cr-containing Al$_2$O$_3$ layers of the coated tools D1 to D15 of the present invention, and the conventional Cr-containing Al$_2$O$_3$ layers of the conventional coated tools D1 to D15, the area ratios of crystal grains in which the Σ3 coincidence site lattice interfaces are present inside the crystal grains which constitute each layer were measured.

First, as for the reformed Cr-containing Al$_2$O$_3$ layers of the coated tools D1 to D15 of the present invention, when the respective layers are within a lens barrel of the field-emission-type scanning electron microscope, with the surfaces of the layers as polished surfaces; crystal grains having a hexagonal crystal lattice present within the measurement range of each polished surface are individually irradiated with an electron beam having an acceleration voltage of 15 kV with an irradiating current of 1 nA at an angle of incidence of 70 degrees with respect to each polished surface, thereby measuring the angle at which the normal line to each of crystal lattice planes of the crystal grains crosses the normal line to each base surface, at intervals of 0.1 μm/step for a region 30×50 μm, using the electronic backscattering diffraction image apparatus; and from these measurement results, the crystal orientation relationship between adjacent crystal lattices is calculated, and the distribution of lattice points (constituent atom sharing lattice points) where respective constituent atoms which constitute a crystal lattice interface sharing one constituent atom between the crystal lattices is calculated; and a constituent atom sharing lattice point configuration in which N (here, N is any even number equal to or greater than 2 in a crystal structure of a corundum-type hexagonal close-packing crystal, but when the upper limit of N is 28 from the viewpoint of a distribution frequency, even numbers 4, 8, 14, 24, and 26 do not exist) lattice points which do not share any constituent atoms between the constituent atom sharing lattice points are present is expressed by ΣN+1, the area ratios of crystal grain in which at least one or more Σ3 coincidence site lattice interfaces are present inside the crystal grains among all the crystal grains present within the measurement range of the reformed Cr-containing Al$_2$O$_3$ layers were obtained, and the values of the area ratios were shown in Table 38 as Σ3 coincidence site lattice interface ratio (%).

Next, even as for the conventional Cr-containing Al$_2$O$_3$ layers of the conventional coated tools D1 to D15, by the same method as the case of the coated tools of the present inventions, the area ratios of crystal grains in which at least one or more Σ3 coincidence site lattice interfaces are present inside the crystal grains among all the crystal grains present within the measurement range of the conventional reformed Cr-containing Al$_2$O$_3$ layers were obtained, and the values of the area ratios were shown in Table 39 as a Σ3 coincidence site lattice interface ratio (%).

As shown in Tables 38 and 39, in the reformed Cr-containing Al$_2$O$_3$ layers of the coated tools D1 to D15 of the present invention, the area ratios of crystal grains in which at least one or more Σ3 coincidence site lattice interfaces are present inside the crystal grains are 60% or more. On the other hand, in the conventional Cr-containing Al$_2$O$_3$ layers of the conventional coated tools D1 to D15, the area ratios of crystal grains in which at least one or more Σ3 coincidence site lattice interfaces are present inside the crystal grains are 40% or less. It can be understood from this that the rate at which the Σ3 coincidence site lattice interfaces are present inside crystal grains is very small.

Subsequently, as for the reformed Cr-containing Al$_2$O$_3$ layers of the coated tools D1 to D15 of the present invention, and the conventional Cr-containing Al$_2$O$_3$ layers of the conventional coated tools D1 to D15, the area ratios of flat hexagonal crystal grains of a large grain size present within the plane perpendicular to the layer thickness direction were obtained using the field-emission-type scanning electron microscope. These values are shown in Tables 38 and 39. Here, the "flat hexagonal crystal grains of a large grain size" means polygonal crystal grains in which "the mean value of ten grains is 3 to 8 μm when the diameter of grains present within the plane perpendicular to the layer thickness direction observed by the field-emission-type scanning electron microscope is measured, and six vertex angles whose angle of vertex is 100 to 140° are provided".

Subsequently, although the thicknesses of the respective constituent layers in the hard coating layers of the coated tools D11 to D15 of the present invention, and the conventional coated tools D11 to D15 were measured using the scanning electron microscope (longitudinal-section measurement), substantially the same mean layer thicknesses (mean value of five-point measurements) as the target layer thicknesses were shown in all cases.

Next, all the coated tools D1 to D15 of the present invention and the conventional coated tools D1 to D15 were screw-fixed to a tip portion of a bite made of tool steel by a fixing jig, and in this state, were subjected to a wet high-speed high-feed-rate cutting test (normal cutting speed and feed rate are 120 m/min, and 0.3 mm/rev, respectively) on stainless steel under the following conditions (referred to as cutting condition A):

Workpiece: a round bar of JIS-SUS316,
Cutting speed: 240 m/min,
Depth of cut: 1.0 mm,
Feed rate: 0.45 mm/rev, and
Cutting time: 5 minutes, a wet high-speed high-feed-rate cutting test (normal cutting speed and feed rate are 150 m/min, and 0.4 mm/rev, respectively) on ductile cast iron under the following conditions (referred to as cutting condition B):

Workpiece: a round bar of JIS-FCD700,
Cutting speed: 240 m/min,
Depth of cut: 1.0 mm,
Feed rate: 0.7 mm/rev, and
Cutting time: 5 minutes,
a wet high-speed high-feed-rate cutting test (normal cutting speed and feed rate are 80 m/min, and 2.5 mm/rev, respectively) on high manganese steel under the following conditions (referred to as cutting condition C):

Workpiece: a round bar of JIS-SMn438,
Cutting speed: 120 m/min,
Depth of cut: 5.5 mm,
Feed rate: 0.3 mm/rev, and
Cutting time: 5 minutes, and
the flank wear widths of the cutting edges were measured in all the cutting tests. These test results are shown in Table 40.

TABLE 31

| | Type | | Compounding composition (Mass %) | | | | | | | |
|---|---|---|---|---|---|---|---|---|---|---|
| | | | Co | TiC | ZrC | VC | TaC | NbC | $Cr_3C_2$ | TiN | WC |
| Tool substrate | 4A | | 7 | 1.5 | 0.5 | — | — | 0.5 | — | 1.5 | Balance |
| | 4B | | 5.7 | — | — | — | 1.5 | 0.5 | — | — | Balance |
| | 4C | | 5.7 | — | — | — | — | — | — | — | Balance |
| | 4D | | 9.5 | 8 | — | — | — | 7.5 | — | — | Balance |
| | 4E | | 12.5 | — | — | 0.5 | — | — | 0.5 | — | Balance |

TABLE 32

| | Type | | Compounding composition (Mass %) | | | | | | | |
|---|---|---|---|---|---|---|---|---|---|---|
| | | | Co | Ni | ZrC | TaC | NbC | $Mo_2C$ | WC | TiCN |
| Tool substrate | 4a | | 12 | 6 | — | 10 | — | 10 | 15 | Balance |
| | 4b | | 7 | 7 | — | 5 | — | 7.5 | 2 | Balance |
| | 4c | | 5 | 2 | — | — | 1 | 6 | 8 | Balance |
| | 4d | | 9 | 6 | — | 11 | 2 | — | 2 | Balance |
| | 4e | | 8 | 5 | 1 | 8 | — | 10 | 8 | Balance |

TABLE 33

| Hard coating layer (Lower layer) | | Formation conditions (Reaction atmosphere pressure given in kPa and temperature given in ° C.) | | |
|---|---|---|---|---|
| Type | Composition (Numbers indicate atomic ratio) | Composition of reaction gas (Vol. %) | Reaction atmosphere | |
| | | | Pressure | Temperature |
| TiC layer | TiC | $TiCl_4$: 4.2%, $CH_4$: 8.5%, $H_2$: Balance | 7 | 1020 |
| TiN layer (First layer) | TiN | $TiCl_4$: 4.2%, $N_2$: 30%, $H_2$: Balance | 30 | 900 |
| TiN layer (Other layer) | TiN | $TiCl_4$: 4.2%, $N_2$: 35%, $H_2$: Balance | 50 | 1040 |
| $I-TiC_{0.5}N_{0.5}$ layer | $TiC_{0.5}N_{0.5}$ | $TiCl_4$: 4.2%, $N_2$: 20%, $CH_3CN$: 0.6%, $H_2$: Balance | 7 | 900 |
| TiCN layer | $TiC_{0.5}N_{0.5}$ | $TiCl_4$: 4.2%, $N_2$: 20%, $CH_4$: 4%, $H_2$: Balance | 12 | 1020 |
| TiCO layer | $TiC_{0.5}O_{0.5}$ | $TiCl_4$: 4.2%, CO: 4%, $H_2$: Balance | 7 | 1020 |
| TiCNO layer | $TiC_{0.3}N_{0.3}O_{0.4}$ | $TiCl_4$: 4.2%, CO: 3%, $CH_4$: 3%, $N_2$: 20%, $H_2$: Balance | 20 | 1020 |

TABLE 34

| Intermediate layer (Reformed $Al_2O_3$ layer) Formation symbol | | Neclear thin film formation conditions | | | Heat treatment | |
|---|---|---|---|---|---|---|
| | | | Reaction atmosphere | | Reaction atmosphere | |
| | | Composition of reaction gas (Vol %) | Pressure/ kPa | Temperature/° C. | Pressure/ kPa | Temperature/° C. |
| Neclear thin film (4A) | 4A | $AlCl_3$: 3%, $CO_2$: 0.5%, $C_2H_4$: 0.01%, $H_2$: Balance | 3 | 800 | 3 | 1100 |
| Neclear thin film (4B) | 4B | $AlCl_3$: 6%, $CO_2$: 1.5%, $C_2H_4$: 0.12%, $H_2$: Balance | 7 | 750 | 7 | 1200 |
| Neclear thin film (4C) | 4C | $AlCl_3$: 10%, $CO_2$: 3%, $C_2H_4$: 0.3%, $H_2$: Balance | 13 | 900 | 13 | 1000 |

TABLE 34-continued

| Intermediate layer (Reformed Al$_2$O$_3$ layer) Formation symbol | Composition of reaction gas (Vol %) | Neclear thin film formation conditions | | Heat treatment | |
|---|---|---|---|---|---|
| | | Reaction atmosphere | | Reaction atmosphere | |
| | | Pressure/ kPa | Temperature/°C. | Pressure/ kPa | Temperature/°C. |
| α-Type Al$_2$O$_3$ layer[*] | — AlCl$_3$: 2.2%, CO$_2$: 5.5%, HCl: 2.2%, H$_2$S: 0.2%, H$_2$: Balance | 7 | 1000 | — | — |

(Note)
Reaction gas composition and reaction atmosphere of the column "α-type Al$_2$O$_3$ layer[*]" indicate formation conditions of a normal α-type Al$_2$O$_3$ layer after formation of neclear thin film (4A) to 4(C).

TABLE 35

| Formation symbol of upper layer (Reformed Cr-containing Al$_2$O$_3$ layer) | | Formation conditions (Reaction atmosphere pressure given in kPa and temperature given in °C.) | | |
|---|---|---|---|---|
| | | Composition of reaction gas (Vol. %) | Reaction atmosphere | |
| | | | Pressure | Temperature |
| 4A | Initial condition | AlCl$_3$: 4%, CrCl$_3$: 0.04%, CO$_2$: 8%, HCl: 1.5%, H$_2$S: 0.15%, H$_2$: Balance | 8 | 970 |
| | Film formation condition | AlCl$_3$: 4%, CrCl$_3$: 0.04%, CO$_2$: 8%, HCl: 1.5%, H$_2$S: 0.15%, H$_2$: Balance | 8 | 1020 |
| 4B | Initial condition | AlCl$_3$: 3.8% CrCl$_3$: 0.08%, CO$_2$: 8%, HCl: 1.5%, H$_2$S: 0.15%, H$_2$: Balance | 10 | 940 |
| | Film formation condition | AlCl$_3$: 3.8%, CrCl$_3$: 0.08%, CO$_2$: 8%, HCl: 1.5%, H$_2$S: 0.15%, H$_2$: Balance | 10 | 1020 |
| 4C | Initial condition | AlCl$_3$: 3.3%, CrCl$_3$: 0.17%, CO$_2$: 7%, HCl: 3%, H$_2$S: 0.2%, H$_2$: Balance | 6 | 960 |
| | Film formation condition | AlCl$_3$: 3.3%, CrCl$_3$: 0.17%, CO$_2$: 7%, HCl: 3%, H$_2$S: 0.2%, H$_2$: Balance | 6 | 1030 |
| 4D | Initial condition | AlCl$_3$: 3%, CrCl$_3$: 0.23%, CO$_2$: 7%, HCl: 2%, H$_2$S: 0.1%, H$_2$: Balance | 9 | 950 |
| | Film formation condition | AlCl$_3$: 3%, CrCl$_3$: 0.23%, CO$_2$: 7%, HCl: 2%, H$_2$S: 0.1%, H$_2$: Balance | 9 | 1040 |
| 4E | Initial condition | AlCl$_3$: 2.3%, CrCl$_3$: 0.26%, CO$_2$: 6%, HCl: 2%, H$_2$S: 0.05%, H$_2$: Balance | 7 | 930 |
| | Film formation condition | AlCl$_3$: 2.3%, CrCl$_3$: 0.26%, CO$_2$: 6%, HCl: 2%, H$_2$S: 0.05%, H$_2$: Balance | 7 | 1050 |

TABLE 36

| Formation symbol of upper layer (Conventional AlTiO layer) | | Formation condition (Reaction atmosphere pressure given in kPa and temperature given in °C.) | | |
|---|---|---|---|---|
| | | Composition of reaction gas (Vol. %) | Reaction atmosphere | |
| | | | Pressure | Temperature |
| 4a | Neclear formation condition | AlCl$_3$: 4%, CrCl$_3$: 0.04%, CO$_2$: 8%, HCl: 1.5%, H$_2$S: 0.2%, H$_2$: Balance | 8 | 750 |
| | Film formation condition | AlCl$_3$: 4%, CrCl$_3$: 0.04%, CO$_2$: 8%, HCl: 1.5%, H$_2$S: 0.2%, H$_2$: Balance | 8 | 1020 |
| 4b | Neclear formation condition | AlCl$_3$: 3.8%, CrCl$_3$: 0.08%, CO$_2$: 8%, HCl: 1.5%, H$_2$S: 0.2%, H$_2$: Balance | 10 | 800 |
| | Film formation condition | AlCl$_3$: 3.8%, CrCl$_3$: 0.08%, CO$_2$: 8%, HCl: 1.5%, H$_2$S: 0.2%, H$_2$: Balance | 10 | 1020 |
| 4c | Neclear formation condition | AlCl$_3$: 3.3%, CrCl$_3$: 0.17%, CO$_2$: 7%, HCl: 2%, H$_2$S: 0.15%, H$_2$: Balance | 7 | 840 |
| | Film formation condition | AlCl$_3$: 3.3%, CrCl$_3$: 0.17%, CO$_2$: 7%, HCl: 2%, H$_2$S: 0.15%, H$_2$: Balance | 7 | 1030 |
| 4d | Neclear formation condition | AlCl$_3$: 3%, CrCl$_3$: 0.23%, CO$_2$: 7%, HCl: 2.5%, H$_2$S: 0.1%, H$_2$: Balance | 7 | 860 |
| | Film formation condition | AlCl$_3$: 2.3%, CrCl$_3$: 0.26%, CO$_2$: 6%, HCl: 3%, H$_2$S: 0.05%, H$_2$: Balance | 7 | 1030 |
| 4e | Neclear formation condition | AlCl$_3$: 4%, CrCl$_3$: 0.04%, CO$_2$: 8%, HCl: 1.5%, H$_2$S: 0.15%, H$_2$: Balance | 6 | 900 |
| | Film formation condition | AlCl$_3$: 4%, CrCl$_3$: 0.04%, CO$_2$: 8%, HCl: 1.5%, H$_2$S: 0.15%, H$_2$: Balance | 6 | 1050 |

TABLE 37

| Type | | Tool substrate symbol | Lower layer of hard coating layer [Ti compound layer] | | | |
|---|---|---|---|---|---|---|
| | | | First layer (μm) | Second layer (μm) | Third layer (μm) | Fourth layer (μm) |
| Coated tool of the present invention | D1 | 4a | TiN (1) | 1-TiCN (17.5) | TiN (1) | TiCNO (0.5) |
| | D2 | 4A | TiCN (1) | 1-TiCN (8.5) | TiCO (0.5) | — |
| | D3 | 4b | TiN (1) | 1-TiCN (4) | TiC (4) | TiCNO (1) |
| | D4 | 4B | TiC (1) | 1-TiCN (9) | — | — |
| | D5 | 4c | TiN (1) | 1-TiCN (4.5) | TiCNO (0.5) | — |
| | D6 | 4C | TiN (0.5) | 1-TiCN (1.5) | TiC (0.5) | TiCNO (0.5) |
| | D7 | 4d | TiN (0.5) | 1-TiCN (10) | TiC (2) | TiCNO (0.3) |
| | D8 | 4D | TiN (1) | TiCN (19) | — | — |
| | D9 | 4e | TiC (0.5) | 1-TiCN (9) | TiCO (0.5) | — |
| | D10 | 4E | TiN (1) | TiCN (1) | TiCN (7) | TiCO (1) |
| | D11 | 4A | TiN (0.3) | 1-TiCN (5) | TiCNO (0.7) | TiCO (0.1) |
| | D12 | 4a | TiN (1) | 1-TiCN (10) | TiCO (0.5) | — |
| | D13 | 4B | TiN (0.5) | 1-TiCN (12) | TiN (0.5) | TiCNO (0.2) |
| | D14 | 4b | TiN (0.6) | 1-TiCN (7) | TiCNO (0.3) | — |
| | D15 | 4C | TiN (0.4) | 1-TiCN (3) | TiCN (0.5) | TiCO (0.1) |

(Numbers in the parentheses of lower layer column indicate target layer thickness)

TABLE 38

| Type | | Tool substrate symbol | Hard coating layer Intermediate layer [Reformed Al$_2$O$_3$ layer] | | | |
|---|---|---|---|---|---|---|
| | | | Formation symbol of intermediate layer | Target layer thickness (μm) | Tilt angle division where (0001) plane shows highest peak (Degree) | Frequency ratio of tilt angle division of 0 to 10 degrees (%) |
| Coated tool of the present invention | D1 | 4a | 4A | D1 | 1.50-1.75 | 60 |
| | D2 | 4A | 4B | D1 | 2.75-3.00 | 52 |
| | D3 | 4b | 4C | D2 | 2.00-2.25 | 65 |
| | D4 | 4B | 4A | D2 | 5.25-5.50 | 70 |
| | D5 | 4c | 4B | D3 | 2.25-2.50 | 83 |
| | D6 | 4C | 4B | D3 | 3.50-3.75 | 97 |
| | C7 | 4d | 4C | D4 | 4.25-4.50 | 84 |
| | D8 | 4D | 4C | D4 | 3.25-3.50 | 86 |
| | D9 | 4e | 4A | D5 | 2.00-2.25 | 89 |
| | D10 | 4E | 4B | D5 | 5.25-5.50 | 82 |
| | D11 | 4A | 4B | D2 | 2.25-2.50 | 72 |
| | D12 | 4a | 4C | D2 | 1.75-2.00 | 83 |
| | D13 | 4B | 4A | D3 | 0.50-0.75 | 92 |
| | D14 | 4b | 4B | D2 | 0.25-0.50 | 88 |
| | D15 | 4C | 4C | D3 | 1.25-1.50 | 85 |

| Type | | Hard coating layer Upper layer [Reformed Cr-containing Al$_2$O$_3$ layer] | | | |
|---|---|---|---|---|---|
| | | Formation symbol of upper layer | Content ratio of Cr [Cr/(Al + Cr)] (Atomic ratio) | Target layer thickness (μm) | Tilt angle division where (0001) plane shows highest peak (Degree) |
| Coated tool of the present invention | D1 | 4A | 0.01 | 5 | 1.25-1.50 |
| | D2 | 4C | 0.05 | 2 | 3.25-3.50 |
| | D3 | 4B | 0.02 | 4 | 2.00-2.25 |
| | D4 | 4A | 0.01 | 15 | 5.50-5.75 |
| | D5 | 4C | 0.05 | 13 | 2.50-2.75 |

TABLE 38-continued

| | | | | |
|---|---|---|---|---|
| D6 | 4B | 0.02 | 10 | 3.75-4.00 |
| C7 | 4D | 0.07 | 7 | 4.75-5.00 |
| D8 | 4E | 0.10 | 6 | 3.25-3.50 |
| D9 | 4C | 0.05 | 14 | 2.00-2.25 |
| D10 | 4D | 0.07 | 3 | 5.50-5.75 |
| D11 | 4C | 0.05 | 4 | 2.25-2.50 |
| D12 | 4E | 0.10 | 5 | 1.50-1.75 |
| D13 | 4D | 0.07 | 6 | 0.50-0.75 |
| D14 | 4B | 0.02 | 3 | 0.00-0.25 |
| D15 | 4C | 0.05 | 4 | 1.25-1.50 |

| | | Hard coating layer Upper layer [Reformed Cr-containing $Al_2O_3$ layer] | | | |
|---|---|---|---|---|---|
| Type | | Frequency ratio of tilt angle division of 0 to 10 degrees (%) | Crystal grain ratio Having $\Sigma 3$ coincidence site lattice interface therein (Area %) | Surface ratio of flat hexagonal crystal grain (Area %) | Surface roughness Ra (μm) |
| Coated tool of the present invention | D1 | 64 | 63 | 14 | * 0.3 |
| | D2 | 60 | 60 | 3 | 0.4 |
| | D3 | 66 | 65 | 21 | 0.5 |
| | D4 | 62 | 64 | 9 | 0.6 |
| | D5 | 73 | 68 | 17 | 0.5 |
| | D6 | 80 | 81 | 19 | 0.4 |
| | C7 | 75 | 72 | 30 | * 0.2 |
| | D8 | 78 | 73 | 23 | 0.4 |
| | D9 | 81 | 76 | 16 | 0.5 |
| | D10 | 79 | 69 | 37 | * 0.1 |
| | D11 | 72 | 68 | 55 | 0.4 |
| | D12 | 76 | 72 | 66 | * 0.2 |
| | D13 | 91 | 84 | 75 | 0.5 |
| | D14 | 82 | 80 | 84 | * 0.3 |
| | D15 | 85 | 85 | 59 | 0.4 |

(Note)
The mark * in the column "Surface roughness" indicates that wet blasting processing was performed.

TABLE 39

| | | | Hard coating layer Intermediate layer | | | |
|---|---|---|---|---|---|---|
| Type | | Tool substrate symbol | Formation symbol of intermediate layer | Target layer thickness (μm) | Tilt angle division where (0001) plane shows highest peak (Degree) | Frequency ratio of tilt angle division of 0 to 10 degrees (%) |
| Comparative coated tool | C1 | 4a | — | — | — | — |
| | C2 | 4A | — | — | — | — |
| | C3 | 4b | — | — | — | — |
| | C4 | 4B | — | — | — | — |
| | C5 | 4c | — | — | — | — |
| | C6 | 4C | — | — | — | — |
| | C7 | 4d | — | — | — | — |
| | C8 | 4D | — | — | — | — |
| | C9 | 4e | — | — | — | — |
| | C10 | 4E | — | — | — | — |
| | C11 | 4A | — | — | — | — |
| | C12 | 4a | — | — | — | — |
| | C13 | 4B | — | — | — | — |
| | C14 | 4b | — | — | — | — |
| | C15 | 4C | — | — | — | — |

| | | Hard coating layer Upper layer [Conventional Cr-containing $Al_2O_3$ layer] | | | |
|---|---|---|---|---|---|
| Type | | Formation symbol of upper layer | Content ratio of Cr [Cr/(Al + Cr)] (Atomic ratio) | Target layer thickness (μm) | Tilt angle division where (0001) plane shows highest peak (Degree) |
| Comparative coated tool | C1 | 4a | 0.01 | 5 | 4.50-4.75 |
| | C2 | 4c | 0.05 | 2 | 3.00-3.25 |
| | C3 | 4b | 0.02 | 4 | 4.75-5.00 |
| | C4 | 4a | 0.01 | 15 | 5.75-6.00 |

TABLE 39-continued

|  |  |  |  |  |
|---|---|---|---|---|
| C5 | 4c | 0.05 | 13 | 2.25-2.50 |
| C6 | 4b | 0.02 | 10 | 5.25-5.50 |
| C7 | 4d | 0.07 | 7 | 6.50-6.75 |
| C8 | 4e | 0.10 | 6 | 8.00-8.25 |
| C9 | 4c | 0.05 | 14 | 1.75-2.00 |
| C10 | 4d | 0.07 | 3 | 7.50-7.75 |
| C11 | 4c | 0.05 | 4 | 0.00-0.25 |
| C12 | 4e | 0.10 | 5 | 9.75-10.00 |
| C13 | 4d | 0.07 | 6 | 8.75-9.00 |
| C14 | 4b | 0.02 | 3 | 6.00-6.25 |
| C15 | 4c | 0.05 | 4 | 0.75-1.00 |

| | | | Hard coating layer Upper layer [Conventional Cr-containing $Al_2O_3$ layer] | | | |
|---|---|---|---|---|---|---|
| Type | | | Frequency ratio of tilt angle division of 0 to 10 degrees (%) | Crystal grain ratio Having $\Sigma 3$ coincidence site lattice interface therein (Area %) | Surface ratio of flat hexagonal crystal grain (Area %) | Surface roughness Ra (μm) |
| Comparative coated tool | | C1 | 75 | 2 | 0 | * 0.3 |
| | | C2 | 60 | 5 | 0 | 0.5 |
| | | C3 | 82 | 8 | 0 | 0.6 |
| | | C4 | 86 | 12 | 0 | 0.9 |
| | | C5 | 56 | 7 | 0 | 0.8 |
| | | C6 | 89 | 16 | 0 | 0.8 |
| | | C7 | 74 | 10 | 5 | * 0.3 |
| | | C8 | 54 | 7 | 0 | 0.7 |
| | | C9 | 58 | 8 | 0 | 0.8 |
| | | C10 | 61 | 13 | 0 | * 0.2 |
| | | C11 | 47 | 3 | 0 | 0.6 |
| | | C12 | 45 | 0 | 0 | * 0.3 |
| | | C13 | 50 | 9 | 0 | 0.6 |
| | | C14 | 85 | 17 | 0 | * 0.2 |
| | | C15 | 49 | 5 | 0 | 0.6 |

(Note)
The mark * in the column "Surface roughness" indicates that wet blasting processing was performed.

TABLE 40

| | | Flank wear width (mm) | | | | Cutting test result (min) | | |
|---|---|---|---|---|---|---|---|---|
| Type | | Cutting condition (A) | Cutting condition (B) | Cutting condition (C) | Type | Cutting condition (A) | Cutting condition (B) | Cutting condition (C) |
| Coated tool of the present invention | D1 | 0.3 | 0.28 | 0.34 | Comparative coated tool | D1 | * 2.6 | * 3.5 | * 2.1 |
| | D2 | 0.26 | 0.24 | 0.29 | | D2 | 3.7 | 3.9 | 3 |
| | D3 | 0.19 | 0.19 | 0.21 | | D3 | 4.2 | 4.4 | 2.6 |
| | D4 | 0.22 | 0.2 | 0.24 | | D4 | * 1.4 | * 2.5 | * 1.1 |
| | D5 | 0.19 | 0.17 | 0.2 | | D5 | * 2.1 | * 3.3 | * 1.7 |
| | D6 | 0.23 | 0.21 | 0.26 | | D6 | 3.9 | 4.2 | * 2.3 |
| | D7 | 0.28 | 0.25 | 0.29 | | D7 | * 2.2 | * 3.4 | * 1.9 |
| | D8 | 0.3 | 0.27 | 0.3 | | D8 | * 1.6 | * 2.7 | * 1.3 |
| | D9 | 0.26 | 0.23 | 0.28 | | D9 | * 1.8 | * 2.9 | * 1.5 |
| | D10 | 0.28 | 0.25 | 0.31 | | D10 | 3.4 | 3.8 | 2.4 |
| | D11 | 0.31 | 0.29 | 0.33 | Reference coated tool | D11 | 3.3 | 3.9 | 2.2 |
| | D12 | 0.29 | 0.27 | 0.32 | | D12 | 3.6 | 4 | 2.1 |
| | D13 | 0.2 | 0.18 | 0.22 | | D13 | 4.5 | 4.8 | 3.1 |
| | D14 | 0.21 | 0.18 | 0.21 | | D14 | 4.2 | 4.5 | 3.0 |
| | D15 | 0.21 | 0.2 | 0.23 | | D15 | 4.3 | 4.6 | 2.8 |

Cutting test results of comparative coated tools and reference coated tools show cutting times (min) until the tools come to the end of their usable lifespan due to chipping or flank wear (usable lifespan determination criterion: Flank wear width of 0.5 mm).
In addition, the mark * in columns indicates a case where tools come to the end of their usable lifespan due to chipping.

From the results shown in Tables 38 to 40, as for the coated tools D1 to D15 of the present invention, the (0001) plane orientation rate of the reformed α-type $Al_2O_3$ layers which are the intermediate layers of the hard coating layers show a high ratio of 45% or more, and have excellent high-temperature strength. In addition, the reformed Cr-containing $Al_2O_3$ layers which constitute the upper layers have the texture of the flat-plate polygonal (flat hexagonal) elongated crystal grains, and the (0001) plane orientation rate show a high ratio of 60% or more, the surface ratios of crystal grains in which at least one or more $\Sigma 3$ coincidence site lattice interfaces are present inside the crystal grains are as high as 60% or more, or post-processing is performed on the Cr-containing $Al_2O_3$ layers and the surface smoothness thereof is further improved. Thereby, the Cr-containing $Al_2O_3$ layers have superior high-temperature strength, and strength within the crystal grains, and have superior surface flatness. As a result, in high-speed heavy cutting work of difficult-to-cut materials, such as stainless steel or ductile cast iron, accompanied by high heat generation, and high load resulting from a high feed rate and a high depth of cut acts on the cutting edge, the hard coating layers exhibit superior chipping resistance, show excellent abrasion resistance for a long-term use, and allows a more prolonged usable lifespan.

On the other hand, it is clear that the comparative coated tools D1 to D15 in which the hard coating layers are composed of the Ti compound layers and the conventional Cr-containing $Al_2O_3$ layers come to the end of their usable lifespan in a relatively short time due to occurrence of chipping, or the like.

Example 5

The following powders, each having a mean particle size within a range of 2 to 4 μm, were prepared as raw materials: WC powder, TiC powder, ZrC powder, VC powder, TaC powder, NbC powder, $Cr_3C_2$ powder, TiN powder, TaN powder, and Co powder. These raw powders were compounded with each other in the compounding compositions shown in Table 1, mixed with each other in an acetone solution having wax added thereto for 24 hours using a ball mill, and were then dried under reduced pressure. Thereafter, the resultant powder mixture was press-formed into a green compact having a predetermined shape at a pressure of 98 MPa. The green compact was then sintered in a vacuum under the following conditions: a pressure of 5 Pa, a predetermined temperature within a range of 1370° C. to 1470° C., and a holding duration of 1 hour. After sintering, cutting edges were subjected to honing (R: 0.07 mm) to manufacture bodies 1A to 1E made of WC-based cemented carbide and having a throwaway tip shape defined in ISO CNMG120408MA.

Additionally, the following powders, each having a mean particle size within a range of 0.5 to 2 μm, were prepared as raw materials for substrates: TiCN (TiC/TiN=50/50 in weight ratio) powder, $Mo_2C$ power, ZrC power, NbC powder, TaC powder, WC power, Co powder and Ni powder. These raw powders were compounded with each other in the compounding compositions shown in Table 2, were wet-mixed with each other for 24 hours using a ball mill, and were dried. Thereafter, the resulting powder mixture was press-formed into a green compact at a pressure of 98 MPa. The green compact was then sintered in a nitrogen atmosphere under the following conditions: a pressure of 1.3 kPa, a temperature of 1540° C., and a holding duration of 1 hour. After sintering, cutting edges were subjected to honing (R: 0.07 mm) to manufacture bodies 1a to 1e made of TiCN-based cermet and having a tip shape defined in ISO Standard CNMG120408MA.

Subsequently, these bodies 1A to 1E and the bodies 1a to 1e were loaded into a normal chemical vapor deposition apparatus.

(a) First, Ti compound layers with target layer thicknesses shown in Table 41 were vapor-deposited as lower layers of hard coating layers under the conditions shown in Table 3 (1-TiCN in Table 3 shows the formation conditions of TiCN layers with a longitudinal growth crystalline structure disclosed in Japanese Unexamined Patent Application Publication No. 6-8010, and the others show the formation conditions of a normal granular crystalline structure).

(b) Subsequently, reformed α-type $Al_2O_3$ layers with target layer thicknesses shown in Table 44 were vapor-deposited as intermediate layers of the hard coating layers under the conditions shown in Table 4.

(c) Next, coated tools E1 to BE5 of the present invention were manufactured, respectively, by vapor-depositing reformed AlBO layers with target layer thicknesses similarly shown in Table 44 as upper layers of hard coating layers according to the vapor deposition conditions shown in Table 42.

For the purpose of comparison, comparative coated tools E1 to E10 (equivalent to the conventional coated tool 6) provided with hard coating layers composed of Ti compound layers and conventional AlBO layers with target layer thicknesses shown in Table 45 were manufactured, respectively, by forming lower layers of hard coating layers under the conditions shown in Table 3 and forming upper layers under the conditions (equivalent to the vapor deposition conditions of the conventional AlBO layers disclosed in PTL 6)) shown in Table 43.

The type of the bodies, the type of the lower layers, and the thickness of the lower layers in the comparative coated tools E1 to E10 are the same as those of the coated tools E1 to E10 of the present invention, respectively.

Moreover, for reference, reference coated tools E11 to E15 (equivalent to the conventional coated tool 1) provided with hard coating layers composed of Ti compound layers and conventional α-type $Al_2O_3$ layers with target layer thicknesses shown in Table 45 were manufactured, respectively, by forming lower layers of hard coating layers under the conditions shown in Table 3 and forming α-type $Al_2O_3$ layers under the conditions (equivalent to the vapor deposition conditions of the conventional α-type $Al_2O_3$ layers disclosed in PTL 1) shown in Table 4.

The type of the bodies, the type of the lower layers, and the thickness of the lower layers in the reference coated tools E11 to E15 are the same as those of the coated tools E11 to E15 of the present invention, respectively.

Post-processing composed of wet blasting processing with projection pressure 0.15 MPa and $Al_2O_3$ grains of 200 meshes was performed on the surfaces of some reformed AlBO layers of the coated tools of the present invention, and the surfaces of some conventional AlBO layers of the comparative coated tools. As the post-processing, polishing processing using an elastic grind stone may be adopted.

Tables 44 and 45 show the values of the surface roughness (Ra (μm)) of the reformed AlBO layers (those marked by * in Table 44) of the coated tools of the present invention which were subjected to post-processing and the conventional AlBO layers (those marked by * in Table 45) of the comparative coated tools. (For reference, the values of Ra regarding the coated tools of the present invention and the comparative coated tools which were not subjected to post-processing are also shown in Tables 44 and 45.)

Subsequently, as for the reformed α-type $Al_2O_3$ layers which constitute the intermediate layers of the hard coating layers of the coated tools E1 to E15 of the present invention, the reformed AlBO layers which constitute the upper layers of the hard coating layers, the conventional AlBO layers of the comparative coated tools E1 to E10, and the α-type $Al_2O_3$ layers of the reference coated tools E11 to E15, tilt angle frequency distribution graphs were plotted, respectively, using the field-emission-type scanning electron microscope.

The tilt angle frequency distribution graphs were plotted by setting the respective layers in the coated tools E1 to E15 of the present invention, the comparative coated tools E1 to E10, and the reference coated tools E11 to E15 within a lens barrel of the field-emission-type scanning electron microscope, with the surfaces of the layers as polished surfaces; individually irradiated crystal grains having a hexagonal crystal lattice present within the measurement range of each polished surface with an electron beam having an acceleration voltage of 15 kV with an irradiating current of 1 nA at an angle of incidence of 70 degrees with respect to each polished surface, thereby measuring the tilt angle of the normal line to the (0001) plane, which is a crystal plane of each crystal grain, to the normal line to each polished surface, at intervals of 0.1 μm/step for a region 30×50 μm, using the electronic backscattering diffraction image apparatus; and on the basis of these measurement results, dividing the measured tilt angles which are within a range of 0 to 45 degrees among the measured tilt angles at every pitch of 0.25 degrees, and summing the frequencies present within the respective divisions.

The "surface" in this invention includes not only a face parallel to the surface of a base, but also a face which inclines to the surface of the base, for example, the cutting face of a layer.

As a result, in the obtained tilt angle frequency distribution graphs of the reformed α-type $Al_2O_3$ layers and reformed AlBO layers of the coated tools of the present invention, the conventional AlBO layers of the comparative coated tools E1 to E10, and the conventional α-type $Al_2O_3$ layers of the reference coated tools B11 to B15, as shown in Tables 44 and 45, respectively, the distributions of the measured tilt angles of the (0001) plane in the reformed α-type $Al_2O_3$ layers and reformed AlBO layers of the coated tools of the present invention show a tilt angle frequency distribution graph in which the highest peak appears in the tilt angle division within a range of 0 to 10 degrees, respectively. On the other hand, the distribution of the measured tilt angles of the (0001) plane in the conventional AlBO layers of the comparative coated tools E1 to E10 shows a tilt angle frequency distribution graph in which the highest peak does not present in an unbiased manner within a range of 0 to 45 degrees.

Tables 44 and 45 show the ratios of the frequencies present in the tilt angle division within a range of 0 to 10 degrees, which are accounted for in the overall tilt angle frequency distribution graph.

Subsequently, as for the reformed AlBO layers which constitute the upper layers of the coated tools E1 to E15 of the present invention, and the conventional AlBO layers of the comparative coated tools E1 to E10, the crystal grain structure and the constituent atom sharing lattice point configuration were inspected using the field-emission-type scanning electron microscope and the electronic backscattering diffraction image apparatus. First, when the reformed AlBO layers of the coated tools E1 to E15 of the present invention and the conventional AlBO layers of the comparative coated tools E1 to E10 were observed using the field-emission-type scanning electron microscope, the flat-plate polygonal (including flat hexagonal) and elongated crystal grain structure of a large grain size were observed in the coated tools E1 to E15 of the present invention. On the other hand, a polygonal and elongated crystal grain structure was observed in the comparative coated tools E1 to E10. However, the grain size of each crystal grain was small as compared to that of the present invention, and pyramidal irregularities were formed in the layer surface.

Subsequently, as for the reformed AlBO layers of the coated tools E1 to E15 of the present invention, and the conventional AlBO layers of the comparative coated tools E1 to E10, the area ratios of crystal grains in which the Σ3 coincidence site lattice interfaces are present inside the crystal grains which constitute each layer were measured.

First, as for the reformed AlBO layers of the coated tools E1 to E15 of the present invention, when the respective layers are within a lens barrel of the field-emission-type scanning electron microscope, with the surfaces of the layers as polished surfaces; crystal grains having a hexagonal crystal lattice present within the measurement range of each polished surface are individually irradiated with an electron beam having an acceleration voltage of 15 kV with an irradiating current of 1 nA at an angle of incidence of 70 degrees with respect to each polished surface, thereby measuring the angle at which the normal line to each of crystal lattice planes of the crystal grains crosses the normal line to each base surface, at intervals of 0.1 μm/step for a region 30×50 μm, using the electronic backscattering diffraction image apparatus; and from these measurement results, the crystal orientation relationship between adjacent crystal lattices is calculated, and the distribution of lattice points (constituent atom sharing lattice points) where respective constituent atoms which constitute a crystal lattice interface sharing one constituent atom between the crystal lattices is calculated; and a constituent atom sharing lattice point configuration in which N (here, N is any even number equal to or greater than 2 in a crystal structure of a corundum-type hexagonal close-packing crystal, but when the upper limit of N is 28 from the viewpoint of a distribution frequency, even numbers 4, 8, 14, 24, and 26 do not exist) lattice points which do not share any constituent atoms between the constituent atom sharing lattice points are present is expressed by ΣN+1, the area ratios of crystal grain in which at least one or more Σ3 coincidence site lattice interfaces are present inside the crystal grains among all the crystal grains present within the measurement range of the reformed AlBO layers were obtained, and the values of the area ratios were shown in Table 44 as Σ3 coincidence site lattice interface ratio (%).

Next, even as for the conventional AlBO layers of the comparative coated tools E1 to E10, by the same method as the case of the coated tools of the present inventions, the area ratios of crystal grains in which at least one or more Σ3 coincidence site lattice interfaces are present inside the crystal grains among all the crystal grains present within the measurement range of the conventional reformed AlBO layers were obtained, and the values of the area ratios were shown in Table 45 as Σ3 coincidence site lattice interface ratio (%).

As shown in Tables 44 and 45, in the reformed AlBO layers of the coated tools E1 to E15 of the present invention, the area ratios of crystal grains in which at least one or more Σ3 coincidence site lattice interfaces are present inside the crystal grains are 60% or more. On the other hand, in the conventional AlBO layers of the comparative coated tools E1 to E10, the area ratios of crystal grains in which at least one or more Σ3 coincidence site lattice interfaces are present inside the crystal grains are 40% or less. It can be understood from this that the rate at which the Σ3 coincidence site lattice interfaces are present inside crystal grains is very small.

Subsequently, as for the reformed AlBO layers of the coated tools E1 to E15 of the present invention, and the conventional AlBO layers of the comparative coated tools E1 to E10, the area ratios of flat hexagonal crystal grains of a large grain size present within the plane perpendicular to the layer thickness direction were obtained using the field-emission-type scanning electron microscope. These values are shown in Tables 44 and 45.

Here, the "flat hexagonal crystal grains of a large grain size" means polygonal crystal grains in which the mean value of ten grains is 3 to 8 μm when the diameter of grains present within the plane perpendicular to the layer thickness direction observed by the field-emission-type scanning electron microscope is measured, and six vertex angles whose angle of vertex is 100 to 140° are provided.

Subsequently, although the thicknesses of the respective constituent layers in the hard coating layers of the coated tools E1 to E15 of the present invention, the comparative coated tools E1 to E10, and the reference coated tools E11 to E15 were measured using the scanning electron microscope (longitudinal-section measurement), substantially the same mean layer thicknesses (mean value of five-point measurements) as the target layer thicknesses were shown in all cases.

Next, all the coated tools E1 to E15 of the present invention, the comparative coated tools E1 to E10, and the reference coated tools E11 to E15 were screw-fixed to a tip portion of a bite made of tool steel by a fixing jig, and in this state, were subjected to a dry high-speed intermittent cutting test (normal cutting speed is 200 m/min) on bearing steel under the following conditions (referred to as cutting condition A):

Workpiece: a round bar of JIS-SUJ2 (HRC62) with four longitudinal grooves equally-spaced in the length direction,
Cutting speed: 250 m/min,
Depth of cut: 1.5 mm,
Feed rate: 0.15 mm/rev, and
Cutting time: 5 minutes,
a dry high-speed intermittent cutting test (normal cutting speed is 200 m/min) on alloy tool steel under the following conditions (referred to as cutting condition B):

Workpiece: a round bar of JIS-SKD11 (HRC58) with four longitudinal grooves equally-spaced in the length direction,
Cutting speed: 300 m/min,
Depth of cut: 1.5 mm,
Feed rate: 0.15 mm/rev, and
Cutting time: 5 minutes, and
a dry high-speed intermittent cutting test (normal cutting speed is 150 m/min) on carbon tool steel under the following conditions (reference to as cutting condition C):

Workpiece: a round bar of JIS-SK3 (HRC61) with four longitudinal grooves equally-spaced in the length direction,
Cutting speed: 250 m/min,
Depth of cut: 1.5 mm,
Feed rate: 0.15 mm/rev, and
Cutting time: 5 minutes, and the flank wear widths of the cutting edges were measured in all the cutting tests. These test results are shown in Table 46.

TABLE 41

| Type | | Tool substrate symbol | Lower layer of hard coating layer[Ti compound layer] | | | |
|---|---|---|---|---|---|---|
| | | | First layer (μm) | Second layer (μm) | Third layer (μm) | Fourth layer (μm) |
| Coated tool of the present invention | E1 | 1a | TiN (1) | 1-TiCN (17.5) | TiN (1) | TiCNO (0.5) |
| | E2 | 1A | TiCN (1) | 1-TiCN (8.5) | TiCO (0.5) | — |
| | E3 | 1b | TiN (1) | 1-TiCN (4) | TiC (4) | TiCNO (1) |
| | E4 | 1B | TiC (1) | 1-TiCN (9) | — | — |
| | E5 | 1c | TiN (1) | 1-TiCN (4.5) | TiCNO (0.5) | — |
| | E6 | 1C | TiN (0.5) | 1-TiCN (1.5) | TiC (0.5) | TiCNO (0.5) |
| | E7 | 1d | TiN (0.5) | 1-TiCN (10) | TiC (2) | TiCNO (0.3) |
| | E8 | 1D | TiN (1) | TiCN (19) | — | — |
| | E9 | 1e | TiC (0.5) | 1-TiCN (9) | TiCO (0.5) | — |
| | E10 | 1E | TiN (1) | TiC (1) | TiCN (7) | TiCO (1) |
| | E11 | 1A | TiN (0.3) | 1-TiCN (5) | TiCNO (0.7) | TiCO (0.1) |
| | E12 | 1a | TiN (1) | 1-TiCN (10) | TiCO (0.5) | — |
| | E13 | 1B | TiN (0.5) | 1-TiCN (12) | TiN (0.5) | TiCNO (0.2) |
| | E14 | 1b | TiN (0.6) | 1-TiCN (7) | TiCNO (0.3) | — |
| | E15 | 1C | TiN (0.4) | 1-TiCN (3) | TiCN (0.5) | TiCO (0.1) |

(Numbers in the parentheses of lower layer column indicate target layer thickness)

TABLE 42

| B-containing α-type Al₂O₃ layer | | Formation condition (Reaction atmosphere pressure given in kPa and temperature given in ° C.) | | |
|---|---|---|---|---|
| | | | Reaction atmosphere | |
| Formation symbol | | Composition of reaction gas (Vol. %) | Pressure | Temperature |
| 5A | First step | AlCl₃: 1%, BCl₃: 0%, HCl: 1%, CO₂: 2%, H₂S: 0.25%, H₂: Balance | 6 | 960 |
| | Second step | AlCl₃: 6%, BCl₃: 0.2%, HCl: 3%, CO₂: 5%, H₂S: 0.4%, H₂: Balance | 6 | 1000 |
| 5B | First step | AlCl₃: 2%, BCl₃: 0.01%, HCl: 2%, CO₂: 4%, H₂S: 0.3%, H₂: Balance | 7 | 980 |
| | Second step | AlCl₃: 7%, BCl₃: 0.08%, HCl: 4%, CO₂: 6%, H₂S: 0.3%, H₂: Balance | 7 | 990 |
| 5C | First step | AlCl₃: 3%, BCl₃: 0.005%, HCl: 3%, CO₂: 5%, H₂S: 0.4%, H₂: Balance | 10 | 1000 |
| | Second step | AlCl₃: 8%, BCl₃: 0.07%, HCl: 4%, CO₂: 6%, H₂S: 0.25%, H₂: Balance | 10 | 970 |

TABLE 42-continued

| B-containing α-type Al$_2$O$_3$ layer Formation symbol | Formation condition (Reaction atmosphere pressure given in kPa and temperature given in °C.) Composition of reaction gas (Vol. %) | Reaction atmosphere Pressure | Temperature |
|---|---|---|---|
| 5D First step | AlCl$_3$: 5%, BCl$_3$: 0%, HCl: 5%, CO$_2$: 5%, H$_2$S: 0.4%, H$_2$: Balance | 8 | 1010 |
| Second step | AlCl$_3$: 10%, BCl$_3$: 0.02%, HCl: 3%, CO$_2$: 8%, H$_2$S: 0.6%, H$_2$: Balance | 8 | 1010 |
| 5E First step | AlCl$_3$: 2%, BCl$_3$: 0.005%, HCl: 4%, CO$_2$: 5%, H$_2$S: 0.6%, H$_2$: Balance | 7 | 1000 |
| Second step | AlCl$_3$: 6%, BCl$_3$: 0.1%, HCl: 5%, CO$_2$: 4%, H$_2$S: 0.25%, H$_2$: Balance | 7 | 960 |
| 5F First step | AlCl$_3$: 3%, BCl$_3$: 0.01%, HCl: 4%, CO$_2$: 6%, H$_2$S: 0.75%, H$_2$: Balance | 6 | 1010 |
| Second step | AlCl$_3$: 8%, BCl$_3$: 0.2%, HCl: 4%, CO$_2$: 8%, H$_2$S: 0.3%, H$_2$: Balance | 6 | 980 |

TABLE 43

| Conventional B-containing Al$_2$O$_3$ layer Formation Number | Formation condition (Reaction atmosphere pressure given in kPa and temperature given in °C.) Composition of reaction gas (Vol. %) | Reaction atmosphere Pressure | Temperature |
|---|---|---|---|
| 5a | AlCl$_3$: 1.6%, CO$_2$: 4%, BCl$_3$: 0.15%, Ar: 23%, N$_2$: 58% H$_2$: Balance | 101.3 kPa | 1060 |
| 5b | AlCl$_3$: 1.6%, CO$_2$: 4%, BCl$_3$: 0.15%, Ar: 81%, H$_2$: Balance | 101.3 kPa | 1060 |
| 5c | AlCl$_3$: 1.6%, CO$_2$: 4%, BCl$_3$: 0.6%, Ar: 81%, H$_2$: Balance | 101.3 kPa | 1060 |
| 5d | AlCl$_3$: 1.6%, CO$_2$: 4%, BCl$_3$: 0.07%, Ar: 81%, H$_2$: Balance | 101.3 kPa | 1060 |
| 5e | AlCl$_3$: 3.2%, CO$_2$: 4%, HCl; 4%, BCl$_3$: 0.3% CO: 16%, H$_2$: Balance | 4 kPa | 1020 |

TABLE 44

| | | | Hard coating layer | | |
|---|---|---|---|---|---|
| | | | Intermediate layer [α-type Al$_2$O$_3$ layer] | | Upper layer [B-containing α-type Al$_2$O$_3$ layer] Frequency ratio |
| Type | Tool substrate symbol | Formation symbol of intermediate layer | Target layer thickness (μm) | Tilt angle division where (0001) plane shows highest peak (Degree) | of tilt angle division of 0 to 10 degrees (%) |
| Coated tool of the present invention | E1 | 1a | 1A | 1 | 1.50-1.75 | 45 |
| | E2 | 1A | 1B | 1 | 0.00-0.25 | 78 |
| | E3 | 1b | 1C | 2 | 0.50-0.75 | 84 |
| | E4 | 1B | 1A | 2 | 0.25-0.50 | 75 |
| | E5 | 1c | 1B | 3 | 4.50-4.75 | 91 |
| | E6 | 1C | 1B | 3 | 1.25-1.50 | 73 |
| | E7 | 1d | 1C | 4 | 3.00-3.25 | 71 |
| | E8 | 1D | 1C | 4 | 9.75-10.00 | 63 |
| | E9 | 1e | 1A | 5 | 5.50-5.75 | 75 |
| | E10 | 1E | 1B | 5 | 2.50-2.75 | 84 |
| | E11 | 1A | 1B | 2 | 0.50-0.75 | 81 |
| | E12 | 1a | 1C | 2 | 0.75-1.00 | 95 |
| | E13 | 1B | 1A | 3 | 1.75-2.00 | 94 |
| | E14 | 1b | 1B | 2 | 2.50-2.75 | 69 |
| | E15 | 1C | 1C | 3 | 6.50-6.75 | 82 |

| | | Hard coating layer Upper layer [B-containing α-type Al$_2$O$_3$ layer] | | |
|---|---|---|---|---|
| Type | | Formation symbol of upper layer | Content ratio of B [B/(Al + B)] (Atomic ratio) | Target layer thickness (μm) | Tilt angle division where (0001) plane shows highest peak (Degree) |
| Coated tool of the present invention | E1 | 5A | 0.01 | 2 | 1.50-1.75 |
| | E2 | 5A | 0.01 | 4 | 0.00-0.25 |
| | E3 | 5B | 0.007 | 8 | 0.50-0.75 |
| | E4 | 5B | 0.007 | 4 | 0.25-0.50 |
| | E5 | 5C | 0.004 | 7 | 4.50-4.75 |
| | E6 | 5C | 0.004 | 13 | 1.25-1.50 |
| | E7 | 5D | 0.001 | 3 | 3.00-3.25 |
| | E8 | 5D | 0.001 | 4 | 9.75-10.00 |

TABLE 44-continued

| | | | | | |
|---|---|---|---|---|---|
| | E9 | 5A | 0.01 | 9 | 5.50-5.75 |
| | E10 | 5A | 0.01 | 15 | 2.50-2.75 |
| | E11 | 5E | 0.008 | 6 | 0.50-0.75 |
| | E12 | 5E | 0.008 | 9 | 0.75-1.00 |
| | E13 | 5F | 0.006 | 3 | 1.75-2.00 |
| | E14 | 5F | 0.006 | 8 | 2.50-2.75 |
| | E15 | 5E | 0.008 | 5 | 6.50-6.75 |

| | | Hard coating layer Upper layer [B-containing α-type $Al_2O_3$ layer] | | | |
|---|---|---|---|---|---|
| Type | | Frequency ratio of tilt angle division of 0 to 10 degrees (%) | Crystal grain ratio Having Σ3 coincidence site lattice interface therein (Area %) | Surface ratio of flat hexagonal crystal grain (Area %) | Surface roughness Ra (μm) |
| Coated tool of the present invention | E1 | 60 | 60 | 7 | 0.1* |
| | E2 | 84 | 66 | 12 | 0.4 |
| | E3 | 90 | 82 | 27 | 0.5 |
| | E4 | 80 | 75 | 17 | 0.2* |
| | E5 | 91 | 84 | 15 | 0.5 |
| | E6 | 79 | 74 | 21 | 0.3* |
| | E7 | 77 | 72 | 22 | 0.4 |
| | E8 | 68 | 64 | 13 | 0.4 |
| | E9 | 88 | 89 | 34 | 0.6 |
| | E10 | 93 | 94 | 33 | 0.7 |
| | E11 | 89 | 91 | 77 | 0.5 |
| | E12 | 97 | 96 | 85 | 0.5 |
| | E13 | 99 | 97 | 96 | 0.4 |
| | E14 | 71 | 82 | 35 | 0.4 |
| | E15 | 88 | 92 | 69 | 0.2* |

TABLE 45

| | | Hard coating layer Intermediate layer [α-type $Al_2O_3$ layer] | | | |
|---|---|---|---|---|---|
| Type | | Formation symbol of intermediate layer | Target layer thickness (μm) | Tilt angle division where (0001) plane shows highest peak (Degree) | Frequency ratio of tilt angle division of 0 to 10 degrees (%) |
| Comparative coated tool | E1 | — | — | — | — |
| | E2 | — | — | — | — |
| | E3 | — | — | — | — |
| | E4 | — | — | — | — |
| | E5 | — | — | — | — |
| | E6 | — | — | — | — |
| | E7 | — | — | — | — |
| | E8 | — | — | — | — |
| | E9 | — | — | — | — |
| | E10 | — | — | — | — |
| Reference coated tool | E11 | 1A | 2 | 1.50-1.75 | 55 |
| | E12 | 1B | 7 | 2.00-2.25 | 63 |
| | E13 | 1C | 10 | 3.00-3.25 | 48 |
| | E14 | 1A | 8 | 1.25-1.50 | 65 |
| | E15 | 1B | 5 | 1.75-2.00 | 71 |

| | | Hard coating layer Upper layer [B-containing α-type $Al_2O_3$ layer] | | | |
|---|---|---|---|---|---|
| Type | | Formation symbol of upper layer | Content ratio of B [B/(B + Zr)] (atomic ratio) | Target layer thickness (μm) | Tilt angle division where (0001) plane shows highest peak (Degree) |
| Comparative coated tool | E1 | 5a | 0.1 | 12 | 15.50-15.75 |
| | E2 | 5b | 0.1 | 8 | 19.75-20.00 |
| | E3 | 5c | 0.1 | 10 | 35.00-35.25 |
| | E4 | 5d | 0.4 | 17 | 27.50-27.75 |
| | E5 | 5e | 0.05 | 7 | 17.00-17.25 |
| | E6 | 5a | 0.1 | 3 | 22.50-22.75 |
| | E7 | 5b | 0.1 | 5 | 23.75-24.00 |
| | E8 | 5c | 0.1 | 9 | 32.25-35.50 |

TABLE 45-continued

|  | Type |  |  |  |  |
|---|---|---|---|---|---|
|  | E9 | 5d | 0.4 | 11 | 34.50-34.75 |
|  | E10 | 5e | 0.05 | 20 | 35.50-35.75 |
| Reference coated tool | E11 | — | — | — | — |
|  | E12 | — | — | — | — |
|  | E13 | — | — | — | — |
|  | E14 | — | — | — | — |
|  | E15 | — | — | — | — |

| | Type | Hard coating layer Upper layer [B-containing α-type $Al_2O_3$ layer] | | | |
|---|---|---|---|---|---|
| | | Frequency ratio of tilt angle division of 0 to 10 degrees (%) | Crystal grain ratio Having Σ3 coincidence site lattice interface therein (Area %) | Surface ratio of flat hexagonal crystal grain (Area %) | Surface roughness Ra (μm) |
| Comparative coated tool | E1 | 14 | 10 | 0 | 0.5 |
| | E2 | 10 | 5 | 0 | 0.3* |
| | E3 | 6 | 3 | 0 | 0.5 |
| | E4 | 16 | 11 | 0 | 0.8 |
| | E5 | 4 | 15 | 0 | 0.9 |
| | E6 | 12 | 14 | 0 | 0.8 |
| | E7 | 8 | 12 | 5 | 0.1* |
| | E8 | 4 | 8 | 0 | 0.6 |
| | E9 | 3 | 1 | 0 | 0.05* |
| | E10 | 9 | 0 | 0 | 0.9 |
| Reference coated tool | E11 | — | — | — | — |
| | E12 | — | — | — | — |
| | E13 | — | — | — | — |
| | E14 | — | — | — | — |
| | E15 | — | — | — | — |

TABLE 46

| | Type | Flank wear width (mm) | | | | Type | Cutting test result (min) | | |
|---|---|---|---|---|---|---|---|---|---|
| | | Cutting condition (A) | Cutting condition (B) | Cutting condition (C) | | | Cutting condition (A) | Cutting condition (B) | Cutting condition (C) |
| Coated tool of the present invention | E1 | 3.3 | 3.3 | 3.4 | Comparative coated tool | E1 | 1.1 * | 1.3 | 12 * |
| | E2 | 1.4 | 1.6 | 1.5 | | E2 | 2.4 | 2.5 | 2.4 |
| | E3 | 1.3 | 1.3 | 1.2 | | E3 | 1.3 * | 1.1 * | 1.5 |
| | E4 | 1.3 | 1.2 | 1.1 | | E4 | 2.8 | 2.7 | 1.5 * |
| | E5 | 2.3 | 2.2 | 2.1 | | E5 | 2.5 | 1.4 * | 2.3 |
| | E6 | 2.4 | 2.5 | 2.4 | | E6 | 0.8 * | 1.1 * | 0.9 * |
| | E7 | 1.7 | 1.5 | 1.4 | | E7 | 1.6 * | 3.1 | 3.2 |
| | E8 | 2.0 | 1.8 | 1.8 | | E8 | 2.8 | 1.6 * | 2.1 * |
| | E9 | 2.3 | 2.2 | 2.4 | | E9 | 1.2 * | 1.3 * | 1.1 * |
| | E10 | 2.3 | 2.2 | 2.6 | | E10 | 0.6 * | 0.7 * | 0.8 * |
| | E11 | 1.2 | 1.3 | 1.0 | Reference coated tool | E11 | 3.1 | 3.2 | 2.9 |
| | E12 | 2.0 | 1.7 | 1.8 | | E12 | 1.4 * | 2.4 | 2.0 * |
| | E13 | 1.1 | 1.0 | 0.9 | | E13 | 3.0 | 3.1 | 2.7 |
| | E14 | 1.8 | 1.7 | 1.7 | | E14 | 1.5 * | 2.5 | 1.7 * |
| | E15 | 1.2 | 1.1 | 1.1 | | E15 | 2.2 * | 3.1 | 2.9 |

Cutting test results of comparative coated tools and reference coated tools show cutting times (min) until the tools come to the end of their usable lifespan due to chipping or flank wear (usable lifespan determination criterion: Flank wear width of 0.5 mm).
In addition, the mark * in columns indicates a case where tools come to the end of their usable lifespan due to chipping.

From the results shown in Tables 44 to 46, as for the coated tools E1 to E15 of the present invention, the (0001) plane orientation rate of the reformed α-type $Al_2O_3$ layers which are the intermediate layers of the hard coating layers show a high ratio of 45% or more, and have excellent high-temperature strength. In addition, the reformed AlBO layers which constitute the upper layers have the texture of the flat-plate polygonal (flat hexagonal) elongated crystal grains, and the (0001) plane orientation rate show a high ratio of 60% or more, the surface ratios of crystal grains in which at least one or more Σ3 coincidence site lattice interfaces are present inside the crystal grains are as high as 60% or more, or post-processing is performed on the reformed AlBO layers and the surface smoothness thereof is further improved. Thereby, the reformed AlBO layers have superior high-temperature strength, and strength within the crystal grains, and have superior surface flatness. As a result, in high-speed intermittent cutting work of high-hardness steel, such as quenching materials for alloy tool steel or bearing steel, accompanied by high heat generation, and intermittent impact loading acts on the cutting edge, the hard coating layers exhibit superior chipping resistance, show excellent cutting performance for a long-term use, and allows a more prolonged usable lifespan.

On the other hand, it is clear that the comparative coated tools E1 to E10 in which the hard coating layers are composed of the AlBO layer and the conventional Ti compound layers and the reference coated tools E11 to E15 in which the hard coating layers are composed of the Ti compound layers and the conventional α-type Al₂O₃ layers, come to the end of their usable lifespan in a relatively short time due to occurrence of chipping, promotion of abrasion, or the like.

As described above, even in high-speed intermittent cutting work of high harness steel accompanied by high heat generation, and intermittent and impacting high load acts repeatedly on the cutting edge as well as in cutting work of various kinds of steel or cast iron, or the like under normal conditions, the coated tools of this invention exhibit excellent chipping resistance without occurrence of chipping, and show excellent cutting performance for a prolonged period of time. Therefore, it is possible to satisfactorily cope with the demands for high performance of a cutting device, for labor saving and energy saving in cutting work, and cost reduction.

Example 6

The following powders, each having a mean particle size within a range of 2 to 4 μm, were prepared as raw materials: WC powder, TiC powder, ZrC powder, VC powder, TaC powder, NbC powder, Cr₃C₂ powder, TiN powder, TaN powder, and Co powder. These raw powders were compounded with each other in the compounding compositions shown in Table 1, mixed with each other in an acetone solution having wax added thereto for 24 hours using a ball mill, and were then dried under reduced pressure. Thereafter, the resultant powder mixture was press-formed into a green compact having a predetermined shape at a pressure of 98 MPa. The green compact was then sintered in a vacuum under the following conditions: a pressure of 5 Pa, a predetermined temperature within a range of 1370° C. to 1470° C., and a holding duration of 1 hour. After sintering, cutting edges were subjected to honing (R: 0.07 mm) to manufacture bodies 1A to 1E made of WC-based cemented carbide and having a throwaway tip shape defined in ISO CNMG120408MA.

Additionally, the following powders, each having a mean particle size within a range of 0.5 to 2 min, were prepared as raw materials for substrates: TiCN (TiC/TiN-50/50 in weight ratio) powder, Mo₂C power, ZrC power, NbC powder, TaC powder, WC power, Co powder and Ni powder. These raw powders were compounded with each other in the compounding compositions shown in Table 2, were wet-mixed with each other for 24 hours using a ball mill, and were dried. Thereafter, the resulting powder mixture was press-formed into a green compact at a pressure of 98 MPa. The green compact was then sintered in a nitrogen atmosphere under the following conditions: a pressure of 1.3 kPa, a temperature of 1540° C., and a holding duration of 1 hour. After sintering, cutting edges were subjected to honing (R: 0.07 mm) to manufacture bodies 1a to 1e made of TiCN-based cermet and having a tip shape defined in ISO Standard CNMG120408MA. Subsequently, these bodies 1A to 1E and the bodies 1a to 1e were loaded into a normal chemical vapor deposition apparatus. (a) First, Ti compound layers with target layer thicknesses shown in Table 47 were vapor-deposited as lower layers of hard coating layers under the conditions shown in Table 3 (1-TiCN in Table 3 shows the formation conditions of TiCN layers with a longitudinal growth crystalline structure disclosed in Japanese Unexamined Patent Application Publication No. 6-8010, and the others show the formation conditions of a normal granular crystalline structure). (b) Subsequently, reformed α-type Al₂O₃ layers with target layer thicknesses shown in Table 50 were vapor-deposited as intermediate layers of the hard coating layers under the conditions shown in Table 4.

(c) Next, coated tools F1 to F15 of the present invention were manufactured, respectively, by vapor-depositing reformed AlTiZrO layers with target layer thicknesses similarly shown in Table 50 as upper layers of hard coating layers according to the vapor deposition conditions shown in Table 48.

For the purpose of comparison, comparative coated tools F1 to F10 (equivalent to the conventional coated tool 7) provided with hard coating layers composed of Ti compound layers and conventional AlTiZrO layers with target layer thicknesses shown in Table 51 were manufactured, respectively, by forming lower layers of hard coating layers under the conditions shown in Table 3 and forming upper layers under the conditions (equivalent to the vapor deposition conditions of the conventional AlTiZrO layers disclosed in PTL 7)) shown in Table 49.

The type of the bodies, the type of the lower layers, and the thickness of the lower layers in the comparative coated tools F1 to F10 are the same as those of the coated tools F1 to F10 of the present invention, respectively.

Moreover, for reference, reference coated tools F11 to F15 (equivalent to the conventional coated tool 1) provided with hard coating layers composed of Ti compound layers and conventional α-type Al₂O₃ layers with target layer thicknesses shown in Table 51 were manufactured, respectively, by forming lower layers of hard coating layers under the conditions shown in Table 3 and forming α-type Al₂O₃ layers under the conditions (equivalent to the vapor deposition conditions of the conventional α-type Al₂O₃ layers disclosed in PTL 1) shown in Table 4.

The type of the bodies, the type of the lower layers, and the thickness of the lower layers in the reference coated tools F11 to F15 are the same as those of the coated tools F11 to F15 of the present invention, respectively.

Post-processing composed of wet blasting processing with projection pressure 0.15 MPa and Al₂O₃ grains of 200 meshes was performed on the surfaces of some reformed AlTiZrO layers of the coated tools of the present invention, and the surfaces of some conventional AlTiZrO layers of the comparative coated tools. As the post-processing, polishing processing using an elastic grind stone may be adopted.

Tables 50 and 51 show the values of the surface roughness (Ra (μm)) of the reformed AlTiZrO layers (those marked by * in Table 50) of the coated tools of the present invention which were subjected to post-processing and the conventional AlTiZrO layers (those marked by * in Table 51) of the comparative coated tools. (For reference, the values of Ra regarding the coated tools of the present invention and the comparative coated tools which were not subjected to post-processing are also shown in Tables 50 and 51.)

Subsequently, as for the reformed α-type Al₂O₃ layers which constitute the intermediate layers of the hard coating layers of the coated tools F1 to F15 of the present invention, the reformed AlTiZrO layers which constitute the upper layers of the hard coating layers, the conventional AlTiZrO layers of the comparative coated tools F1 to F10, and the α-type Al₂O₃ layers of the reference coated tools F11 to F15, tilt angle frequency distribution graphs were plotted, respectively, using the field-emission-type scanning electron microscope.

The tilt angle frequency distribution graphs were plotted by setting the respective layers in the coated tools F1 to F15 of the present invention, the comparative coated tools F1 to F10, and the reference coated tools F11 to F15 within a lens barrel of the field-emission-type scanning electron microscope, with the surfaces of the layers as polished surfaces; individually irradiated crystal grains having a hexagonal crystal lattice present within the measurement range of each polished surface with an electron beam having an acceleration voltage of 15 kV with an irradiating current of 1 nA at an angle of incidence of 70 degrees with respect to each polished surface, thereby measuring the tilt angle of the normal line to the (0001) plane, which is a crystal plane of each crystal grain, to the normal line to each polished surface, at intervals of 0.1 μm/step for a region 30×50 μm, using the electronic backscattering diffraction image apparatus; and on the basis of these measurement results, dividing the measured tilt angles which are within a range of 0 to 45 degrees among the measured tilt angles at every pitch of 0.25 degrees, and summing the frequencies present within the respective divisions.

The "surface" in this invention includes not only a face parallel to the surface of a base, but also a face which inclines to the surface of the base, for example, the cutting face of a layer.

As a result, in the obtained tilt angle frequency distribution graphs of the reformed α-type $Al_2O_3$ layers and reformed AlTiZrO layers of the coated tools of the present invention, the conventional AlTiZrO layers of the comparative coated tools F1 to F10, and the conventional α-type $Al_2O_3$ layers of the reference coated tools F11 to F15, as shown in Tables 50 and 51, respectively, the distributions of the measured tilt angles of the (0001) plane in the reformed α-type $Al_2O_3$ layers and reformed AlTiZrO layers of the coated tools of the present invention show a tilt angle frequency distribution graph in which the highest peak appears in the tilt angle division within a range of 0 to 10 degrees, respectively. On the other hand, the distribution of the measured tilt angles of the (0001) plane in the conventional AlTiZrO layers of the comparative coated tools F1 to F10 shows a tilt angle frequency distribution graph in which the highest peak does not present in an unbiased manner within a range of 0 to 45 degrees.

Tables 50 and 51 show the ratios of the frequencies present in the tilt angle division within a range of 0 to 10 degrees, which are accounted for in the overall tilt angle frequency distribution graph.

Subsequently, as for the reformed AlTiZrO layers which constitute the upper layers of the coated tools F1 to F15 of the present invention, and the conventional AlTiZrO layers of the comparative coated tools F1 to F10, the crystal grain structure and the constituent atom sharing lattice point configuration were inspected using the field-emission-type scanning electron microscope and the electronic backscattering diffraction image apparatus. First, when the reformed AlTiZrO layers of the coated tools F1 to F15 of the present invention and the conventional AlTiZrO layers of the comparative coated tools F1 to F10 were observed using the field-emission-type scanning electron microscope, the flat-plate polygonal (including flat hexagonal) and elongated crystal grain structure of a large grain size were observed in the coated tools F1 to F15 of the present invention. On the other hand, a polygonal and elongated crystal grain structure was observed in the comparative coated tools F1 to F10. However, the grain size of each crystal grain was small as compared to that of the present invention, and pyramidal irregularities were formed in the layer surface.

Subsequently, as for the reformed AlTiZrO layers of the coated tools F1 to F15 of the present invention, and the conventional AlTiZrO layers of the comparative coated tools F1 to F10, the area ratios of crystal grains in which the Σ3 coincidence site lattice interfaces are present inside the crystal grains which constitute each layer were measured.

First, as for the reformed AlTiZrO layers of the coated tools F1 to F15 of the present invention, when the respective layers are within a lens barrel of the field-emission-type scanning electron microscope, with the surfaces of the layers as polished surfaces; crystal grains having a hexagonal crystal lattice present within the measurement range of each polished surface are individually irradiated with an electron beam having an acceleration voltage of 15 kV with an irradiating current of 1 nA at an angle of incidence of 70 degrees with respect to each polished surface, thereby measuring the angle at which the normal line to each of crystal lattice planes of the crystal grains crosses the normal line to each base surface, at intervals of 0.1 μm/step for a region 30×50 μm, using the electronic backscattering diffraction image apparatus; and from these measurement results, the crystal orientation relationship between adjacent crystal lattices is calculated, and the distribution of lattice points (constituent atom sharing lattice points) where respective constituent atoms which constitute a crystal lattice interface sharing one constituent atom between the crystal lattices is calculated; and a constituent atom sharing lattice point configuration in which N (here, N is any even number equal to or greater than 2 in a crystal structure of a corundum-type hexagonal close-packing crystal, but when the upper limit of N is 28 from the viewpoint of a distribution frequency, even numbers 4, 8, 14, 24, and 26 do not exist) lattice points which do not share any constituent atoms between the constituent atom sharing lattice points are present is expressed by ΣN+1, the area ratios of crystal grain in which at least one or more Σ3 coincidence site lattice interfaces are present inside the crystal grains among all the crystal grains present within the measurement range of the reformed AlTiZrO layers were obtained, and the values of the area ratios were shown in Table 50 as Σ3 coincidence site lattice interface ratio (%).

Next, even as for the conventional AlTiZrO layers of the comparative coated tools F1 to F10, by the same method as the case of the coated tools of the present inventions, the area ratios of crystal grains in which at least one or more Σ3 coincidence site lattice interfaces are present inside the crystal grains among all the crystal grains present within the measurement range of the conventional reformed AlTiZrO layers were obtained, and the values of the area ratios were shown in Table 51 as a Σ3 coincidence site lattice interface ratio (%).

As shown in Tables 49 and 50, in the reformed AlTiZrO layers of the coated tools F1 to F15 of the present invention, the area ratios of crystal grains in which at least one or more Σ3 coincidence site lattice interfaces are present inside the crystal grains are 60% or more. On the other hand, in the conventional AlTiZrO layers of the comparative coated tools F1 to F10, the area ratios of crystal grains in which at least one or more Σ3 coincidence site lattice interfaces are present inside the crystal grains are 40% or less. It can be understood from this that the rate at which the Σ3 coincidence site lattice interfaces are present inside crystal grains is very small.

Subsequently, as for the reformed AlTiZrO layers of the coated tools F1 to F15 of the present invention, and the conventional AlTiZrO layers of the comparative coated tools F1 to F10, the area ratios of flat hexagonal crystal grains of a large grain size present within the plane perpendicular to the layer thickness direction were obtained using the field-emission-type scanning electron microscope. These values are shown in Tables 50 and 51.

Here, the "flat hexagonal crystal grains of a large grain size" means polygonal crystal grains in which the mean value of ten grains is 3 to 8 μm when the diameter of grains present within the plane perpendicular to the layer thickness direction observed by the field-emission-type scanning electron microscope is measured, and six vertex angles whose angle of vertex is 100 to 140° are provided.

Subsequently, although the thicknesses of the respective constituent layers in the hard coating layers of the coated tools F1 to F15 of the present invention, the comparative coated tools F1 to F10, and the reference coated tools F11 to F15 were measured using the scanning electron microscope (longitudinal-section measurement), substantially the same mean layer thicknesses (mean value of five-point measurements) as the target layer thicknesses were shown in all cases.

Next, all the coated tools F1 to F15 of the present invention, the comparative coated tools F1 to F10, and the reference coated tools F11 to F15 were screw-fixed to a tip portion of a bite made of tool steel by a fixing jig, and in this state, were subjected to a dry high-speed intermittent cutting test (normal cutting speed is 200 m/min) on bearing steel under the following conditions (referred to as cutting condition A):
Workpiece: a round bar of JIS-SUJ2 (HRC62) with four longitudinal grooves equally-spaced in the length direction,
Cutting speed: 250 m/min,
Depth of cut: 1.5 mm,
Feed rate: 0.15 mm/rev, and
Cutting time: 5 minutes, a dry high-speed intermittent cutting test (normal cutting speed is 200 m/min) on alloy tool steel under the following conditions (referred to as cutting condition B):
Workpiece: a round bar of JIS-SKD11 (HRC58) with four longitudinal grooves equally-spaced in the length direction,
Cutting speed: 300 m/min,
Depth of cut: 1.5 mm,
Feed rate: 0.15 mm/rev, and
Cutting time: 5 minutes, and a dry high-speed intermittent cutting test (normal cutting speed is 150 m/min) on carbon tool steel under the following conditions (referred to as cutting condition C):
Workpiece: a round bar of JIS-SK3 (HRC61) with four longitudinal grooves equally-spaced in the length direction,
Cutting speed: 250 m/min,
Depth of cut: 1.5 mm,
Feed rate: 0.15 mm/rev, and
Cutting time: 5 minutes, and
the flank wear widths of the cutting edges were measured in all the cutting tests. These test results are shown in Table 52.

TABLE 47

| Type | Tool substrate symbol | Lower layer of hard coating layer [Ti compound layer] | | | |
|---|---|---|---|---|---|
| | | First layer (μm) | Second layer (μm) | Third layer (μm) | Fourth layer (μm) |
| Coated tool of the present invention | F1 | 1a | TiN (1) | 1-TiCN (17.5) | TiN (1) | TiCNO (0.5) |
| | F2 | 1A | TiCN (1) | 1-TiCN (8.5) | TiCO (0.5) | — |
| | F3 | 1b | TiN (1) | 1-TiCN (4) | TiC (4) | TiCNO (1) |
| | F4 | 1B | TiC (1) | 1-TiCN (9) | — | — |
| | F5 | 1c | TiN (1) | 1-TiCN (4.5) | TiCNO (0.5) | — |
| | F6 | 1C | TiN (0.5) | 1-TiCN (1.5) | TiC (0.5) | TiCNO (0.5) |
| | F7 | 1d | TiN (0.5) | 1-TiCN (10) | TiC (2) | TiCNO (0.3) |
| | F8 | 1D | TiN (1) | TiCN (19) | — | — |
| | F9 | 1e | TiC (0.5) | 1-TiCN (9) | TiCO (0.5) | — |
| | F10 | 1E | TiN (1) | TiC (1) | TiCN (7) | TiCO (1) |
| | F11 | 1A | TiN (0.3) | 1-TiCN (5) | TiCNO (0.7) | TiCO (0.1) |
| | F12 | 1a | TiN (1) | 1-TiCN (10) | TiCO (0.5) | — |
| | F13 | 1B | TiN (0.5) | 1-TiCN (12) | TiN (0.5) | TiCNO (0.2) |
| | F14 | 1b | TiN (0.6) | 1-TiCN (7) | TiCNO (0.3) | — |
| | F15 | 1C | TiN (0.4) | 1-TiCN (3) | TiCN (0.5) | TiCO (0.1) |

(Numbers in the parentheses of lower layer column indicate target layer thickness)

TABLE 48

| Ti-and-Zr-containing α-type $Al_2O_3$ layer | Formation condition (Reaction atmosphere pressure given in kPa and temperature given in °C.) | | |
|---|---|---|---|
| | | Reaction atmosphere | |
| Formation symbol | Composition of reaction gas (Vol. %) | Pressure | Temperature |
| 6A First step | $AlCl_3$: 1%, $TiCl_4$: 0.01%, $ZrCl_4$: 0.07%, HCl: 1%, $CO_2$: 2%, $H_2S$: 0.25%, $H_2$: Balance | 6 | 960 |
| Second step | $AlCl_3$: 6%, $TiCl_4$: 0.6%, $ZrCl_4$: 1.2%, HCl: 3%, $CO_2$: 5%, $H_2S$: 0.4%, $H_2$: Balance | 6 | 940 |
| 6B First step | $AlCl_3$: 2%, $TiCl_4$: 0.007%, $ZrCl_4$: 0.1%, HCl: 2%, $CO_2$: 4%, $H_2S$: 0.3%, $H_2$: Balance | 7 | 980 |
| Second step | $AlCl_3$: 7%, $TiCl_4$: 0.45%, $ZrCl_4$: 1.0%, HCl: 4%, $CO_2$: 6%, $H_2S$: 0.3%, $H_2$: Balance | 7 | 960 |

TABLE 48-continued

| Ti-and-Zr-containing α-type Al₂O₃ layer | | Formation condition (Reaction atmosphere pressure given in kPa and temperature given in °C.) | | |
|---|---|---|---|---|
| | | | Reaction atmosphere | |
| Formation symbol | | Composition of reaction gas (Vol. %) | Pressure | Temperature |
| 6C | First step | $AlCl_3$: 3%, $TiCl_4$: 0.005%, $ZrCl_4$: 0.08%, HCl: 3%, $CO_2$: 5%, $H_2S$: 0.4%, $H_2$: Balance | 10 | 1000 |
|    | Second step | $AlCl_3$: 8%, $TiCl_4$: 0.20%, $ZrCl_4$: 0.8%, HCl: 4%, $CO_2$: 6%, $H_2S$: 0.25%, $H_2$: Balance | 10 | 970 |
| 6D | First step | $AlCl_3$: 5%, $TiCl_4$: 0.005%, $ZrCl_4$: 0.06%, HCl: 5%, $CO_2$: 5%, $H_2S$: 0.4%, $H_2$: Balance | 8 | 1010 |
|    | Second step | $AlCl_3$: 10%, $TiCl_4$: 0.06%, $ZrCl_4$: 0.6%, HCl: 3%, $CO_2$: 8%, $H_2S$: 0.5%, $H_2$: Balance | 8 | 980 |
| 6E | First step | $AlCl_3$: 2%, $TiCl_4$: 0%, $ZrCl_4$: 0.05%, HCl: 4%, $CO_2$: 5%, $H_2S$: 0.6%, $H_2$: Balance | 7 | 1000 |
|    | Second step | $AlCl_3$: 6%, $TiCl_4$: 0.05%, $ZrCl_4$: 0.9%, HCl: 5%, $CO_2$: 4%, $H_2S$: 0.25%, $H_2$: Balance | 7 | 960 |
| 6F | First step | $AlCl_3$: 3%, $TiCl_4$: 0%, $ZrCl_4$: 0.1%, HCl: 4%, $CO_2$: 6%, $H_2S$: 0.75%, $H_2$: Balance | 6 | 990 |
|    | Second step | $AlCl_3$: 10%, $TiCl_4$: 0.06%, $ZrCl_4$: 0.6%, HCl: 4%, $CO_2$: 8%, $H_2S$: 0.3%, $H_2$: Balance | 6 | 940 |

TABLE 49

| Conventional Ti-and-Zr-containing α-type Al₂O₃ layer | Formation condition (Reaction atmosphere pressure given in kPa and temperature given in °C.) | | |
|---|---|---|---|
| | | Reaction atmosphere | |
| Formation symbol | Composition of reaction gas (Vol. %) | Pressure | Temperature |
| 6A | $AlCl_3$: 6%, $TiCl_4$: 0.6%, $ZrCl_4$: 1.2%, $CH_4$: 0.1%, $CO_2$: 5%, $H_2$: Balance | 6 | 940 |
| 6B | $AlCl_3$: 7%, $TiCl_4$: 0.45%, $ZrCl_4$: 1.0%, $CH_4$: 0.3%, $CO_2$: 6%, $H_2$: Balance | 7 | 960 |
| 6C | $AlCl_3$: 8%, $TiCl_4$: 0.2%, $ZrCl_4$: 0.8%, $CH_4$: 0.5%, $CO_2$: 6%, $H_2$: Balance | 10 | 970 |
| 6D | $AlCl_3$: 10%, $TiCl_4$: 0.06%, $ZrCl_4$: 0.6%, $CH_4$: 1%, $CO_2$: 8%, $H_2$: Balance | 8 | 1010 |

TABLE 50

| | | | Hard coating layer Intermediate layer [α-type Al₂O₃ layer] | | | |
|---|---|---|---|---|---|---|
| Type | | Tool substrate symbol | Formation symbol of intermediate layer | Target layer thickness (µm) | Tilt angle division where (0001) plane shows highest peak (Degree) | Frequency ratio of tilt angle division of 0 to 10 degrees (%) |
| Coated tool of the present invention | F1 | 1a | 1A | 1 | 1.50-1.75 | 45 |
| | F2 | 1A | 1B | 1 | 0.00-0.25 | 78 |
| | F3 | 1b | 1C | 2 | 0.50-0.75 | 84 |
| | F4 | 1B | 1A | 2 | 0.25-0.50 | 75 |
| | F5 | 1c | 1B | 3 | 4.50-4.75 | 91 |
| | F6 | 1C | 1B | 3 | 1.25-1.50 | 73 |
| | F7 | 1d | 1C | 4 | 3.00-3.25 | 71 |
| | F8 | 1D | 1C | 4 | 9.75-10.00 | 63 |
| | F9 | 1e | 1A | 5 | 5.50-5.75 | 75 |
| | F10 | 1E | 1B | 5 | 2.50-2.75 | 84 |
| | F11 | 1A | 1B | 2 | 0.50-0.75 | 81 |
| | F12 | 1a | 1C | 2 | 0.75-1.00 | 95 |
| | F13 | 1B | 1A | 3 | 1.75-2.00 | 94 |
| | F14 | 1b | 1B | 2 | 2.50-2.75 | 69 |
| | F15 | 1C | 1C | 3 | 6.50-6.75 | 82 |

| | | | Hard coating layer Upper layer [Ti-and-Zr-containing α-typeAl₂O₃ layer] | | | |
|---|---|---|---|---|---|---|
| Type | | Formation symbol of upper layer | Content ratio of Ti [Al/(Al + Ti + Zr)] (Atomic ratio) | Content ratio of Zr [Zr/(Al + Ti + Zr)] (Atomic ratio) | Target layer thickness (µm) | Tilt angle division where (0001) plane shows highest peak (Degree) |
| Coated tool of the present invention | F1 | 6A | 0.01 | 0.01 | 2 | 1.50-1.75 |
| | F2 | 6A | 0.01 | 0.01 | 4 | 0.00-0.25 |
| | F3 | 6B | 0.0075 | 0.008 | 8 | 0.50-0.75 |
| | F4 | 6B | 0.0075 | 0.008 | 4 | 0.25-0.50 |
| | F5 | 6C | 0.005 | 0.003 | 7 | 4.50-4.75 |
| | F6 | 6C | 0.005 | 0.003 | 13 | 1.25-1.50 |
| | F7 | 6D | 0.004 | 0.002 | 3 | 3.00-3.25 |
| | F8 | 6D | 0.004 | 0.002 | 4 | 9.75-10.00 |

TABLE 50-continued

| | | | | | |
|---|---|---|---|---|---|
| F9 | 6A | 0.01 | 0.01 | 9 | 5.50-5.75 |
| F10 | 6A | 0.01 | 0.01 | 15 | 2.50-2.75 |
| F11 | 6E | 0.003 | 0.004 | 6 | 0.50-0.75 |
| F12 | 6E | 0.003 | 0.004 | 9 | 0.75-1.00 |
| F13 | 6F | 0.002 | 0.002 | 3 | 1.75-2.00 |
| F14 | 6F | 0.002 | 0.002 | 8 | 2.50-2.75 |
| F15 | 6E | 0.003 | 0.004 | 5 | 6.50-6.75 |

| | | | Hard coating layer Upper layer [Ti-and-Zr-containing α-typeAl$_2$O$_3$ layer] | | | |
|---|---|---|---|---|---|---|
| | | Type | Frequency ratio of tilt angle division of 0 to 10 degrees (%) | Crystal grain ratio Having Σ3 coincidence site lattice interface therein (Area %) | Surface ratio of flat hexagonal crystal grain (Area %) | Surface roughness Ra (μm) |
| Coated tool of the present invention | | F1 | 60 | 60 | 5 | 0.1* |
| | | F2 | 83 | 64 | 11 | 0.4 |
| | | F3 | 88 | 80 | 25 | 0.5 |
| | | F4 | 79 | 74 | 16 | 0.2* |
| | | F5 | 90 | 83 | 14 | 0.5 |
| | | F6 | 80 | 75 | 22 | 0.3* |
| | | F7 | 76 | 71 | 23 | 0.4 |
| | | F8 | 69 | 66 | 14 | 0.4 |
| | | F9 | 86 | 86 | 32 | 0.6 |
| | | F10 | 91 | 95 | 34 | 0.7 |
| | | F11 | 90 | 91 | 78 | 0.5 |
| | | F12 | 96 | 94 | 83 | 0.5 |
| | | F13 | 99 | 98 | 97 | 0.4 |
| | | F14 | 72 | 83 | 35 | 0.4 |
| | | F15 | 89 | 93 | 71 | 0.2* |

TABLE 51

| | | | Hard coating layer Upper layer [α-typeAl$_2$O$_3$ layer] | | | |
|---|---|---|---|---|---|---|
| Type | | Tool substrate symbol | Formation symbol of intermediate layer | Target layer thickness (μm) | Tilt angle division where (0001) plane shows highest peak (Degree) | Frequency ratio of tilt angle division of 0 to 10 degrees (%) |
| Comparative coated tool | F1 | 1a | — | — | — | — |
| | F2 | 1A | — | — | — | — |
| | F3 | 1b | — | — | — | — |
| | F4 | 1B | — | — | — | — |
| | F5 | 1c | — | — | — | — |
| | F6 | 1C | — | — | — | — |
| | F7 | 1d | — | — | — | — |
| | F8 | 1D | — | — | — | — |
| | F9 | 1e | — | — | — | — |
| | F10 | 1E | — | — | — | — |
| Reference coated tool | F11 | 1A | 1B | 8 | 0.75-1.00 | 65 |
| | F12 | 1a | 1A | 11 | 0.75-1.00 | 95 |
| | F13 | 1B | 1C | 6 | 1.75-2.00 | 94 |
| | F14 | 1b | 1B | 10 | 2.50-2.75 | 69 |
| | F15 | 1C | 1C | 8 | 6.70-6.75 | 83 |

| | | | Hard coating layer Upper layer [Ti-andZr-containing α-type Al$_2$O$_3$ layer] | | | |
|---|---|---|---|---|---|---|
| Type | | Formation symbol of upper layer | Content ratio of Ti [Al/(Al + Ti + Zr)] (Atomic ratio) | Content ratio of Zr [Zr/(Al + Ti + Zr)] (Atomic ratio) | Target layer thickness (μm) | Tilt angle division where (0001) plane shows highest peak (Degree) |
| Comparative coated tool | F1 | 6A | 0.01 | 0.01 | 3 | 17.00-17.25 |
| | F2 | 6A | 0.01 | 0.01 | 5 | 15.50-15.75 |
| | F3 | 6B | 0.0075 | 0.008 | 10 | 18.00-18.25 |
| | F4 | 6B | 0.0075 | 0.008 | 6 | 20.00-20.25 |
| | F5 | 6C | 0.005 | 0.003 | 10 | 25.50-25.75 |
| | F6 | 6C | 0.005 | 0.003 | 16 | 37.00-37.25 |
| | F7 | 6D | 0.004 | 0.002 | 7 | 33.25-33.50 |
| | F8 | 6D | 0.004 | 0.002 | 8 | 25.75-30.00 |

TABLE 51-continued

|  |  |  |  |  |  |  |
|---|---|---|---|---|---|---|
|  | F9 | 6A | 0.01 | 0.01 | 14 | 27.00-27.25 |
|  | F10 | 6A | 0.01 | 0.01 | 20 | 17.75-20.00 |
| Reference | F11 | — | — | — | — | — |
| coated | F12 | — | — | — | — | — |
| tool | F13 | — | — | — | — | — |
|  | F14 | — | — | — | — | — |
|  | F15 | — | — | — | — | — |

| | | Hard coating layer Upper layer [Ti-andZr-containing α-type Al₂O₃ layer] | | | |
|---|---|---|---|---|---|
| | Type | Frequency ratio of tilt angle division of 0 to 10 degrees (%) | Crystal grain ratio Having Σ3 coincidence site lattice interface therein (Area %) | Surface ratio of flat hexagonal crystal grain (Area %) | Surface roughness Ra (μm) |
| Comparative | F1 | 13 | 9 | 0 | 0.1* |
| coated | F2 | 9 | 6 | 0 | 0.4 |
| tool | F3 | 7 | 0 | 0 | 0.5 |
|  | F4 | 6 | 2 | 0 | 0.2* |
|  | F5 | 8 | 4 | 0 | 0.5 |
|  | F6 | 10 | 8 | 0 | 0.3* |
|  | F7 | 5 | 10 | 0 | 0.4 |
|  | F8 | 3 | 6 | 0 | 0.4 |
|  | F9 | 11 | 12 | 0 | 0.6 |
|  | F10 | 4 | 3 | 0 | 0.7 |
| Reference | F11 | — | — | — | 0.5 |
| coated | F12 | — | — | — | 0.5 |
| tool | F13 | — | — | — | 0.4 |
|  | F14 | — | — | — | 0.4 |
|  | F15 | — | — | — | 0.2* |

TABLE 52

| | | Flank wear width (mm) | | | | | Cutting test result (min) | | |
|---|---|---|---|---|---|---|---|---|---|
| Type | | Cutting condition (A) | Cutting condition (B) | Cutting condition (C) | Type | | Cutting condition (A) | Cutting condition (B) | Cutting condition (C) |
| Coated tool | F1 | 0.31 | 0.32 | 0.33 | Comparative | F1 | 1.0 * | 1.2 | 1.1 * |
| of the | F2 | 0.13 | 0.15 | 0.14 | coated tool | F2 | 2.3 | 2.4 | 2.5 |
| present | F3 | 0.14 | 0.14 | 0.13 |  | F3 | 1.2 * | 1.0 * | 1.6 |
| invention | F4 | 0.13 | 0.13 | 0.12 |  | F4 | 2.7 | 2.8 | 1.5 * |
|  | F5 | 0.24 | 0.23 | 0.22 |  | F5 | 2.4 | 1.5 * | 2.2 |
|  | F6 | 0.25 | 0.24 | 0.23 |  | F6 | 0.9 * | 1.0 * | 0.8 * |
|  | F7 | 0.16 | 0.14 | 0.15 |  | F7 | 1.5 * | 2.9 | 3.1 |
|  | F8 | 0.19 | 0.17 | 0.18 |  | F8 | 2.9 | 1.5 * | 2.0 * |
|  | F9 | 0.22 | 0.22 | 0.23 |  | F9 | 1.1 * | 1.2 * | 1.0 * |
|  | F10 | 0.24 | 0.23 | 0.25 |  | F10 | 0.5 * | 0.6 * | 0.7 * |
|  | F11 | 0.13 | 0.12 | 0.11 | Reference | F11 | 3.0 | 3.1 | 2.9 |
|  | F12 | 0.19 | 0.18 | 0.19 | coated tool | F12 | 1.8 * | 2.5 | 2.0 * |
|  | F13 | 0.12 | 0.11 | 0.10 |  | F13 | 2.9 | 3.0 | 2.8 |
|  | F14 | 0.17 | 0.18 | 0.18 |  | F14 | 1.7 * | 2.4 | 1.9 * |
|  | F15 | 0.12 | 0.12 | 0.10 |  | F15 | 2.0 * | 3.0 | 2.8 |

Cutting test results of comparative coated tools and reference coated tools show cutting times (min) until the tools come to the end of their usable lifespan due to chipping or flank wear (usable lifespan determination criterion: Flank wear width of 0.5 mm).
In addition, the mark * in columns indicates a case where tools come to the end of their usable lifespan due to chipping.

From the results shown in Tables 50 to 52, as for the coated tools F1 to F15 of the present invention, the (0001) plane orientation rate of the reformed α-type Al₂O₃ layers which are the intermediate layers of the hard coating layers show a high ratio of 45% or more, and have excellent high-temperature strength. In addition, the reformed AlTiZrO layers which constitute the upper layers have the texture of the flat-plate polygonal (flat hexagonal) elongated crystal grains, and the (0001) plane orientation rate show a high ratio of 60% or more, the surface ratios of crystal grains in which at least one or more Σ3 coincidence site lattice interfaces are present inside the crystal grains are as high as 60% or more, or post-processing is performed on the reformed AlTiZrO layers and the surface smoothness thereof is further improved. Thereby, the reformed AlTiZrO layers have superior high-temperature strength, and strength within the crystal grains, and have superior surface flatness. As a result, in high-speed intermittent cutting work of high-hardness steel, such as quenching materials for alloy tool steel or bearing steel, accompanied by high heat generation, and intermittent impact loading acts on the cutting edge, the hard coating layers exhibit superior chipping resistance, show excellent cutting performance for a long-term use, and allows a more prolonged usable lifespan.

On the other hand, it is clear that the comparative coated tools F1 to F10 in which the hard coating layers are composed of the Ti compound layers and the conventional AlTiZrO layers and the reference coated tools F11 to F15 in which the hard coating layers are composed of the Ti compound layers and the conventional α-type $Al_2O_3$ layers, come to the end of their usable lifespan in a relatively short time due to the occurrence of chipping, promotion of abrasion, or the like.

As described above, even in high-speed intermittent cutting work of high-hardness steel accompanied by high heat generation, and intermittent and high impact loading acts repeatedly on the cutting edge as well as in cutting work of various kinds of steel or cast iron, or the like under normal conditions, the coated tools of this invention exhibit excellent chipping resistance without occurrence of chipping, and show excellent cutting performance for a prolonged period of time. Therefore, it is possible to satisfactorily cope with the demands for high performance of a cutting device, for labor saving and energy saving in cutting work, and cost reduction.

INDUSTRIAL APPLICABILITY

As described above, even in high-speed intermittent cutting work accompanied by high heat generation, and intermittent impact loading acts on the cutting edge as well as in cutting work of various kinds of steel or cast iron, or the like under normal conditions, the coated tools of this invention can suppress occurrence of chipping, and exhibit excellent cutting performance for a prolonged period of time. Therefore, it is possible to satisfactorily cope with the demands for high performance of a cutting device, for labor saving and energy saving in cutting work, and cost reduction.

The invention claimed is:

1. A surface-coated cutting tool comprising:
    a tool substrate made of tungsten carbide-based cemented carbide or titanium carbonitride-based cermet; and
    a hard coating layer, which is formed by vapor-depositing in order, a lower layer (a), an intermediate layer (b), and an upper layer (c) on the surface of the tool substrate,
    wherein the lower layer (a) is a Ti compound layer composed of one or more of a titanium carbide layer, a titanium nitride layer, a titanium carbonitride layer, a titanium carboxide layer, and a titanium oxycarbonitride layer, all of which are formed by chemical vapor deposition, and having a total mean layer thickness of 3 to 20 μm,
    wherein the intermediate layer (b) is an aluminum oxide layer having a mean layer thickness of 1 to 5 μm and having an α-type crystal structure in a chemically vapor-deposited state,
    wherein the upper layer (c) is an aluminum oxide layer having a mean layer thickness of 2 to 15 μm and an α-type crystal structure in a chemically vapor-deposited state, the aluminum oxide layer containing one or more kinds of elements selected from a group consisting of Ti, Y, Zr, Cr, and B,
    wherein, the intermediate layer (b) has properties indicated by a tilt-angle frequency distribution graph in which the highest peak exists in a tilt angle division ranging 0 to 10° and the total sum of frequencies existing in the range of 0 to 10° occupies a ratio of 45% or more of the total frequencies in the tilt-angle frequency distribution graph, the tilt-angle frequency distribution graph being obtained by utilizing a field-emission-type scanning electron microscope, irradiating electron beams to individual crystal grains with a hexagonal crystal lattice existing in a measurement range of a polished surface of the tool substrate, measuring a tilt angle formed by the normal line to the polished surface and the normal line to (0001) plane as a crystal plane of the crystal grains, sectioning the measured tilt angles belonging to a range of 0 to 45° every pitch of 0.25°, and collecting the frequencies existing in each section,
    wherein, the upper layer (c) is an aluminum oxide layer having a texture made of crystal grains with a flat-plate polygonal shape within a plane perpendicular to a layer thickness direction and have an elongated shape in the layer thickness direction within a plane parallel to the layer thickness direction and containing one or more kinds of elements selected from a group consisting of Ti, Y, Zr, Cr, and B, the texture being observed by a field-emission scanning electron microscope,
    wherein, the upper layer (c) has properties indicated by a tilt-angle frequency distribution graph in which the highest peak exists in a tilt angle division ranging 0 to 10° and the sum of frequencies existing in the range of 0 to 10° occupies a ratio of 60% or more of the total frequencies in the tilt-angle frequency distribution graph, the tilt-angle frequency distribution graph being obtained by utilizing a field-emission-type scanning electron microscope, irradiating electron beams to individual crystal grains with a hexagonal crystal lattice existing in a measurement range of a polished surface of the tool substrate, measuring a tilt angle formed by the normal line to the polished surface and the normal line to (0001) plane as a crystal plane of the crystal grains, sectioning the measured tilt angles belonging to a range of 0 to 45° every pitch of 0.25°, and collecting the frequencies existing in each section, and
    wherein when electron beams are radiated to the individual crystal grains existing within a measurable range of a polished surface of the tool substrate by utilizing a field-emission-type scanning electron microscope and an electron backscatter diffraction imaging device to measure angles formed by normal lines of crystal lattice faces with hexagonal crystal lattices and the normal line to the polished surface, a crystallographic orientation relationship between the adjacent crystal lattices is calculated from the measurement result, and a distribution of lattice points (constituent atom sharing lattice points) in each constituent atom of a crystal lattice interface shares one constituent atom between the crystal lattices is calculated, and when a constituent atom sharing lattice point type in which N lattice points not sharing the constituent atom exist between the constituent atom sharing lattice points (where N is an even number of 2 or more in view of a crystal structure of corundum type hexagonal close packed crystal but does not include even numbers of 4, 8, 14, 24, and 26 when the upper limit of N is set to 28 in view of distribution frequency) is expressed as ΣN+1, the insides of the above mentioned crystal grains, which constitutes the upper layer (c) and occupies 60% or more as an area ratio in the crystal grains of the upper layer, are divided by at least one crystal lattice interface with the constituent atom sharing lattice point type expressed by Σ3, and
    the upper layer (c) contains one or more kinds of elements selected from a group consisting of Ti, Y, Zr, Cr, and B.

2. The surface-coated cutting tool according to claim 1, wherein the upper layer (c) is an aluminum oxide layer containing Ti only.

3. The surface-coated cutting tool according to claim 2, wherein, when the texture of the upper layer (c) is observed by the field-emission scanning electron microscope, crystal grains which have a flat hexagonal shape within the plane perpendicular to the layer thickness direction and have an elongated shape in the layer thickness direction within the plane parallel to the layer thickness direction account for 35% or more of the whole as an area ratio within the plane perpendicular to the layer thickness direction.

4. The surface-coated cutting tool according to claim 2, wherein the upper layer (c) has a surface roughness (Ra) within a range of 0.05 to 0.3 μm.

5. The surface-coated cutting tool according to claim 1, wherein the upper layer (c) is an aluminum oxide layer containing Y only.

6. The surface-coated cutting tool according to claim 5, wherein, when the texture of the upper layer (c) is observed by the field-emission scanning electron microscope, crystal grains which have a flat hexagonal shape within the plane perpendicular to the layer thickness direction and have an elongated shape in the layer thickness direction within the plane parallel to the layer thickness direction account for 35% or more of the whole as an area ratio within the plane perpendicular to the layer thickness direction.

7. The surface-coated cutting tool according to claim 5, wherein the upper layer (c) has a surface roughness (Ra) within a range of 0.05 to 0.3 μm.

8. The surface-coated cutting tool according to claim 1, wherein the upper layer (c) is an aluminum oxide layer containing Zr only.

9. The surface-coated cutting tool according to claim 8, wherein, when the texture of the upper layer (c) is observed by the field-emission scanning electron microscope, crystal grains which have a flat hexagonal shape within the plane perpendicular to the layer thickness direction and have an elongated shape in the layer thickness direction within the plane parallel to the layer thickness direction account for 35% or more of the whole as an area ratio within the plane perpendicular to the layer thickness direction.

10. The surface-coated cutting tool according to claim 8, wherein the upper layer (c) has a surface roughness (Ra) within a range of 0.05 to 0.3 μm.

11. The surface-coated cutting tool according to claim 1, wherein the upper layer (c) is an aluminum oxide layer containing Cr only.

12. The surface-coated cutting tool according to claim 11, wherein, when the texture of the upper layer (c) is observed by the field-emission scanning electron microscope, crystal grains which have a flat hexagonal shape within the plane perpendicular to the layer thickness direction and have an elongated shape in the layer thickness direction within the plane parallel to the layer thickness direction account for 35% or more of the whole as an area ratio within the plane perpendicular to the layer thickness direction.

13. The surface-coated cutting tool according to claim 11, wherein the upper layer (c) has a surface roughness (Ra) within a range of 0.05 to 0.3 μm.

14. The surface-coated cutting tool according to claim 1, wherein the upper layer (c) is an aluminum oxide layer containing B only.

15. The surface-coated cutting tool according to claim 14, wherein, when the texture of the upper layer (c) is observed by the field-emission scanning electron microscope, crystal grains which have a flat hexagonal shape within the plane perpendicular to the layer thickness direction and have an elongated shape in the layer thickness direction within the plane parallel to the layer thickness direction account for 35% or more of the whole as an area ratio within the plane perpendicular to the layer thickness direction.

16. The surface-coated cutting tool according to claim 14, wherein the upper layer (c) has a surface roughness (Ra) within a range of 0.05 to 0.3 μm.

17. The surface-coated cutting tool according to claim 1, wherein, when the texture of the upper layer (c) is observed by the field-emission scanning electron microscope, crystal grains which have a flat hexagonal shape within the plane perpendicular to the layer thickness direction and have an elongated shape in the layer thickness direction within the plane parallel to the layer thickness direction account for 35% or more of the whole as an area ratio within the plane perpendicular to the layer thickness direction.

18. The surface-coated cutting tool according to claim 1, wherein the upper layer (c) has a surface roughness (Ra) within a range of 0.05 to 0.3 μm.

19. The surface-coated cutting tool according to claim 1, wherein the aluminum oxide of the intermediate layer (b) is $Al_2O_3$.

20. The surface-coated cutting tool according to claim 1, wherein the upper layer (c) is an outermost layer of the surface-coated tool.

* * * * *